US010175574B2

(12) United States Patent
Idei et al.

(10) Patent No.: US 10,175,574 B2
(45) Date of Patent: Jan. 8, 2019

(54) COLORING COMPOSITION, AND CURED FILM, COLOR FILTER, PATTERN FORMING METHOD, METHOD FOR MANUFACTURING COLOR FILTER, SOLID-STATE IMAGING DEVICE, IMAGE DISPLAY DEVICE, AND DYE MULTIMER, EACH USING THE COLORING COMPOSITION

(71) Applicant: FUJIFILM Corporation, Tokyo (JP)

(72) Inventors: Hiroaki Idei, Haibara-gun (JP); Kazuya Oota, Haibara-gun (JP); Suguru Samejima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/212,800

(22) Filed: Jul. 18, 2016

(65) Prior Publication Data

US 2016/0327859 A1 Nov. 10, 2016

Related U.S. Application Data

(63) Continuation of application No. PCT/JP2015/052168, filed on Jan. 27, 2015.

(30) Foreign Application Priority Data

Jan. 31, 2014 (JP) ................................ 2014-017699

(51) Int. Cl.

| | |
|---|---|
| ***G02B 5/20*** | (2006.01) |
| ***G03F 7/004*** | (2006.01) |
| ***G03F 7/00*** | (2006.01) |
| ***G03F 7/027*** | (2006.01) |
| ***G03F 7/105*** | (2006.01) |
| ***C09B 69/10*** | (2006.01) |
| ***G02B 5/22*** | (2006.01) |
| ***G03F 7/16*** | (2006.01) |
| ***G03F 7/20*** | (2006.01) |
| ***G03F 7/32*** | (2006.01) |

(52) U.S. Cl.

CPC .......... *G03F 7/0007* (2013.01); *C09B 69/101* (2013.01); *C09B 69/103* (2013.01); *C09B 69/105* (2013.01); *C09B 69/106* (2013.01); *C09B 69/109* (2013.01); *G02B 5/223* (2013.01); *G03F 7/027* (2013.01); *G03F 7/105* (2013.01); *G03F 7/16* (2013.01); *G03F 7/2002* (2013.01); *G03F 7/32* (2013.01)

(58) Field of Classification Search

CPC ..... C09B 69/10; C09B 69/101; C09B 69/102; C09B 69/103; C09B 69/104; C09B 69/105; C09B 69/106; C09B 69/107; C09B 69/108; C09B 69/109; G03F 7/0007; G03F 7/027; G03F 7/028; G03F 7/032; G03F 7/2002; G02B 5/223; H01L 27/14621

USPC .... 430/7, 270.1, 281.1, 286.1, 287.1, 288.1; 257/440

See application file for complete search history.

(56) References Cited

U.S. PATENT DOCUMENTS

| | | | | |
|---|---|---|---|---|
| 5,446,134 A | | 8/1995 | Armand et al. | |
| 5,623,001 A | * | 4/1997 | Figov .................. | C09D 11/101 106/31.43 |
| 5,741,632 A | | 4/1998 | Kiekens | |
| 6,509,125 B1 | | 1/2003 | Ito et al. | |
| 7,622,521 B2 | | 11/2009 | Seto | |
| 7,901,851 B2 | | 3/2011 | Mizukawa et al. | |
| 8,197,994 B2 | | 6/2012 | Mizukawa et al. | |
| 8,367,282 B2 | | 2/2013 | Mizukawa et al. | |
| 8,778,235 B2 | | 7/2014 | Ito et al. | |
| 8,779,159 B2 | | 7/2014 | Mizukawa et al. | |
| 2004/0129178 A1 | | 7/2004 | Jung et al. | |
| 2005/0221120 A1 | | 10/2005 | Owczarczyk et al. | |
| 2006/0163208 A1 | | 7/2006 | Park et al. | |

(Continued)

FOREIGN PATENT DOCUMENTS

| | | |
|---|---|---|
| EP | 0 779 540 A1 | 6/1997 |
| JP | 6-503842 A | 4/1994 |

(Continued)

OTHER PUBLICATIONS

Computer-generated translation of JP 2000-212207 (Aug. 2000).*

(Continued)

*Primary Examiner* — John A McPherson
(74) *Attorney, Agent, or Firm* — Sughrue Mion, PLLC

(57) ABSTRACT

A coloring composition having good light fastness and exposure sensitivity in the case of preparing a cured film; and a cured film, a color filter, a pattern forming method, a method for manufacturing a color filter, a solid-state imaging device, an image display device, and a dye multimer, each using the coloring composition, are provided. The coloring composition contains a dye multimer having a colorant structure and at least one structure selected from structures of Formulas (1) to (5) in the same molecule (Formula (1) is shown below), and a curable compound:

(1)

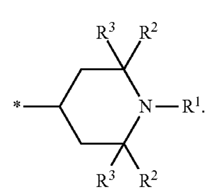

18 Claims, No Drawings

(56) References Cited

U.S. PATENT DOCUMENTS

| | | | | |
|---|---|---|---|---|
| 2006/0199951 | A1 | 9/2006 | Wang | |
| 2007/0112134 | A1 | 5/2007 | Seto | |
| 2007/0117031 | A1 | 5/2007 | Mizukawa et al. | |
| 2008/0076044 | A1 | 3/2008 | Mizukawa et al. | |
| 2009/0098490 | A1 | 4/2009 | Pham et al. | |
| 2009/0240329 | A1 | 9/2009 | Gousse | |
| 2010/0230647 | A1 | 9/2010 | Mizukawa et al. | |
| 2012/0138877 | A1 | 6/2012 | Mizukawa et al. | |
| 2012/0187351 | A1 | 7/2012 | Ito et al. | |
| 2012/0202145 | A1 * | 8/2012 | Arayama ................ | G03F 7/027 430/7 |
| 2012/0235099 | A1 | 9/2012 | Ushijima et al. | |
| 2012/0238752 | A1 | 9/2012 | Mizukawa et al. | |
| 2014/0349101 | A1 | 11/2014 | Kaneko et al. | |
| 2016/0154303 | A1 | 6/2016 | Itou et al. | |
| 2016/0327859 | A1 | 11/2016 | Idei et al. | |

FOREIGN PATENT DOCUMENTS

| | | | |
|---|---|---|---|
| JP | 9-179236 | A | 7/1997 |
| JP | 2000-162429 | A | 6/2000 |
| JP | 2000-212207 | A * | 8/2000 |
| JP | 2000-355660 | A | 12/2000 |
| JP | 2002-40591 | A | 2/2002 |
| JP | 2003-342494 | A | 12/2003 |
| JP | 2004-115812 | A | 4/2004 |
| JP | 2004-269565 | A | 9/2004 |
| JP | 2005-002328 | A | 1/2005 |
| JP | 2007-138051 | A | 6/2007 |
| JP | 2007-139906 | A | 6/2007 |
| JP | 2008-292970 | A | 12/2008 |
| JP | 2008-297524 | A | 12/2008 |
| JP | 2009-510209 | A | 3/2009 |
| JP | 2010-18788 | A | 1/2010 |
| JP | 2010-54808 | A | 3/2010 |
| JP | 2011-95732 | A | 5/2011 |
| JP | 2012-32754 | A | 2/2012 |
| JP | 2012-46712 | A | 3/2012 |
| JP | 2012-046712 | A | 3/2012 |
| JP | 2012-107192 | A | 6/2012 |
| JP | 2012-108469 | A | 6/2012 |
| JP | 2013-029760 | A | 2/2013 |
| JP | 2013-87248 | A | 5/2013 |
| JP | 2013-195854 | A | 9/2013 |
| JP | 2014-196262 | A | 10/2014 |
| JP | 2014-196394 | A | 10/2014 |
| JP | 2015-071743 | A | 4/2015 |
| SG | 178428 | A1 | 3/2012 |
| WO | 2011/158748 | A1 | 12/2011 |
| WO | 2013/011687 | A1 | 1/2013 |
| WO | 2015/033814 | A1 | 3/2015 |

OTHER PUBLICATIONS

Computer-generated translation of JP 2012-032754 (Feb. 2012).*
Computer-generated translation of JP 2004-269565 (Sep. 2004).*
Computer-generated transaltion of JP 2003-342494 (Dec. 2003).*
Office Action dated Oct. 11, 2017 from the United States Patent and Trademark Office in copending U.S. Appl. No. 15/014,756.
Advisory Action dated Jan. 16, 2018 from the United States Patent and Trademark Office in co-pending U.S. Appl. No. 15/014,756.
Office Action dated Nov. 28, 2017 from the Korean Intellectual Property Office in Korean Application No. 10-2016-7002478.
International Search Report of PCT/JP2015/052168 dated Apr. 21, 2015.
Written Opinion of PCT/JP2015/052168 dated Apr. 21, 2015.
Office Action dated Apr. 18, 2017, issued from the Japan Patent Office in counterpart Japanese Patent Application No. 2014-017699.
Bojinov, et al., *Novel polymerizable light emitting dyes—combination of a hindered amine with a 9-phenylxanthene fluorophore. Synthesis and photophysical investigations*, Dyes and Pigments, ScienceDirect, vol. 74, 2007, pp. 187-194, 8 pages total.
Office Action dated Oct. 24, 2017, from Taiwanese Intellectual Property Office in Taiwanese Application No. 103130325.
International Search Report dated Nov. 25, 2014, issued by the International Searching Authority in subject-matter related Application No. PCT/JP2014/072213.
Written Opinion dated Nov. 25, 2014, issued by the International Searching Authority in subject-matter related Application No. PCT/JP2014/072213.
International Preliminary Report on Patentability with translation of Written Opinion dated Mar. 8, 2016, issued by the International Searching Authority in subject-matter related Application No. PCT/JP2014/072213.
Communication dated May 23, 2016 from the State Intellectual Property Office of the P.R.C. in subject-matter related Chinese Application No. 201480038627.4.
Communication dated Aug. 10, 2016 from the European Patent Office in subject-matter related European Application No. 14842160.5.
Communication dated Aug. 2, 2016 from the Japanese Patent Office in subject-matter related Japanese Application No. 2014-165546.
Communication dated Jan. 16, 2017 from the State Intellectual Property Office of the P.R.C. in subject-matter related Chinese Application No. 201480038627.4.
Communication dated Feb. 28, 2017 from the Japanese Patent Office in subject-matter related Japanese Application No. 2014-165546.
Communication dated Jun. 22, 2017 from U.S. Patent & Trademark Office in co-pending U.S. Appl. No. 15/014,756.
Office Action dated Jul. 4, 2017 from the Japanese Patent Office in counterpart Japanese Application No. 2014-017699.
Office Action dated Jun. 8, 2017 from the State Intellectual Property Office of the P.R.C. in subject-matter related Chinese Application No. 201480038627.4.
International Preliminary Report on Patentability dated Aug. 11, 2016, from the International Bureau in counterpart International Application No. PCT/JP2015/052168.
Office Action dated Feb. 6, 2018, from Japanese Patent Office in Japanese Application No. 2017-092275.
Office Action dated Apr. 11, 2018, from Korean Intellectual Property Office in Korean Application No. 10-2016-7002478.
Office Action dated Mar. 15, 2018 from the Korean Intellectual Property Office in counterpart Korean application No. 10-2016-7020021.
Office Action dated Jun. 27, 2017 from the Japanese Patent Office in Japanese Application No. 2014-017699.
Office Action dated Jan. 2, 2018 from the State Intellectual Property Office of the P.R.C. in Chinese Application No. 201610864555.X.
Notice of Allowance dated Sep. 11, 2018 from the United States Patent and Trademark Office in counterpart U.S. Appl. No. 15/014,756.
Office Action dated Sep. 25, 2018 from the Taiwanese Patent Office in counterpart Taiwanese application No. 104100132.

* cited by examiner

COLORING COMPOSITION, AND CURED FILM, COLOR FILTER, PATTERN FORMING METHOD, METHOD FOR MANUFACTURING COLOR FILTER, SOLID-STATE IMAGING DEVICE, IMAGE DISPLAY DEVICE, AND DYE MULTIMER, EACH USING THE COLORING COMPOSITION

This application is a Continuation of PCT International Application No. PCT/JP2015/052168 filed on Jan. 27, 2015, which claims priority under 35 U.S.C. § 119(a) to Japanese Patent Application No. 2014-017699 filed on Jan. 31, 2014. The above application(s) is hereby expressly incorporated by reference, in its entirety, into the present application.

BACKGROUND OF THE INVENTION

1. Field of the Invention

The present invention relates to a coloring composition. Specifically, it relates to a coloring composition which is suitable for forming colored pixels. The present invention also relates to a cured film, a color filter, a solid-state imaging device, and an image display device, each using the coloring composition. The present invention also relates to a pattern forming method and a method for manufacturing a color filter, using the coloring composition. In addition, the present invention also relates to a dye multimer for use in the coloring composition.

2. Description of the Related Art

Recently, there is a significantly growing demand for solid-state imaging devices such as CCD image sensors along with the widespread use of digital cameras, cell phones equipped with cameras, and the like. Color filters are used as key devices of displays or optical elements of these devices, and are increasingly required to be more sensitive and smaller. Such color filters typically have a colored pattern of three primary colors, i.e., red (R), green (G), and blue (B), and have a role in decomposing the light transmitted through it into the three primary colors.

Coloring agents for use in color filters are commonly required to satisfy the following requirements. That is, the colorants are required to have preferable spectral characteristics in terms of color reproducibility; not to exhibit optical disorders as unevenness in optical densities that may cause light scattering or color unevenness/roughness; to have good fastness against environmental conditions under which the devices are manufactured and used, such as heat resistance and light fastness; to have a large molar light absorption coefficient and enable formation of a thin film; and the like.

As one of methods for manufacturing the color filter, there is a pigment dispersion method. The pigment dispersion method for manufacturing the color filter by a photolithography method or an ink jet printing method is stable against light and heat due to use of pigments. However, it problems such as light scattering and color unevenness/roughness often occurs since the pigments themselves are microparticles. Micronization of pigments is carried out so as to overcome these problems, but there is a problem in that it is not compatible with dispersion stability.

An alternative method to the pigment dispersion method for manufacturing the color filter may be a method using a dye as a color material. The dye is dissolved in a resist so that it can suppress light scattering or color unevenness/roughness as with a pigment. The dye has problems in that it is deteriorated in heat resistance or light fastness, as compared with the pigment. For solving the problems, dyes with excellent rigidity have recently been developed (see, for example, JP2008-292970A and JP2010-18788A).

Furthermore, in a coloring composition including a dye, in the case of carrying out a heating treatment after forming a film, it is pointed out that a phenomenon that color transfer among colored adjacent patterns having different colors and overlapping laminated layers easily occurs. With regard to this problem, a method in which a colorant is polymerized so as to solve the problem is disclosed (see, for example, JP2007-139906A, JP2007-138051A, JP2000-162429A, JP2011-95732A, JP2013-029760A, and JP2012-32754A).

In addition, many color materials having excellent light fastness have recently been developed, but it is known that a photostabilizer is separately added to a coloring composition in order to further impart light fastness (see, for example, JP2010-54808A (JP5141448B)).

Non-Patent Document 1: Dyes and Pigments 74 (207) 187-194 is an example of the related art.

SUMMARY OF THE INVENTION

Here, in the case of preparing a cured film using a coloring composition, it is necessary to improve light fastness while maintaining good exposure sensitivity.

The invention of the present application has been made to solve such problems, and in the case of preparing a cured film, the present invention has an object to provide a coloring composition having good exposure sensitivity and light fastness.

The present inventors have conducted investigations, and as a result, they have found that the problems can be solved by using a coloring composition containing a dye multimer having a colorant structure and a photostable group with a specific structure in the same molecule, and a curable compound, thereby completing the present invention.

Specifically, the problems have been solved by the following means <1>, and preferably the means <2> to <19>.

<1> A coloring composition comprising:

a dye multimer having a colorant structure and at least one of a structure represented by following Formula (1), following Formula (2), following Formula (3), following Formula (4) or following Formula (5) in the same molecule; and a curable compound:

(1)

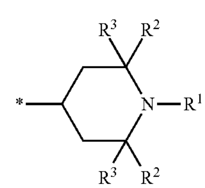

(in Formula (1), $R^1$ represents a hydrogen atom, an alkyl group having 1 to 18 carbon atoms, an aryl group, or an oxy radical; $R^2$ and $R^3$ each independently represent an alkyl group having 1 to 18 carbon atoms; $R^2$ and $R^3$ may be bonded to each other to represent an aliphatic ring having 4 to 12 carbon atoms; and "*" represents a bonding hand of the structure represented by Formula (1) with a polymer skeleton);

(2)

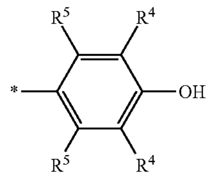

(in Formula (2), $R^4$ represents the following Formula (2A), an alkyl group having 1 to 18 carbon atoms, or an aryl group; $R^5$'s each independently represent a hydrogen atom or an alkyl group having 1 to 18 carbon atoms; and "*" represents a bonding hand of the structure represented by Formula (2) with a polymer skeleton);

(2A)

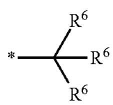

(in Formula (2A), $R^6$'s each independently represent an alkyl group having 1 to 18 carbon atoms; and "*" represents a bonding hand of the structure represented by Formula (2A) with the structure represented by Formula (2));

(3)

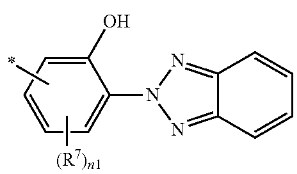

(in Formula (3), $R^7$ represents an alkyl group having 1 to 18 carbon atoms; n1 represents an integer of 0 to 3; in the case where n1 is 2 or 3, $R^7$'s may be the same as or different from each other; and "*" represents a bonding hand of the structure represented by Formula (3) with a polymer skeleton);

(4)

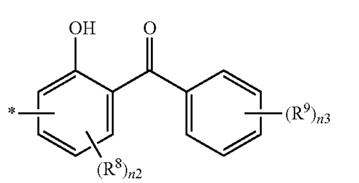

(in Formula (4), $R^8$ and $R^9$ each independently represent an alkyl group having 1 to 18 carbon atoms; n2 represents an integer of 0 to 3; n3 represents an integer of 0 to 4; in the case where n2 is 2 or 3, $R^8$'s may be the same as or different from each other; in the case where n3 represents an integer of 2 to 4, $R^9$'s may be the same as or different from each other; and "*" represents a bonding hand of the structure represented by Formula (4) with a polymer skeleton);

(5)

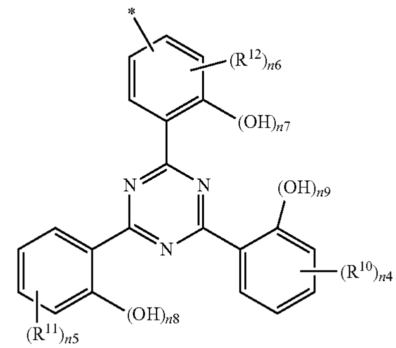

(in Formula (5), $R^{10}$ to $R^{12}$ each independently represent an alkyl group having 1 to 18 carbon atoms or an alkoxy group having 1 to 8 carbon atoms; n4 to n6 each independently represent an integer of 0 to 5; n7 to n9 each independently represent 0 or 1, and at least one of n7, n8 or n9 represents 1; and "*" represents a bonding hand of the structure represented by Formula (5) with a polymer skeleton).

<2> The coloring composition as described in <1>, in which the curable compound is a polyfunctional polymerizable monomer and the coloring composition further contains a polymerization initiator.

<3> The coloring composition as described in <1> or <2>, in which the dye multimer further has an acid group.

<4> The coloring composition as described in any one of <1> to <3>, in which the dye multimer further has a polymerizable group.

<5> The coloring composition as described in any one of <1> to <4>, in which the dye multimer is a random radical polymer.

<6> The coloring composition as described in any one of <1> to <5>, in which the dye multimer has a structural unit having a colorant structure and a structural unit having at least one of the structure represented by Formula (1), Formula (2), Formula (3), Formula (4) or Formula (5).

<7> The coloring composition as described in <6>, in which the content of the structural unit having at least one of the structure represented by Formula (1), Formula (2), Formula (3), Formula (4) or Formula (5) in all the structural units contained in the dye multimer is 0.5% by mole to 20% by mole.

<8> The coloring composition as described in any one of <1> to <7>, further comprising an alkali-soluble resin.

<9> The coloring composition as described in any one of <1> to <8>, in which the colorant structure is derived from a colorant selected from a dipyrromethane colorant, an azo colorant, an anthroquinone colorant, a triphenylmethane colorant, a xanthene colorant, a cyanine colorant, a squarylium colorant, a quinophthalone colorant, a phthalocyanine colorant, and a subphthalocyanine colorant.

<10> The coloring composition as described in any one of <1> to <9>, further comprising a pigment.

<11> The coloring composition as described in any one of <1> to <10>, in which the color difference ΔE*ab between before and after exposure for 100 hours under the conditions of an illuminance of 75 mw/$m^2$ in a light having a wavelength of 300 nm to 400 nm and a humidity of 50% when a colored film having a thickness of 0.6 μm is formed is 5 or less.

<12> The coloring composition as described in any one of <1> to <11>, used for forming a colored layer of the color filter.

<13> A colored cured film obtained by curing the coloring composition as described in any one of <1> to <12>.

<14> A color filter comprising the colored cured film as described in <13>.

<15> A pattern forming method comprising:

a step of applying the coloring composition as described in any one of <1> to <12> onto a support to form a coloring composition layer;

a step of patternwise exposing the coloring composition layer; and a step of removing an unexposed area by development to form a colored pattern.

<16> A method for manufacturing a color filter, comprising:

a step of applying the coloring composition as described in any one of <1> to <12> onto a support to form a coloring composition layer;

a step of patternwise exposing the coloring composition layer; and a step of removing an unexposed area by development to form a colored pattern.

<17> A solid-state imaging device comprising the color filter as described in <14> or a color filter obtained by the method for manufacturing a color filter as described in <16>.

<18> An image display device comprising the color filter as described in <14> or a color filter obtained by the method for manufacturing a color filter as described in <16>.

<19> A dye multimer comprising:

at least one of structural units having a colorant structure represented by the following Formula (TP) or the following Formula (J); and at least one of structural units having a structure represented by the following Formula (1):

Formula (TP)

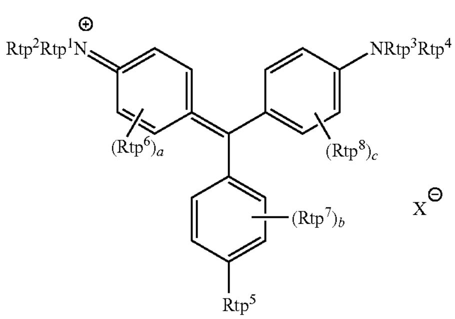

(in Formula (TP), $Rtp^1$ to $Rtp^4$ each independently represent a hydrogen atom, an alkyl group, or an aryl group. $Rtp^5$ represents a hydrogen atom, an alkyl group, an aryl group, or $NRtp^9Rtp^{10}$ ($Rtp^9$ and $Rtp^{10}$ represent a hydrogen atom, an alkyl group, or an aryl group), $Rtp^6$, $Rtp^7$, and $Rtp^8$ represent substituents, a, b, and c represent an integer of 0 to 4, in the case where a, b, and c are 2 or more, $Rtp^6$, $Rtp^7$, and $Rtp^8$ may be linked to each other to form a ring; and $X^-$ represents an anion);

General Formula (J)

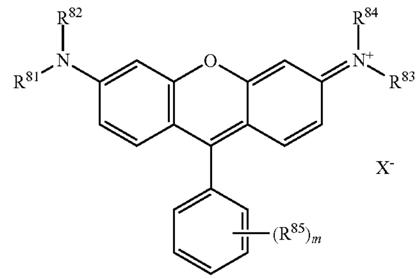

(in Formula (J), $R^{81}$, $R^{82}$, $R^{83}$, and $R^{84}$ each independently represent a hydrogen atom or a monovalent substituent, $R^{85}$'s each independently represent a monovalent substituent, and m represents an integer of 0 to 5; $X^-$ represents an anion or $X^-$ is not present, and at least one of $R^{81}$, $R^{82}$, $R^{83}$ or $R^{84}$ includes an anion);

(1)

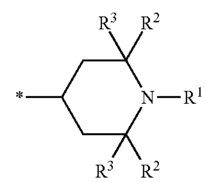

(in Formula (1), $R^1$ represents a hydrogen atom, an alkyl group having 1 to 18 carbon atoms, or an oxy radical; $R^2$ and $R^3$ each independently represent a methyl group or an ethyl group; and "*" represents a bonding hand of the structure represented by Formula (1) with a polymer skeleton).

According to the present invention, it became possible to provide a coloring composition having good exposure sensitivity and light fastness in the case of preparing a cured film. It also became possible to provide a dye multimer, a cured film, a color filter, a method for manufacturing a color filter, a solid-state imaging device, and an image display device.

DESCRIPTION OF THE PREFERRED EMBODIMENTS

Hereinafter, the contents of the present invention will be described in detail. Further, in the present specification, a numeral value range represented by "(a value) to (a value)" means a range including the numeral values represented before and after "to" as a lower limit value and an upper limit value, respectively.

In the present specification, the total solid content refers to a total mass of the components remaining when a solvent is excluded from the entire composition of a coloring composition. Further, it refers to a sold content at 25° C.

In citations for a group (atomic group) in the present specification, when the group is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

Furthermore, "radiation" in the present specification means, for example, a bright line spectrum of a mercury lamp, far ultraviolet rays represented by an excimer laser, extreme ultraviolet rays (EUV rays), X-rays, electron beams, or the like. In addition, in the present invention, light means active lights or radiation. "Exposure" in the present specification includes, unless otherwise specified, not only exposure by a mercury lamp, far ultraviolet rays represented by an excimer laser, X-rays, EUV rays, or the like, but also writing by particle rays such as electron beams and ion beams.

Furthermore, in the present specification, "(meth)acrylate" represents either or both of an acrylate and a methacrylate, "(meth)acryl" represents either or both of an acryl and a methacryl, and "(meth)acryloyl" represents either or both of an acryloyl and a methacryloyl.

In addition, in the present specification, a "monomer material" and a "monomer" have the same definition. The monomer in the present specification refers to a compound which is distinguished from an oligomer or a polymer and has a weight-average molecular weight of 2,000 or less. In the present specification, a polymerizable compound refers to a compound having a polymerizable functional group, and may be a monomer or a polymer. The polymerizable functional group refers to a group involved in a polymerization reaction.

In the present specification, Me represents a methyl group, Et represents an ethyl group, Pr represents a propyl group, Bu represents a butyl group, and Ph represents a phenyl group in formulae.

In the present specification, a term "step" includes not only an independent step, but also steps which are not clearly distinguished from other steps if an intended action of the steps is accomplished.

In the present specification, the weight-average molecular weight and the number-average molecular weight are defined as a value in terms of polystyrene by GPC measurement. In the present specification, the weight-average molecular weight (Mw) and the number-average molecular weight (Mn) can be determined, for example, using HLC-8220 (manufactured by Tosoh Corporation), and TSKgel Super AWM-H (manufactured by Tosoh Corporation, 6.0 mm ID×15.0 cm) as a column, and a 10 mmol/L solution of lithium bromide in NMP (N-methylpyrrolidone) as an eluant.

The coloring composition of the present invention (hereinafter simply referred to as "the composition of the present invention" in some cases) may contain a dye multimer having a colorant structure and at least one of a structure represented by the following Formula (1), Formula (2), Formula (3), Formula (4) or Formula (5) in the same molecule, and a curable compound.

(1)

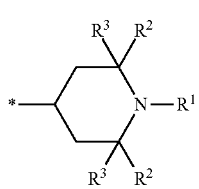

In Formula (1), $R^1$ represents a hydrogen atom, an alkyl group having 1 to 18 carbon atoms, an aryl group, or an oxy radical; $R^2$ and $R^3$ each independently represent an alkyl group having 1 to 18 carbon atoms; $R^2$ and $R^3$ may be bonded to each other to represent an aliphatic ring having 4 to 12 carbon atoms; and "*" represents a bonding hand of the structure represented by Formula (1) with a polymer skeleton.

(2)

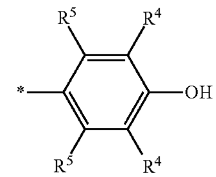

In Formula (2), $R^4$ represents the following Formula (2A), an alkyl group having 1 to 18 carbon atoms, or an aryl group; $R^5$'s each independently represent a hydrogen atom or an alkyl group having 1 to 18 carbon atoms; and "*" represents a bonding hand of the structure represented by Formula (2) with a polymer skeleton.

(2A)

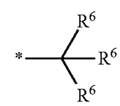

In Formula (2A), $R^6$'s each independently represent an alkyl group having 1 to 18 carbon atoms; and "*" represents a bonding hand of the structure represented by Formula (2A) with the structure represented by Formula (2).

(3)

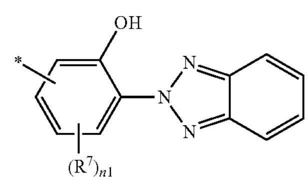

In Formula (3), $R^7$ represents an alkyl group having 1 to 18 carbon atoms; n1 represents an integer of 0 to 3; in the case where n1 is 2 or 3, $R^e$'s may be the same as or different from each other; and "*" represents a bonding hand of the structure represented by Formula (3) with a polymer skeleton.

(4)

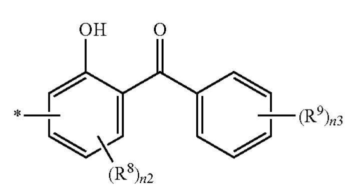

In Formula (4), $R^8$ and $R^9$ each independently represent an alkyl group having 1 to 18 carbon atoms; n2 represents an integer of 0 to 3; n3 represents an integer of 0 to 4; in the case where n2 is 2 or 3, $R^8$'s may be the same as or different from each other; in the case where n3 represents an integer of 2 to 4, $R^9$'s may be the same as or different from each other; and "*" represents a bonding hand of the structure represented by Formula (4) with a polymer skeleton.

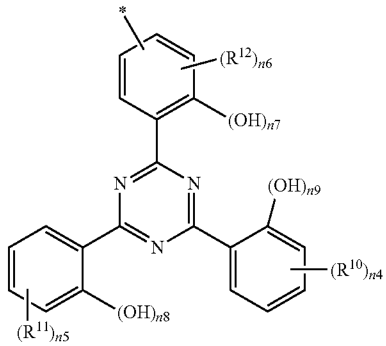

(5)

In Formula (5), $R^{10}$ to $R^{12}$ each independently represent an alkyl group having 1 to 18 carbon atoms or an alkoxy group having 1 to 8 carbon atoms; n4 represents an integer of 0 to 5; n5 represents an integer of 0 to 4; n6 represents an integer of 0 to 4; n7 to n9 each independently represent 0 or 1, and at least one of n7, n8 or n9 represents 1; and "*" represents a bonding hand of the structure represented by Formula (5) with a polymer skeleton.

By adopting such a configuration, in the case of preparing a cured film, the exposure sensitivity and the light fastness can be improved. Here, the structures represented by Formulae (1) to (5) function as a photostabilizer, and thus, contribute to an increase in exposure sensitivity and light fastness. Further, adhesion can be improved, and also, generation of development residues can be inhibited.

This mechanism is presumed, but by using a dye multimer having the colorant structure and at least one of the structure represented by Formula (1), Formula (2), Formula (3), Formula (4) or Formula (5) in the same molecule, the distance between the colorant structure and the structures represented by Formulae (1) to (5) is shortened. As a result, it can be thought that exposure sensitivity and light fastness can be more effectively improved. Further, when the dye is blended with a compound having at least one of the structure represented by Formula (1), Formula (2), Formula (3), Formula (4) or Formula (5) in the form of a separate molecule, it may have a problem in the compatibility thereof. With this regard, since the dye multimer used in the present invention has the colorant structure and at least one of the structure represented by Formula (1), Formula (2), Formula (3), Formula (4) or Formula (5) in the same molecule, it is possible to avoid the problem in the compatibility.

The coloring composition of the present invention can be used in color filters, ink materials (UV ink materials), sublimation heat-sensitive transfer materials, and the like, and can be suitably used in color filters.

Due to the characteristics of the colorant structure included in the dye multimer used in the present invention, the coloring composition of the present invention can be formed into thin films (for example, having a thickness of 1 μm or less) with colored patterns. Thus, the coloring composition of the present invention can be suitably used for a color filter for a solid-state imaging device which is required to have a very small size of 2 μm or less (a pixel pattern having a side length of, for example, 0.5 μm to 2.0 μm as viewed from a direction perpendicular to the substrate) with high precision and to have a good rectangular sectional profile.

The coloring composition of the present invention preferably has a color difference (ΔE*ab) between before and after exposure for 100 hours under the conditions of an illuminance of 75 mw/$m^2$ (300 nm to 400 nm) and a humidity of 50% when a colored film having a thickness of 0.6 μm is formed, of 5 or less, and more preferably has the color difference of 3 or less.

<Dye Multimer>

The coloring composition of the present invention may contain at least one, or two or more of dye multimers.

The dye multimer has a colorant structure and at least one of the structure represented by Formula (1), Formula (2), Formula (3), Formula (4) or Formula (5) in the same molecule. Further, the "colorant structure" as mentioned herein represents a structure which is formed by removing a hydrogen atom from a specific colorant (hereinafter also referred to as a "colorant compound") which can form a colorant structure which will be described later, and can be linked to a dye multimer linking portion (a polymer chain, a core of dendrimer, and the like).

The dye multimer is preferably a random radical polymer. By adopting such a configuration, the distance between the colorant structure and the structures represented by Formulae (1) to (5) is shorter than that in the case of a block polymer, and thus, it is possible to improve the exposure sensitivity and the light fastness more effectively.

It is preferable that the dye multimer has a structural unit having a colorant structure, and a structural unit having at least one of the structure represented by Formula (1), Formula (2), Formula (3), Formula (4) or Formula (5). Further, the dye multimer may further have other structural units. Examples of such other structural units include a structural unit having a polymerizable group, and a structural unit having an acid group. For the dye multimer, it is preferable that the colorant structure has a cationic site. Hereinafter, the preferred structures of the dye multimer, the functional group (a substituent group A which will be described later) which may be contained in the dye multimer, and the preferred physical properties of the dye multimer will be described in detail.

<<Colorant Structure>>

The dye multimer is usually a multimer having a colorant structure whose maximum absorption wavelength is present in a range of 400 nm to 780 nm, in a molecular structure thereof, and includes the structure of a dimer, a trimer, a polymer, or the like.

In the coloring composition of the present invention, the dye multimer functions as a colorant, for example.

The dye multimer of the present invention has a maximum absorption wavelength of preferably 420 nm to 700 nm, and preferably 450 nm to 650 nm.

Specific colorant compounds which can form a colorant structure are described in "New Edition of Dye Handbook" (edited by The Society of Synthetic Organic Chemistry, Japan; Maruzen Co., Ltd., 1970), "Color index" (edited by The Society of Dyers and colourists), "Dye Handbook" (Gen Ookawa, et al; Kodansha, Ltd., 1986), and the like.

Examples of the colorant structure used in the present invention include colorant structures selected from a quinone colorant (a benzoquinone colorant, a naphthoquinone colorant, an anthroquinone colorant, an anthrapyridone colorant, and the like), a carbonium colorant (a diarylmethane colorant, a triarylmethane colorant, a xanthene colorant, an acridine colorant, and the like), a quinonimine colorant (an oxazine colorant, a thioazine colorant, and the like), an azine colorant, polymethane colorant (an oxonol colorant, a merocyanine colorant, an arylidene colorant, a styryl colorant, a cyanine colorant, a squarylium colorant, a croconium colorant, and the like), a quinophthalone colorant, a phthalocyanine colorant, a subphthalocyanine colorant, a perinone colorant, an indigo colorant, a thioindigo colorant, a quinoline colorant, a nitro colorant, a nitroso colorant, a dipyrromethane colorant, an azo colorant, and metal complex colorants thereof.

Among these colorant structures, from the viewpoints of color separating properties and light fastness, a colorant structure selected from a dipyrromethane colorant, an azo colorant, an anthroquinone colorant, a triarylmethane colorant, a xanthene colorant, a cyanine colorant, a squarylium colorant, a quinophthalone colorant, a phthalocyanine colorant, and a subphthalocyanine colorant is preferable, and a triarylmethane colorant and a xanthene colorant are more preferable.

Hereinafter, the colorant structure which is preferably used in the present invention which will be specifically described.

(Anthraquinone Colorant)

One of the colorant structures used in the present invention is a colorant structure having a partial structure derived from an anthraquinone colorant. As a colorant structure having a partial structure derived from an anthraquinone colorant (anthraquinone compound), partial structures derived from compounds represented by the following General Formulae (AQ-1) to (AQ-3) are preferable. The anthraquinone compounds collectively refer to compounds having a colorant site including an anthraquinone skeleton in the molecule.

General Formula (AQ-1)

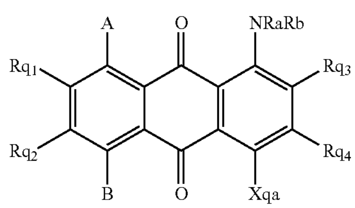

General Formula (AQ-2)

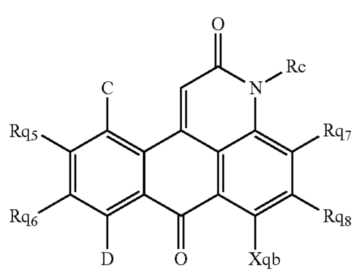

General Formula (AQ-3)

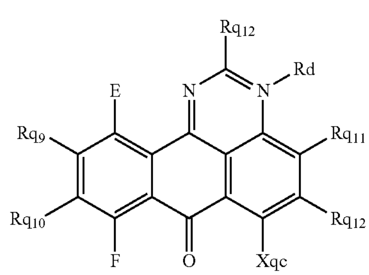

In General Formula (AQ-1), A and B each independently represent an amino group, a hydroxyl group, an alkoxy group, or a hydrogen atom. Xqa represents $ORqa^1$ or $NRqa^2Rqa^3$. $Rqa^1$ to $Rqa^3$ each independently represent a hydrogen atom, an alkyl group, or an aryl group, and $Rq_1$ to $Rq_4$ represent substituents. The substituents which may be contained in $Rq_1$ to $Rq_4$ are the same substituents as those exemplified in the section of Substituent Group A which will be describe later. Ra and Rb each independently represent a hydrogen atom, an alkyl group, or an aryl group.

In General Formula (AQ-2), C and D have the same definitions as A and B in General Formula (AQ-1). Xqb represents $ORqb^1$ or $NRqb^2Rqb^3$. $Rqb^1$ to $Rqb^3$ each independently represent a hydrogen atom, an alkyl group, or an aryl group, and $Rq_5$ to $Rq_8$ represent substituents. $Rq_5$ to $Rq_8$ have the same definitions as $Rq_1$ to $Rq_4$ in General Formula (AQ-1). Rc has the same definition as Ra or Rb in General Formula (AQ-1).

In General Formula (AQ-3), E and F have the same definitions as A and B in General Formula (AQ-1). Xqc represents $ORqc^1$ or $NRqc^2Rqc^3$. $Rqc^1$ to $Rqc^3$ each independently represent a hydrogen atom, an alkyl group, or an aryl group. $Rq_9$ to $Rq_{12}$ have the same definitions as $Rq_1$ to $Rq_4$ in General Formula (AQ-1). Rd has the same definition as Ra or Rb in General Formula (AQ-1).

Preferred ranges of General Formulae (AQ-1), (AQ-2), and (AQ-3) can be found in, for example, paragraphs "0045" to "0047" of JP2013-29760A, the contents of which are incorporated herein by reference.

With respect to specific examples of the anthraquinone colorant, reference can be made to, for example, paragraphs "0049" and "0050" of JP2013-29760A, the contents of which are incorporated herein by reference. Further, in the specific examples of the anthroquinone colorant, any hydrogen atom in the structure of the anthroquinone colorant is bonded with a polymer skeleton.

(Triarylmethane Colorant)

One of the aspects of the colorant structures used in the present invention is a colorant structure having a partial structure derived from a triarylmethane colorant (triarylmethane compound). The colorant has a partial structure derived from a compound represented by the following Formula (TP) as a colorant structure. The triarylmethane compound collectively refers to compounds having a colorant site including a triarylmethane skeleton in the molecule.

Formula (TP)

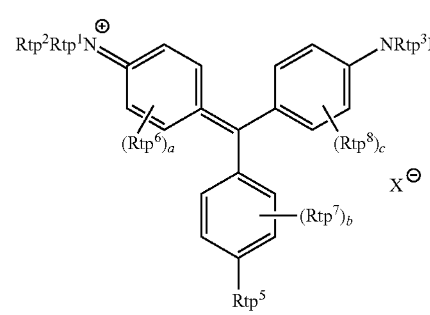

(In Formula (TP), $Rtp^1$ to $Rtp^4$ each independently represent a hydrogen atom, an alkyl group, or an aryl group. $Rtp^5$ represents a hydrogen atom, an alkyl group, an aryl group, or $NRtp^9Rtp^{10}$ ($Rtp^9$ and $Rtp^{10}$ represent a hydrogen atom, an alkyl group, or an aryl group). $Rtp^6$, $Rtp^7$, and $Rtp^8$ represent substituents. a, b, and c represent an integer of 0 to 4. In the case where a, b, and c are 2 or more, $Rtp^6$, $Rtp^7$, and $Rtp^8$ may be linked to each other to form a ring. $X^-$ represents an anion structure.)

$Rtp^1$ to $Rtp^6$ are preferably a hydrogen atom, a linear or branched alkyl group having 1 to 5 carbon atoms, or a phenyl group. $Rtp^5$ is preferably a hydrogen atom or $NRtp^9Rtp^{10}$, and particularly preferably $NRtp^9Rtp^{10}$. $Rtp^9$ and $Rtp^{10}$ are preferably a hydrogen atom, a linear or branched alkyl group having 1 to 5 carbon atoms, or a phenyl group. As the substituents represented by $Rtp^6$, $Rtp^7$, and $Rtp^8$, the substituents exemplified in the section of Substituent Group A can be used. In particular, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 5 carbon atoms, an alkenyl group having 1 to 5 carbon atoms, a phenyl group, or a carboxyl group is more preferable. In particular, $Rtp^6$ and $Rtp^8$ are preferably an alkyl group having 1 to 5 carbon atoms, and $Rtp^7$ is preferably an alkenyl group (particularly preferably a phenyl group formed by linking two adjacent alkenyl groups to each other), a phenyl group, or a carboxyl group.

a, b, or c each independently represents an integer of 0 to 4. In particular, a and b are preferably 0 to 1, and c is preferably 0 to 2.

It is preferable that the compound represented by Formula (TP) is bonded to a polymer skeleton at one of $Rtp^1$ to $Rtp^{10}$.

Specific examples of the compounds represented by Formula (TP) are shown below, but the present invention is not limited thereto. In the specific examples, $X^-$ represents an anion. Further, any one hydrogen atom of the colorant structure is bonded to a polymer skeleton.

Among the following specific examples, from the viewpoints of color characteristics and heat resistance, (tp-4), (tp-5), (tp-6), and (tp-8) are particularly preferable.

(tp-1)

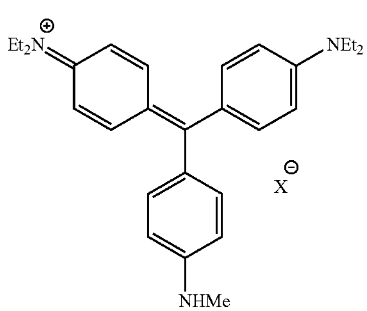

(tp-2)

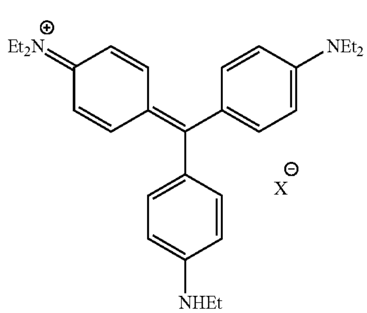

-continued (tp-3)

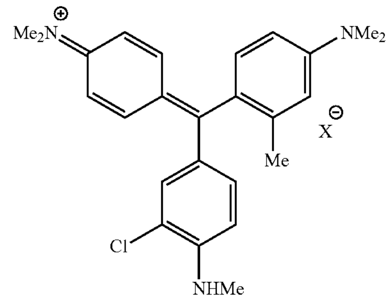

(tp-4)

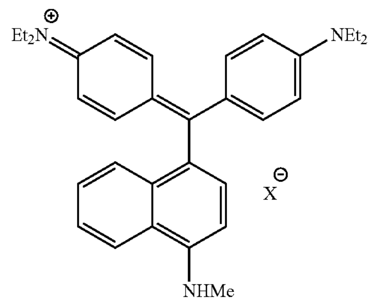

(tp-5)

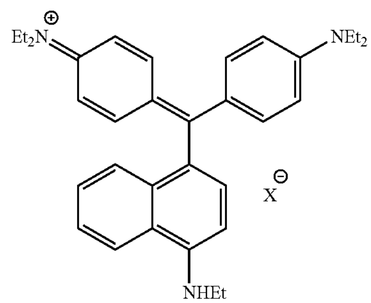

(tp-6)

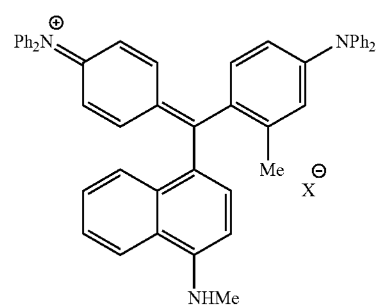

(tp-7)

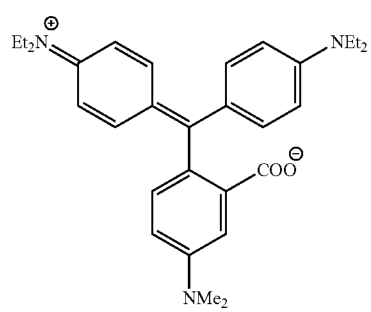

-continued
(tp-8)
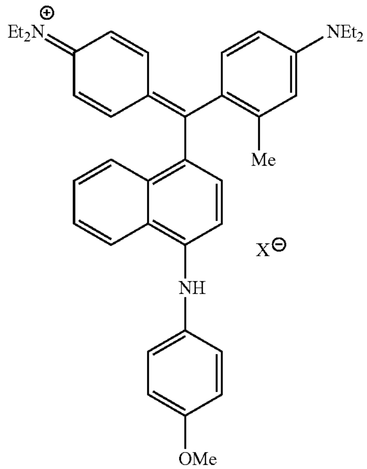
(tp-9)
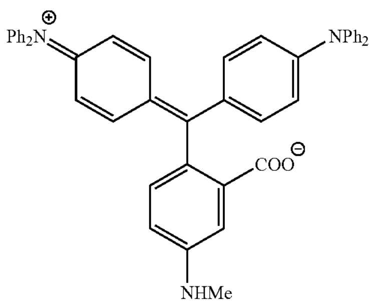
(tp-10)
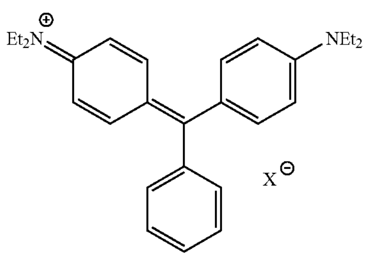
(tp-11)
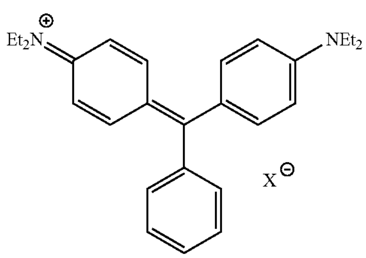
(tp-12)
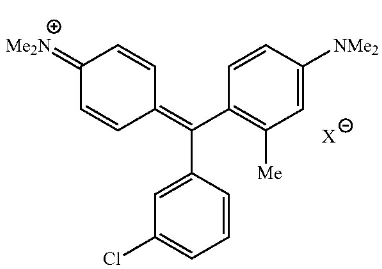
-continued
(tp-13)
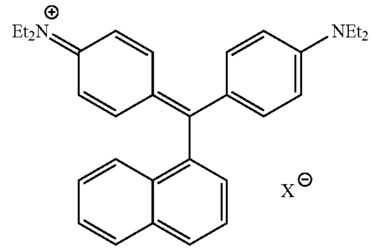
(tp-14)
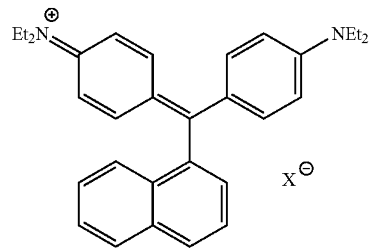
(tp-15)
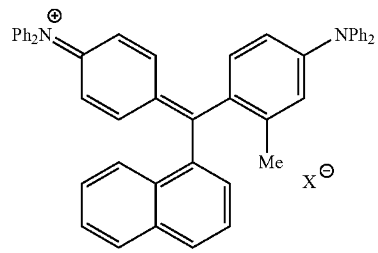
(tp-16)
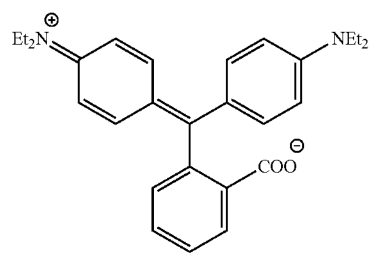
(tp-17)
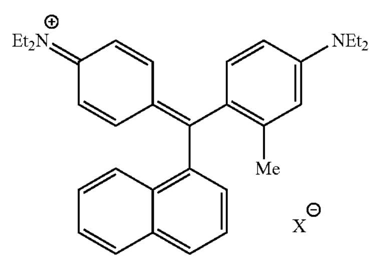
(tp-18)
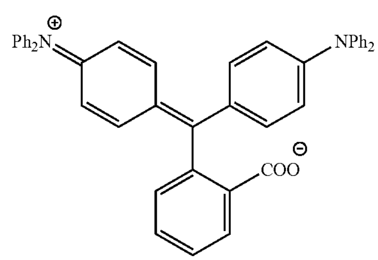
(Xanthene Colorant)
A preferred embodiment of the colorant structure in the present invention is a colorant structure having a partial structure derived from a xanthene colorant (xanthene compound). The colorant has a partial structure derived from a xanthene compound represented by the following Formula (J) as a colorant structure.

General Formula (J)

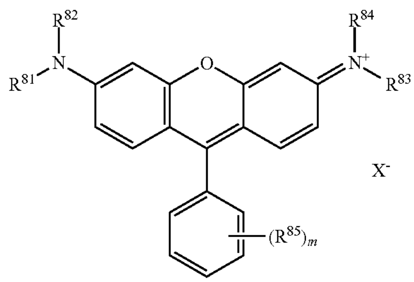

(In Formula (J), $R^{81}$, $R^{82}$, $R^{83}$, and $R^{84}$ each independently represent a hydrogen atom or a monovalent substituent. $R^{85}$'s each independently represent a monovalent substituent, and m represents an integer of 0 to 5. $X^-$ represents an anion or is not present, and at least one of $R^{81}$, $R^{82}$, $R^{83}$, or $R^{84}$ includes an anion.)

The substituents which may be contained in $R^{81}$ to $R^{84}$, and $R^{85}$ in Formula (J) have the same definitions as the substituents exemplified in the section of Substituent Group A.

The compound represented by Formula (J) is preferably bonded to a polymer skeleton at any one site of $R^{81}$ to $R^{85}$.

In Formula (J), $R^{81}$ and $R^{82}$, $R^{83}$ and $R^{84}$, and $R^{85}$'s in the case where m is 2 or more may be each independently bonded to each other to form a 5-, 6-, or 7-membered saturated ring or a 5-, 6-, or 7-membered unsaturated ring. In the case where the formed 5-, 6-, or 7-membered ring is a group which can be further substituted, the ring may be substituted with the substituents described for $R^{81}$ to $R^{85}$. In the case where the ring is substituted with two or more substituents, these substituents may be the same as or different from each other.

In Formula (J), in the case where $R^{81}$ and $R^{82}$, $R^{83}$ and $R^{84}$, and $R^{85}$'s in the case where m is 2 or more are bonded to each other to form 5-, 6-, and 7-membered saturated rings not having a substituent or form 5-, 6-, and 7-membered unsaturated rings, examples of the 5-, 6-, and 7-membered saturated rings not having a substituent or the 5-, 6-, and 7-membered unsaturated rings include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

In particular, it is preferable that $R^{82}$ and $R^{83}$ are a hydrogen atom or a substituted or unsubstituted alkyl group, and $R^{81}$ and $R^{84}$ are a substituted or unsubstituted alkyl group or phenyl group. Further, $R^{85}$ is preferably a halogen atom, a linear or branched alkyl group having 1 to 5 carbon atoms, a sulfo group, a sulfonamide group, a carboxyl group, or an amide group, and more preferably a sulfo group, a sulfonamide group, a carboxyl group, or an amide group. $R^{85}$ is preferably bonded to an adjacent portion of carbon linked to a xanthene ring. The substituent contained in the phenyl group represented by $R^{81}$ and $R^{84}$ is particularly preferably a hydrogen atom, a halogen atom, a linear or branched alkyl group having 1 to 5 carbon atoms, a sulfo group, a sulfonamide group, or a carboxyl group.

The compound having a xanthene skeleton represented by Formula (J) can be synthesized using methods described in the literature. Specifically, the methods described in Tetrahedron, 2003, vol. 44, No. 23, pp. 4355 to 4360; Tetrahedron, 2005, vol. 61, No. 12, pp. 3097 to 3106; and the like can be applied.

In the case where $X^-$ represents an anion, reference can be made to the description of the case where the counter anion which will be described later is a different molecule. Further, in the case where $X^-$ is not present, at least one of $R^{81}$, $R^{82}$, $R^{83}$, or $R^{84}$ includes an anion, reference can be made to the description of the case where the counter anion is in the same structural unit.

Hereinafter, specific aspects (a first aspect and a second aspect) of the compound represented by Formula (J) will be described.

(First Aspect of Compound Represented by Formula (J))

In the compound represented by Formula (J), one of $R^{81}$ and $R^{83}$ may represent a group represented by the following General Formula (2), and the other of $R^{81}$ and $R^{83}$ may represent a hydrogen atom, a group represented by the following General Formula (2), or an aryl or alkyl group other than the group represented by General Formula (2). Further, $R^{82}$ and $R^{84}$ may each independently represent a hydrogen atom, an alkyl group, or an aryl group.

General Formula (2)

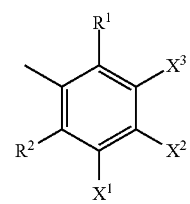

In General Formula (2), $R^1$ and $R^2$ each independently represent an alkyl group having 3 or more carbon atoms, an aryl group, or a heterocyclic group, and $X^1$ to $X^3$ each independently represent a hydrogen atom or a monovalent substituent. The colorant compound represented by General Formula (1) has a counter anion inside the molecule and/or outside the molecule.

In General Formula (1), one of $R^{81}$ and $R^{83}$ represents a group represented by General Formula (2), and the other of $R^{81}$ and $R^{83}$ represents a hydrogen atom, a group represented by the following General Formula (2), or an aryl group or an alkyl group other than the group represented by General Formula (2), and may be the group represented by General Formula (2) or an aryl group other than the group represented by General Formula (2). Further, both of $R^{81}$ and $R^{83}$ may be the groups represented by General Formula (2). In the case where both of $R^{81}$ and $R^{83}$ are the groups represented by General Formula (2), two groups represented by General Formula (2) may be the same as or different from each other.

In General Formula (2), $R^1$ and $R^2$ each independently represent an alkyl group having 3 or more carbon atoms, an aryl group, or a heterocyclic group, and may be a secondary or tertiary alkyl group having 3 to 12 carbon atoms, or an isopropyl group.

The alkyl group having 3 or more carbon atoms may be specifically linear, branched, or cyclic, and may have 3 to 24 carbon atoms, 3 to 18 carbon atoms, or 3 to 12 carbon atoms.

Specific examples thereof include a propyl group, an isopropyl group, a butyl group (for example, a t-butyl group), a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbonyl group, and a 1-adamantyl group; the alkyl group may be a propyl group, an isopropyl group, a butyl group, a t-butyl group, a pentyl group, a hexyl group, a heptyl group, an octyl group, a 2-ethylhexyl group, a dodecyl group, a cyclopropyl group, a cyclopentyl group, or a cyclohexyl group, a propyl group, an isopropyl group, a butyl group (t-butyl group), a pentyl group, a hexyl group, a heptyl group, an octyl group, or a 2-ethylhexyl group, and may also be an isopropyl group, a t-butyl group, or a 2-ethylhexyl group.

Examples of the aryl group include a substituted or unsubstituted aryl group. The substituted or unsubstituted aryl group may be an aryl group having 6 to 30 carbon atoms, and examples thereof include a phenyl group and a naphthyl group. Examples of the substituent include the same substituents as those in Substituent Group A which will be described later.

The heterocycle of the heterocyclic group may be a 5- or 6-membered ring, and may or may not further be condensed. Further, the heterocycle may be an aromatic heterocycle or a non-aromatic heterocycle. Examples thereof include a pyridine ring, a pyrazine ring, a pyridazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, and a thiazolidine ring. Among these, the heterocycle may be an aromatic heterocyclic group, and examples thereof include a pyridine ring, a pyrazine ring, a pyridazine ring, a pyrazole ring, an imidazole ring, a benzimidazole ring, a triazole ring, a benzoxazole ring, a thiazole ring, a benzothiazole ring, an isothiazole ring, a benzisothiazole ring, and a thiadiazole ring. The heterocycle may be a pyrazole ring, an imidazole ring, a benzoxazole ring, or a thiadiazole ring, or may be a pyrazole ring or a thiadiazole ring (a 1,3,4-thiadiazole ring or a 1,2,4-thiadiazole ring). These may have a substituent, and examples of the substituent include the same substituents as those in Substituent Group A which will be described later.

$R^1$ and $R^2$ may be an alkyl group having 3 or more carbon atoms, or may be an alkyl group having 3 to 12 carbon atoms.

In General Formula (2), $X^1$ to $X^3$ each independently represent a hydrogen atom or a monovalent substituent. Examples of the substituent include the same substituents as those in Substituent Group A which will be described later. $X^1$ to $X^3$ may be a halogen atom, an alkyl group, a hydroxyl group, a alkoxy group, an acyl group, an acyloxy group, an alkylthio group, a sulfonamide group, or sulfamoyl group.

Examples of the aryl group other than the group represented by General Formula (2) include a phenyl group. The phenyl group may or may not have a substituent. Examples of the substituent include the same substituents as those in Substituent Group A which will be described later, and the substituent may be an alkyl group or an aryl group.

$R^{82}$ and $R^{84}$ each independently represent a hydrogen atom, an alkyl group, or an aryl group, and the alkyl group and the aryl group may or may not have a substituent.

The substituted or unsubstituted alkyl group may be an alkyl group having 1 to 30 carbon atom. Examples of the substituent include the same substituents in Substituent Group A which will be described later. Examples of the alkyl group include a methyl group, an ethyl group, a propyl group, an isopropyl group, a butyl group (t-butyl group), an n-octyl group, and a 2-ethylhexyl group.

The substituted or unsubstituted aryl group may be an aryl group having 6 to 30 carbon atoms, and examples thereof include a phenyl group and a naphthyl group. Examples of the substituent include the same as those of Substituent Group A which will be described later.

$R^{82}$ and $R^{84}$ may be a hydrogen atom or an alkyl group, or may be a hydrogen atom.

(Second Aspect of Compound Represented by Formula (J))

In the compound represented by Formula (J), $R^{81}$ and $R^{83}$ each independently represent an aliphatic hydrocarbon group, and $R^{82}$ and $R^{84}$ each independently represent an aromatic hydrocarbon group.

Examples of $R^{81}$ and $R^{83}$ each independently include an aliphatic hydrocarbon group, and it may be an alkyl group having 1 to 10 carbon atoms or an alky group having 1 to 5 carbon atoms, may be a methyl group, an ethyl group, a propyl group, or a butyl group, or may be a methyl group, an ethyl group, an n-propyl group, an iso-propyl group, or an n-butyl group. and $R^{83}$ may be different from or the same as each other. The alkyl group as $R^{81}$ and $R^{83}$ may have a substituent.

$R^{82}$ and $R^{84}$ are each independently an aromatic hydrocarbon group, and may be a phenyl group. The aromatic hydrocarbon group as $R^{82}$ and $R^{84}$ may have a substituent, is selected from Substituent Group A which will be described later, may be an alkyl group having 1 to 5 carbon atoms, may be a methyl group, an ethyl group, a propyl group, or a butyl group, or may be a methyl group, an ethyl group, an n-propyl group, or an n-butyl group.

At least one of $R^{81}$ and $R^{83}$, or $R^{82}$ and $R^{84}$ may be represented by the following General Formula (A1-1-2).

General Formula (A1-1-2)

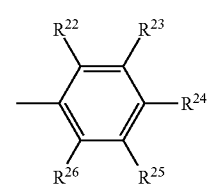

In General Formula (A1-1-2), $R^{23}$ to $R^{25}$ each independently represent a hydrogen atom, a halogen atom, a hydroxyl group, an alkoxy group, an alkyl group having 1 to 12 carbon atoms, a carbonyl group, a carbonylamide group, a sulfonyl group, a sulfonylamide group, a nitro group, an amino group, an aminocarbonyl group, an aminosulfonyl group, a sulfonylimide group, or a carbonylimide group, and $R^{22}$ and $R^{26}$ each independently represent an alkyl group having 1 to 5 carbon atoms.

In General Formula (A1-1-2), $R^{23}$ to $R^{25}$ may be a hydrogen atom or a halogen atom.

In General Formula (A1-1-2), $R^{22}$ and $R^{26}$ may be each independently an alkyl group having 1 to 5 carbon atoms.

The alkyl group having 1 to 5 carbon atoms may be methyl group, an ethyl group, a propyl group, or a butyl group, or may be a methyl group, an ethyl group, an n-propyl group, an iso-propyl group, or an n-butyl group.

$R^{85}$'s each independently represent a hydrogen atom, a halogen atom, an alkyl group, an aryl group, a carbonyl group, a nitro group, an amino group, an alkylamino group, an arylamino group, or a sulfonyl group. Examples of the halogen atom include a fluorine atom, a chlorine atom, and a bromine atom, and the halogen atom may be a fluorine atom or a chlorine atom. The aliphatic hydrocarbon group may be an aliphatic hydrocarbon group having 1 to 10 carbon atoms. Further, examples of the aliphatic hydrocarbon group include an alkyl group, an alkenyl group, and the aliphatic hydrocarbon group may be an alkyl group. The aromatic hydrocarbon group may be an aryl group or a phenyl group.

Specific examples of the xanthene compound are shown below, but the present invention is not limited thereto. In the following specific examples, X represents an anion. Further, any one hydrogen atom in the colorant structure is bonded to a polymer skeleton.

Furthermore, in the colorant structure, the cation is non-localized, but is present on a nitrogen atom, or a carbon atom of the xanthene ring, for example, as shown below.

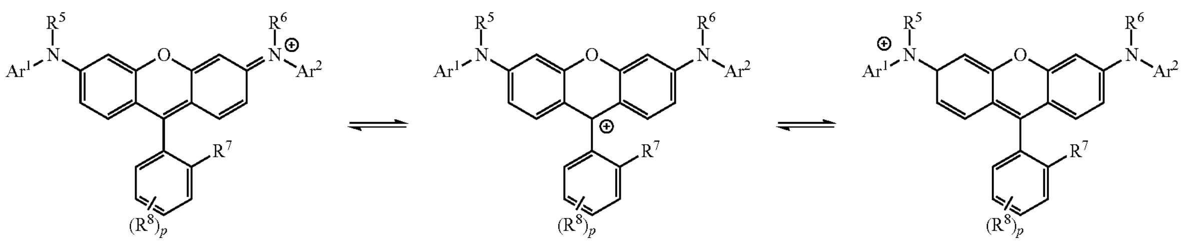

(A-xt-1)

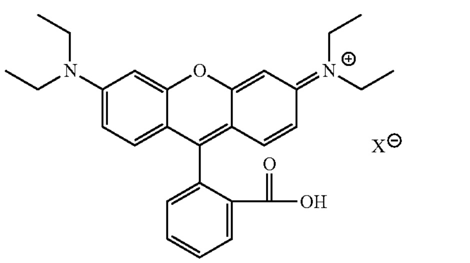

(A-xt-2)

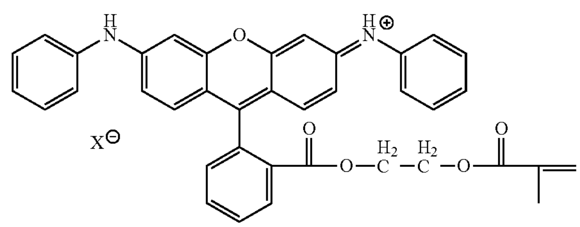

(A-xt-3)

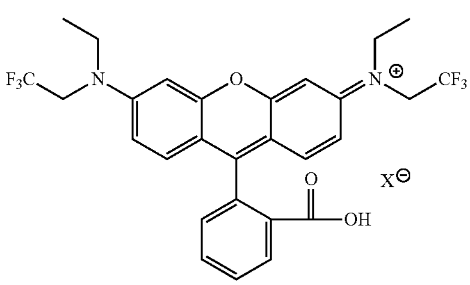

(A-xt-4)

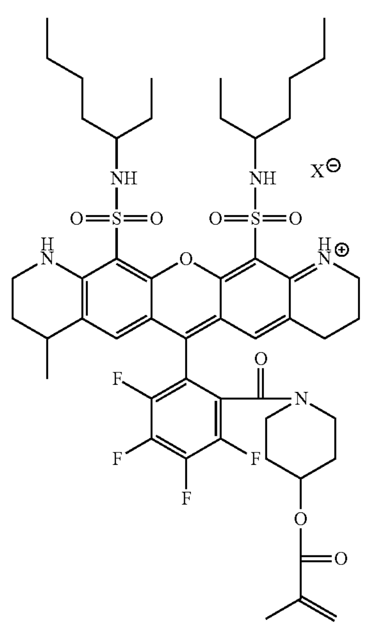

-continued
(A-xt-5)
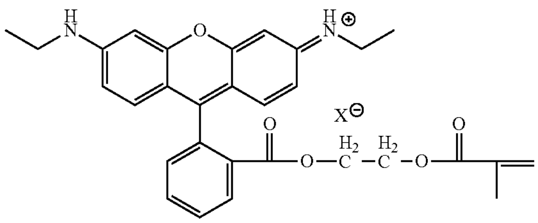
(A-xt-6)
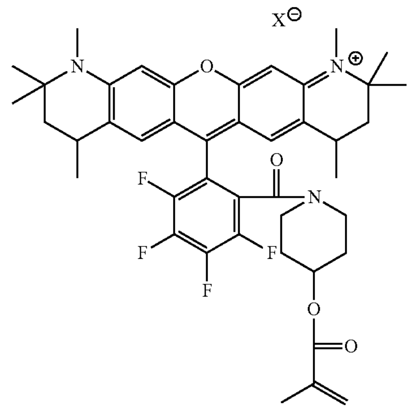
(A-xt-7)
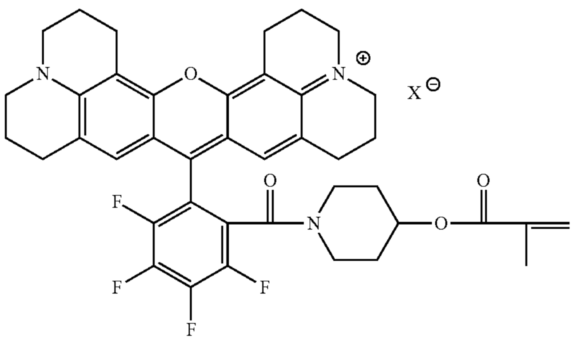
(A-xt-8)
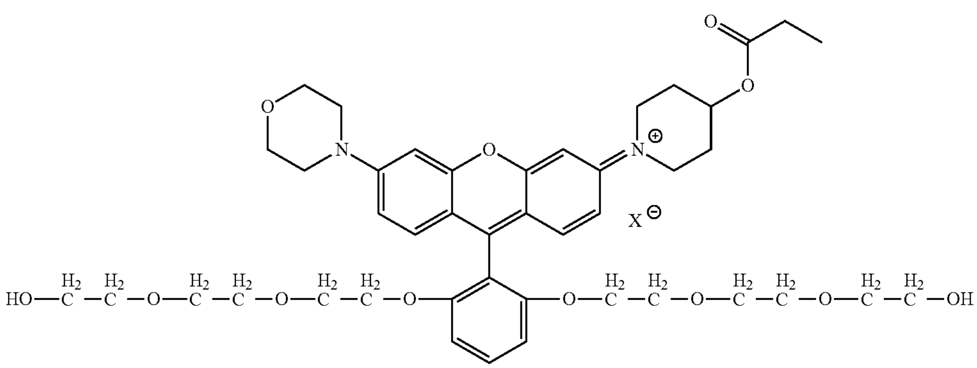
(A-xt-9)
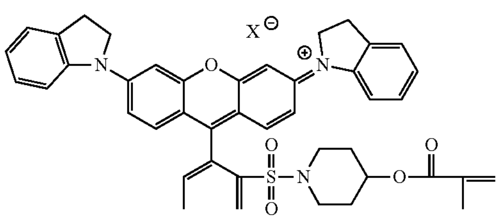
(A-xt-10)
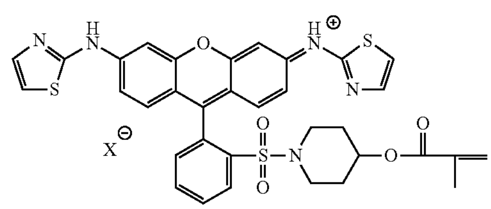
(A-xt-11)
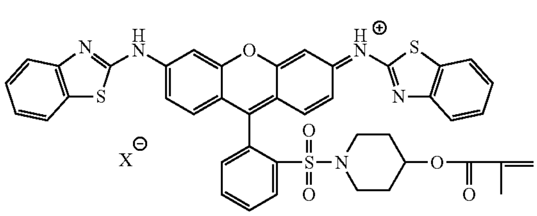
(A-xt-12)
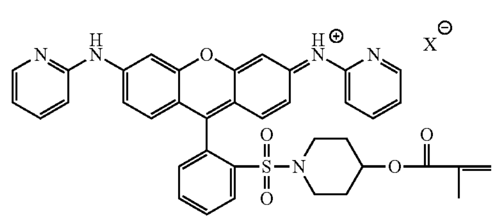

-continued (A-xt-13)

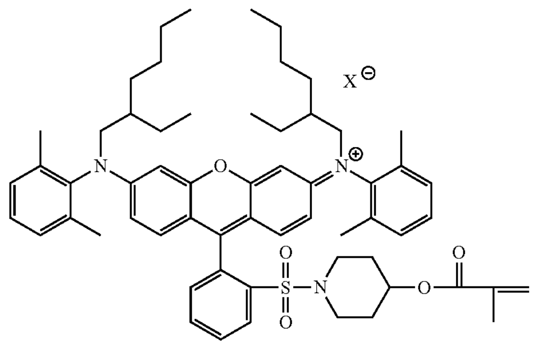

(A-xt-14)

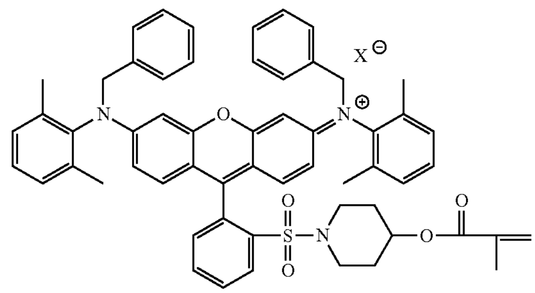

(A-xt-15)

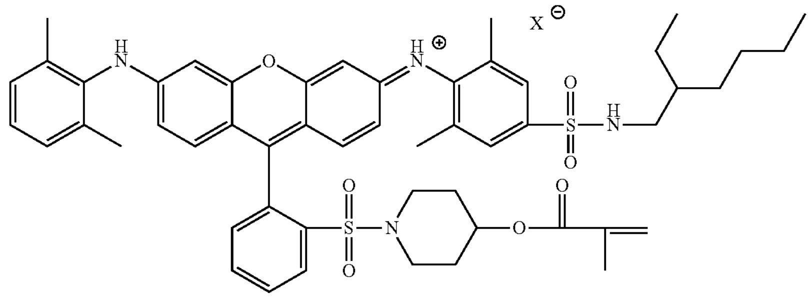

(A-xt-16)

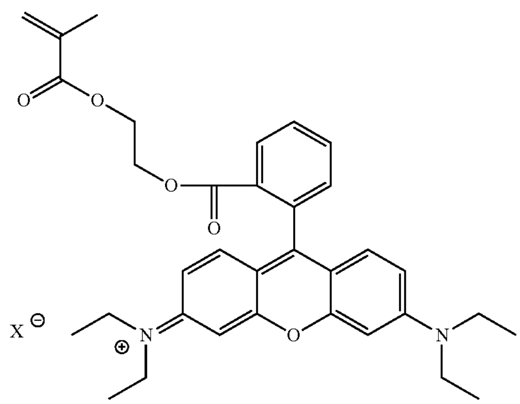

(Cyanine Colorant)

One of the aspects of the colorant structure used in the present invention is a colorant structure having a partial structure derived from a cyanine colorant (cyanine compound). As the colorant structure having a partial structure derived from a cyanine colorant, a partial structure derived from a compound (cyanine compound) represented by the following General Formula (PM) is preferable. The cyanine compounds in the present invention collectively refer to compounds having a colorant site including a cyanine skeleton in the molecule.

General Formula (PM)

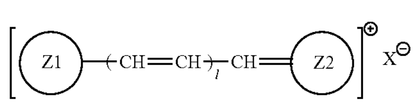

In General Formula (PM), a ring Z1 and a ring Z2 each independently represent a heterocycle which may have a substituent. 1 represents an integer of 0 to 3, and $X^-$ represents an anion.

With respect to preferred ranges of General Formula (PM), reference can be made to, for example, paragraphs "0077" to "0084" of JP2013-29760A, the contents of which are incorporated herein by reference. Further, in specific examples of the cyanine colorant described in paragraphs "0077" to "0084" of JP2013-29760A, any one hydrogen atom in the cyanine colorant structure is bonded to a polymer skeleton.

(Squarylium Colorant)

One of the aspects of the colorant structure used in the present invention is a colorant structure having a partial structure derived from a squarylium colorant (squarylium compound). As the colorant structure having a partial structure derived from a squarylium colorant, a partial structure derived from a compound (squarylium compound) represented by the following General Formula (K) is preferable. The squarylium compounds in the present invention collectively refer to compounds having a colorant site including a squarylium skeleton in the molecule.

General Formula (K)

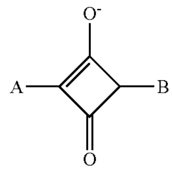

In General Formula (K), A and B each independently represent an aryl group or a heterocyclic group. The aryl group is preferably an aryl group having 6 to 48 carbon atoms, and more preferably 6 to 24 carbon atoms, such as phenyl and naphthyl. The heterocyclic group is preferably a 5- or 6-membered heterocyclic group such as pyrroyl, imidazoyl, pyrazoyl, thienyl, pyridyl, pyrimidyl, pyridazyl, triazol-1-yl, furyl, and thiadiazolyl.

With respect to preferred ranges of General Formula (K), reference can be made to, for example, paragraphs "0088" to "0106" of JP2013-29760A, the contents of which are incorporated herein by reference. Further, in specific examples of the squarylium colorant described in paragraphs "0088" to "0106" of JP2013-29760A, any one hydrogen atom in the squarylium colorant structure is bonded to a polymer skeleton.

(Quinophthalone Colorants)

One of the aspects of the colorant structure used in the present invention is a colorant structure having a partial structure derived from a quinophthalone colorant (quinophthalone compound). As the colorant structure having a partial structure derived from a quinophthalone colorant, a partial structure derived from a compound (quinophthalone compound) represented by the following General Formula (QP) is preferable. The quinophthalone compounds in the present invention collectively refer to compounds having a colorant site including a quinophthalone skeleton in the molecule.

General Formula (QP)

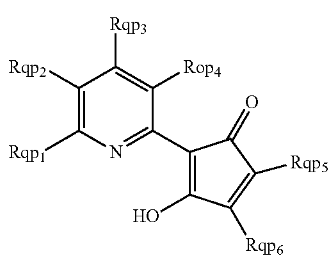

In General Formula (QP), $Rqp^1$ to $Rqp^6$ each independently represent a hydrogen atom or a substituent. In the case where at least two of $Rqp^1$ to $Rqp^6$ are adjacent to each other, they may be bonded to each other to form a ring, and a ring thus formed may further be substituted.

With respect to preferred ranges of General Formula (QP), reference can be made to, for example, paragraphs "0110" to "0114" of JP2013-29760A, the contents of which are incorporated herein by reference. Further, in specific examples of the quinophthalone colorant described in paragraphs "0110" to "0114" of JP2013-29760A, any one hydrogen atom in the quinophthalone colorant structure is bonded to a polymer skeleton.

(Phthalocyanine Colorant)

One of the aspects of the colorant structure used in the present invention is a colorant structure having a partial structure derived from a phthalocyanine colorant (phthalocyanine compound). As the colorant structure having a partial structure derived from a phthalocyanine colorant, a partial structure derived from a compound (phthalocyanine compound) represented by the following General Formula (F) is preferable. The phthalocyanine compounds in the present invention collectively refer to compounds having a colorant site including a phthalocyanine skeleton in the molecule.

General Formula (F)

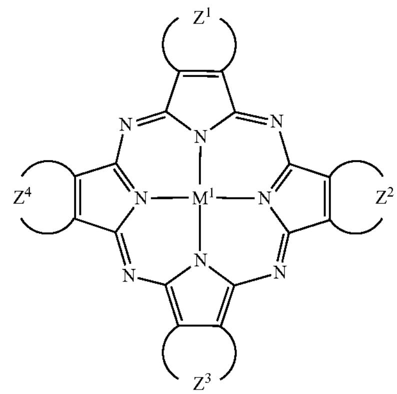

In General Formula (F), $M^1$ represents a metal, $Z^1$, $Z^2$, $Z^3$, and $Z^4$ each independently represent a group of atoms required to form a 6-membered ring including atoms selected from a hydrogen atom, a carbon atom, and a nitrogen atom.

With respect to preferred ranges of General Formula (F), reference can be made to, for example, paragraphs "0118" to "0124" of JP2013-29760A, the contents of which are incorporated herein by reference. Further, in specific examples of the phthalocyanine colorant described in paragraphs "0118" to "0124" of JP2013-29760A, any one hydrogen atom in the phthalocyanine colorant structure is bonded to a polymer skeleton.

(Subphthalocyanine Compound)

One of the aspects of the cation having a colorant structure according to the present invention is a cation having a partial structure derived from a subphthalocyanine colorant (phthalocyanine compound). As the cation having a partial structure derived from a subphthalocyanine colorant, a partial structure derived from a compound (subphthalocyanine compound) represented by the following General Formula (SP) is preferable. The subphthalocyanine compounds in the present invention collectively refer to compounds having a colorant site including a subphthalocyanine skeleton in the molecule.

General Formula (SP)

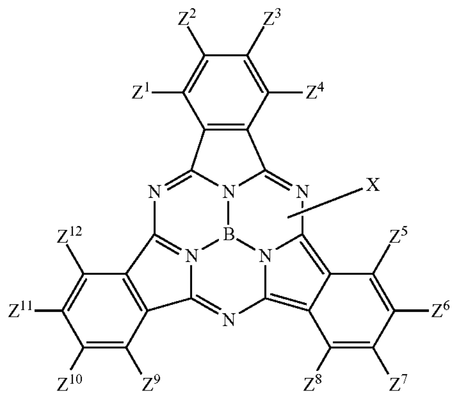

(In General Formula (SP), $Z^1$ to $Z^{12}$ each independently represent a hydrogen atom, an alkyl group, an aryl group, a hydroxyl group, a mercapto group, an amino group, an alkoxy group, an aryloxy group, or a thioether group. X represents an anion.)

With respect to preferred ranges of General Formula (SP), reference can be made to, for example, paragraphs “0128” to “0133” of JP2013-29760A, the contents of which are incorporated herein by reference. Further, in specific examples of the subphthalocyanine colorant described in paragraphs “0128” to “0133” of JP2013-29760A, any one hydrogen atom in the subphthalocyanine colorant structure is bonded to a polymer skeleton.

Moreover, one of the aspects of the cation having a colorant structure according to the present invention may be a cation having a partial structure derived from a dipyrromethane colorant or an azo colorant. With respect to the dipyrromethane colorant and the azo colorant, reference can be made to, for example, paragraphs “0033” to “0135” of JP2011-95732A, the contents of which are incorporated herein by reference.

In the dye used in the present invention, a hydrogen atom in the colorant structure may be substituted with a substituent selected from the following Substituent Group A.

(Substituent Group A)

Examples of the substituent which the dye multimer may have include halogen atoms (for example, fluorine, chlorine, and bromine), an alkyl group (preferably a linear, branched, or cyclic alkyl group having 1 to 48 carbon atoms, and more preferably a linear, branched, or cyclic alkyl group having 1 to 24 carbon atoms, such as methyl, ethyl, propyl, isopropyl, butyl groups (preferably a t-butyl group), pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (preferably an alkenyl group having 2 to 48 carbon atoms, and more preferably an alkenyl group having 2 to 18 carbon atoms, such as vinyl, allyl, and 3-buten-1-yl), an alkanyl group (preferably an alkanyl group having 2 to 20 carbon atoms, more preferably an alkanyl group having 2 to 12 carbon atoms, and particularly preferably an alkanyl group having 2 to 8 carbon atoms, such as propargyl and 3-pentynyl), an aryl group (preferably an aryl group having 6 to 48 carbon atoms, and more preferably an aryl group having preferably 6 to 24 carbon atoms, such as phenyl and naphthyl), a heterocyclic group (preferably a heterocyclic group having 1 to 32 carbon atoms, and more preferably a heterocyclic group having 1 to 18 carbon atoms, such as a 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (preferably a silyl group having 3 to 38 carbon atoms, and more preferably a silyl group having 3 to 18 carbon atoms, such as trimethylsilyl, triethylsilyl, tributylsilyl, t-butyldimethylsilyl, and t-hexyldimethylsilyl), a hydroxyl group, a cyano group, a nitro group, an alkoxy group (preferably an alkoxy group having 1 to 48 carbon atoms, and more preferably an alkoxy group having 1 to 24 carbon atoms, such as methoxy, ethoxy, 1-butoxy, 2-butoxy, isopropoxy, t-butoxy, dodecyloxy, and a cycloalkyloxy group such as cyclopentyloxy and cyclohexyloxy, an aryloxy group (preferably an aryloxy group having 6 to 48 carbon atoms, and more preferably an aryloxy group having 6 to 24 carbon atoms, such as phenoxy and 1-naphthoxy), a heterocyclic oxy group (preferably a heterocyclic oxy group having 1 to 32 carbon atoms, and more preferably a heterocyclic oxy group having 1 to 18 carbon atoms, such as 1-phenyltetrazole-5-oxy and 2-tetrahydropyranyloxy), a silyloxy group (preferably a silyloxy group having 1 to 32 carbon atoms, and more preferably a silyloxy group having 1 to 18 carbon atoms, such as trimethylsilyloxy, t-butyldimethylsilyloxy, and diphenylmethylsilyloxy), an acyloxy group (preferably an acyloxy group having 2 to 48 carbon atoms, and more preferably an acyloxy group having 2 to 24 carbon atoms, such as acetoxy, pivaloyloxy, benzoyloxy, and dodecanoyloxy), an alkoxycarbonyloxy group (preferably an alkoxycarbonyloxy group having 2 to 48 carbon atoms, and more preferably an alkoxycarbonyloxy group having 2 to 24 carbon atoms, such as ethoxycarbonyloxy, t-butoxycarbonyloxy, and a cycloalkyloxycarbonyloxy group such as cyclohexyloxycarbonyloxy), an aryloxycarbonyloxy group (preferably an aryloxycarbonyloxy group having 7 to 32 carbon atoms, and more preferably an aryloxycarbonyloxy group having 7 to 24 carbon atoms, such as phenoxycarbonyloxy), a carbamoyloxy group (preferably a carbamoyloxy group having 1 to 48 carbon atoms, and more preferably a carbamoyloxy group having 1 to 24 carbon atoms, such as N,N-dimethylcarbamoyloxy, N-butylcarbamoyloxy, N-phenylcarbamoyloxy, and N-ethyl-N-phenylcarbamoyloxy), a sulfamoyloxy group (preferably a sulfamoyloxy group having 1 to 32 carbon atoms, and more preferably a sulfamoyloxy group having 1 to 24 carbon atoms, such as N,N-diethylsulfamoyloxy and N-propylsulfamoyloxy), an alkylsulfonyloxy group (preferably an alkylsulfonyloxy group having 1 to 38 carbon atoms, and more preferably an alkylsulfonyloxy group having 1 to 24 carbon atoms, such as methylsulfonyloxy, hexadecylsulfonyloxy, and cyclohexylsulfonyloxy), an arylsulfonyloxy group (preferably an arylsulfonyloxy group having 6 to 32 carbon atoms, and more preferably an arylsulfonyloxy group having 6 to 24 carbon atoms, such as phenylsulfonyloxy), an acyl group (preferably an acyl group having 1 to 48 carbon atoms, and more preferably an acyl group having 1 to 24 carbon atoms, such as formyl, acetyl, pivaloyl, benzoyl, tetradecanoyl, and cyclohexanoyl), an alkoxycarbonyl group (preferably an alkoxycarbonyl group having 2 to 48 carbon atoms, and more preferably an alkoxycarbonyl group having 2 to 24 carbon atoms, such as methoxycarbonyl, ethoxycarbonyl, octadecyloxycarbonyl, cyclohexyloxycarbonyl, and 2,6-di-tert-butyl-4-methylcyclohexyloxycarbonyl), an aryloxycarbonyl group (preferably an aryloxycarbonyl group having 7 to 32 carbon atoms, and more preferably an aryloxycarbonyl group having 7 to 24 carbon atoms, such as phenoxycarbonyl), a carbamoyl group (preferably a carbamoyl group having 1 to 48 carbon atoms, and more preferably a carbamoyl group having 1 to 24 carbon atoms, such as carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, and N,N-dicyclohexylcarbamoyl), an amino group (preferably an amino group having 32 or less carbon atoms, and more preferably an amino group having 24 or less carbon atoms, such as amino, methylamino, N,N-dibutylamino, tetradecylamino, 2-ethylhexylamino, and cyclohexylamino), an anilino group (preferably an anilino group having 6 to 32 carbon atoms, and more preferably an anilino group having 6 to 24 carbon atoms, such as anilino and N-methylanilino), a heterocyclic amino group (preferably a heterocyclic amino group having 1 to 32 carbon atoms, and more preferably a heterocyclic amino group having 1 to 18 carbon atoms, such as 4-pyridylamino), a carbonamide group (preferably a carbonamide group having 2 to 48 carbon atoms, and more preferably a carbonamide group having 2 to 24 carbon atoms, such as acetamide, benzamide, tetradecanamide, pivaloylamide, and cyclohexanamide), a ureide group (preferably a ureide group having 1 to 32 carbon atoms, and more preferably a ureide group having 1 to 24 carbon atoms, such as ureide, N,N-dimethylureide, and N-phenylureide), an imide group (preferably an imide group having 36 or less carbon atoms, and more preferably an imide group having 24 or less carbon atoms, such as N-succinimide and N-phthalimide), an alkoxycarbonylamino group (preferably an alkoxycarbonylamino group having 2 to 48 carbon atoms, and more preferably an alkoxycarbonylamino group having 2 to 24 carbon atoms, such as methoxycarbonylamino, ethoxycarbonylamino, a t-butoxycarbonylamino group, an octadecyloxycarbonylamino group, and cyclohexyloxycarbonylamino), an aryloxycarbonylamino group (preferably an aryloxycarbonylamino group having 7 to 32 carbon atoms, and more preferably an aryloxycarbonylamino group having 7 to 24 carbon atoms, such as phenoxycarbonylamino), a sulfonamide group (preferably a sulfonamide group having 1 to 48 carbon atoms, and more preferably a sulfonamide group having 1 to 24 carbon atoms, such as methanesulfonamide, butanesulfonamide, benzenesulfonamide, hexadecanesulfonamide, and cyclohexanesulfonamide), a sulfamoylamino group (preferably a sulfamoylamino group having 1 to 48 carbon atoms, and more preferably a sulfamoylamino group having 1 to 24 carbon atoms, such as N,N-dipropylsulfamoylamino and N-ethyl-N-dodecylsulfamoylamino), an azo group (preferably an azo group having 1 to 32 carbon atoms, and more preferably an azo group having 1 to 24 carbon atoms, such as phenylazo and 3-pyrazolylazo), an alkylthio group (preferably an alkylthio group having 1 to 48 carbon atoms, and more preferably an alkylthio group having 1 to 24 carbon atoms, such as methylthio, ethylthio, octylthio, and cyclohexylthio), an arylthio group (preferably an arylthio group having 6 to 48 carbon atoms, and more preferably an arylthio group having 6 to 24 carbon atoms, such as phenylthio), a heterocyclic thio group (preferably a heterocyclic thio group having 1 to 32 carbon atoms, and more preferably a heterocyclic thio group having 1 to 18 carbon atoms, such as 2-benzothiazolylthio, 2-pyridylthio, and 1-phenyltetrazolylthio), an alkylsulfinyl group (preferably an alkylsulfinyl group having 1 to 32 carbon atoms, and more preferably an alkylsulfinyl group having 1 to 24 carbon atoms, such as dodecanesulfinyl), an arylsulfinyl group (preferably an arylsulfinyl group having 6 to 32 carbon atoms, and more preferably an arylsulfinyl group having 6 to 24 carbon atoms, such as phenylsulfinyl), an alkylsulfonyl group (preferably an alkylsulfonyl group having 1 to 48 carbon atoms, and more preferably an alkylsulfonyl group having 1 to 24 carbon atoms, such as methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an arylsulfonyl group (preferably an arylsulfonyl group having 6 to 48 carbon atoms, and more preferably an arylsulfonyl group having 6 to 24 carbon atoms, such as phenylsulfonyl and 1-naphthylsulfonyl), a sulfamoyl group (preferably a sulfamoyl group having 32 or less carbon atoms, and more preferably a sulfamoyl group having 24 or less carbon atoms, such as sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (preferably a phosphonyl group having 1 to 32 carbon atoms, and more preferably a phosphonyl group having 1 to 24 carbon atoms, such as phenoxyphosphonyl, octyloxyphosphonyl, and phenylphosphonyl), a phosphinoylamino group (preferably a phosphinoylamino group having 1 to 32 carbon atoms, and more preferably a phosphinoylamino group having 1 to 24 carbon atoms, such as diethoxyphosphinoylamino and dioctyloxyphosphinoylamino), and an alkyloxycarbonyloxy group (preferably an alkyloxycarbonyloxy group having 5 to 30 carbon atoms, and more preferably an alkyloxycarbonyloxy group having 5 to 10 carbon atoms).

These substituent may further be substituted. Further, in the case where two or more substituents are present, they may be the same as or different from each other. In addition, in the case of being allowable, they may be linked to each other to form a ring.

With respect to the details, reference can be made to, for example, paragraphs “0027” to “0038” of JP2013-29760A, the contents of which may be incorporated herein by reference.

<<Structural Unit Having Colorant Structure>>

The structural unit having a colorant structure contained in the dye multimer used in the coloring composition of the present invention is not particularly limited, but it preferably has at least one of a structural unit represented by General Formula (A), a structural unit represented by General Formula (B), and a structural unit represented by General Formula (C), shown in paragraph Nos. “0134” to “0178” of JP2013-29760A, as a skeleton. The description of paragraph Nos. “0134” to “0178” of JP2013-29760A can be incorporated in the present specification.

Since the dye multimer having a structural unit represented by General Formula (A), a structural unit represented by General Formula (C), and a structural unit represented by General Formula (D) is linked via a covalent bond, the heat resistance of the coloring composition containing the dye multimer is improved, and thus, in the case where the coloring composition is applied to formation of a colored pattern in plural colors, there is an effect of suppressing color transfer to other adjacent colored patterns, which is thus preferable. Further, the compound represented by General Formula (A) is preferable since the molecular weight of the dye multimer is easily controlled.

<<<Structural Unit Represented by General Formula (A)>>>

General Formula (A)

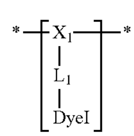

(In General Formula (A), $X_1$ represents a linking group formed by polymerization, and $L_1$ represents a single bond or a divalent linking group. DyeI represents a colorant structure.)

Hereinafter, General Formula (A) will be described in detail.

In General Formula (A), $X_1$ represents a linking group formed by polymerization. That is, $X_1$ represents a portion which forms a repeating unit corresponding to a main chain formed by a polymerization reaction. Moreover, the sites represented by two *'s are repeating units. $X_1$ is not particularly limited as long as it is a linking group formed of a known polymerizable monomer. In particular, as $X_1$, linking groups represented by the following (XX-1) to (XX-24) are preferable; (meth)acryl-based linking chains represented by (XX-1) and (XX-2) are more preferable; linking groups selected from styrene-based linking chains represented by (XX-10) to (XX-17) and vinyl-based linking chains represented by (XX-18) and (XX-19), and (XX-24) are still more preferable; (meth)acryl-based linking chains represented by (XX-1) and (XX-2), styrene-based linking chains represented by (XX-10) to (XX-17), and vinyl-based linking chains represented by (XX-24) are even more preferable; and (meth)acryl-based linking chains represented by (XX-1) and (XX-2), and styrene-based linking chains represented by (XX-11) are even more preferable.

In (XX-1) to (XX-24), * represents a site for linking to $L_1$. Me represents a methyl group. Further, R in (XX-18) and (XX-19) represents a hydrogen atom, an alkyl group having 1 to 5 carbon atoms, or a phenyl group.

(XX-1)

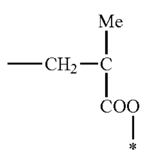

(XX-2)

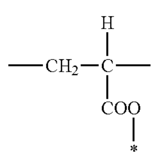

(XX-3)

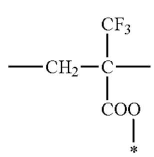

(XX-4)

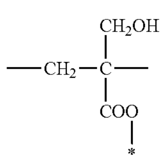

(XX-5)

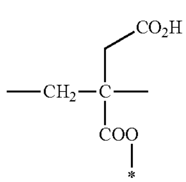

-continued (XX-6)

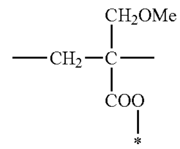

(XX-7)

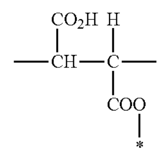

(XX-8)

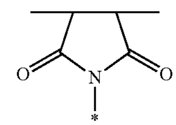

(XX-9)

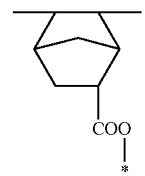

(XX-10)

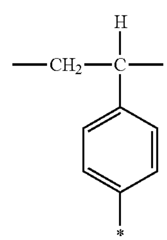

(XX-11)

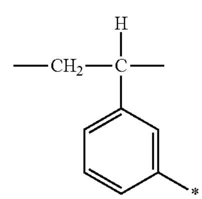

(XX-12)

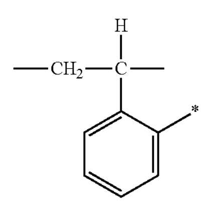

(XX-13)

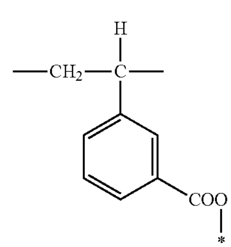

-continued
(XX-14)
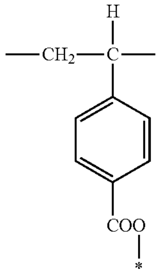
(XX-15)
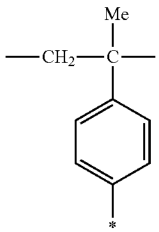
(XX-16)
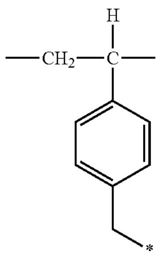
(XX-17)
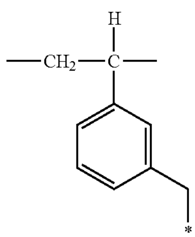
(XX-18)
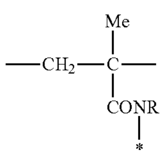
(XX-19)
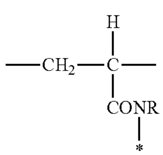
(XX-20)
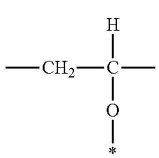
(XX-21)
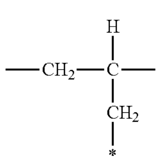
-continued
(XX-22)
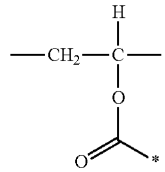
(XX-23)
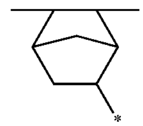
(XX-24)
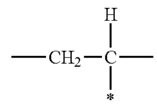
(XX-25)
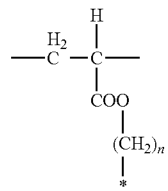
(XX-26)
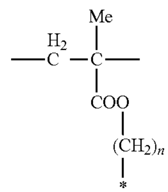
(XX-27)
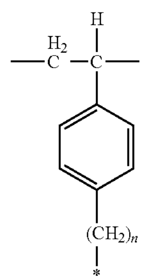
(XX-28)
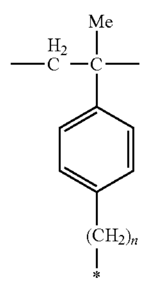
(XX-29)
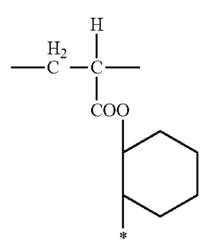

-continued (XX-30)

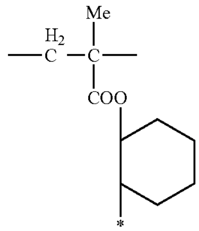

In General Formula (A), $L_1$ represents a single bond or a divalent linking group. In the case where $L_1$ represents a divalent linking group, the divalent linking group represents a substituted or unsubstituted alkylene group having 1 to 30 carbon atoms (for example, a methylene group, an ethylene group, a trimethylene group, a propylene group, and a butylene group), a substituted or unsubstituted arylene group having 6 to 30 carbon atoms (for example, a phenylene group and a naphthalene group), a substituted or unsubstituted heterocyclic linking group, —CH═CH—, —O—, —S—, —C(═O)—, —$CO_2$—, —NR—, —CONR—, —$O_2C$—, —SO—, —$SO_2$—, and a linking group formed of two or more of these linked to each other. Further, a configuration in which $L_1$ includes an anion is also preferable. $L_1$ is preferably a single bond or an alkylene group, and more preferably a single bond or —$(CH_2)$n- (n is an integer of 1 to 5). Herein, R's each independently represent a hydrogen atom, an alkyl group, an aryl group, or a heterocyclic group. Examples of the case where $L_1$ represents an anion will be described later.

In General Formula (A), DyeI represents a colorant structure as described above.

The dye multimer having the structural unit represented by General Formula (A) can be synthesized by (1) a method for synthesizing the multimer by means of addition polymerization using monomers having a colorant residue, or (2) a method for synthesizing the multimer by causing a reaction between a polymer having a highly reactive functional group such as an isocyanate group, an acid anhydride group, and an epoxy group, and a colorant having a functional group (a hydroxyl group, a primary or secondary amino group, a carboxyl group, or the like) which can react with the highly reactive group.

For the addition polymerization, known addition polymerization (radical polymerization, anionic polymerization, or cationic polymerization) can be applied. Among these, it is particularly preferable that the dye multimer is synthesized by radical polymerization, since the reaction condition can be set to be mild conditions and the colorant structure is not decomposed. For the radical polymerization, known reaction conditions can be applied. That is, the dye multimer used in the present invention is preferably an addition polymer.

Among these, from the viewpoint of heat resistance, the dye multimer having the structural unit represented by General Formula (A) is preferably a radical polymer which is obtained by radical polymerization using a colorant monomer having an ethylenically unsaturated bond.

<<Structural Unit Represented by General Formula (B)>>>

General Formula (B)

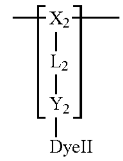

In General Formula (B), $X_2$ has the same definition as $X_1$ in General Formula (A). $L_2$ has the same definition as $L_1$ in General Formula (A). $Y_2$ represents a group capable of forming an ionic bond or a coordinate bond with DyeII. DyeII represents the colorant structure. With respect to details of General Formula (B), reference can be made to paragraphs "0156" to "0161" of JP2013-29760A, the contents of which are incorporated herein by reference.

<<<Structural Unit Represented by General Formula (C)>>>

General Formula (C)

$$*\!-\!\!\left[\text{DyeIII}\!-\!\left(L_3\right)_m\right]\!\!-\!*$$

In General Formula (C), $L_3$ represents a single bond or a divalent linking group. DyeIII represents the colorant structure. m represents 0 or 1. With respect to details of General Formula (C), reference can be made to paragraphs "0165" to "0167" of JP2013-29760A, the contents of which are incorporated herein by reference.

<<<Dye Multimer Represented by General Formula (D)>>>

General Formula (D)

$$(L_4)\!-\!(\text{DyeIV})_n$$

In General Formula (D), $L_4$ represents an n-valent linking group. n represents an integer of 2 to 20. When n is 2 or more, the structures of DyeIV may be the same as or different from each other. DyeIV represents the colorant structure. With respect to details of General Formula (D), reference can be made to paragraphs "0173" to "0178" of JP2013-29760A, the contents of which are incorporated herein by reference.

<<Counter Anion>>

In the case where the colorant structure used in the present invention has a cation structure, the counter anion may be in the same structural unit of the dye multimer or outside the same structural unit. The expression "the counter anion is in the same structural unit" means that the cation and the anion are boned to each other via a covalent bond in a structural unit having a colorant structure. On the other hand, "outside the same structural unit" means to include the other cases. For example, this means a case where the cation and the anion are not bonded to each other via a covalent bond but present as separate compounds, or the case where the cation and the anion are included as independent structural units of a dye multimer.

The anion in the present invention is preferably a non-nucleophilic anion. The non-nucleophilic anion may be an organic anion or an inorganic anion, preferably an organic anion. Examples of counter anions used in the present invention include known non-nucleophilic anions described in paragraph No. "0075" of JP2007-310315A, the contents of which are incorporated herein by reference. The "non-nucleophilicity" herein means the inability of an anion to nucleophilically attack colorants upon heating.

Cases where Counter Anion is in the Same Structural Unit

The first embodiment of the anion in the present invention is the case where the counter anion is in the same structural unit, and specifically the cation and the anion are bonded to each other via a covalent bond in a structural unit having a colorant structure.

In this case, the anion moiety is preferably at least one member selected from —$SO_3^-$, —$COO^-$, —$PO_4^-$, a structure represented by the following General Formula (A1), and a structure represented by the following General Formula (A2), and more preferably at least one selected from a structure represented by the following General Formula (A1) and a structure represented by the following General Formula (A2).

Furthermore, the anion moiety may include a carboxylic acid anion, a sulfonic acid anion, an anion represented by General Formula (A1-1-2), or an anion represented by General Formula (A1-1-3).

General Formula (A1)

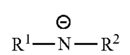

(In General Formula (A1), $R^1$ and $R^2$ each independently represent —$SO_2$— or —CO—.)

In General Formula (A1), it is preferable that at least one of $R^1$ or $R^2$ represents —$SO_2$—, and it is more preferable that both of $R^1$ and $R^2$ represent —$SO_2$—.

General Formula (A1) is more preferably represented by the following General Formula (A1-1).

General Formula (A1-1)

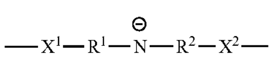

(In General Formula (A1-1), $R^1$ and $R^2$ each independently represent —$SO_2$— or —CO—, and $X^1$ and $X^2$ each independently represent an alkylene group or an arylene group.)

In General Formula (A1-1), $R^1$ and $R^2$ have the same definitions as $R^1$ and $R^2$ in General Formula (A1), and preferred ranges thereof are the same.

In the case where $X^1$ represents an alkylene group, the alkylene group preferably has 1 to 8 carbon atoms, and more preferably has 1 to 6 carbon atoms. In the case where $X^1$ represents an arylene group, the arylene group preferably has 6 to 18 carbon atoms, more preferably has 6 to 12 carbon atoms, and still more preferably has 6 carbon atoms. In the case where $X^1$ has a substituent, it is preferably substituted with a fluorine atom.

$X^2$ preferably represents an alkyl group or an aryl group, with the alkyl group being preferable. The alkyl group preferably has 1 to 8 carbon atoms, more preferably has 1 to 6 carbon atoms, still more preferably has 1 to 3 carbon atoms, and particularly preferably 1 carbon atom. In the case where $X^2$ has a substituent, it is preferably substituted with a fluorine atom.

General Formula (A2)

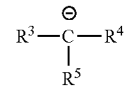

(In General Formula (A2), $R^3$ represents —$SO_2$— or —CO—, and $R^4$ and $R^5$ each independently represent —$SO_2$—, —CO—, or —CN.)

In General Formula (A2), it is preferable that at least one of $R^3$ to $R^5$ represents —$SO_2$—, and it is more preferable that at least two of $R^3$ to $R^5$ represent —$SO_2$—.

An especially preferred example of the present embodiment may be a case where the skeleton of the dye multimer is represented by the structural unit represented by General Formula (A), in which $L_1$ partially includes a moiety represented by General Formula (A1). Specific examples of such a case include (a-xt-1), (a-xt-5), and (a-xt-6) among the examples of the structural units including a colorant structure which will be described later.

In addition, an example of the present embodiment may be a case where the skeleton of the dye multimer used in the present invention includes a structural unit represented by General Formula (B). Specific examples of such a case include (B-dp-1), (B-mp-1), (B-xt-1), and (B-xt-2) among the examples of the structural units including a colorant structure which will be described later.

Cases where Counter Anion is as Separate Molecule

In a second embodiment of the anion according to the present invention, the counter anion is present outside the same structural unit and the cation and the anion are not linked together via a covalent bond but present as separate molecules.

Examples of the anion in this case include a fluorine anion, a chlorine anion, a bromine anion, an iodine anion, a cyanide ion, and a perchlorate anion as well as non-nucleophilic anions, preferably non-nucleophilic anions.

The non-nucleophilic counter anion may be an organic anion or an inorganic anion, and preferably an organic anion. Examples of the counter anion used in the present invention include known non-nucleophilic anions described in paragraph No. "0075" of JP2007-310315A, the contents of which are incorporated herein by reference.

Preferred examples of the counter anion include a bis(sulfonyl)imide anion, a tris(sulfonyl)methyl anion, a tetraaryl borate anion, $B^-(CN)_{n1}(OR^a)_{4-n1}$ ($R^a$ represents an alkyl group having 1 to 10 carbon atoms or an aryl group having 6 to 10 carbon atoms, and n1 represents 1 to 4) and $PF_{n2}R^P_{(6-n2)}{}^-$ ($R^P$ represents a fluorine atom-containing alkyl group having 1 to 10 carbon atoms, and n2 represents an integer of 1 to 6), more preferably an anion selected from a bis(sulfonyl)imide anion, a tris(sulfonyl)methyl anion, and a tetraaryl borate anion, and still more preferably a bis(sulfonyl)imide anion. By using such a non-nucleophilic counter anion, the effects of the present invention tend to be exerted more effectively.

The bis(sulfonyl)imide anion as the non-nucleophilic counter anion is preferably a structure represented by the following General Formula (AN-1).

(AN-1)

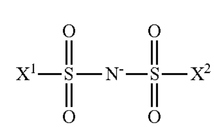

(In Formula (AN-1), $X^1$ and $X^2$ each independently represent a fluorine atom or a fluorine atom-containing alkyl group having 1 to 10 carbon atoms. $X^1$ and $X^2$ may be bonded to each other to form a ring.)

$X^4$ and $X^2$ each independently represent a fluorine atom or a fluorine atom-containing alkyl group having 1 to 10 carbon atoms, preferably a fluorine atom or a fluorine atom-containing alkyl group having 1 to 10 carbon atoms, more preferably a fluorine atom-containing alkyl group having 1 to 10 carbon atoms, still more preferably a perfluoroalkyl group having 1 to 4 carbon atoms, and particularly preferably a trifluoromethyl group.

The tris(sulfonyl)methyl anion as the non-nucleophilic counter anion is preferably a structure represented by the following General Formula (AN-2).

(AN-2)

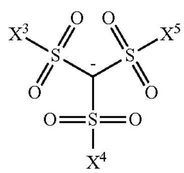

(In Formula (AN-2), $X^3$, $X^4$, and $X^5$ each independently represent a fluorine atom or a fluorine atom-containing alkyl group having 1 to 10 carbon atoms.)

$X^3$, $X^4$, and $X^5$ each independently have the same definitions as $X^1$ and $X^2$, and preferred ranges thereof are also the same.

The tetraaryl borate anion as the non-nucleophilic counter anion is preferably a compound represented by the following General Formula (AN-5).

(AN-5)

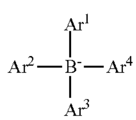

(In Formula (AN-5), $Ar^1$, $Ar^2$, $Ar^3$, and $Ar^4$ each independently represent an aryl group.)

$Ar^1$, $Ar^2$, $Ar^3$, and $Ar^4$ each independently preferably represent an aryl group having 6 to 20 carbon atoms, more preferably represent an aryl group having 6 to 14 carbon atoms, and still more preferably represent an aryl group having 6 to 10 carbon atoms.

The aryl group represented by $Ar^1$, $Ar^2$, $Ar^3$, and $Ar^4$ may have a substituent. In the case where it has a substituent, examples of the substituent include a halogen atom, an alkyl group, an aryl group, an alkoxy group, a carbonyl group, a carbonyloxy group, a carbamoyl group, a sulfo group, a sulfonamide group, and a nitro group, preferably a halogen atom and an alkyl group, more preferably a fluorine atom and an alkyl group, and still more preferably a fluorine atom and a perfluoroalkyl group having 1 to 4 carbon atoms.

$Ar^1$, $Ar^2$, $Ar^3$, and $Ar^4$ each independently more preferably represent a phenyl group having a halogen atom and/or an alkyl group having an halogen atom, and still more preferably a phenyl group having a fluorine atom and/or an alkyl group having fluorine.

The non-nucleophilic counter anion is preferably $—B(CN)_{n1}(OR^a)_{4-n1}$ ($R^a$ represents an alkyl group having 1 to 10 carbon atoms or an aryl group having 6 to 10 carbon atoms, and n1 represents an integer of 1 to 4). The alkyl group having 1 to 10 carbon atoms represented by $R^a$ is preferably an alkyl group having 1 to 6 carbon atoms, more preferably an alkyl group having 1 to 4 carbon atoms. The aryl group having 6 to 10 carbon atoms represented by $R^a$ is preferably a phenyl group or a naphthyl group.

n1 preferably represents 1 to 3, and more preferably represents 1 to 2.

The non-nucleophilic counter anion is preferably $—PF_6R^P_{(6-n2)}{}^-$ ($R^P$ represents a fluorine atom-containing alkyl group having 1 to 10 carbon atoms, and n2 represents an integer of 1 to 6). Preferably, $R^P$ represents a fluorine atom-containing alkyl group having 1 to 6 carbon atoms, more preferably a fluorine atom-containing alkyl group having 1 to 4 carbon atoms, and still more preferably a perfluoroalkyl group having 1 to 3 carbon atoms.

n2 preferably represents an integer of 1 to 4, and more preferably represents 1 or 2.

The non-nucleophilic counter anion used in the present invention preferably has a mass of 100 to 1,000 per molecule, and more preferably has a mass of 200 to 500 per molecule.

The dye multimer of the present invention may include one kind or two or more kinds of non-nucleophilic counter anion.

Specific examples of the non-nucleophilic counter anion used in the present invention are shown below, but the present invention is not limited thereto.

(IM-1)

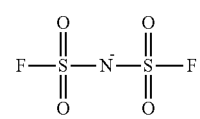

(IM-2)

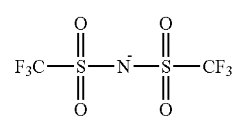

(IM-3)

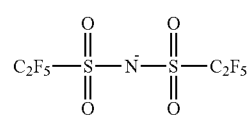

(IM-4)

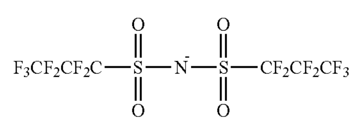

(IM-5)

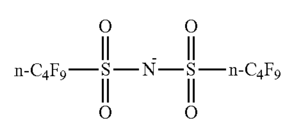

(IM-6)

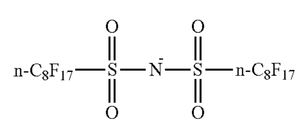

(IM-7)

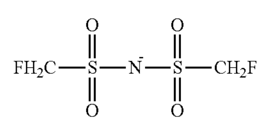

-continued
(IM-8)
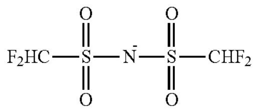
(IM-9)
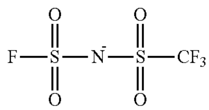
(IM-10)
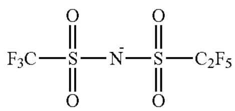
(IM-11)
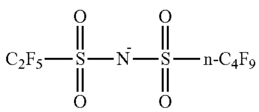
(IM-12)
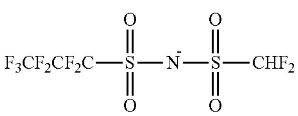
(IM-13)
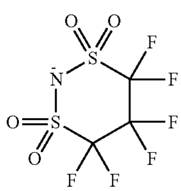
(IM-14)
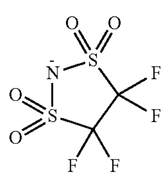
(IM-15)
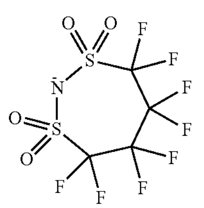
(MD-1)
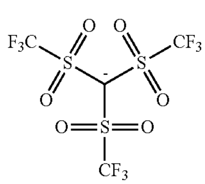
(MD-2)
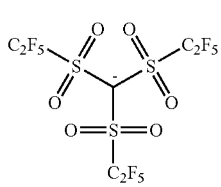
-continued
(MD-3)
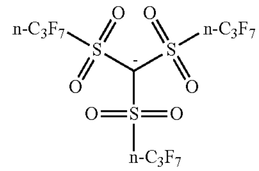
(MD-4)
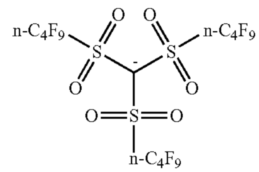
(MD-5)
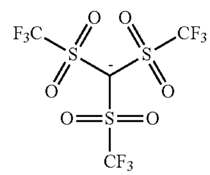
(MD-6)
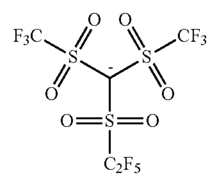
(MD-7)
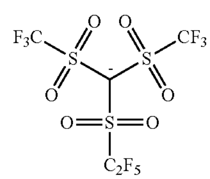
(MD-8)
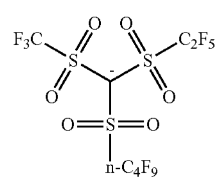
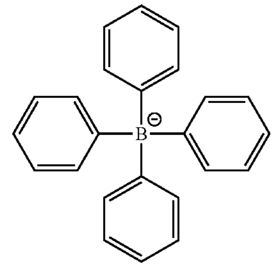

-continued
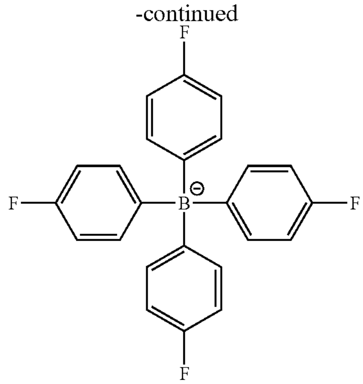
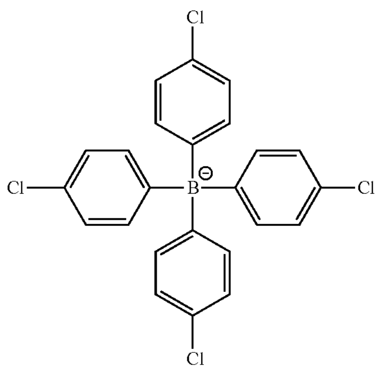
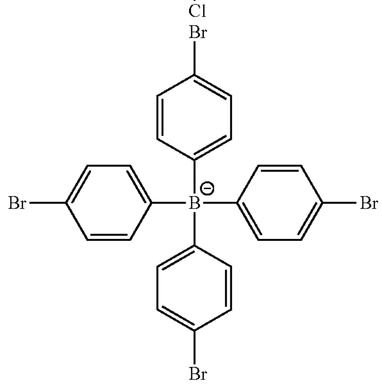
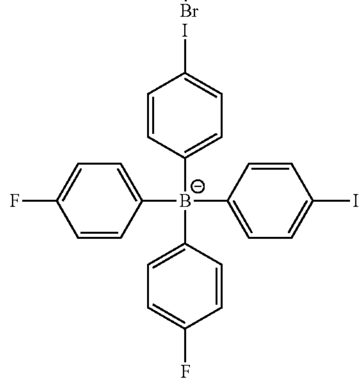
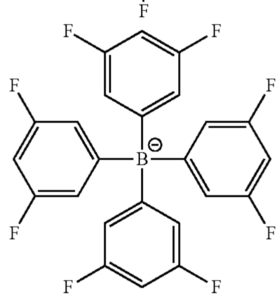
-continued
(a-1)
$CF_3SO_3^-$
(a-2)
$C_4F_{13}SO_3^-$
(a-3)
$C_8F_{17}SO_3^-$
(a-4)
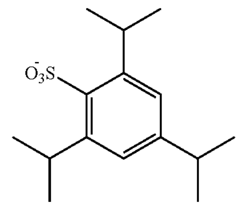
(a-5)
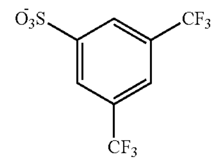
(a-6)
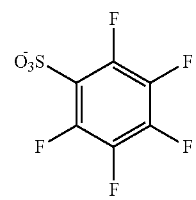
(a-7)
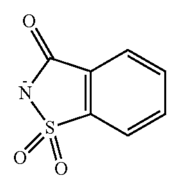
(a-8)
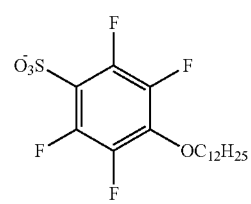
(a-9)
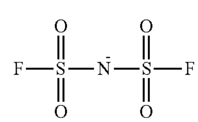
(a-10)
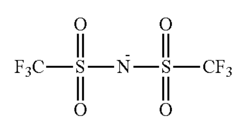
(a-11)
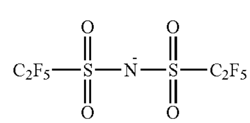
(a-12)
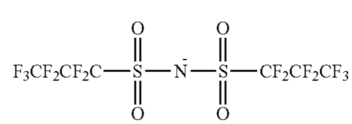

-continued (a-13)

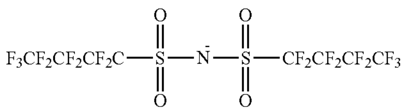

(a-14)

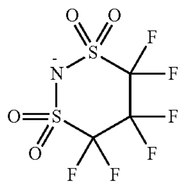

(a-15)

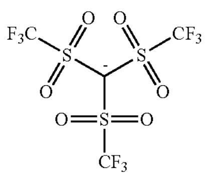

(a-16)

$^-O_3S—CF_2—SO_3^-$ (a-17)

$^-O_3S—CF_2CF_2—SO_3^-$ (a-18)

$^-O_3S—CF_2CF_2CF_2—SO_3^-$ (a-19)

$^-O_3S—CF_2CF_2CF_2CF_2—SO_3^-$ (a-20)

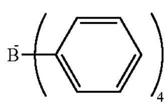

(a-21)

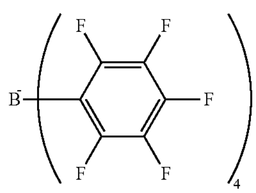

(a-22)

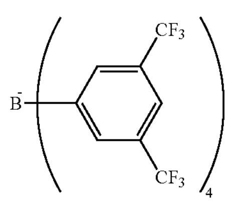

(a-23)

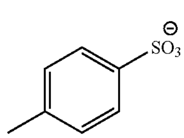

(a-24)

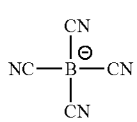

(a-25)

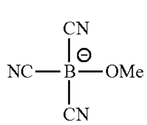

-continued (a-27)

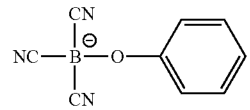

(a-28)

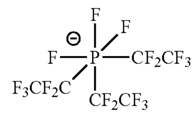

Moreover, in the second embodiment, the anion may be a multimer. Examples of the multimer in, this case include a multimer including a structural unit including an anion and a multimer not including a structural unit derived from a colorant structure including a cation. Here, preferred examples of the structural unit including an anion include structural units including anions which will be described later in a third embodiment. Further, the multimer including an anion may have a structural unit other than the structural unit including an anion. Preferred examples of such a structural unit include those which will be described later as other repeating units that may be included in the dye multimer used in the present invention.

Cases where Cation and Anion are Included in Separate Structural Units of Dye Multimer The third embodiment of the present invention refers to the case where the cation and the anion are included in each independent structural units of the dye multimer.

In the case of the present embodiment, the anion may be present in the side chain or the main chain of the dye multimer, or the counter anion may be present in both of the main chain and the side chain, and preferably in the side chain.

Preferred examples of the structural unit including an anion include a structural unit represented by General Formula (C1) and a structural unit represented by General Formula (D1).

General Formula (C1)

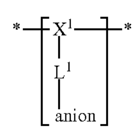

(In General Formula (C1), $X^1$ represents the main chain of the structural unit, $L^1$ represents a single bond or a divalent linking group, and the anion represents a counter anion.)

In General Formula (C1), $X^1$ represents the main chain of the structural unit, usually a linking group formed by a polymerization reaction. It is, for example, preferably a (meth)acryl-based linking group, a styrene-based linking group, or a vinyl-based linking group, more preferably a (meth)acryl-based linking group or a styrene-based linking group, and still more preferably a (meth)acryl-based linking group. Further, sites represented two *'s form a structural unit.

In the case where $L^1$ is represented by a divalent linking group, an alkylene group having 1 to 30 carbon atoms (a methylene group, an ethylene group, a trimethylene group, a propylene group, a butylene group, or the like), an arylene group having 6 to 30 carbon atoms (a phenylene group, a naphthalene group, or the like), a heterocyclic linking group, —CH═CH—, —O—, —S—, —C(═O)—, —CO—, —NR—, —CONR—, —OC—, —SO—, —$SO_2$— and a linking group formed by combination of two or more of these groups are preferable. Here, R's each independently represent a hydrogen atom, an alkyl group, an aryl group, or a heterocyclic group.

In particular, $L^1$ is preferably a single bond or a divalent linking group formed by combination of two or more of an alkylene group having 1 to 10 carbon atoms (preferably —$(CH_2)n$- (n is an integer of 5 to 10)), an arylene group having 6 to 12 carbon atoms (preferably a phenylene group or a naphthalene group), —NH—, —$CO_2$—, —O—, and —$SO_2$—.

Preferred specific examples of $X^1$ include examples of $X^1$ in General Formula (A).

General Formula (D1)

$$*\!-\!\left[L^2\text{—anion—}L^3\right]\!-\!*$$

(In General Formula (D1), $L^2$ and $L^3$ each independently represent a single bond or a divalent linking group. The anion represents the counter anion.)

In General Formula (D1), in the case where $L^2$ and $L^3$ represent a divalent linking group, an alkylene group having 1 to 30 carbon atoms, an arylene group having 6 to 30 carbon atoms, heterocyclic linking group, —CH═CH—, —O—, —S—, —C(═O)—, —$CO_2$—, —NR—, —CONR—, —$O_2C$—, —SO—, —$SO_2$—, and a linking group formed by combination of two or more of these groups are preferable. Here, R's each independently represent a hydrogen atom, an alkyl group, an aryl group, or a heterocyclic group.

$L^2$ is preferably an arylene group having 6 to 12 carbon atoms (particularly a phenylene group). The arylene group having 6 to 30 carbon atoms is preferably substituted with a fluorine atom.

$L^3$ is preferably a group formed by combination of an arylene group having 6 to 12 carbon atoms (particularly a phenylene group) and —O—, and at least one kind of arylene group having 6 to 12 carbon atoms is preferably substituted with a fluorine atom.

Preferred examples of counter anions include the anion moieties mentioned in the explanation of cases in which the counter anion is present in the same structural unit.

Specific examples of structural units including an anion in the present embodiment are shown below, but the present invention is not limited thereto.

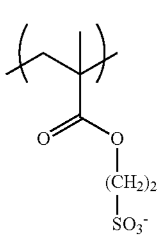

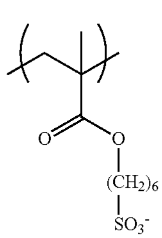

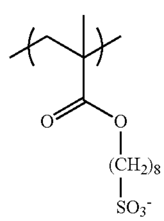

-continued

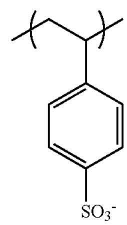

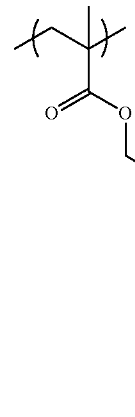

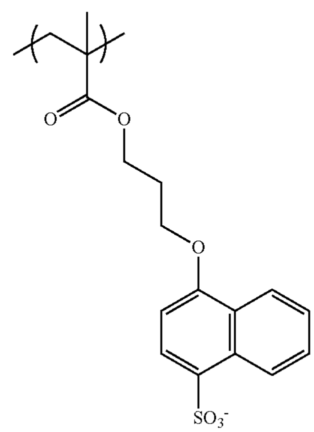

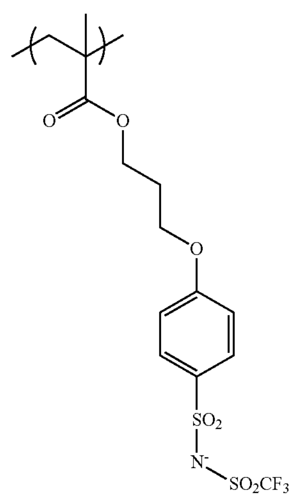

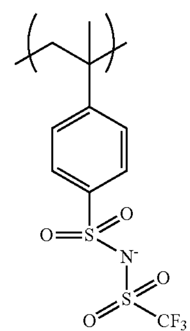

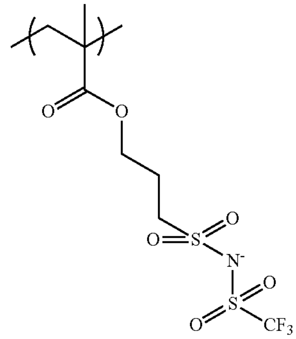

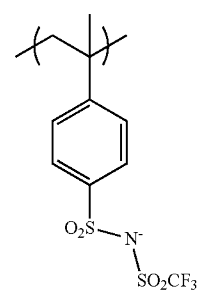

-continued
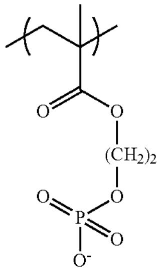
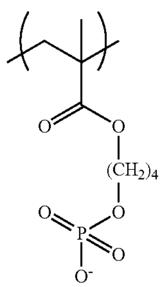
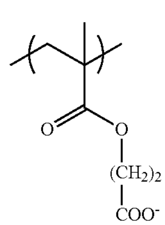
-continued
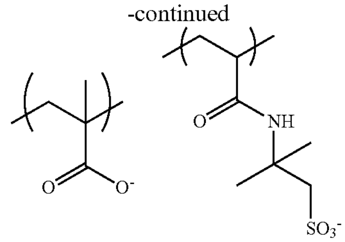
The following specific examples show the state where the anion structures are not dissociated. It should be understood that a state where the anion structures are dissociated is also included in the scope of the present invention.
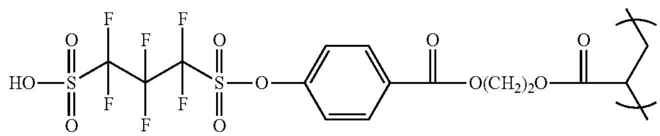
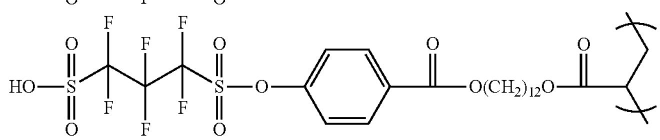
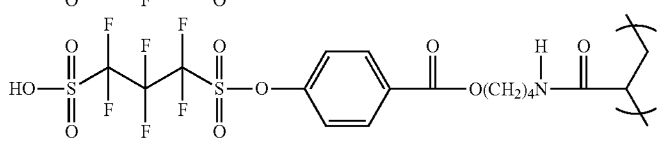
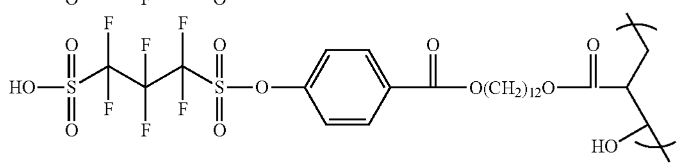
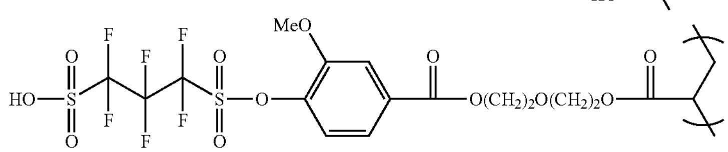
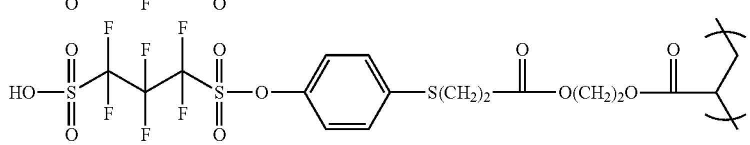
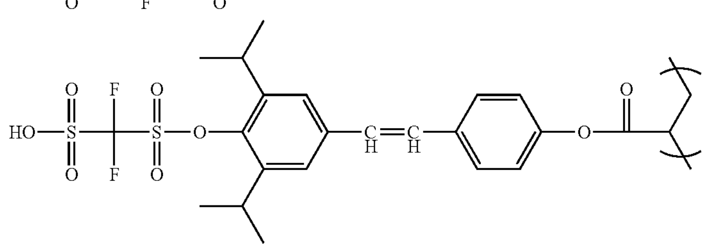
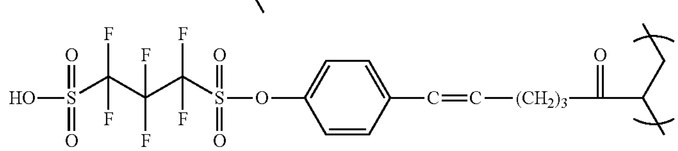
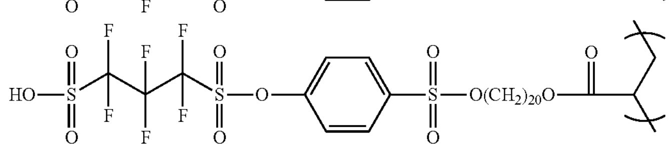

-continued
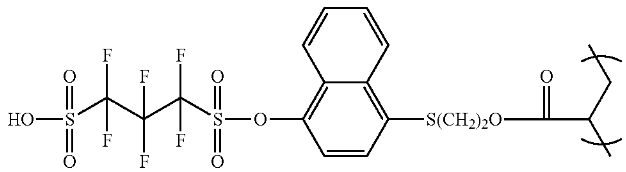
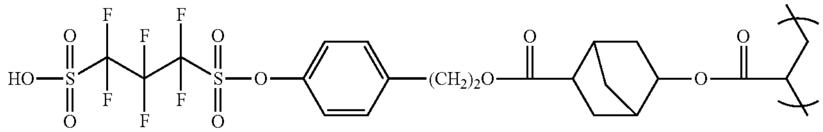
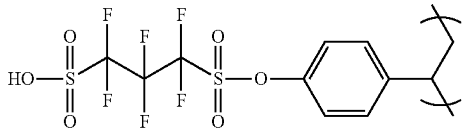
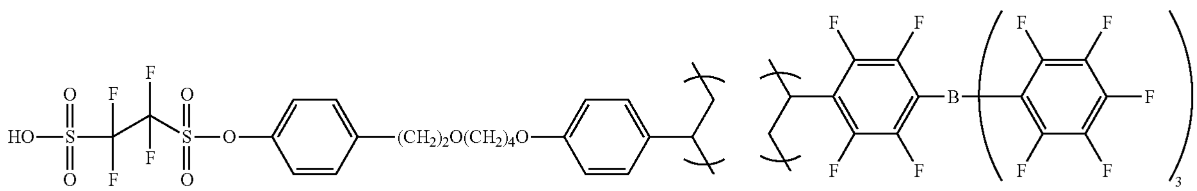
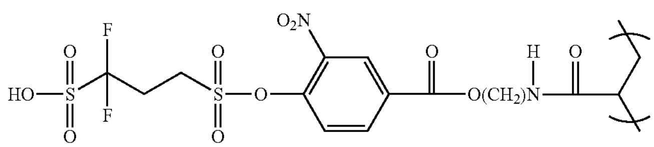
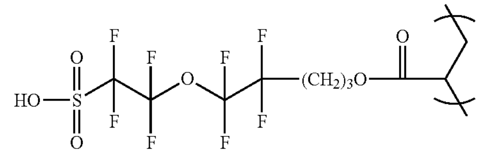
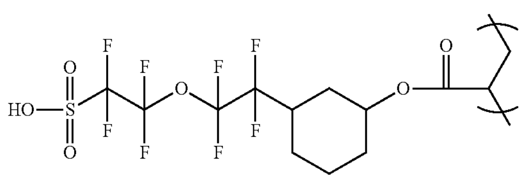
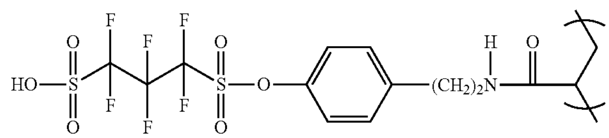
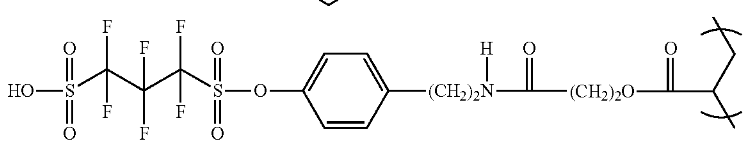
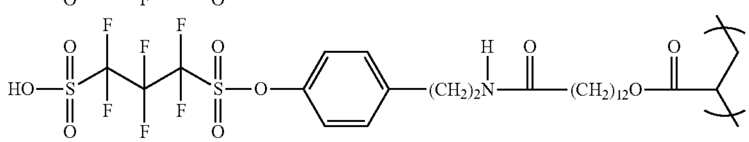
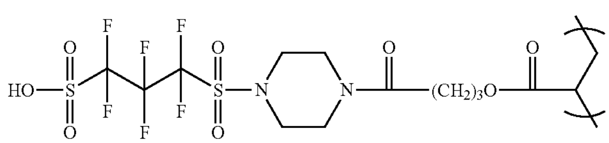
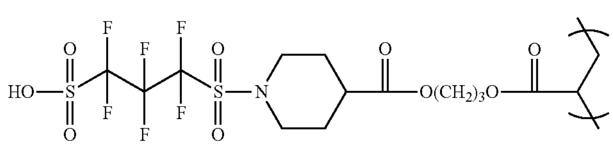
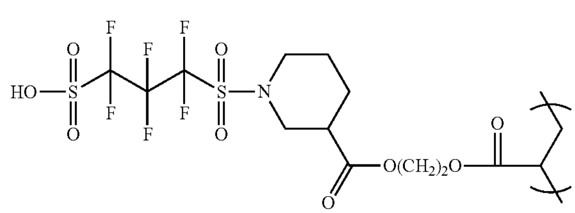
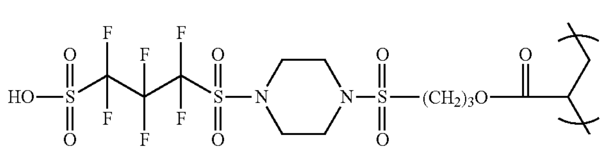
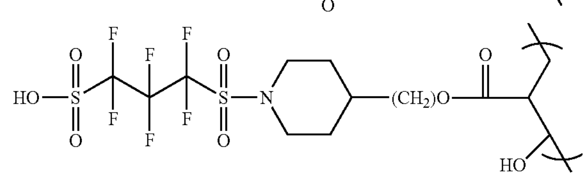

-continued
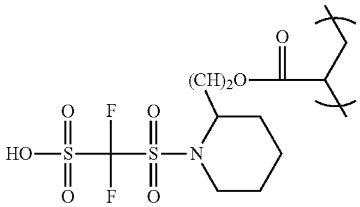
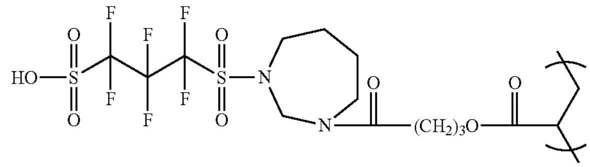
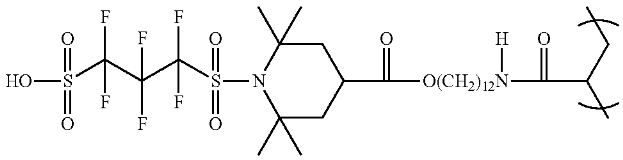
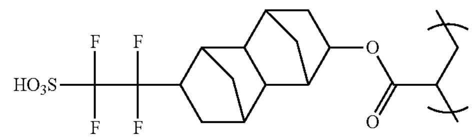
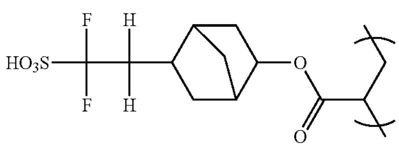
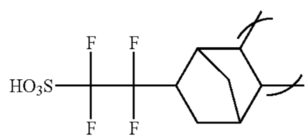
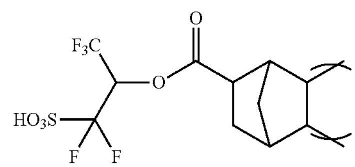
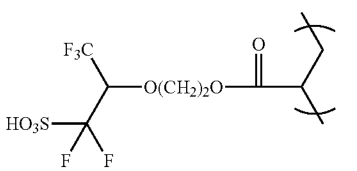
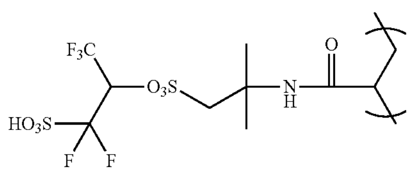
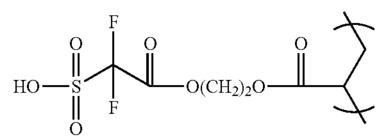
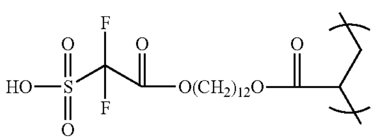
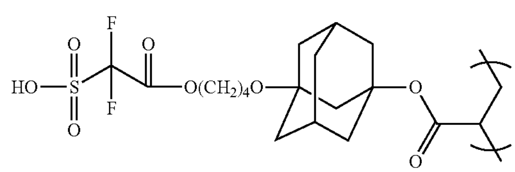
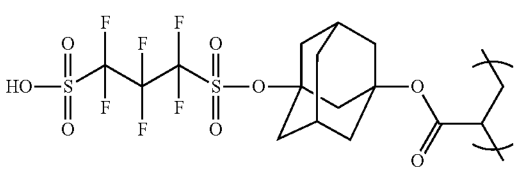
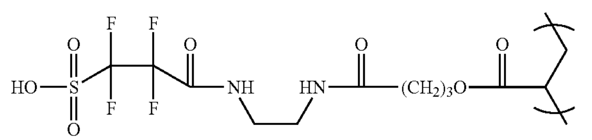
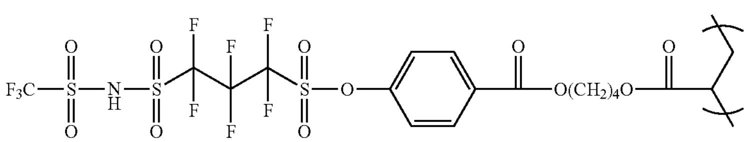
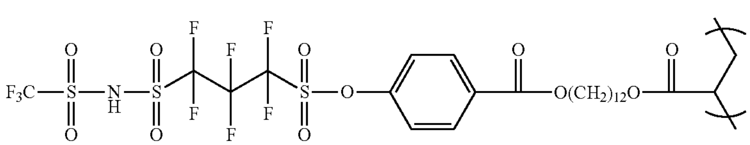
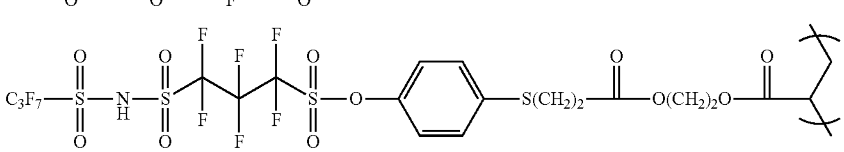
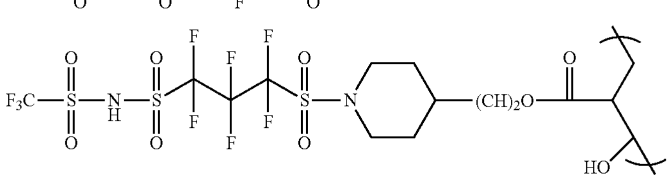

-continued
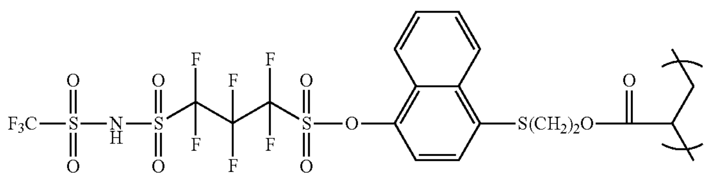
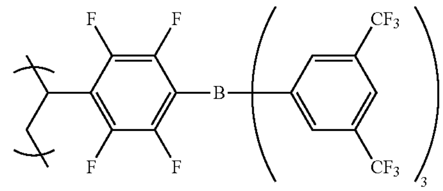
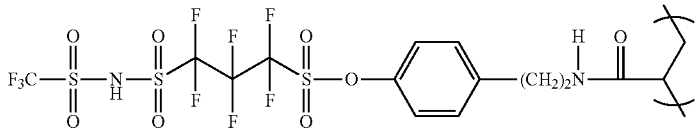
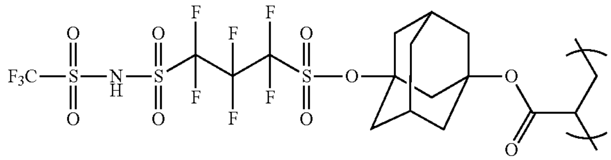
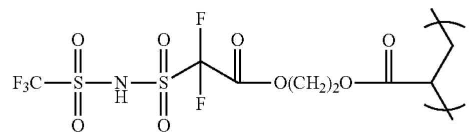
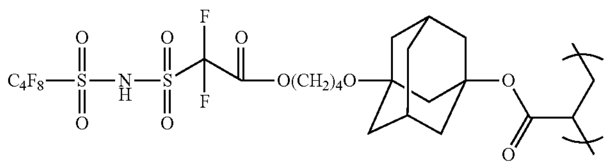
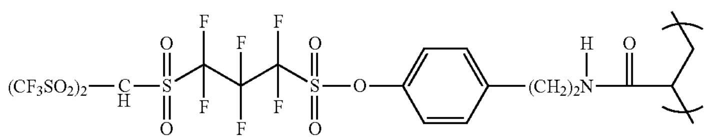
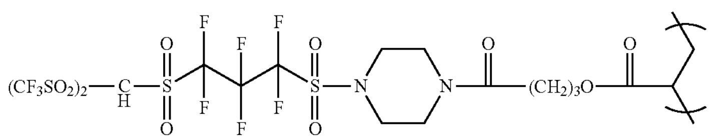
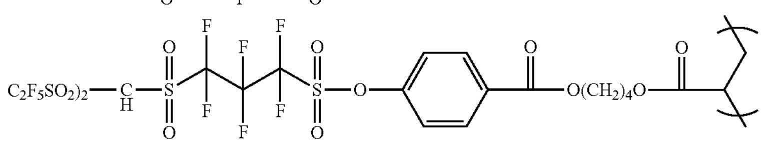
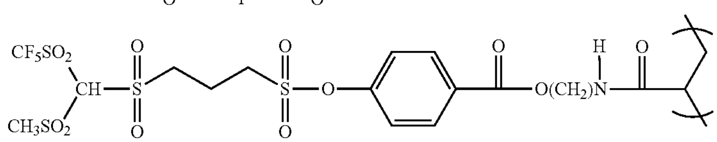
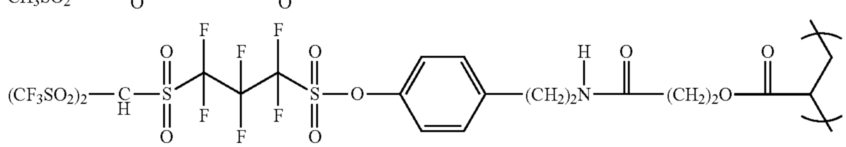
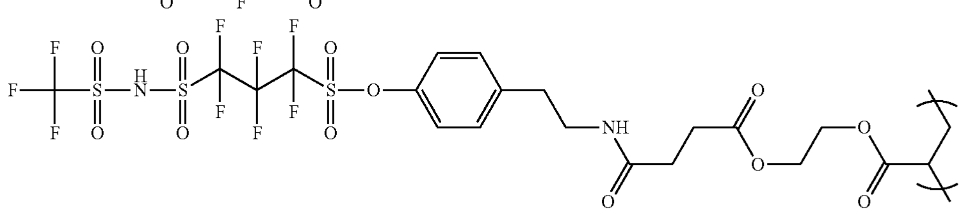
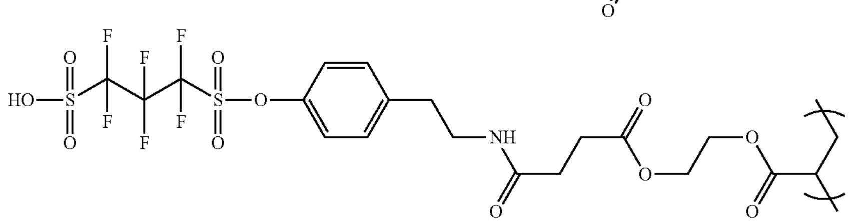

-continued

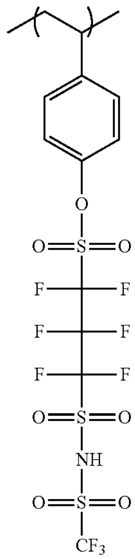
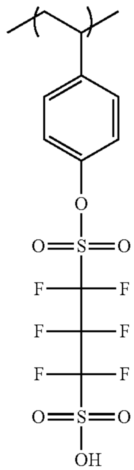
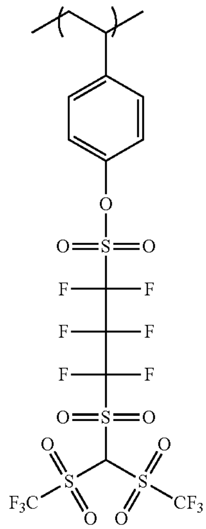
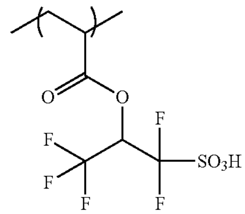
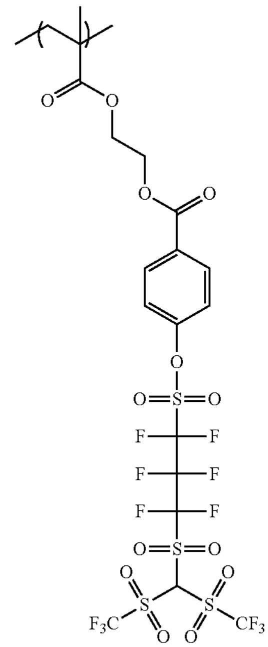
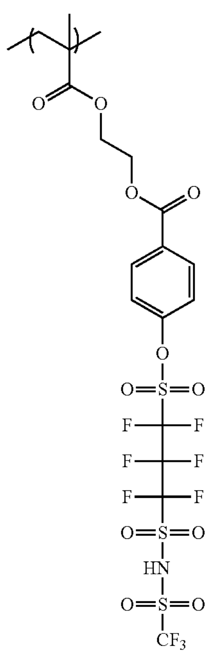
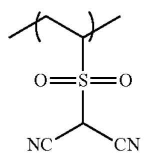
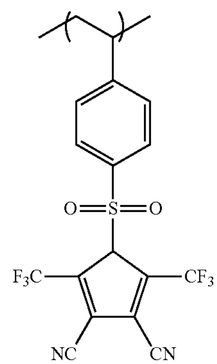

Examples of structural units including a colorant structure used in the present invention are shown below, and it should be understood that the present invention is not limited thereto. $X^-$ represents a counter anion. It should be understood that although some X's are shown to be in a state where the anion structures are undissociated, but a state where the anion structures are dissociated is also included in the scope of the present invention.

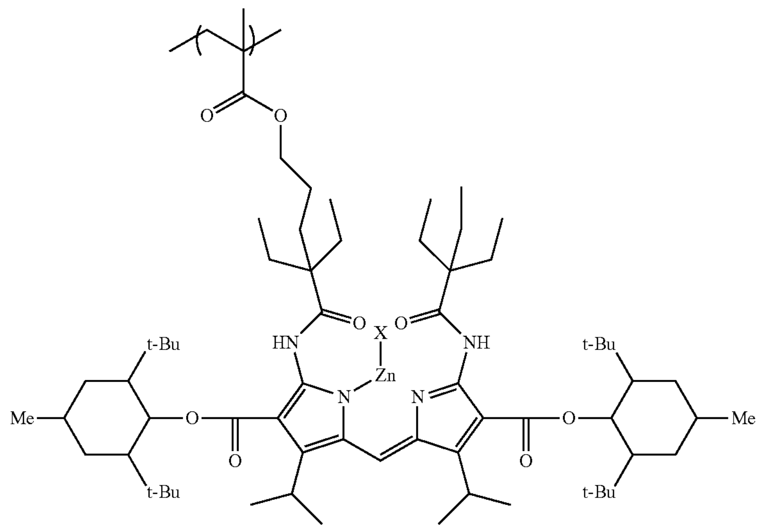
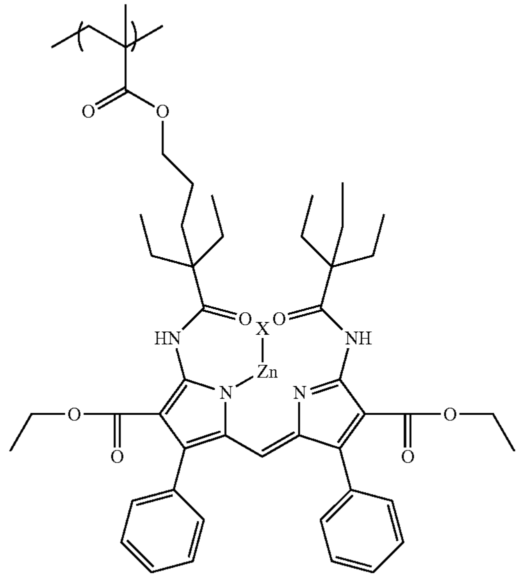
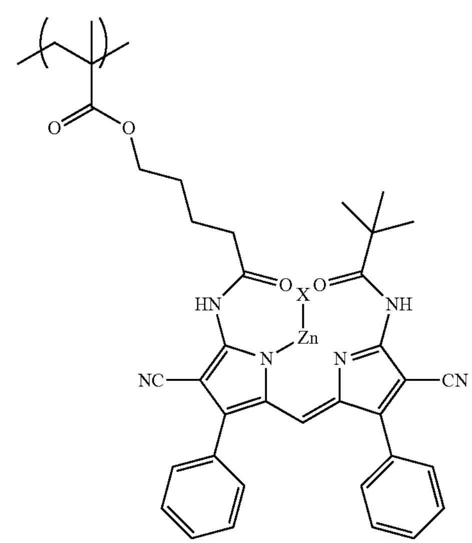
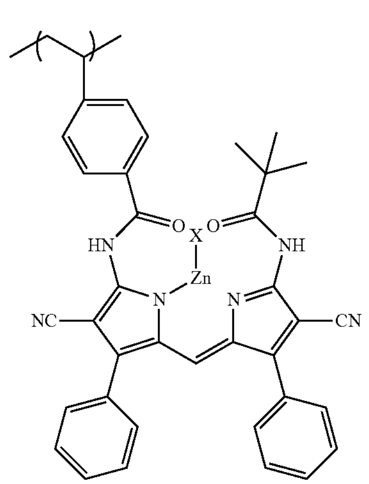
(A-tp-1)
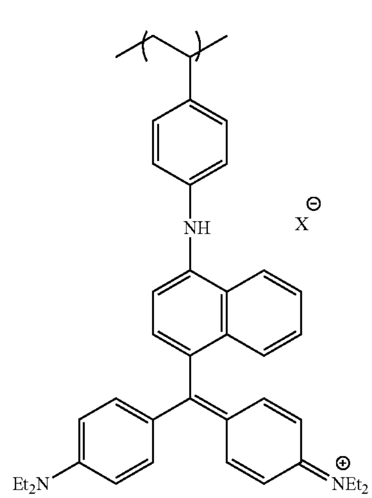

-continued
(A-tp-2)
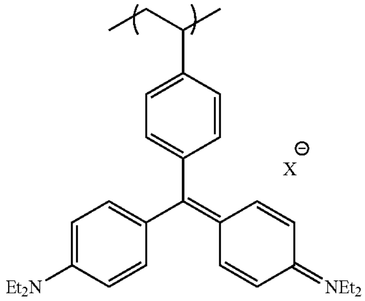
(A-tp-3)
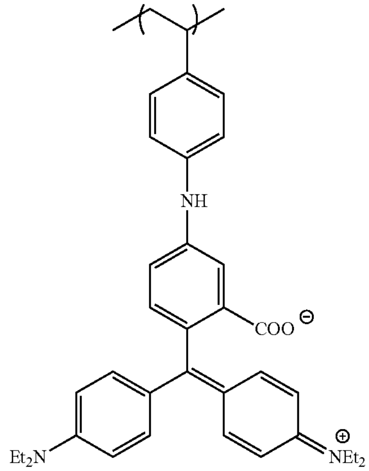
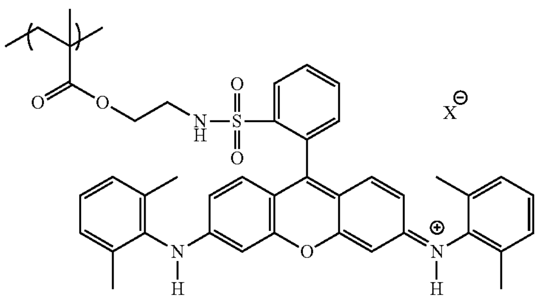
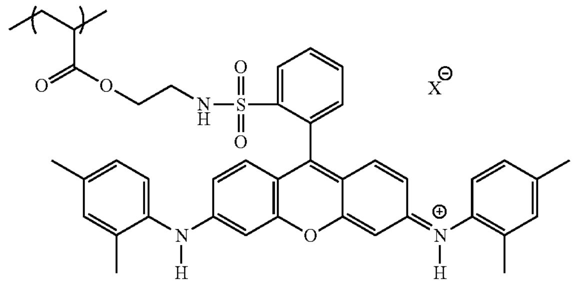
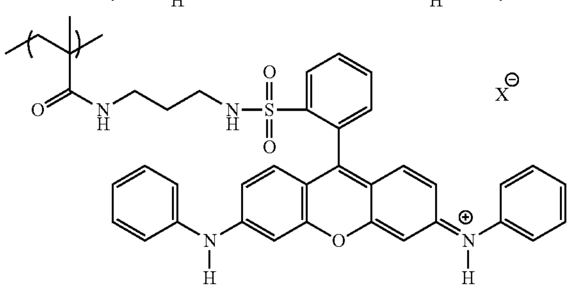
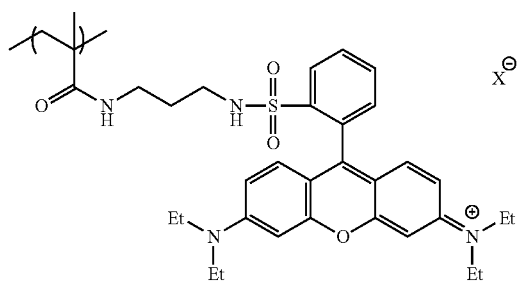
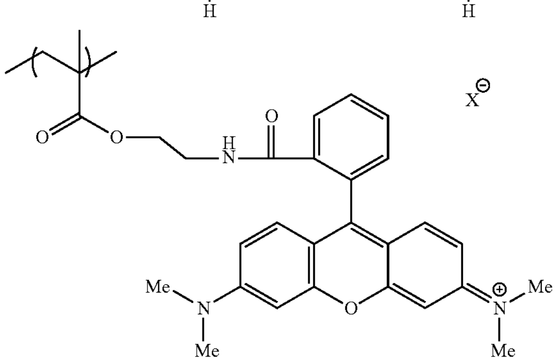
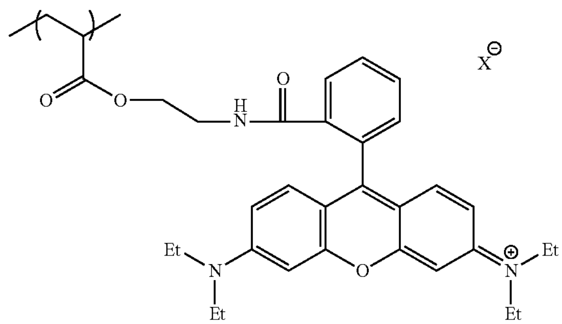
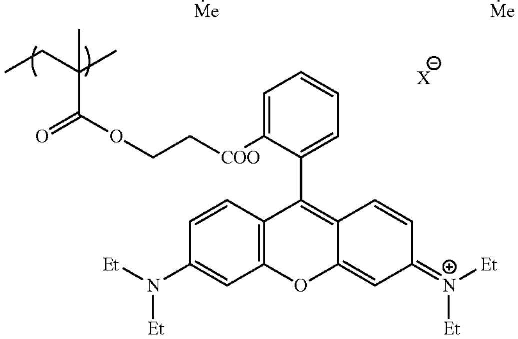
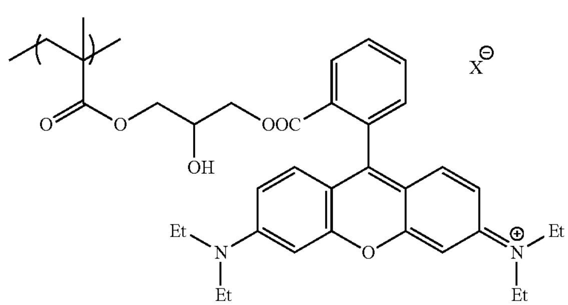

-continued
(a-xt-1)
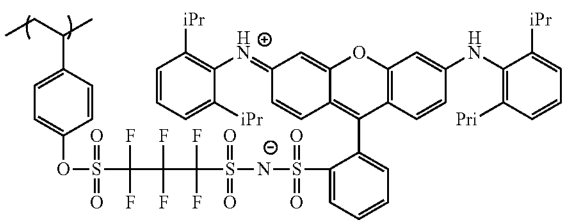
(a-xt-2)
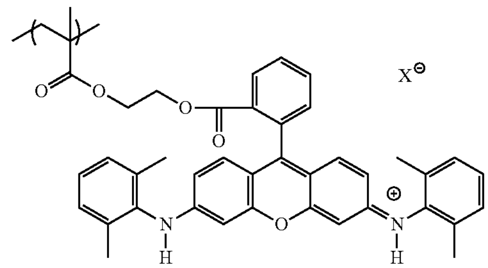
(a-xt-3)
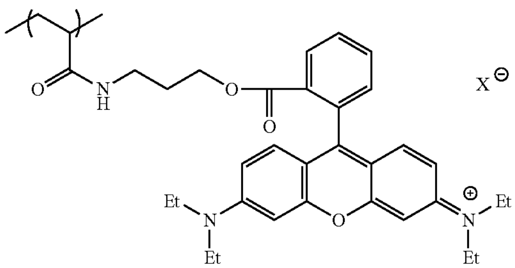
(a-xt-4)
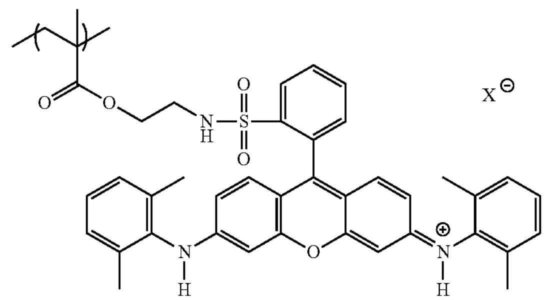
(a-xt-5)
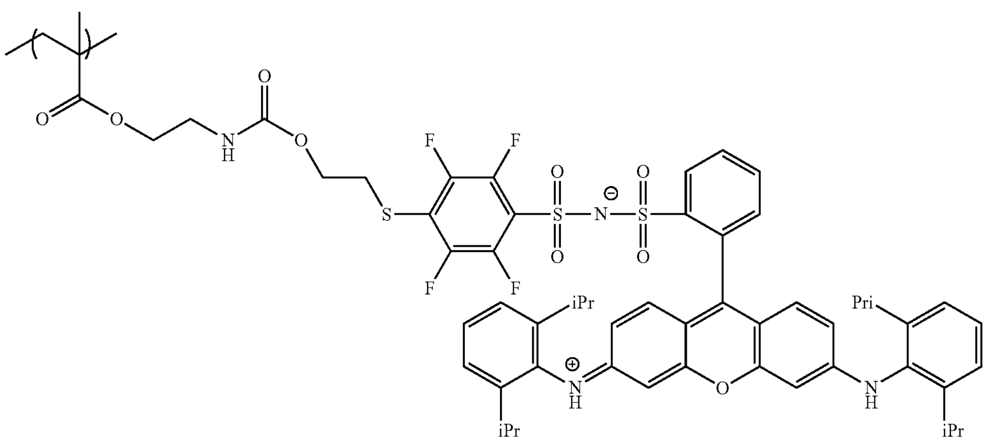
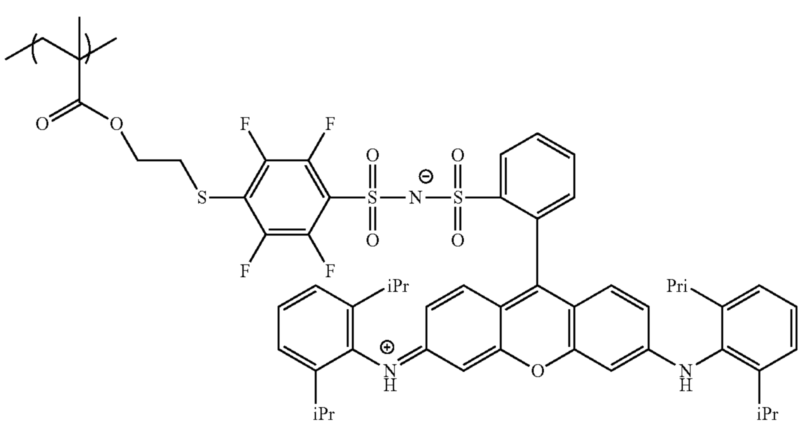

-continued
(a-xt-9)
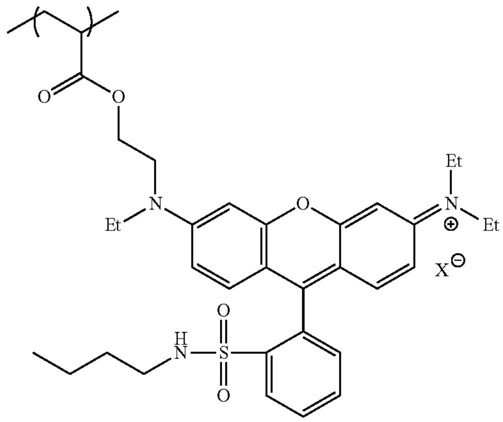
(a-xt-10)
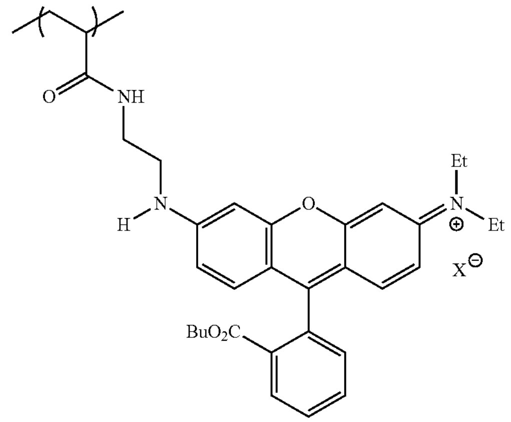
(a-xt-11)
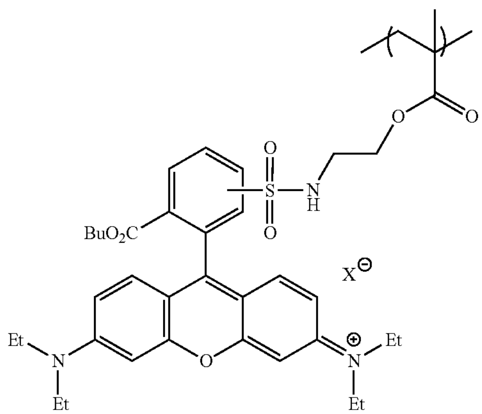
(a-xt-12)
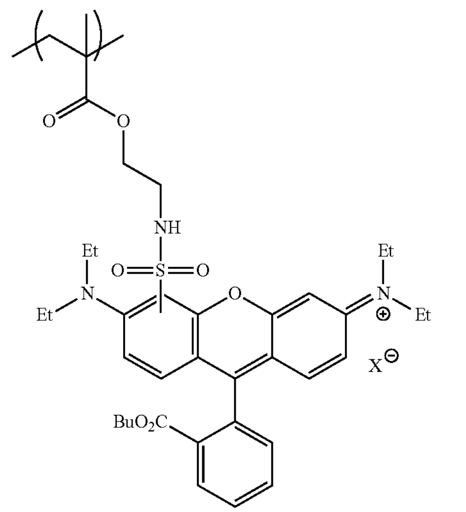
(A-1)
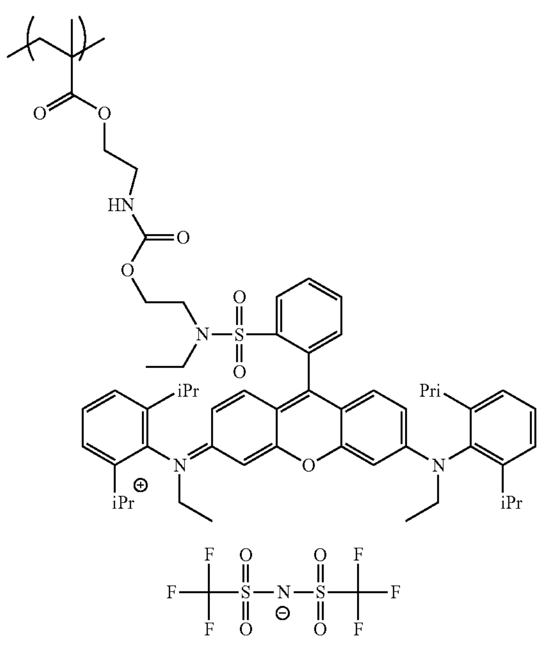
(A-2)
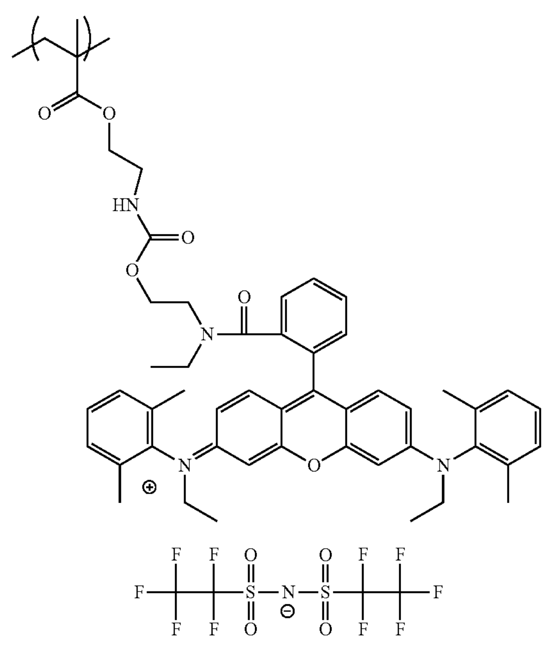

-continued
(A-3)
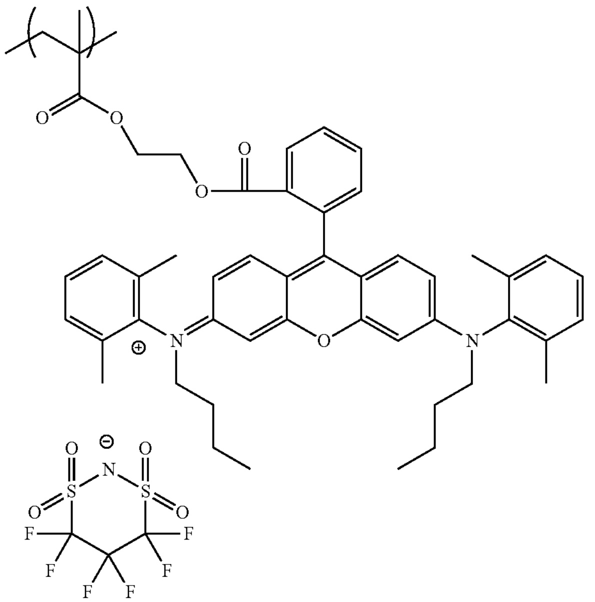
(A-4)
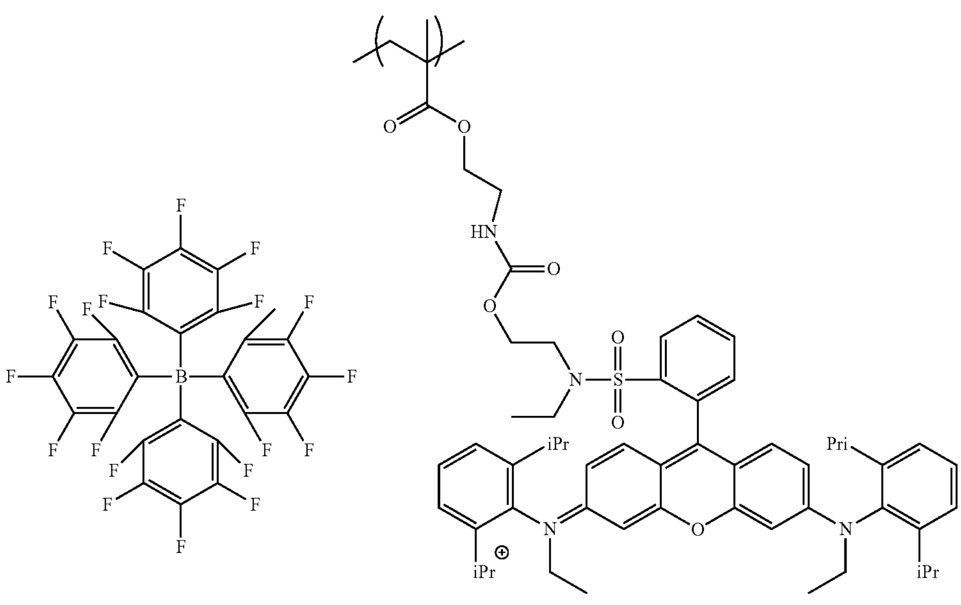

-continued
(A-5)
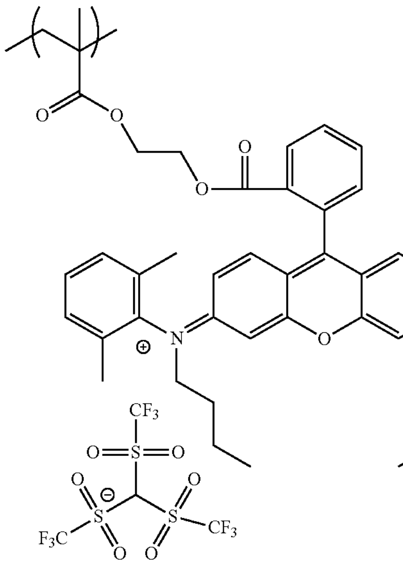
(A-6)
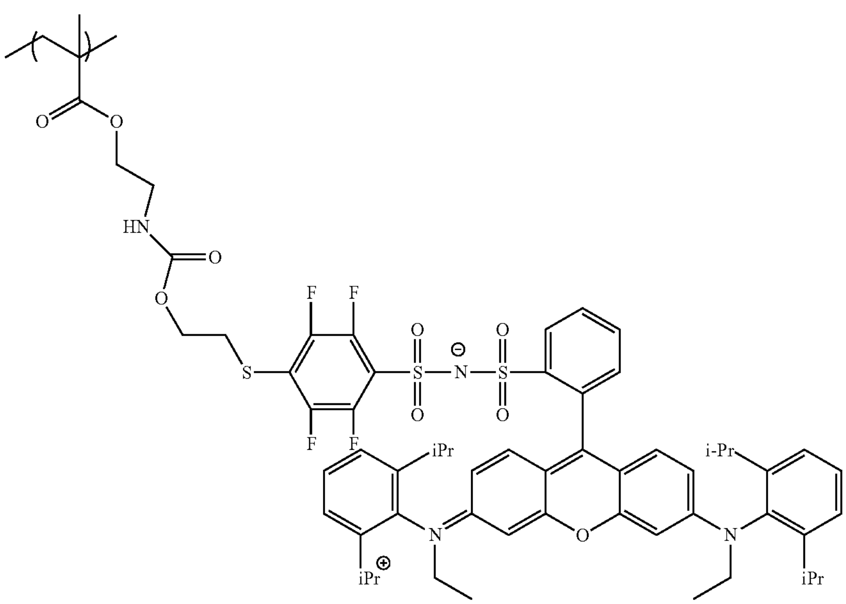

-continued
(A-7)
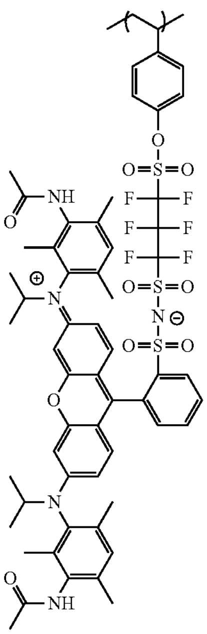
(A-8)
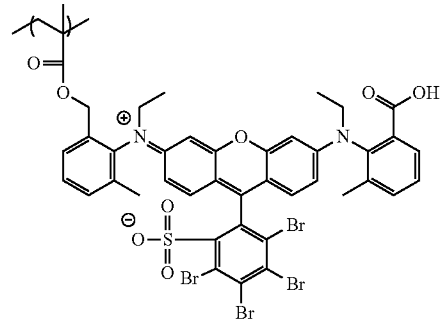
(A-9)
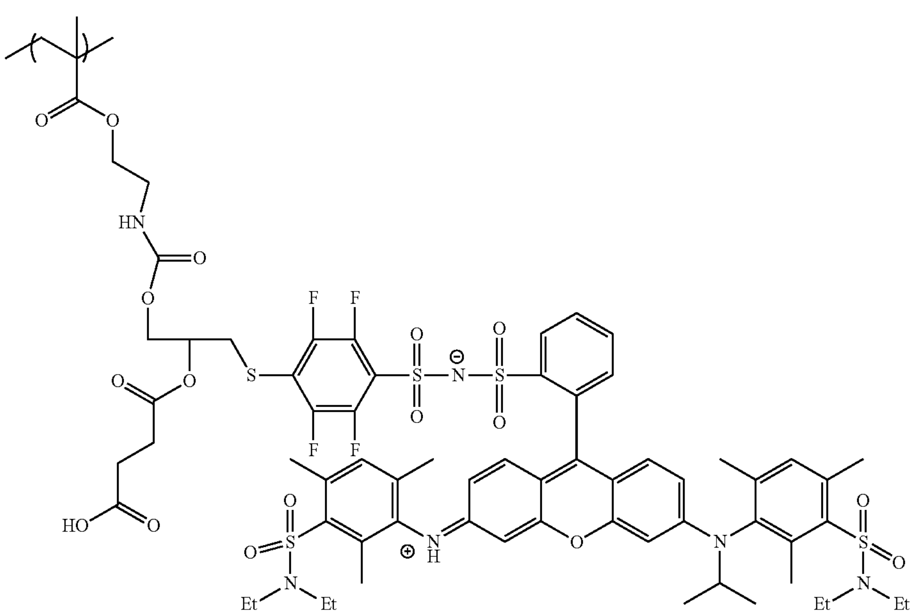

-continued
(A-10)
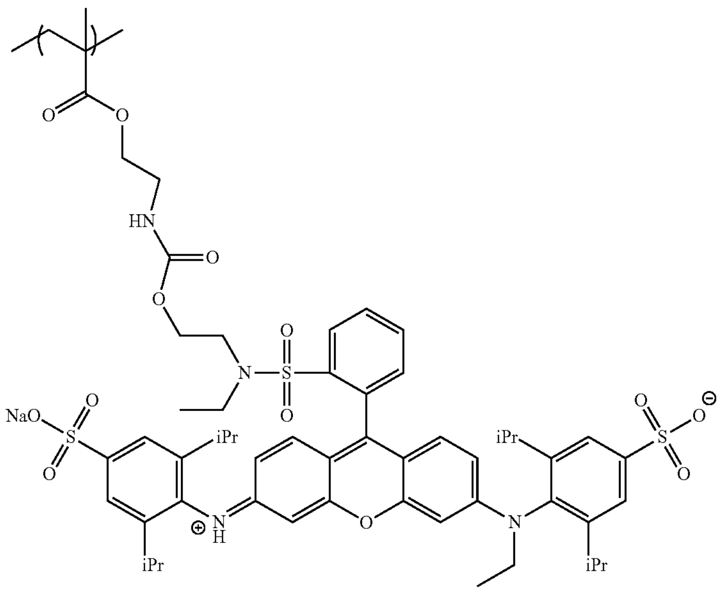
(A-11)
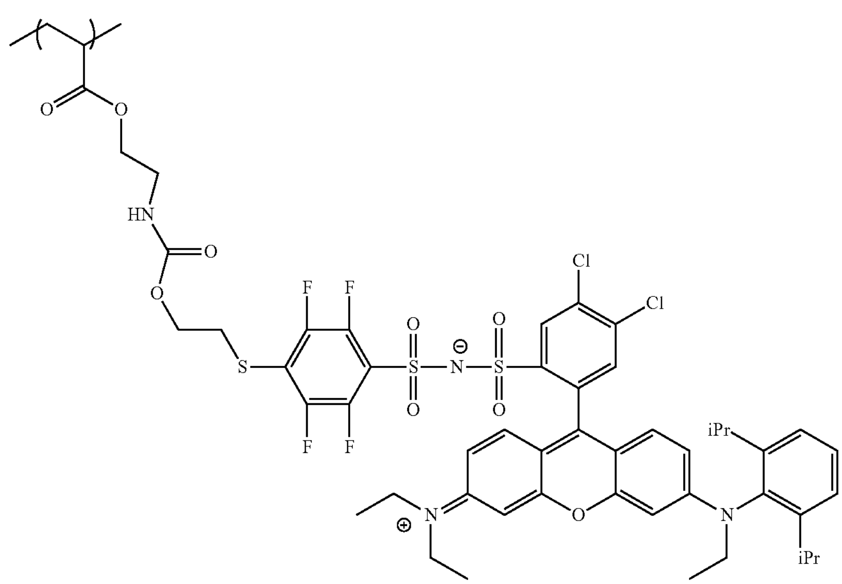

-continued
(A-12)
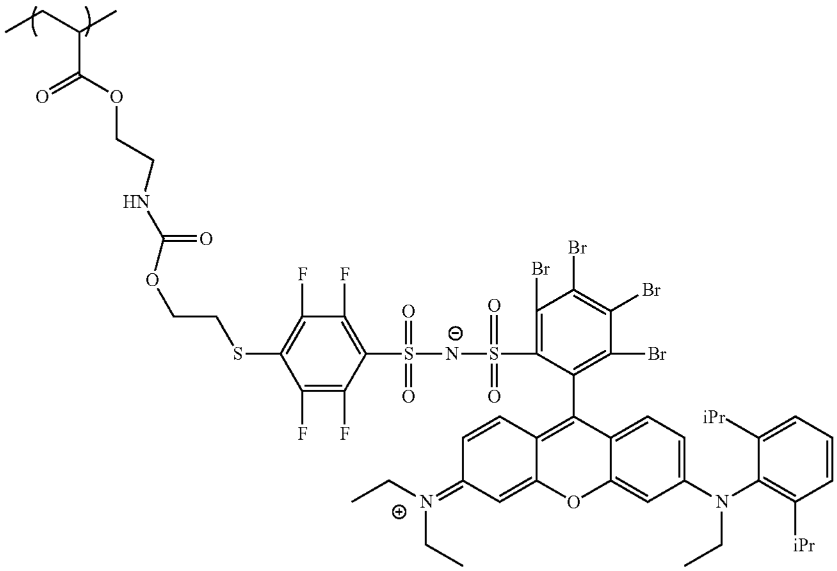
(A-13)
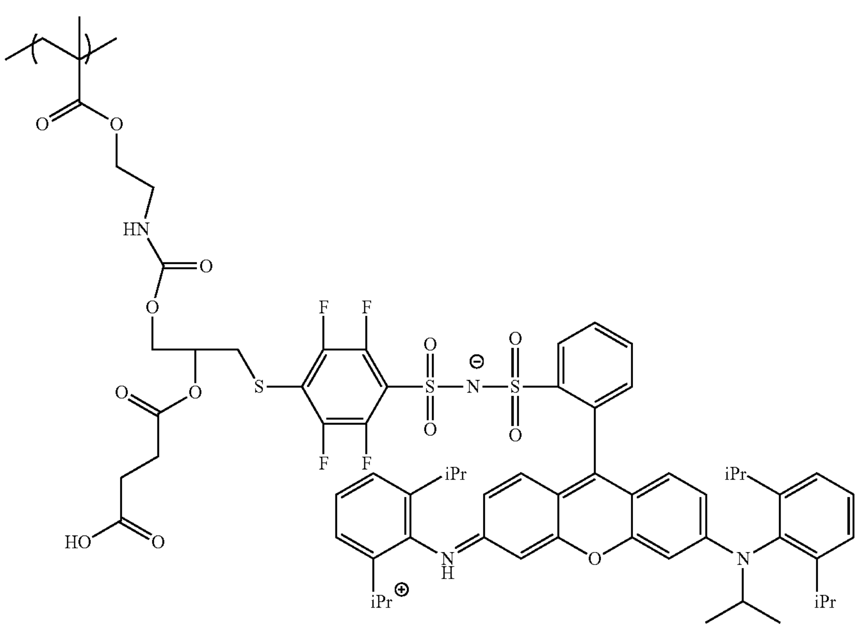

-continued
(A-14)
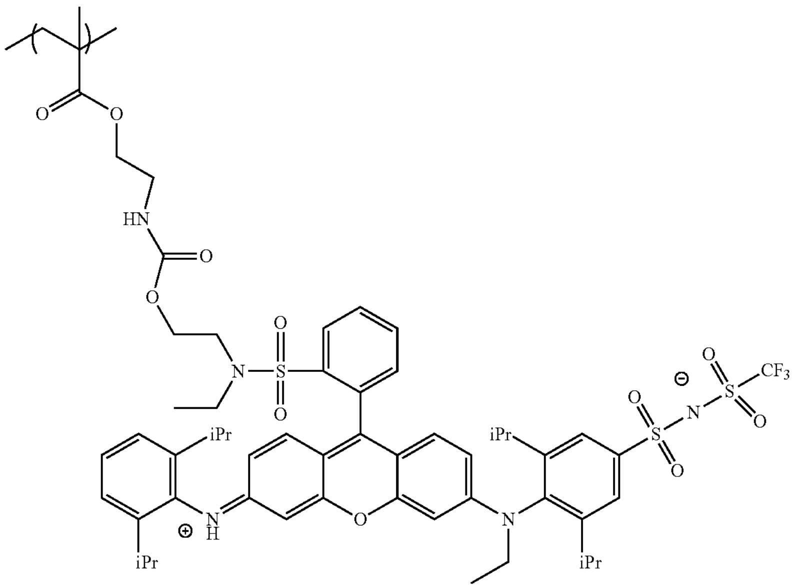
(A-15)
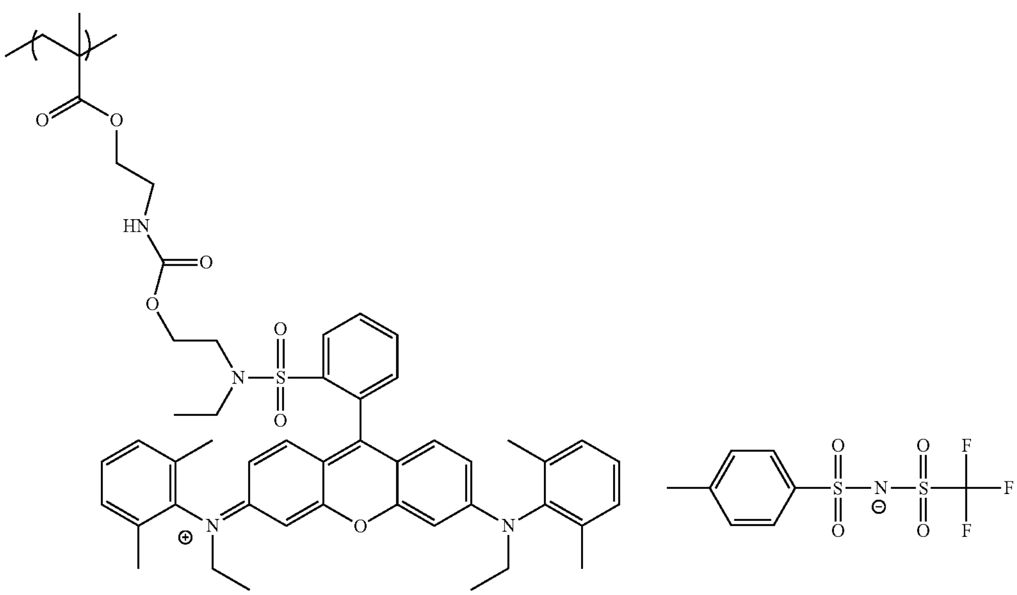
(A-pm-1)
(A-pm-2)
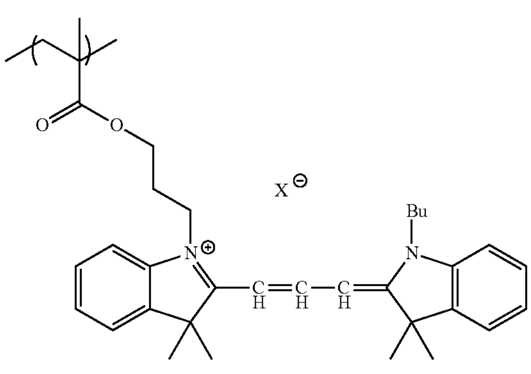
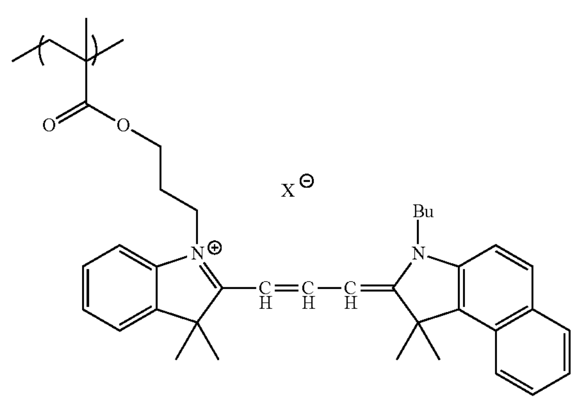

-continued
(A-pm-3)
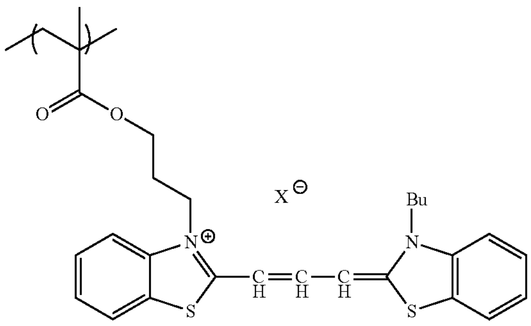
(A-pm-4)
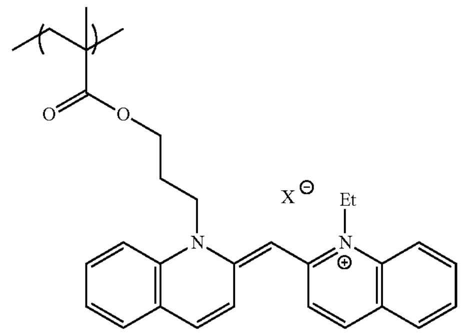
(A-SP-1)
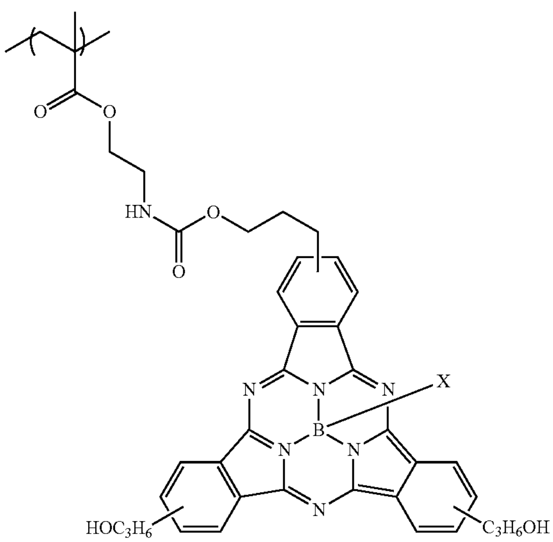
(A-SP-2)
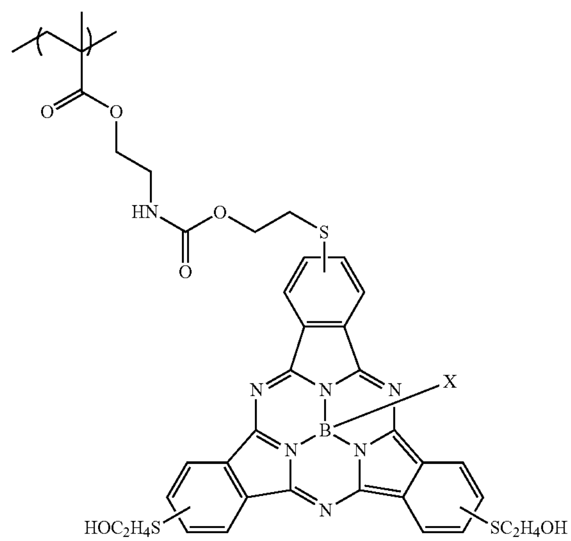
(A-SP-3)
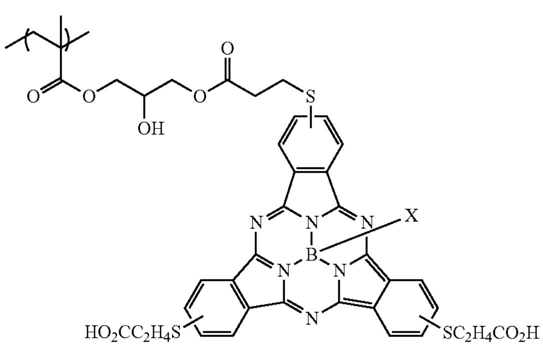
(A-SP-4)
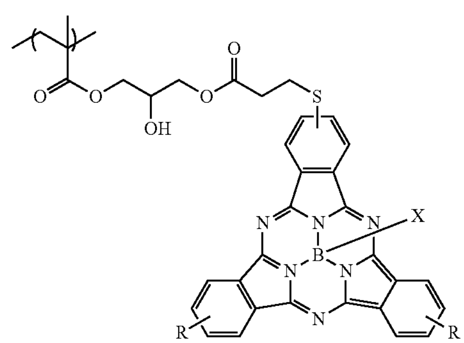

-continued
(B-dp-1)
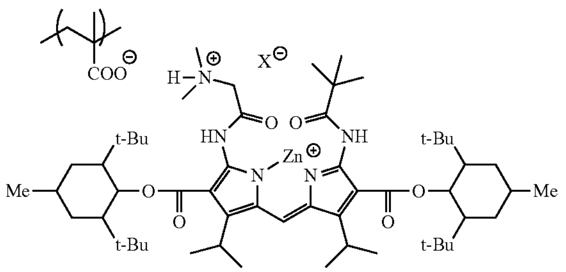
(B-pm-1)
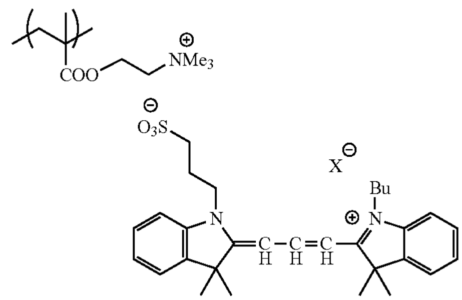
(B-xt-1)
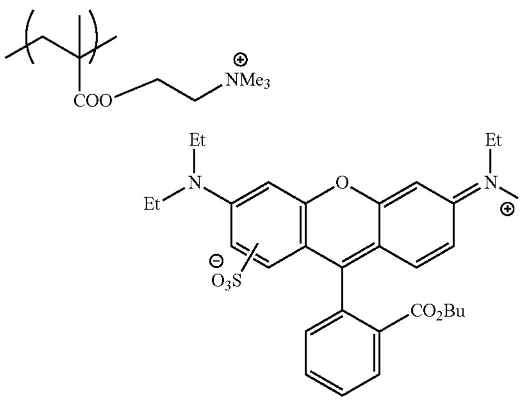
(B-xt-2)
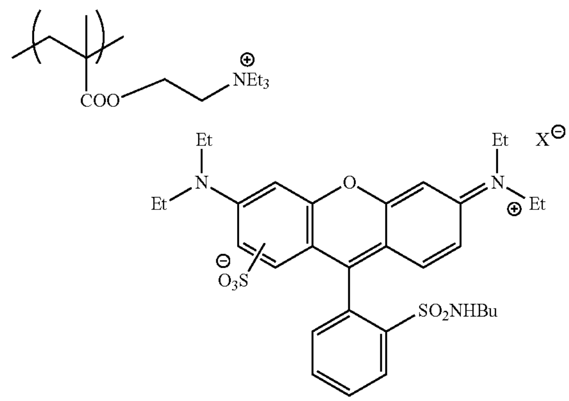
(C-dp-1)
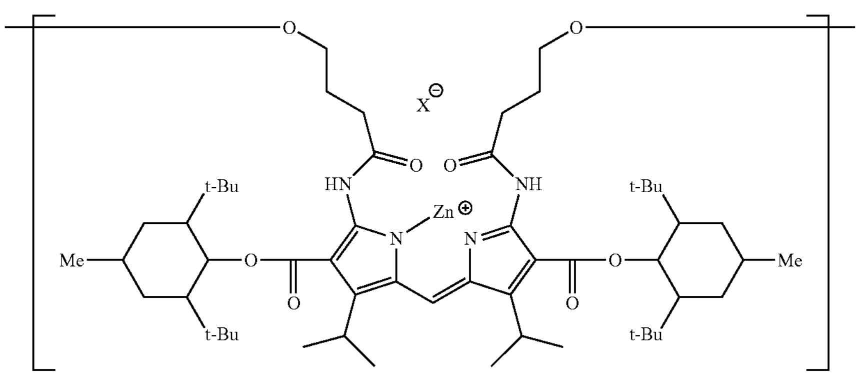
(C-xt-1)
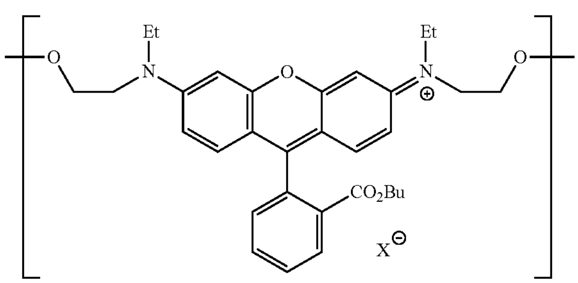
(C-xt-2)
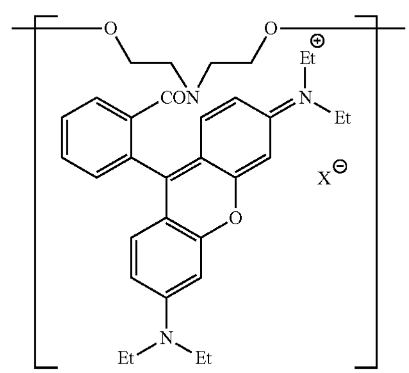
Examples of the structural units including a colorant structure also include structural units derived from any one of the following exemplary compound M-17 to M-37, M-39, M-40, or M-43.

M-17
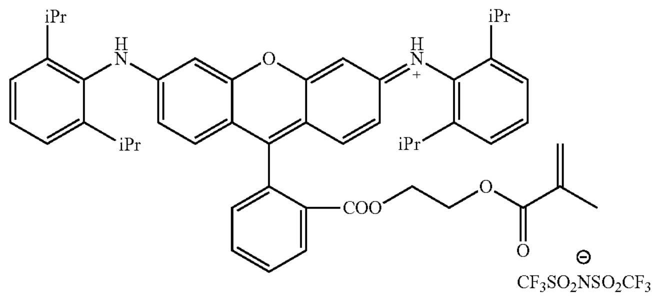
M-18
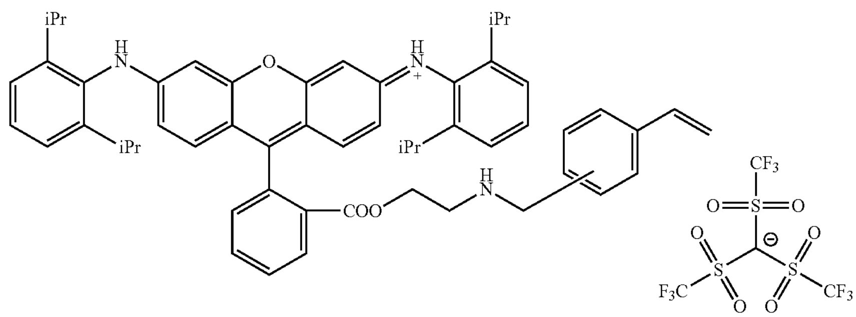
M-19
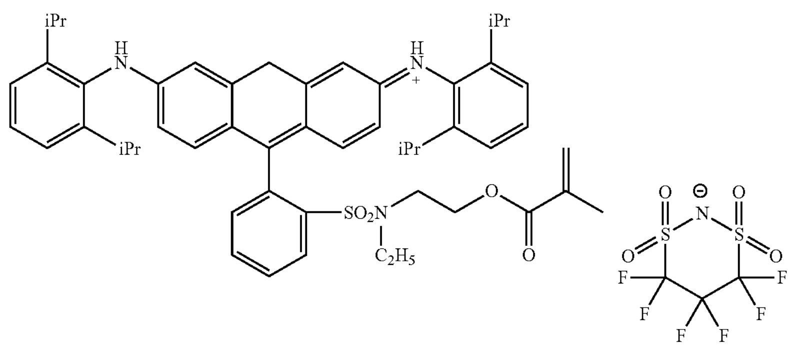
M-20
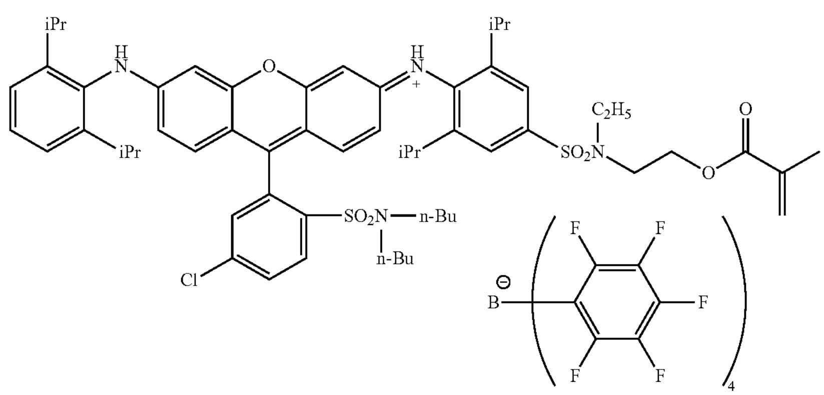
M-21
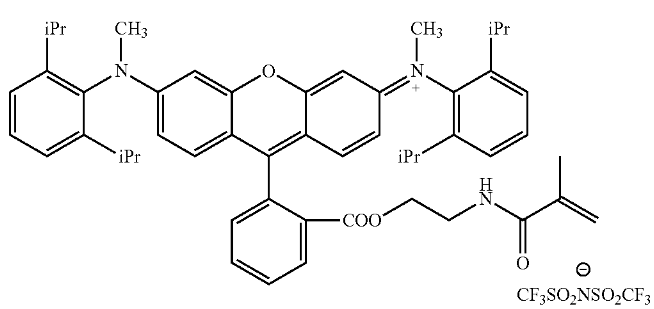

-continued
M-22
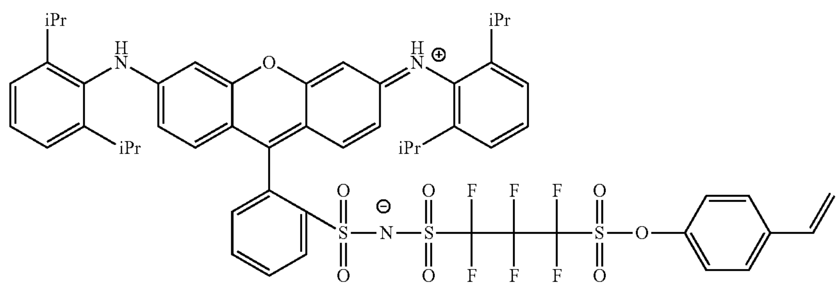
M-23
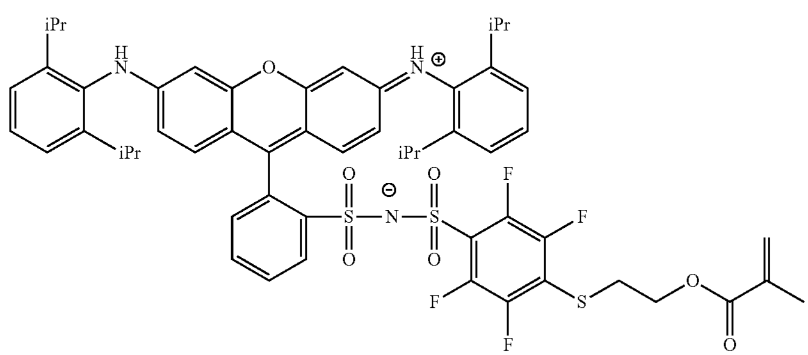
M-24
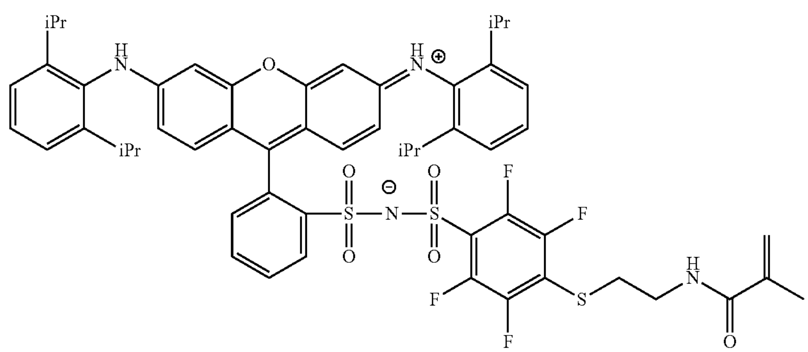
M-25
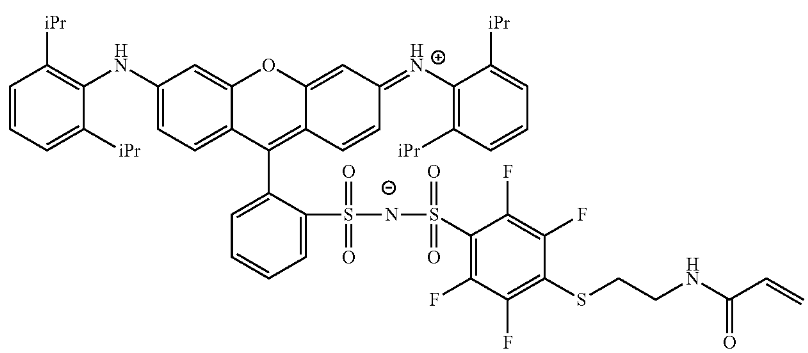

-continued
M-26
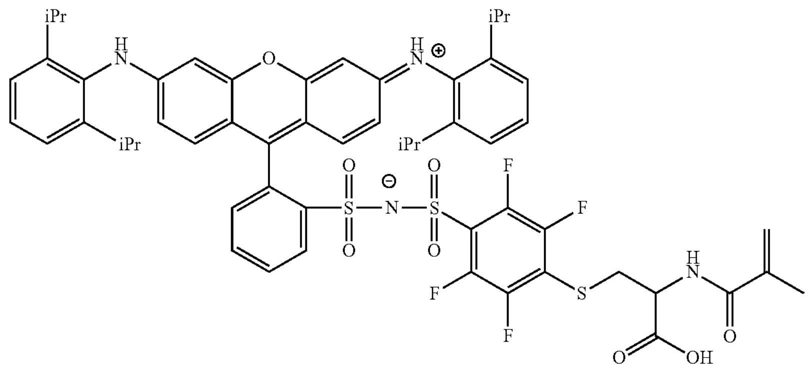
M-27
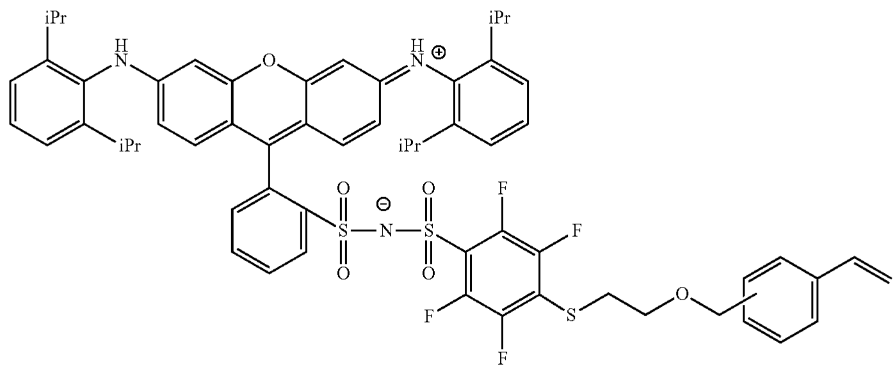
M-28
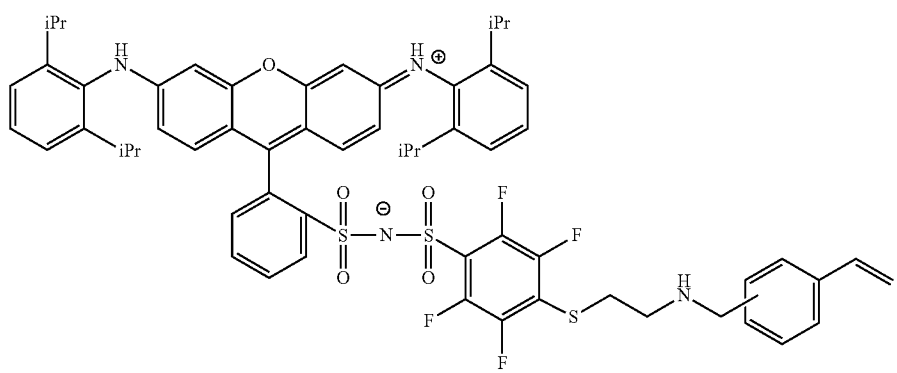
M-29
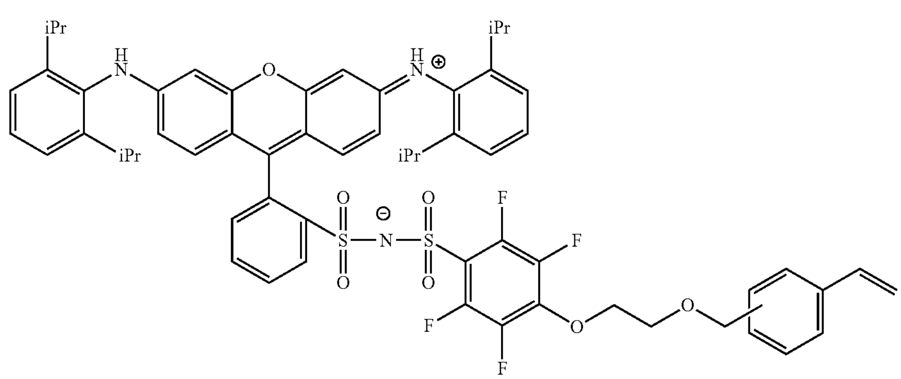

-continued
M-30
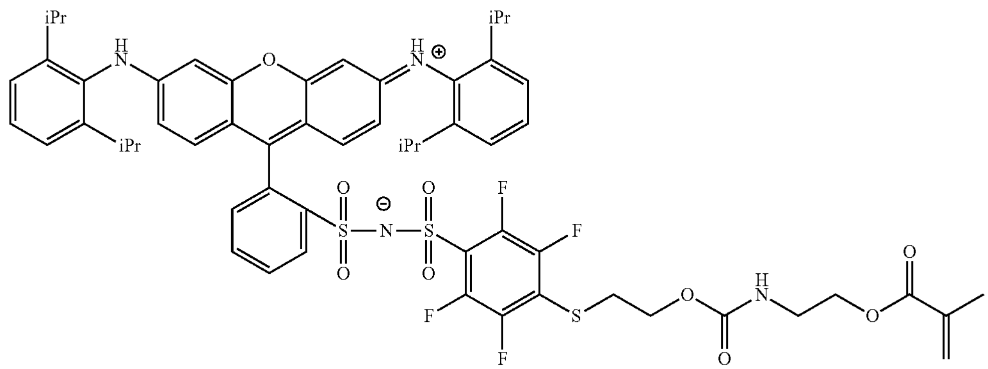
M-31
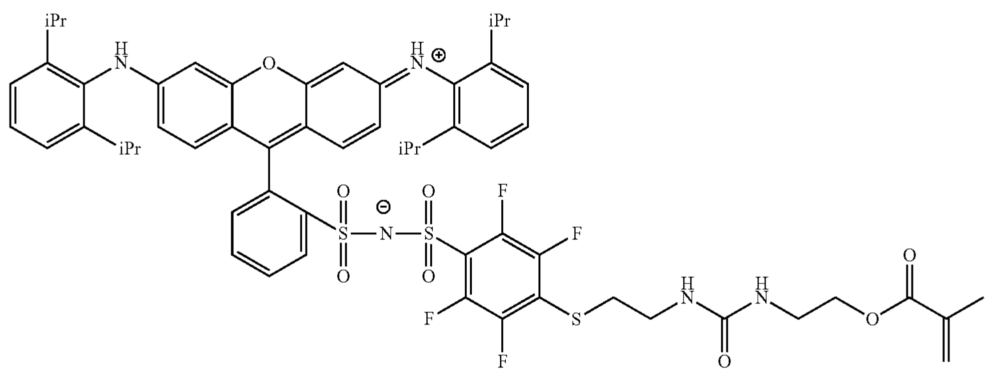
M-32
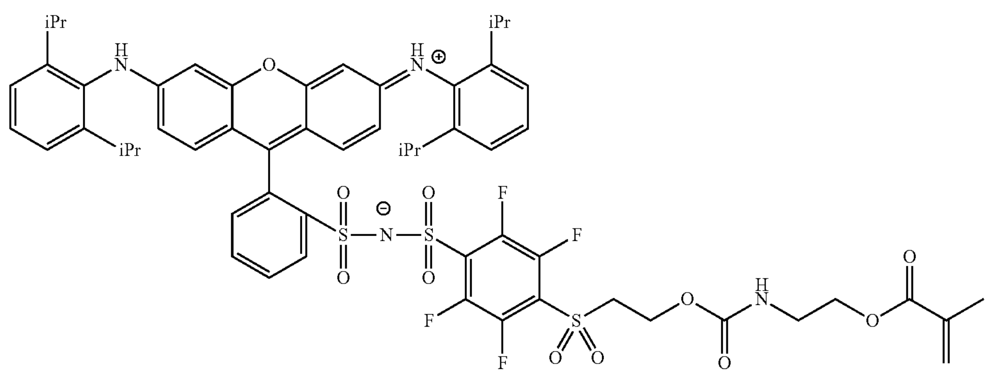
M-33
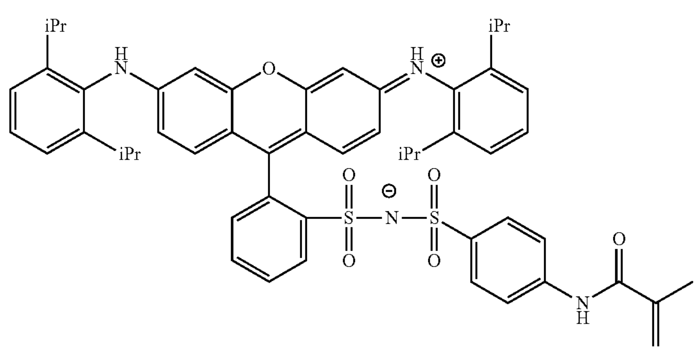

-continued
M-34
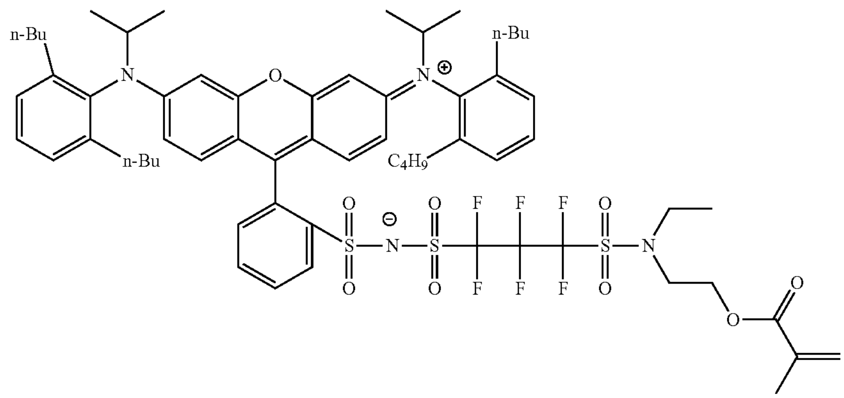
M-35
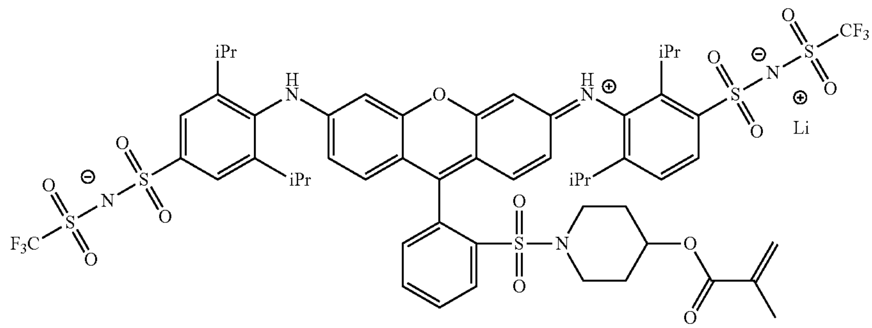
M-36
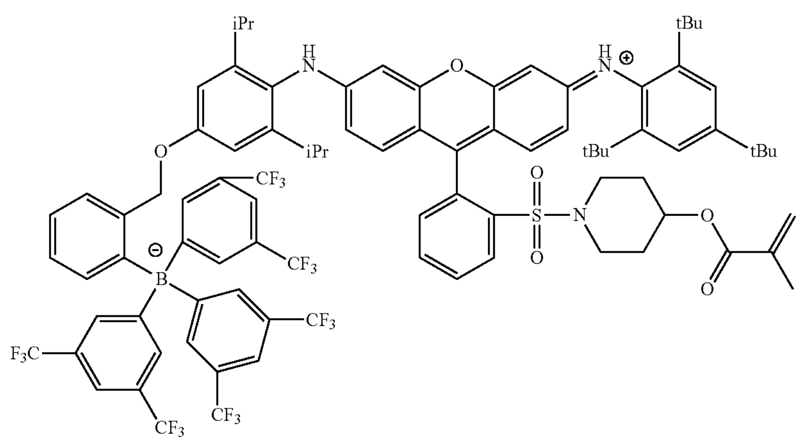
M-37
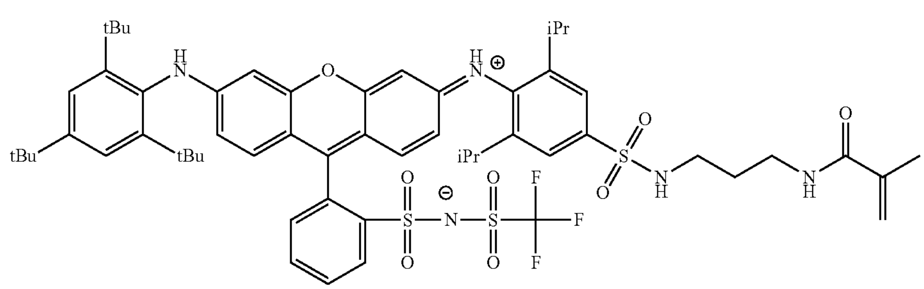

-continued
M-39
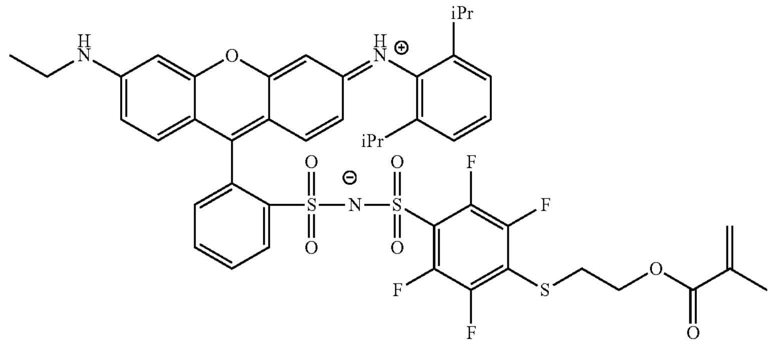
M-40
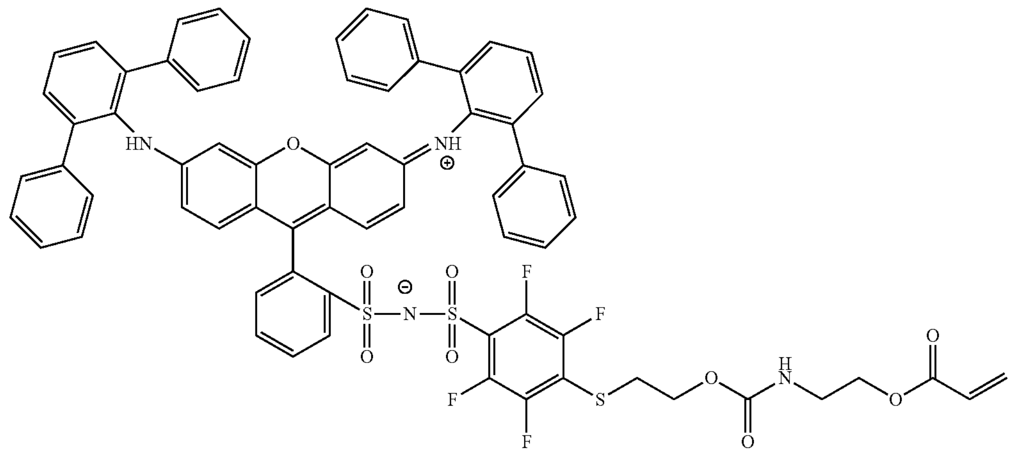
M-43
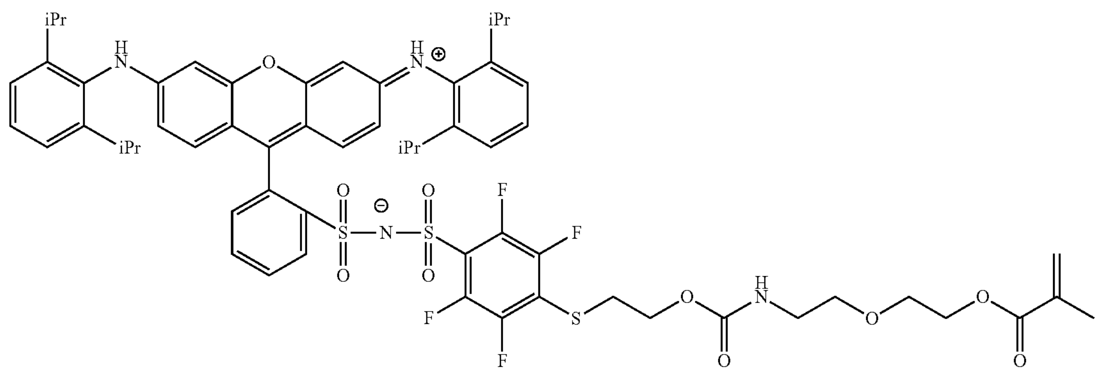
M-44
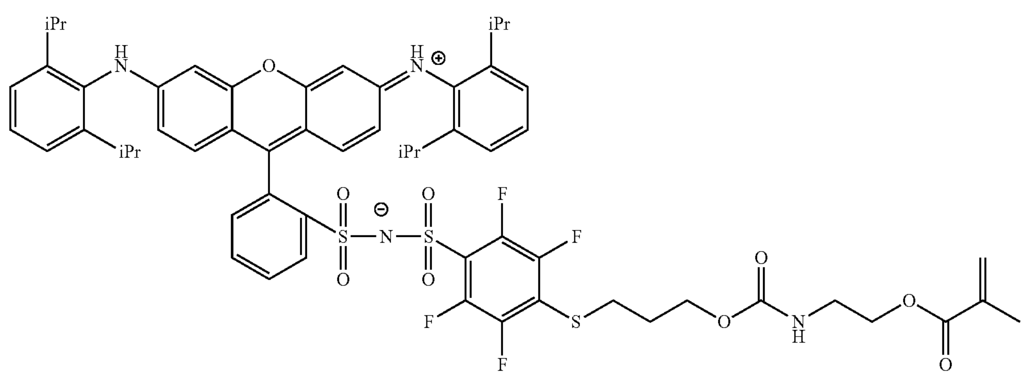

-continued
M-45
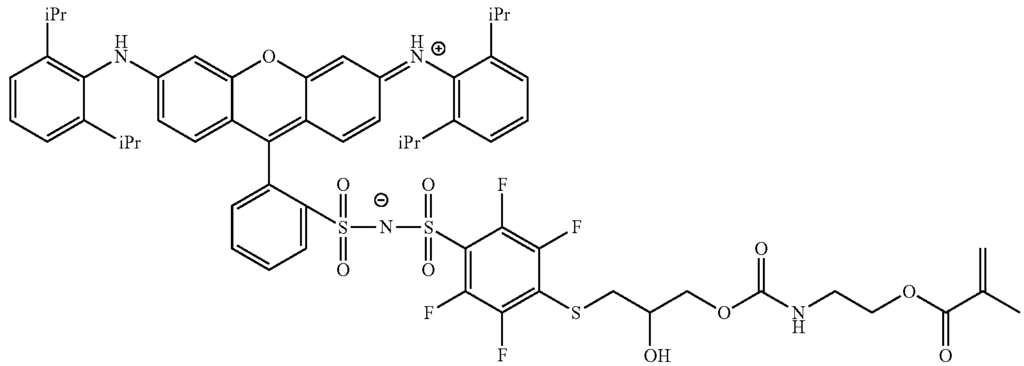
M-46
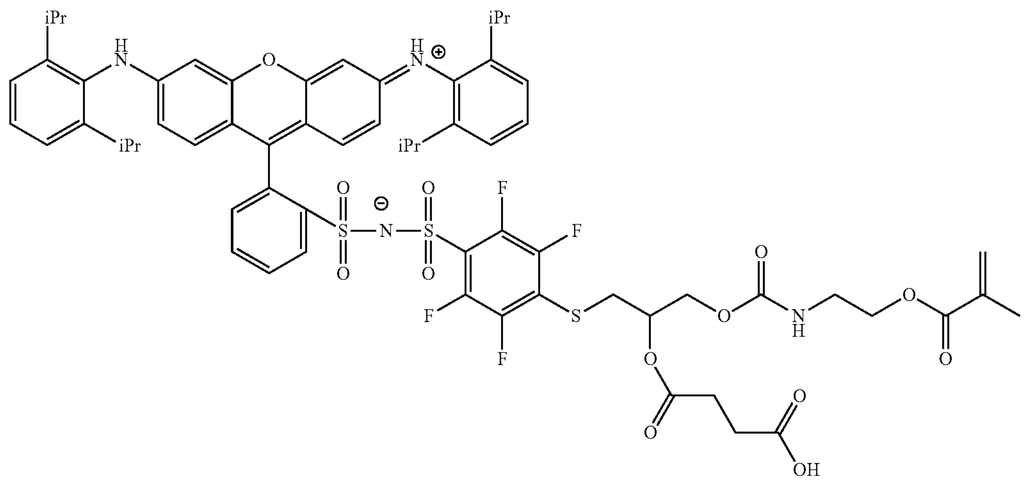
M-47
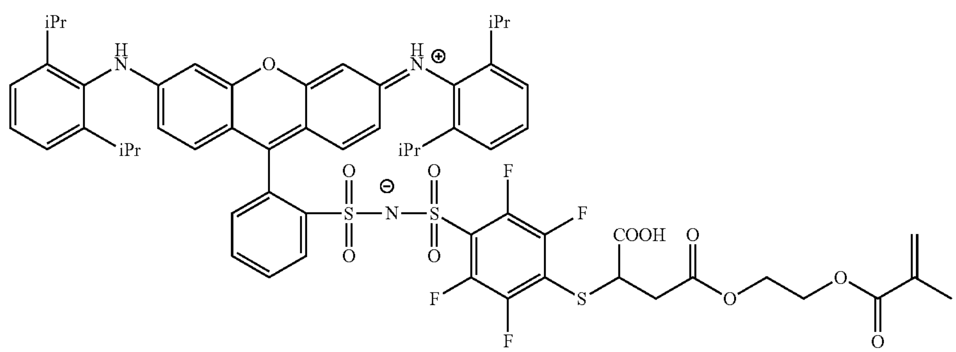
M-48
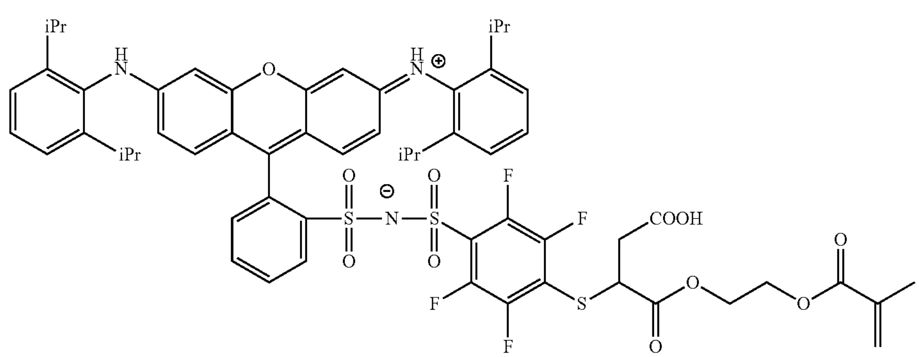

-continued

M-49

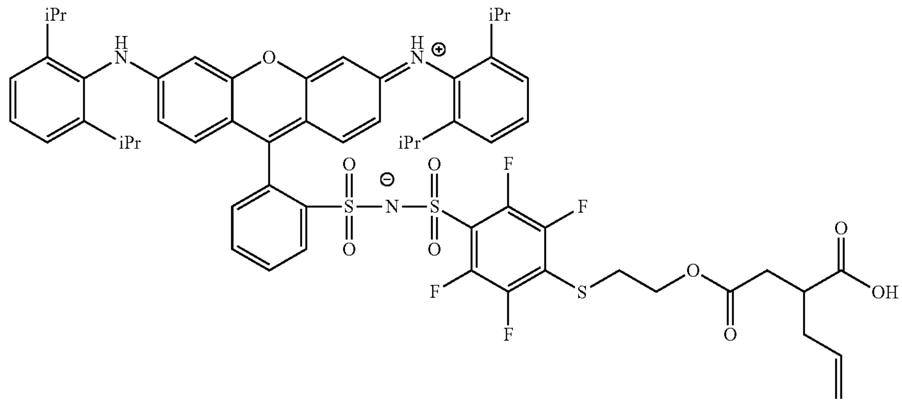

M-50

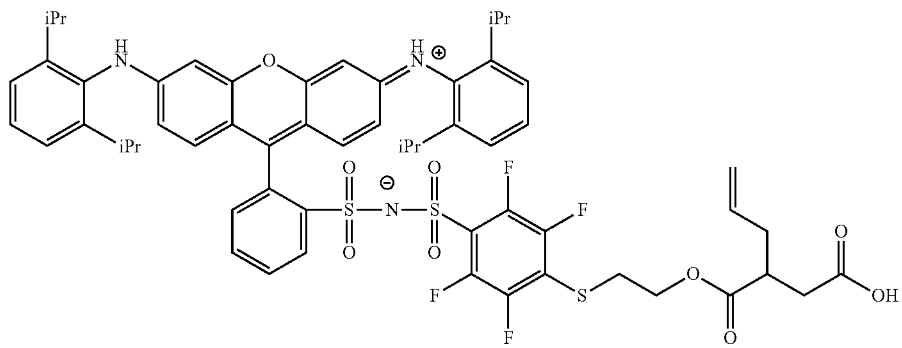

In the dye multimer, the content of the structural unit having a colorant structure is preferably 15% by mole to 60% by mole, more preferably 20% by mole to 50% by mole, and particularly preferably 20% by mole to 45% by mole, with respect to 100% by mole of all the structural units in the dye multimer.

In the dye multimer, the structural unit having a colorant structure may or may not include the structures represented by Formulae (1) to (5).

<<<Structures Represented by Formulae (1) to (5)>>>

The colorant multimer used in the present invention has the colorant structure and at least one the structure represented by Formula (1), Formula (2), Formula (3), Formula (4) or Formula (5) in the same molecule.

The structures represented by Formula (1) are collectively referred to as hindered amines The structures represented by Formula (2) are collectively referred to as hindered phenols. The structures represented by Formula (3) are collectively referred to as benzotriazoles. The structures represented by Formula (4) are collectively referred to as hydroxybenzophenones. The structures represented by Formula (5) are collectively referred to as triazines.

Among the structures represented by Formulae (1) to (5), the structure represented by Formula (1) and the structure represented by Formula (2) are preferable, and the structure represented by Formula (1) is particularly preferable. By incorporating the colorant structure and the structure represented by Formula (1) into the same molecule of the dye multimer used in the present invention, the amine group in the structure represented by Formula (1) interacts with a substrate, and thus, the adhesion can further be improved.

(1)

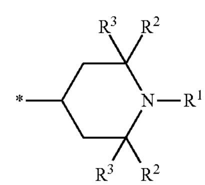

In Formula (1), $R^1$ represents a hydrogen atom, an alkyl group having 1 to 18 carbon atoms, an aryl group, or an oxy radical. $R^2$ and $R^3$ each independently represent an alkyl group having 1 to 18 carbon atoms. $R^2$ and $R^3$ may be bonded to each other to represent an aliphatic ring having 4 to 12 carbon atoms. "*" represents a bonding hand of the structure represented by Formula (1) with a polymer skeleton.

In Formula (1), $R^1$ represents a hydrogen atom, an alkyl group having 1 to 18 carbon atoms, an aryl group, or an oxy radical, and preferably an alkyl group having 1 to 18 carbon atoms.

The alkyl group having 1 to 18 carbon atoms may be linear, branched, or cyclic, and preferably linear. The number of carbon atoms of the alkyl group having 1 to 18 carbon atoms is preferably 1 to 12, more preferably 1 to 8'still more preferably 1 to 3, and particularly preferably 1 or 2. In particular, the alkyl group having 1 to 18 carbon atoms is preferably a methyl group or an ethyl group, and more preferably a methyl group.

The number of carbon atoms of the aryl group may be 6 to 18, 6 to 12, or 6. Specific examples of the aryl group include a phenyl group.

In the case where $R^1$ in Formula (1) represents an alkyl group having 1 to 18 carbon atoms or an aryl group, the alkyl group having 1 to 18 carbon atoms and the aryl group may have a substituent and may be unsubstituted. Examples of the substituent which may be contained include the substituent selected from the substituent group A.

In Formula (1), $R^2$ and $R^3$ each independently represent an alkyl group having 1 to 18 carbon atoms, preferably an alkyl group having 1 to 3 carbon atoms, and more preferably a methyl group. $R^2$ and $R^3$ may be bonded to represent an aliphatic ring having 4 to 12 carbon atoms.

In Formula (1), "*" represents the bonding hand of the bonding with the structure represented by Formula (1) with a polymer skeleton. The bonding hand may be bonded to the polymer skeleton directly or through a linking group, or bonded to the colorant structure directly or through a linking group. In particular, "*" in Formula (1) is preferably bonded to the polymer skeleton directly or through a linking group.

Hereinafter, specific examples of the structure represented by Formula (1) are shown below, but are not limited thereto. In the following structures, "*" represents the bonding hand of the structure represented by Formula (2) with a polymer skeleton.

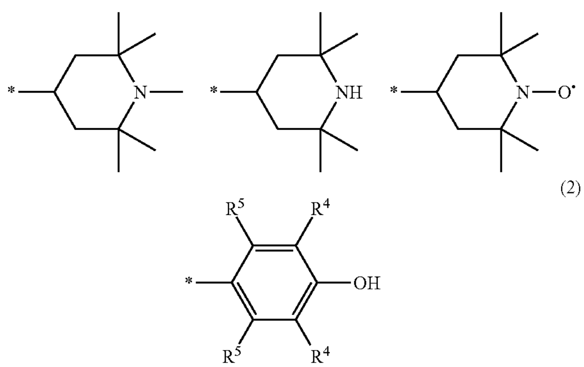

(2)

In Formula (2), $R^4$ represents the following Formula (2A), an alkyl group having 1 to 18 carbon atoms, or an aryl group. $R^5$'s each independently represent a hydrogen atom or an alkyl group having 1 to 18 carbon atoms. "*" represents the bonding hand of the structure represented by Formula (2) with a polymer skeleton.

In Formula (2), $R^4$ represents the Formula (2A), an alkyl group having 1 to 18 carbon atoms, or an aryl group, and is preferably represented by Formula (2A). The alkyl group having 1 to 18 carbon atoms and the aryl group have the same definitions as the alkyl group having 1 to 18 carbon atoms and the aryl group mentioned for $R^1$ in Formula (1). Further, "*" has the same definition as the bonding hand mentioned in Formula (1).

(2A)

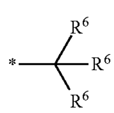

In Formula (2A), $R^6$'s each independently represent an alkyl group having 1 to 18 carbon atoms. "*" represents the bonding hand with the structure represented by Formula (2A) and the structure represented by Formula (2).

In Formula (2A), $R^6$ has the same definition as the alkyl group having 1 to 18 carbon atoms mentioned for $R^1$ in Formula (1). Further, "*" has the same definition as the bonding hand mentioned in Formula (1).

Hereinafter, specific examples of the structure represented by Formula (2) are shown below, but are not limited thereto. In the structures, "*" represents the bonding hand of the structure represented by Formula (2) with a polymer skeleton.

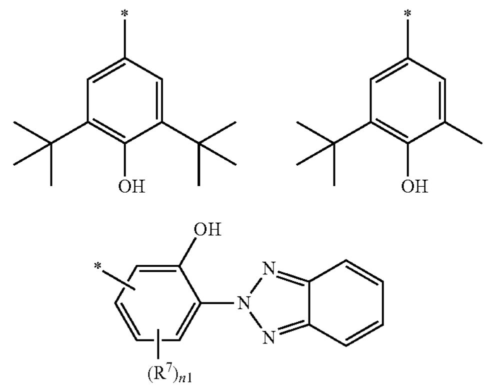

(3)

In Formula (3), $R^7$ represents an alkyl group having 1 to 18 carbon atoms; and n1 represents an integer of 0 to 3. In the case where n1 is 2 or 3, $R^7$'s may be the same as or different from each other. "*" represents the bonding hand of the structure represented by Formula (3) with a polymer skeleton.

In Formula (3), $R^7$ has the same definition as the alkyl group having 1 to 18 carbon atoms mentioned for $R^1$ in Formula (1).

In Formula (3), n1 represents an integer of 0 to 3, preferably an integer of 0 to 2, and preferably 0 or 1.

In Formula (3), "*" has the same definition as the bonding hand mentioned in Formula (1).

Specific examples of the structure represented by Formula (3) are shown below, but are not limited thereto. In the structures, "*" represents the bonding hand of the structure represented by Formula (3) with a polymer skeleton.

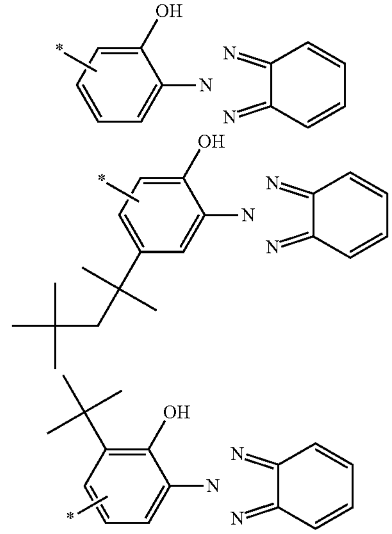

-continued (4)

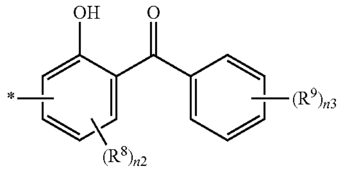

In Formula (4), $R^8$ and $R^9$ each independently represent an alkyl group having 1 to 18 carbon atoms. n2 represents an integer of 0 to 3. n3 represents an integer of 0 to 4. In the case where n2 is 2 or 3, $R^8$'s may be the same as or different from each other. In the case where n3 represents an integer of 2 to 4, $R^9$'s may be the same as or different from each other. "*" represents the bonding hand of the structure represented by Formula (4) with a polymer skeleton.

In Formula (4), $R^8$ and $R^9$ have the same definition as the alkyl group having 1 to 18 carbon atoms mentioned for $R^1$ in Formula (1).

In Formula (4), n2 represents an integer of 0 to 3, preferably 0 to 2, and preferably 0 or 1.

In Formula (4), n3 represents an integer of 0 to 4, preferably 0 to 2, and preferably 0 or 1.

In Formula (4), "*" has the same definition as the bonding hand mentioned in Formula (1).

Specific examples of the structure represented by Formula (4) are shown below, but are not limited thereto. In the structures, "*" represents the bonding hand of the structure represented by Formula (4) with a polymer skeleton.

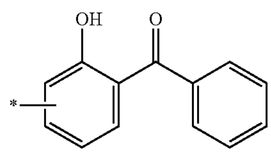

(5)

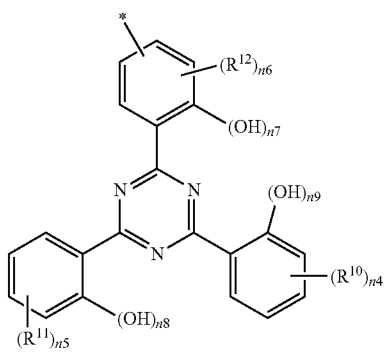

In Formula (5), $R^{10}$ to $R^{12}$ each independently represent an alkyl group having 1 to 18 carbon atoms or an alkoxy group having 1 to 8 carbon atoms. n4 to n6 each independently represent an integer of 0 to 5. n7 to n9 each independently represent 0 or 1, and at least one of n7, n8 or n9 represents 1. "*" represents the bonding hand of the bonding with the structure represented by Formula (5) with a polymer skeleton.

In the case where $R^{10}$ in Formula (5) represents an alkyl group having 1 to 18 carbon atoms, $R^{10}$ has the same definition as the alkyl group having 1 to 18 carbon atoms mentioned for $R^1$ in Formula (1), and is preferably an alkyl group having 1 to 3 carbon atoms, and more preferably a methyl group. In the case where $R^{10}$ represents an alkoxy group having 1 to 8 carbon atoms, the number of carbon atoms of the alkoxy group is preferably 1 to 6, more preferably 1 to 5, and still more preferably 1 to 4.

In Formula (5), n4 represents an integer of 0 to 5, preferably 1 to 4, and preferably 2 or 3. In the case where n4 represents an integer of 2 to 5, $R^{10}$'s may be the same as or different from each other.

$R^{11}$ in Formula (5) has the same definition as $R^{10}$ in Formula (5), and preferred ranges thereof are also the same.

n5 in Formula (5) represents an integer of 0 to 5, preferably 1 to 3, and preferably 1 or 2. In the case where n5 represents an integer of 2 to 5, $R^{11}$'s may be the same as or different from each other.

$R^{12}$ in Formula (5) has the same definition as $R^{10}$ in Formula (5), and preferred ranges thereof are also the same.

n6 in Formula (5) represents an integer of 0 to 5, preferably 0 to 3, and preferably 0 or 1. In the case where n6 represents an integer of 2 to 5, $R^{12}$'s may be the same as or different from each other.

n7 to n9 in Formula (5) each independently represent 0 or 1, and at least one of n7, n8 or n9 represent 1. In particular, it is preferable that only n7 represents 1 or only n8 and n9 represent 1, or that only any one of n7, n8, or n9 represents 1.

$R^{10}$ to $R^{12}$ in Formula (5) may each independently have a substituent or may be unsubstituted. Examples of the substituent which may be contained include the substituents selected from Substituent group A as described above.

In Formula (5), "*" has the same definition as the bonding hand mentioned in Formula (1).

Specific examples of the structure represented by Formula (5) are shown below, but are not limited thereto. In the structures, "*" represents the bonding hand of the structure represented by Formula (5) with a polymer skeleton.

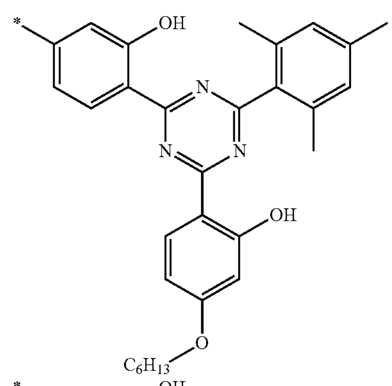

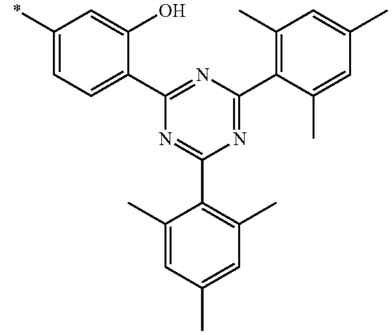

-continued

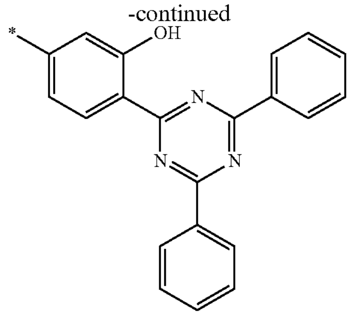

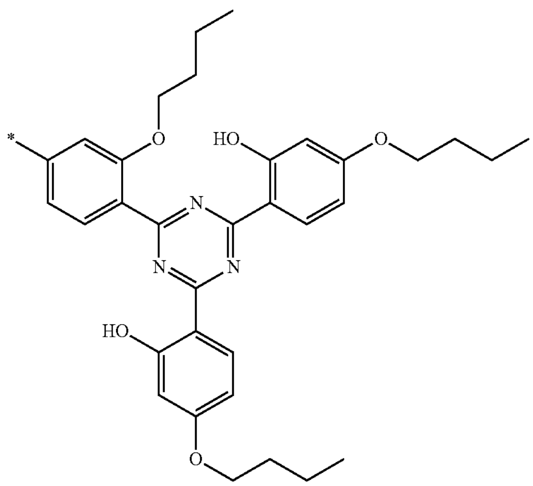

<<<<Structural Unit Containing at Least One of Structure Represented by Formula (1), Formula (2), Formula (3), Formula (4) or Formula (5)>>>>

It is preferable that the structural unit having at least one of the structure represented by Formula (1), Formula (2), Formula (3), Formula (4) or Formula (5), contained in the dye multimer used in the present invention, is represented by the following Formula (E).

Formula (E)

$$\begin{array}{c} -\!(X^3)\!- \\ | \\ L^4 \\ | \\ Z^1 \end{array}$$

In General Formula (E), $X^3$ has the same definition as $X^1$ in General Formula (A). $L^4$ has the same definition as $L^1$ in General Formula (A). $Z^1$ represents the structure represented by Formulae (1) to (5).

Specific examples of the structural unit having at least one of the structure represented by Formula (1), Formula (2), Formula (3), Formula (4) or Formula (5) are shown below, but the present invention is not limited thereto.

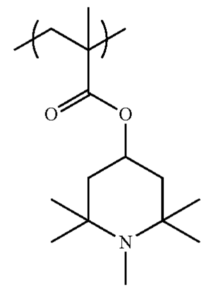

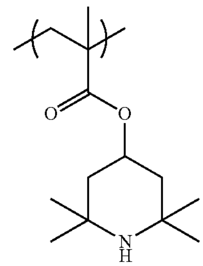

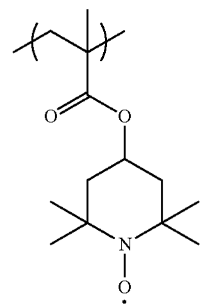

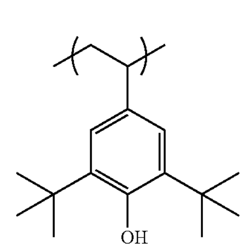

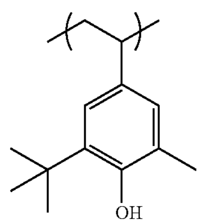

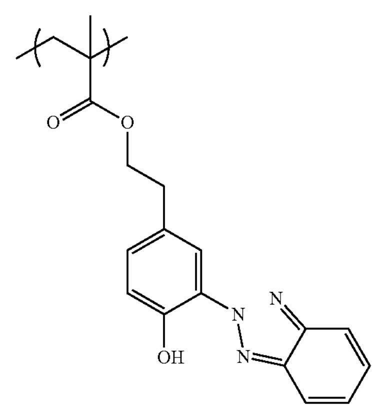

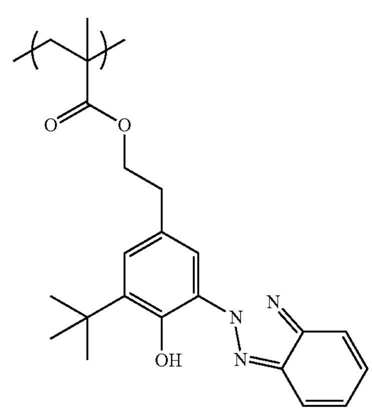

-continued

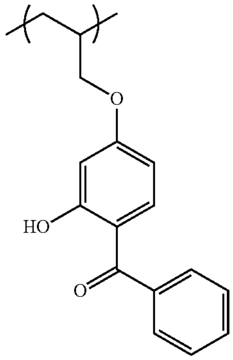

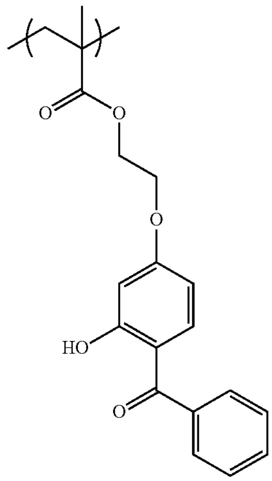

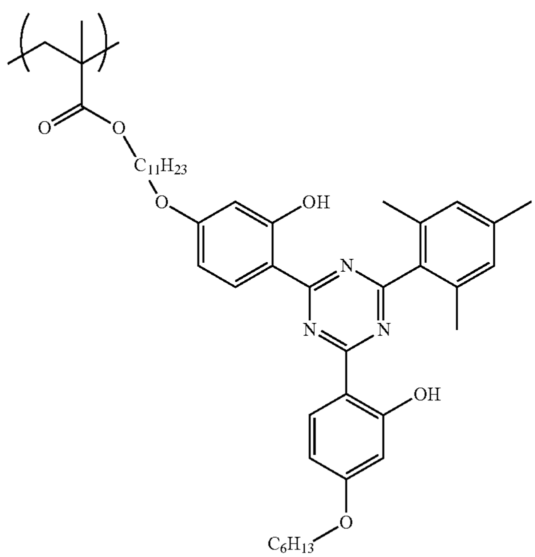

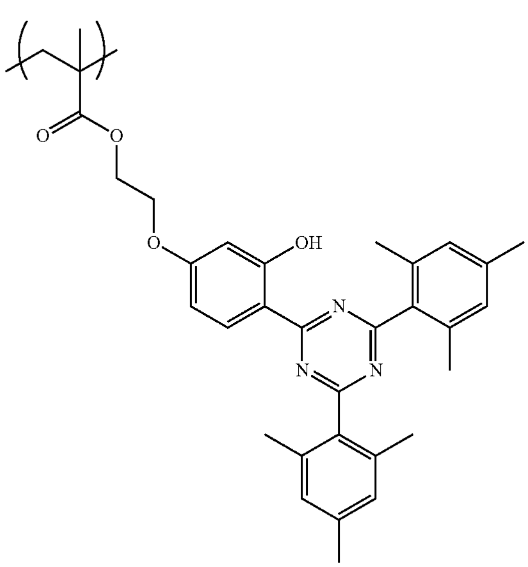

-continued

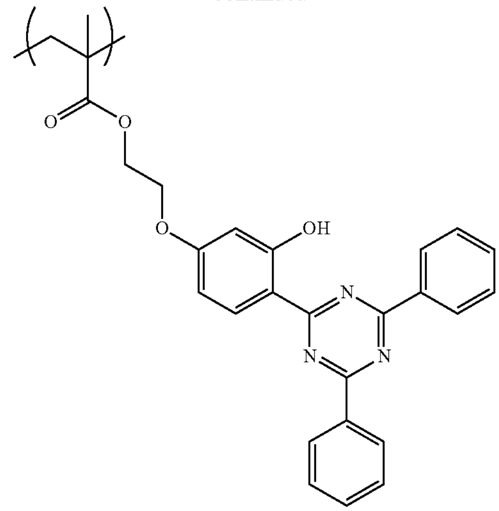

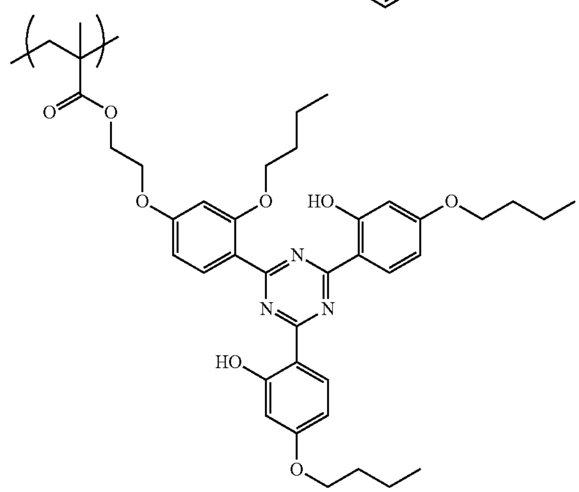

The content of the structural units having at least one of the structure represented by Formula (1), Formula (2), Formula (3), Formula (4) or Formula (5) is preferably 0.5% by mass to 20% by mass, more preferably 1% by mass to 10% by mass, and particularly preferably 1% by mass to 5% by mass, with respect to 100% by mass of all the structural units in the dye multimer.

In addition, the content of the structural units having at least one of the structure represented by Formula (1), Formula (2), Formula (3), Formula (4) or Formula (5) is preferably 0.5% by mole to 25% by mole, more preferably 1% by mole to 10% by mole, and still more preferably 1% by mole to 5% by mole, with respect to 1 mole of the structural unit including the colorant structure.

<<Other Functional Groups or Other Structural Units>>

The dye multimer used in the present invention may have other functional groups or other structural units.

Other functional groups may be included in a structural unit having a colorant structure and/or a structural unit having at least one of the structure represented by Formula (1), Formula (2), Formula (3), Formula (4) or Formula (5), or may be included as other structural units including other functional groups, in addition to these structural units.

Examples of the other functional groups include a polymerizable group, an acid group, and other alkali-soluble groups.

In addition, examples of the other structural units include structural units including at least one of a polymerizable group and an acid group.

Details thereof will be described below.

<<<Polymerizable Group>>>

One kind or two or more kinds of polymerizable group may be included.

As the polymerizable group, known polymerizable groups which can be crosslinked by a radical, an acid, or heat can be used, and examples thereof include a group including an ethylenically unsaturated bond, a cyclic ether group (an epoxy group and an oxetane group), and a methylol group. Particularly, a group including an ethylenically unsaturated bond is preferable, a (meth)acryloyl group is more preferable, and (meth)acryloyl groups derived from glycidyl (meth)acrylate and 3,4-epoxycyclohexyl methyl(meth)acrylate are still more preferable.

Examples of the method for introducing a polymerizable group include (1) a method for introducing a polymerizable group by modifying a structural unit to which the polymerizable group will be introduced with a compound containing the polymerizable group, and (2) a method for introducing a polymerizable group by copolymerizing a compound containing the polymerizable group.

In the case where the colorant monomer includes the polymerizable group, the amount of the polymerizable group included in the colorant monomer is preferably 0.1 mmol to 2.0 mmol, more preferably 0.2 mmol to 1.5 mmol, and particularly preferably 0.3 mmol to 1.0 mmol, with respect to 1 g of the colorant structure.

In addition, in the case where other structural units contain a polymerizable group, the amount of the polymerizable groups is preferably, for example, 10% by mass to 40% by mass, and more preferably 15% by mass to 35% by mass, with respect to 100% by mass of all the repeating units.

Specific examples of structural units having the polymerizable group will be shown below, but the present invention is not limited thereto.

(G-1)

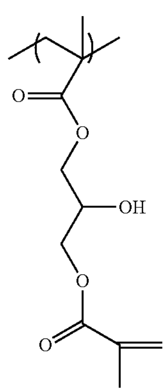

-continued (G-2)

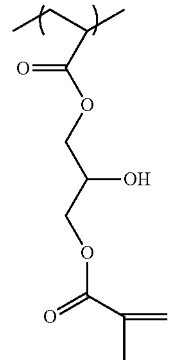

(G-3)

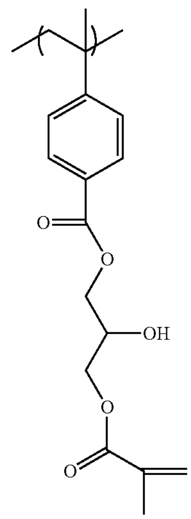

(G-4)

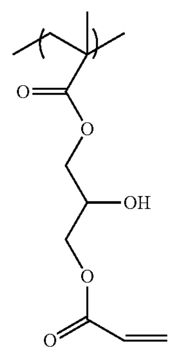

(G-5)

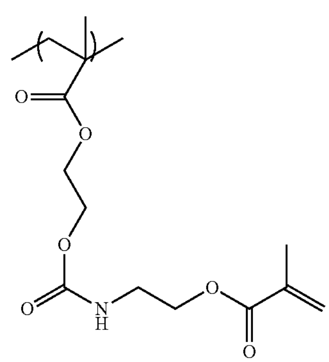

-continued
(G-6)
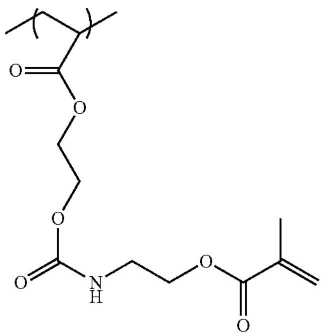
(G-7)
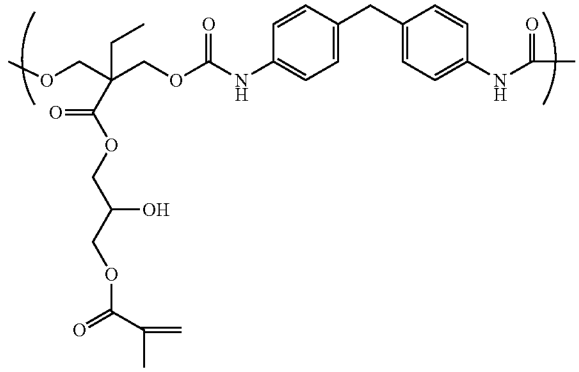
(G-8)
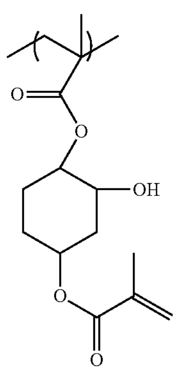
(G-9)
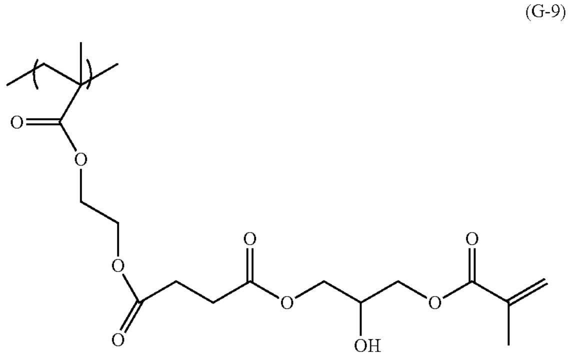
-continued
(G-10)
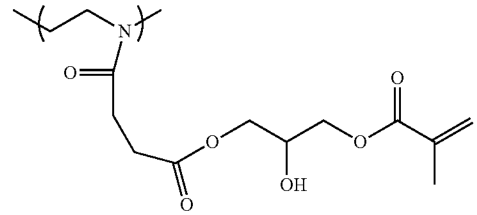
(G-11)
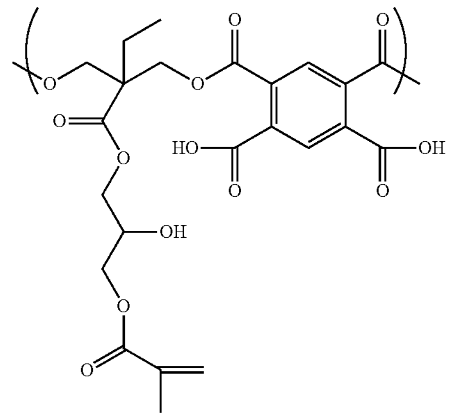
(G-12)
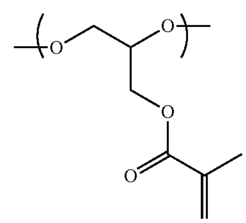
(G-13)
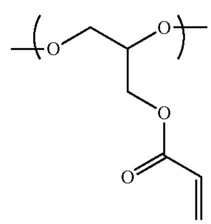
(G-14)
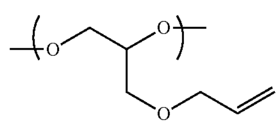
(G-15)
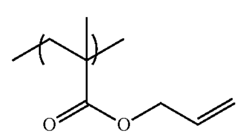
(G-16)
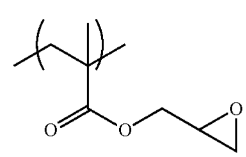

-continued (G-17)

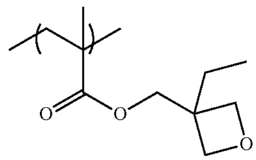

(B-18)

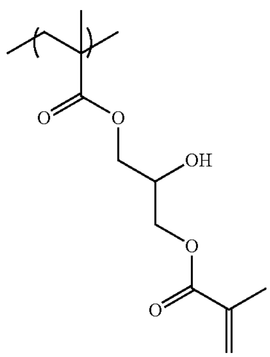

(B-19)

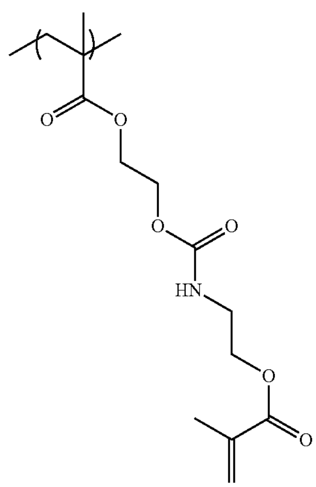

<<<Alkali-Soluble Group Contained in Dye Multimer>>>

Examples of the acid group which may contained in the dye multimer include a carboxylic acid group, a sulfonic acid group, and a phosphoric acid group.

In the present invention, it is preferable that an alkali-soluble group (preferably an acid group) is included in the dye multimer as a structural unit having an alkali-soluble group (an acid group).

Examples of the method for introducing the alkali-soluble group into the dye multimer include a method in which an alkali-soluble group is introduced into a colorant monomer in advance and a method of copolymerizing monomers (a caprolactone-modified derivative of (meth)acrylic acids and acrylic acids, a succinic anhydride-modified derivative of 2-hydroxyethyl (meth)acrylate, a phthalic anhydride-modified derivative of 2-hydroxyethyl (meth)acrylate, a 1,2-cyclohexane dicarboxylic acid anhydride-modified derivative of 2-hydroxyethyl (meth)acrylate, carboxylic acid-containing monomers such as styrenecarboxylic acid, itaconic acid, maleic acid, and norbornene carboxylic acid, phosphoric acid-containing monomers such as acid phosphoxyethyl methacrylate, and vinyl phosphonic acid, and sulfonic acid-containing monomers such as vinyl sulfonic acid and 2-acrylamide-2-methylsulfonic acid) other than a colorant monomer having an alkali-soluble group. It is more preferable to use both of the methods.

The amount (acid value) of the alkali-soluble groups contained in the dye multimer is preferably 15 mgKOH/g to 130 mgKOH/g, more preferably 25 mgKOH/g to 100 mgKOH/g, and particularly preferably 25 mgKOH/g to 80 mgKOH/g, with respect to 1 g of the dye multimer. The amount (acid value) of the alkali-soluble groups can be measured by titration using a 0.1 N aqueous sodium hydroxide solution.

Furthermore, in the case where the dye multimer contains a structural unit including a colorant monomer and a structural unit having an acid group, the proportion of the structural unit containing the structural unit having an acid group is, for example, preferably 5 moles to 70 moles, and more preferably 10 moles to 50 moles, with respect to 100 moles of the structural units including a colorant monomer.

The dye multimer used in the present invention may include a structural unit having a group composed of 2 to 20 unsubstituted structural alkyleneoxy chains in the side chain (hereinafter referred to as a "(b) structural unit" in some cases) as a structural unit including an alkali-soluble group.

The repetition number of the alkyleneoxy chains contained in the structural unit (b) is preferably 2 to 10, more preferably 2 to 15, and still more preferably 2 to 10.

One alkyleneoxy chain is represented by $-(CH_2)_nO-$, and n is an integer. n is preferably 1 to 10, more preferably 1 to 5, and still more preferably 2 or 3.

The group composed of 2 to 20 unsubstituted structural alkyleneoxy chains in the present invention may include one kind or two or more kinds of alkyleneoxy chain.

In the present invention, the (b) structural unit is preferably represented by the following General Formula (P).

General Formula (P)

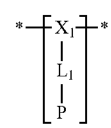

(In General Formula (P), $X_1$ represents a linking group formed by polymerization, $L_1$ represents a single bond or a divalent linking group, and P represents a group including a group composed of repeating alkyleneoxy chains.)

$X_1$ and $L_1$ in General Formula (P) each have same definitions as $X_1$ and $L_1$ in General Formula (A), and preferred ranges thereof are also the same.

P represents a group including a group composed of repeating alkyleneoxy chains, and is more preferably composed of a -group composed of repeating alkyleneoxy chains-terminal atom or terminal group.

As the terminal atom or terminal group, a hydrogen atom, an alkyl group, an aryl group, or a hydroxyl group is preferable, a hydrogen atom, an alkyl group having 1 to 5 carbon atoms, a phenyl group, or a hydroxyl group is more preferable, a hydrogen atom, a methyl group, a phenyl group, or a hydroxyl group is still more preferable, and a hydrogen atom is particularly preferable.

The ratio of the (b) structural unit having a group composed of 2 to 20 unsubstituted repeating alkyleneoxy chains in the side chain is preferably 2% by mole to 20% by mole, and more preferably 5% by mole to 15% by mole, with respect to all the structural units constituting the dye multimer.

Examples of the (b) structural unit which can be used in the present invention are shown below, but it should be understood that the present invention is not limited thereto.

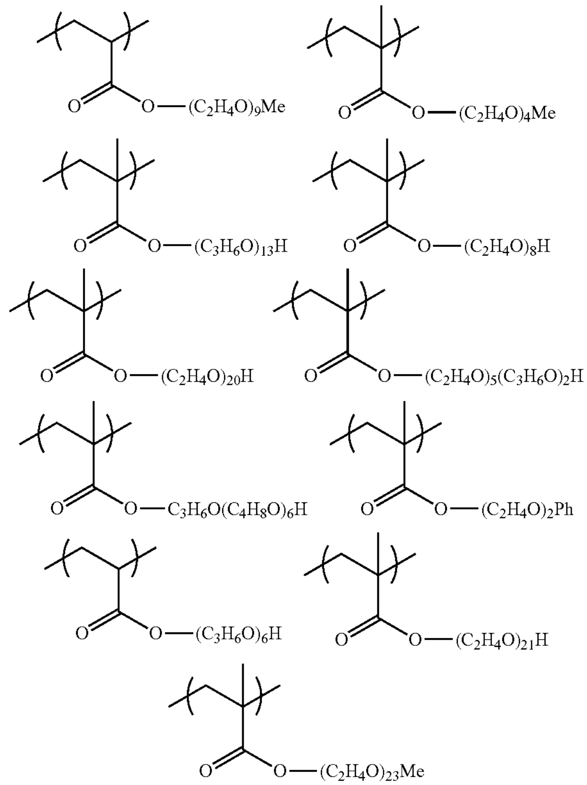

Examples of other functional groups contained in the dye multimer include a development accelerator such as lactone, acid anhydride, amide, —$COCH_2CO$—, and a cyano group, and a hydrophobicity- or hydrophilicity-regulating group such as a long-chained alkyl group, a cyclic alkyl group, an aralkyl group, an aryl group, a polyalkylene oxide group, a hydroxyl group, a maleimide group, and an amino group. These can be appropriately introduced into the dye multimer.

Examples of the method for introducing the functional group include a method for introducing the functional group to the colorant monomer in advance, and a method for copolymerizing a monomer having the functional group.

Specific examples of the structural unit of a functional group other than the alkali-soluble group which may be contained in the dye multimer are shown below, but the present invention is not limited thereto.

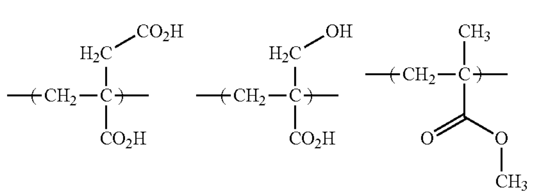

-continued

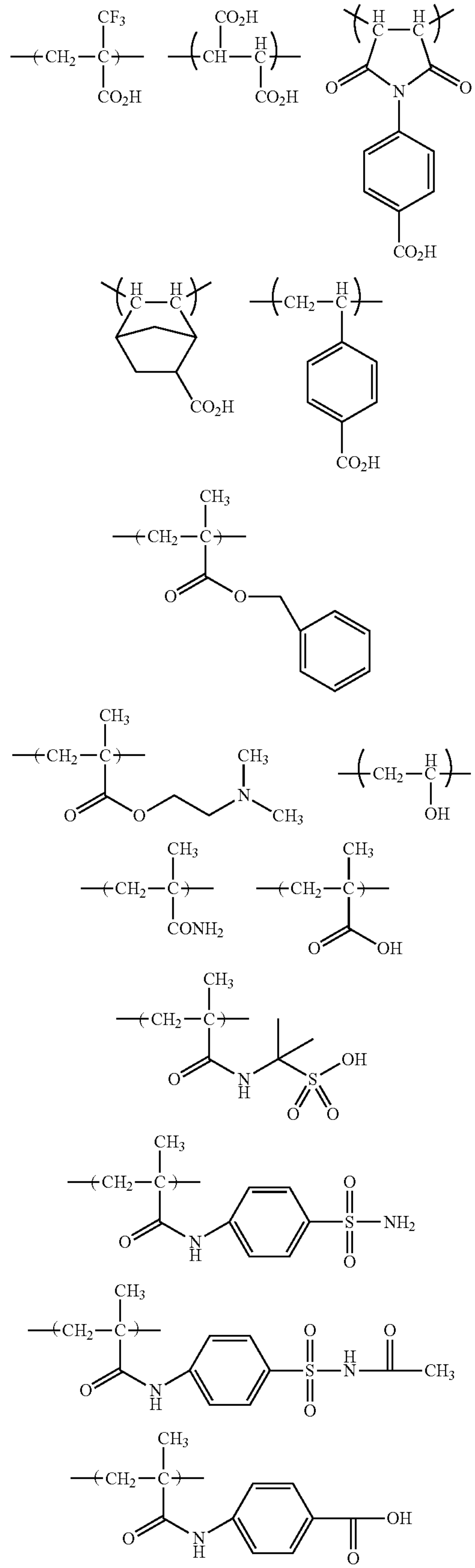

-continued (H-22)

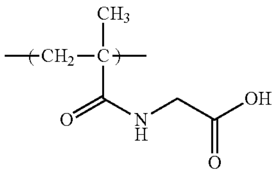

(H-23)

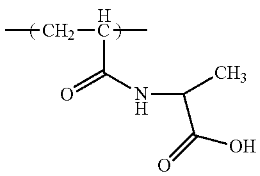

(H-24)

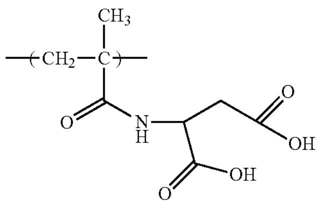

(H-25)

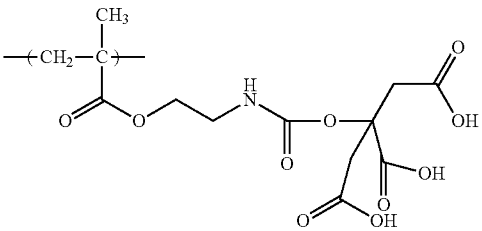

(H-26)

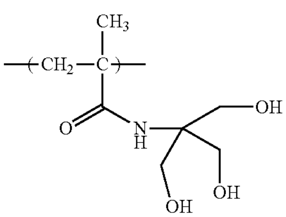

(H-27)

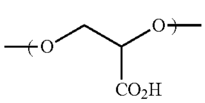

(H-28)

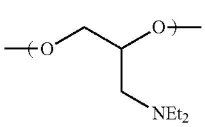

(H-29)

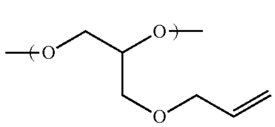

(H-30)

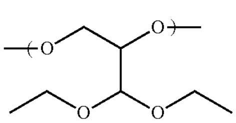

-continued (H-31)

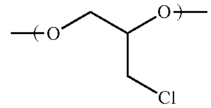

(H-32)

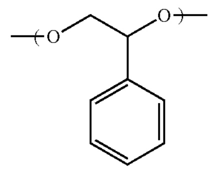

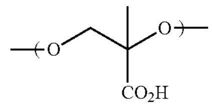

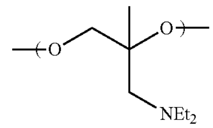

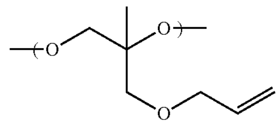

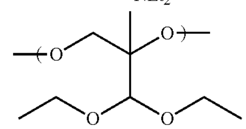

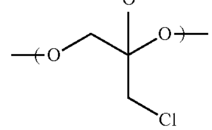

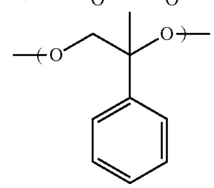

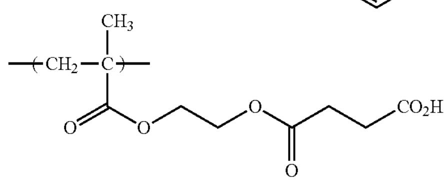

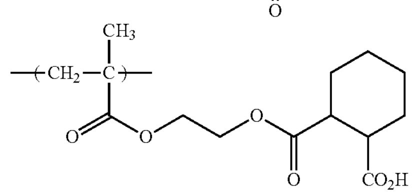

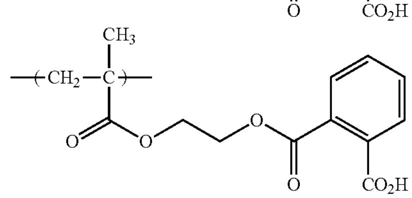

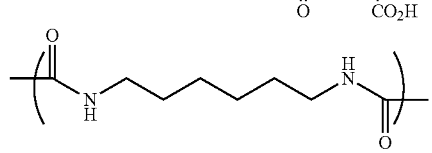

<<<Specific Terminal Group>>>

It is preferable that the dye multimer used in the present invention has a group represented by General Formula (I) or a group represented by General Formula (II) (hereinafter referred to as a "specific terminal group" in some cases). By adopting such a configuration, solvent resistance and light fastness can be imparted more effectively. Further, for example, since the dye multimer can be synthesized by living radical polymerization, the dispersity (Mw/Mn) of the dye multimer can be reduced. That is, with the dye multimer, the light fastness can further be improved by reducing the proportion of the high-molecular-weight components, and the solvent resistance can be improved by reducing the proportion of the low-molecular-weight components. In addition, heat resistance, coatability, and developability can further be improved.

General Formula (I)

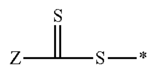

In General Formula (I), Z represents a hydrogen atom or a monovalent substituent. * represents a bonding position with a terminal of the main chain.

In General Formula (I), Z represents a monovalent substituent. Z is preferably a hydrogen atom, a halogen atom, a carboxyl group, a cyano group, an alkyl group having 1 to 30 carbon atoms, a monovalent aromatic hydrocarbon group having 6 to 30 carbon atoms, a monovalent heterocyclic group having a total number of carbon atoms and hetero atoms of 3 to 30, —$OR^1$, —$SR^1$, —OC(═O)$R^1$, —N($R^1$)($R^2$), —C(═O)$OR^1$, —C(═O)N($R^1$)($R^2$), —P(═O)($OR^1$)$_2$, —P(═O)($R^1$)$^2$, or a monovalent group having a polymer chain. It is preferably selected from —$SR^1$, an aryl group, a heteroaryl group, an amino group substituted with an alkyl group and/or an aryl group, an alkoxy group, and an aryloxy group, more preferably selected from —$SR^1$ (preferably an alkylthio group or an arylthio group), and an aryl group, still more preferably an alkylthio group or an aryl group, and particularly preferably an alkylthio group.

The aryl group as Z is preferably a phenyl group or a naphthyl group. The heteroaryl group as Z is preferably a nitrogen-containing 5- or 6-membered compound. The amino group substituted with an alkyl group and/or an aryl group as Z is preferably an amino group substituted with an alkyl group having 1 to 5 carbon atoms or a phenyl group. The alkoxy group as Z is preferably an alkoxy group having 2 to 5 carbon atoms, and the aryloxy group as Z is preferably a phenoxy group.

$R^1$ and $R^2$ each independently represent an alkyl group having 1 to 30 carbon atoms, an alkenyl group having 2 to 30 carbon atoms, a monovalent aromatic hydrocarbon group having 6 to 30 carbon atoms, or a monovalent heterocyclic group having a total number of carbon atoms and hetero atoms of 3 to 30, and each of the alkyl group having 1 to 30 carbon atoms, the monovalent aromatic hydrocarbon group having 6 to 30 carbon atoms, the monovalent heterocyclic group having a total number of carbon atoms and hetero atoms of 3 to 30, and $R^1$ and $R^2$ may or may not be substituted. Examples of the substituent in the case of being substituted include an alkyl group and an aryl group.

$R^1$ and $R^2$ are each independently preferably represent an alkyl group having 1 to 20 carbon atoms or a monovalent aromatic hydrocarbon group having 6 to 30 carbon atoms, and more preferably an alkyl group having 1 to 15 carbon atoms or a phenyl group.

General Formula (II)

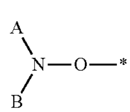

In General Formula (II), A and B each independently represent a monovalent substituent. A and B may be linked to each other to form a ring. * represents a bonding position with a terminal of the main chain.

The monovalent substituents represented by A and B are each independently preferably an alkyl group having 1 to 30 carbon atoms or an aryl group having 6 to 30 carbon atoms. The alkyl group having 1 to 30 carbon atoms more preferably has 3 to 10 carbon atoms.

In particular, it is preferable that one of A and B is a secondary or tertiary alkyl group having 1 to 30 carbon atoms, and the other is an alkyl group having 1 to 30 carbon atoms or an aryl group having 6 to 30 carbon atoms. It is more preferable that one of A and B is a tertiary alkyl group having 1 to 30 carbon atoms, and the other is an alkyl group having 1 to 30 carbon atoms, and it is particularly preferable that one of A and B is a tertiary alkyl group having 1 to 30 carbon atoms, and the other is a secondary or tertiary alkyl group having 1 to 30 carbon atoms (more preferably a secondary alkyl group having 1 to 30 carbon atoms).

As the substituent which may be contained in the alkyl group having 1 to 30 carbon atoms, an aryl group is preferable, and a phenyl group is more preferable. As the substituent which may be contained in the aryl group, an aryl group is preferable. Further, these groups may be substituted with other substituents. A and B may be bonded to each other to form a ring.

In the present invention, in particular, it is preferable that Z in General Formula (I) is —$SR^1$ or an aryl group, and A and B in General Formula (II) are each a secondary or tertiary alkyl group having 1 to 30 carbon atoms (provided that A and B may be bonded to each other to form a ring).

Specific examples of the terminal group are shown, but the present invention is not limited thereto.

(I-1)

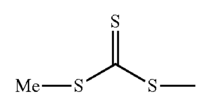

(I-2)

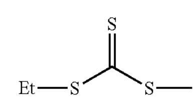

(I-3)

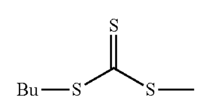

(I-4)

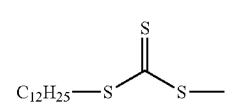

(I-5)

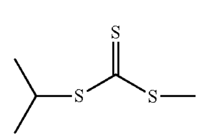

(I-6)

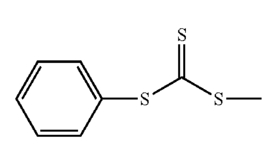

-continued
(I-7)
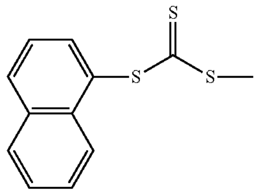
(I-8)
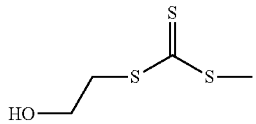
(I-9)
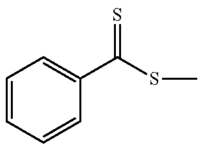
(I-10)
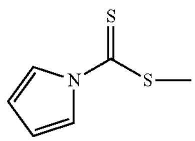
(I-11)
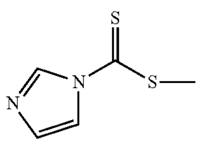
(I-12)
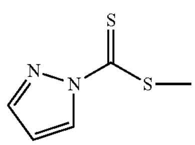
(I-13)
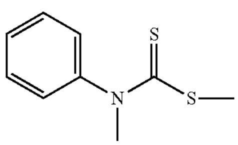
(I-14)
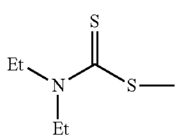
(I-15)
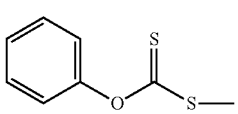
(I-16)
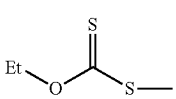
(II-1)
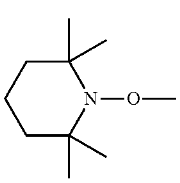
-continued
(II-2)
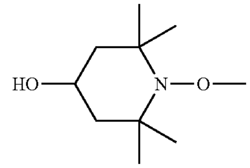
(II-3)
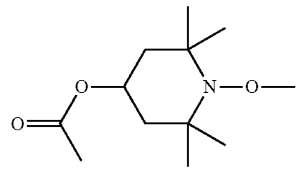
(II-4)
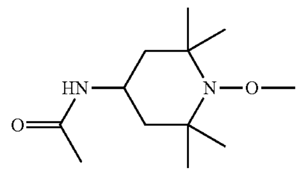
(II-5)
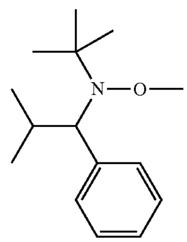
(II-6)
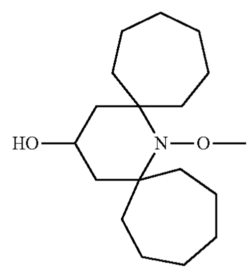
(II-7)
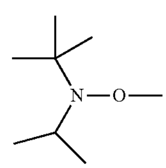
(II-8)
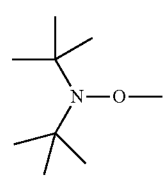
(II-9)
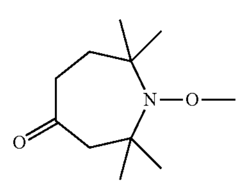

-continued (II-10)

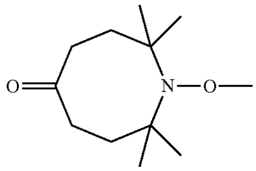

(II-11)

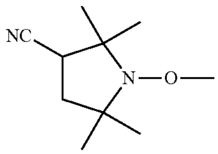

(II-12)

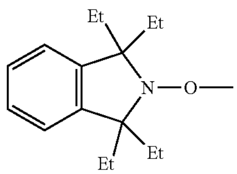

(II-13)

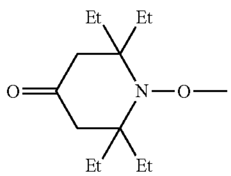

(II-14)

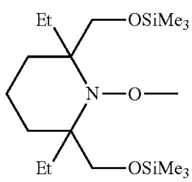

(II-15)

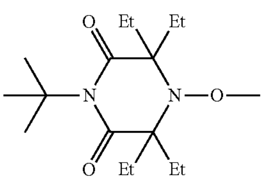

(II-16)

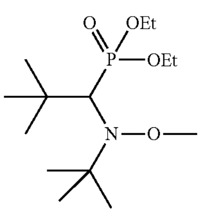

(II-17)

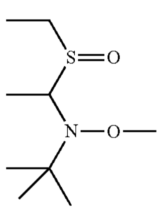

-continued (II-18)

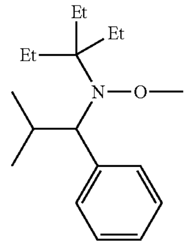

(II-19)

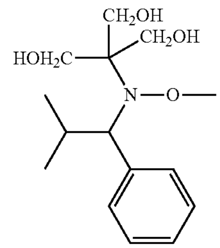

As a method for introducing a terminal group represented by General Formula (I) or (II) into the polymer main chain, a method in which a polymerizable compound having a colorant structure is subjected to radial polymerization in the presence of at least one of a compound represented by General Formula (Ia), a compound represented by General Formula (IIa), or a radical represented by General Formula (IIb) is preferable.

General Formula (Ia)

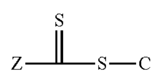

In General Formula (Ia), Z has the same definition as in General Formula (I). C represents a monovalent organic group.

General Formula (IIa)

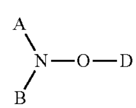

In General Formula (IIa), Z has the same definition as in General Formula (II). D represents a monovalent organic group.

General Formula (IIb)

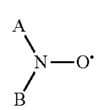

In General Formula (IIb), A and B have the same definitions as in General Formula (II).

By blending such additives, the activation/deactivation of the terminal during the radical polymerization becomes an equilibrium state, and thus, it becomes a state where radials are not inactivated apparently. By carrying out polymerization in such the living radical polymerization, a dye multimer having a low dispersity is obtained.

<<Characteristics of Dye Multimer>>

The maximum absorption wavelength of the dye multimer is preferably 400 nm to 650 nm, and more preferably 450 nm to 600 nm.

The weight-average molecular weight of the dye multimer is preferably 2,000 or more, more preferably 3,000 or more, still more preferably 4,000 or more, and particularly preferably 5,000 or more. The upper limit of the weight-average molecular weight of the dye multimer is not particularly limited, but is preferably 20,000 or less, more preferably 15,000 or less, and still more preferably 10,000 or less.

Moreover, the ratio [(Mw)/(Mn)] of the weight-average molecular weight (Mw) to the number-average molecular weight (Mn) of the dye multimer is preferably 1.0 to 3.0, more preferably 1.6 to 2.5, and particularly preferably 1.6 to 2.0.

The glass transition temperature (Tg) of the dye multimer is preferably 50° C. or higher, and more preferably 100° C. or higher. Further, a 5%-by weight reduction temperature measured by thermogravimetric analysis (TGA measurement) is preferably 120° C. or higher, more preferably 150° C. or higher, and still more preferably 200° C. or higher. Within this region, when the coloring composition of the present invention is applied to the manufacture of a color filter and the like, the change in concentration due to a heating process can be decreased.

In addition, the light absorption coefficient (hereinafter described as ε'. ε'=ε/average molecular weight, unit: L/g·cm) per unit weight of the dye multimer is preferably 30 or more, more preferably 60 or more, and even more preferably 100 or more. If the light absorption coefficient is in this range, when a color filter is manufactured using the coloring composition of the present invention, a color filter having excellent color reproducibility can be manufactured.

A higher molar light absorption coefficient of the dye multimer is more preferable from the viewpoint of coloring properties. Further, the maximum absorption wavelength and the molar light absorption coefficient can be measured by means of a spectrophotometer Cary-5 (manufactured by Varian Medical Systems, Inc.).

It is preferable for the dye multimer is a compound which is dissolved in the following organic solvents.

Examples of the organic solvents include esters (for example, methyl 3-ethoxypropionate, ethyl 3-ethoxypropionate, ethyl lactate, butyl acetate, and methyl 3-methoxypropionate), ethers (for example, methyl cellosolve acetate, ethyl cellosolve acetate, propylene glycol monomethyl ether, and propylene glycol monomethyl ether acetate), ketones (methyl ethyl ketone, cyclohexanone, 2-heptanone, 3-heptanone, and the like), and aromatic hydrocarbons (for example, toluene and xylene). The dye multimer dissolves preferably from 1% by mass to 50% by mass, more preferably from 5% by mass to 40% by mass, and even more preferably from 10% by mass to 30% by mass in these solvents. If the dye multimer is dissolved in the organic solvent in this range, when coloring composition of the present invention is applied to the manufacture of a color filter or the like, suitable coating surface properties can be obtained or reduction in concentration caused by elution after coating of other colors can be decreased.

In the coloring composition of the present invention, the dye multimer may be used singly or in combination of two or more kinds thereof. In the case of using two or more kinds, the total amount thereof preferably corresponds to the content which will be described later.

The content of the dye multimer in the coloring composition of the present invention is preferably 10% by mass to 70% by mass, more preferably 10% by mass to 50% by mass, and particularly preferably 15% by mass to 30% by mass, with respect to the total solid content of the coloring composition.

Furthermore, the colorant component (a dye multimer, a combination of a pigment which will be described later and another dye) including the dye multimer with respect to the total solid content of the coloring composition is preferably 50% by mass or more, and more preferably 60% by mass or more, with respect to the total solid content of the coloring composition.

<Curable Compound>

<<Polymerizable Compound>>

The coloring composition of the present invention contains a curable compound. As the curable compound, known polymerizable compounds which can be crosslinked by a radical, an acid, or heat can be used. Examples thereof include polymerizable compounds having an ethylenically unsaturated bond, a cyclic ether (epoxy or oxethane), methylol, or the like. From the viewpoint of sensitivity, the polymerizable compound is suitably selected from compounds having at least one, and preferably two or more ethylenically unsaturated terminal bonds. Among these, polyfunctional polymerizable compounds having 4 or more functional groups are preferable, and polyfunctional polymerizable compounds having 5 or more functional groups are more preferable.

Such compound groups are widely known in the industrial field of the relevant art and can be used in the present invention without particular limitation. These may be in any type of chemical forms such as a monomer, a prepolymer, that is, a dimer, a trimer, an oligomer, a mixture thereof, and a multimer thereof. The polymerizable compound in the present invention may be used singly or in combination of two or more kinds thereof.

More specifically, examples of the monomer and prepolymer include unsaturated carboxylic acids (for example, acrylic acid, methacrylic acid, itaconic acid, crotonic acid, isocrotonic acid, and maleic acid) or esters thereof, amides, and multimers of these, and among these, an ester of unsaturated carboxylic acid and an aliphatic polyhydric alcohol compound, amides of unsaturated carboxylic acid and an aliphatic polyamine compound, and multimers of these are preferable. Moreover, products of an addition reaction between unsaturated carboxylic esters or amides having nucleophilic substituent such as a hydroxyl group, an amino group, or a mercapto group and monofunctional or polyfunctional isocyanates or epoxies, products of a dehydration condensation reaction between the unsaturated carboxylic esters or amides and a monofunctional or polyfunctional carboxylic acid, and the like are also suitably used. In addition, products of an addition reaction between unsaturated carboxylic esters or amides having an electrophilic substituent such as an isocyanate group or an epoxy group and monofunctional or polyfunctional alcohols, amines, or thiols, and products of a substitution reaction between unsaturated carboxylic esters or amides having an eliminatable substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraph Nos. “0095” to “0108” of JP2009-288705A can also be suitably used in the present invention.

Moreover, as the polymerizable compound, a compound which has at least one addition-polymerizable ethylene group and has an ethylenically unsaturated group having a boiling point of 100° C. or higher under normal pressure is also preferable. With respect to examples of the compound, reference can be made to, for example, paragraph "0227" of JP2013-29760A, the contents of which may be incorporated herein by reference.

Moreover, with respect to the addition-polymerizable compound having at least one ethylenically unsaturated group, which has a boiling point of 100° C. or higher under normal pressure, reference can be made to, for example, paragraph Nos. "0254" to "0257" of JP2008-292970A, the contents of which may be incorporated herein by reference.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth) acrylate (KAYARAD D-310 as a commercially available product; manufactured by Nippon Kayaku Co., Ltd.), dipentaerythritol hexa(meth)acrylate (as a commercially available product, KAYARAD DPHA manufactured by Nippon Chemical Co., Ltd., A-DPH-12E manufactured by Shin-Nakamura Chemical Co., Ltd.), and a structure in which an ethylene glycol or propylene glycol residue is interposed between these (meth)acryloyl groups are preferable. Oligomer types of these can also be used. Hereinafter, aspects of preferred polymerizable compounds are shown.

The polymerizable compound is a polyfunctional monomer, which may have an acid group such as a carboxyl group, a sulfonic acid group, and a phosphoric acid group. If an ethylenic compound has an unreacted carboxyl group as described above, this compound can be used as is, but if desired, a hydroxyl group of the above ethylenic compound may be reacted with a non-aromatic carboxylic anhydride so as to introduce an acid group. In this case, specific examples of the non-aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the monomer having an acid group is preferably a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic anhydride. A monomer in which the aliphatic polyhydroxy compound in the ester is pentaerythritol and/or dipentaerythritol is particularly preferable. Examples of commercially available products thereof include M-510 and M-520, which are polybasic modified acryl oligomers manufactured by TOAGOSEI, CO., LTD.

These monomers may be used singly, but since it is difficult to use a single compound in production, two or more kinds thereof may be used as a mixture. Moreover, if desired, a polyfunctional monomer not having an acid group and a polyfunctional monomer having an acid group may be used in combination therewith as the monomer.

The acid value of the polyfunctional monomer having an acid group is preferably 0.1 mg KOH/g to 40 mg KOH/g, and particularly preferably 5 mg KOH/g to 30 mg KOH/g. If the acid value of the polyfunctional monomer is too low, the development solubility characteristics deteriorates. If the acid value is too high, difficulty is caused in the production and handleability, hence a photopolymerization performance deteriorates, which leads to deterioration of curing properties such as surface smoothness of pixels. Therefore, in the case where a combination of two or more kinds of polyfunctional monomers having different acid groups is used, or in the case where a combination of polyfunctional monomers not having an acid group is used, it is preferable to adjust the acid value such that all the acid groups as the polyfunctional monomers fall within the above range.

Moreover, it is also a preferred aspect that a polyfunctional monomer having a caprolactone structure is contained as a polymerizable monomer.

The polyfunctional monomer having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among these, a polyfunctional monomer having a caprolactone structure represented by the following General Formula (Z-1) is preferable.

(Z-1)

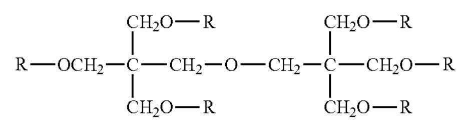

In General Formula (Z-1), all of six R's are a group represented by the following General Formula (Z-2). Alternatively, one to five out of six R's are a group represented by the following General Formula (Z-2), and the remainder is a group represented by the following General Formula (Z-3).

(Z-2)

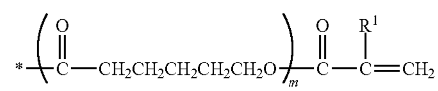

In General Formula (Z-2), $R^1$ represents a hydrogen atom or a methyl group, m represents a number 1 or 2, and "*" represents a bonding hand.

(Z-3)

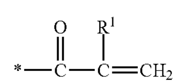

In General Formula (Z-3), $R^1$ represents a hydrogen atom or a methyl group, and "*" represents a bonding hand.

The polyfunctional monomer having such a caprolactone structure is commercially available from Nippon Kayaku Co., Ltd., as a KAYARAD DPCA series, and examples thereof include DPCA-20 (a compound in which m is 1, the number of the group represented by Formula (Z-2) is 2, and all of $R^1$'s are hydrogen atoms in Formulae (Z-1) to (Z-3)), DPCA-30 (a compound in which m is 1, the number of the group represented by Formula (Z-2) is 3, and all of $R^1$'s are hydrogen atoms in Formulae (Z-1) to (Z-3)), DPCA-60 (a compound in which m is 1, the number of the group represented by Formula (Z-2) is 6, and all of R[1]'s are hydrogen atoms in Formulae (Z-1) to (Z-3)), and DPCA-120 (a compound in which m is 2, the number of the group represented by Formula (Z-2) is 6, and all of R[1]'s are hydrogen atoms in Formulae (Z-1) to (Z-3)).

In the present invention, the polyfunctional monomer having a caprolactone structure can be used singly or as a mixture of two or more kinds thereof.

Moreover, the specific monomer in the present invention is preferably at least one kind selected from a group of compounds represented by the following General Formula (Z-4) or (Z-5).

(Z-4)

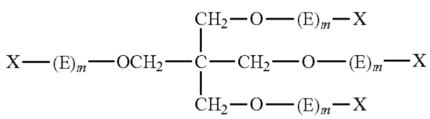

(Z-5)

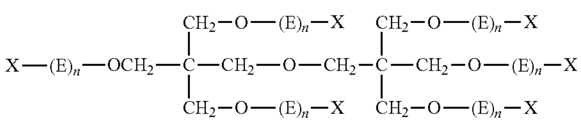

In General Formulae (Z-4) and (Z-5), E's each independently represent —$((CH_2)_yCH_2O)$— or —$((CH_2)_yCH(CH_3)O)$—, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's each independently represent an integer of 0 to 10, and the sum of the respective m's is an integer of 0 to 40. Herein, in the case where the sum of the respective m's is 0, any one of X's is a carboxyl group.

In General Formula (Z-5), the sum of the acryloyl group and the methacryloyl group is 5 or 6, n's each independently represent an integer of 0 to 10, and the sum of the respective n's is an integer of 0 to 60. Herein, in the case where the sum of the respective n's is 0, one of X's is a carboxyl group.

In General Formula (Z-4), m is preferably an integer of 0 to 6, and more preferably an integer of 0 to 4.

Further, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, —$((CH_2)yCH_2O)$— or —$((CH_2)yCH(CH_3)O)$— in General Formula (Z-4) or (Z-5) is preferably in the form in which the terminal at an oxygen atom side binds to X.

The compound represented by General Formula (Z-4) or (Z-5) may be used singly or in combination of two or more kinds thereof. In particular, a form in which all of six X's in General Formula (Z-5) are an acryloyl group is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable.

Specific examples of the compounds include compounds represented by the following Formulae (a) to (f) (hereinafter also referred to as "exemplary compounds (a) to (f)"). Among these, the exemplary compounds (a), (b), (e), and (f) are preferable.

(a)

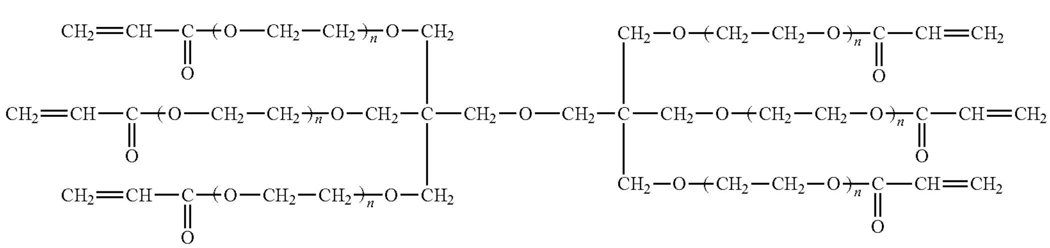

(the sum of the respective n's is 6)

-continued (b)

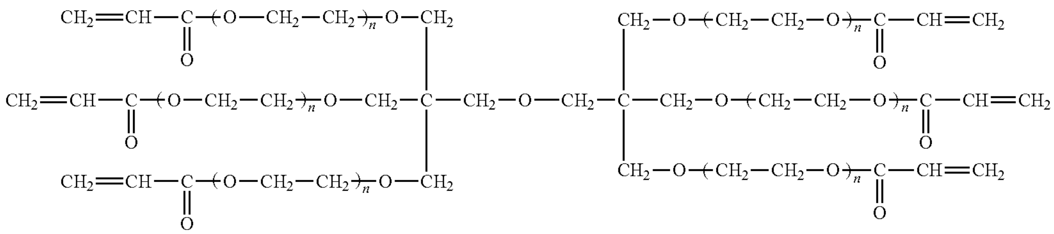

(the sum of the respective n's is 12)

(c)

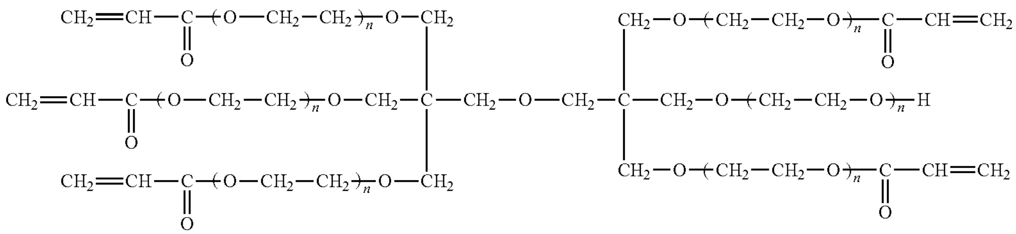

(the sum of the respective n's is 12)

(d)

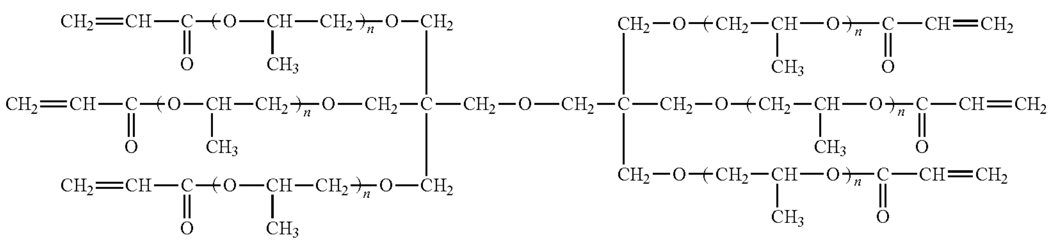

(the sum of the respective n's is 6)

(e)

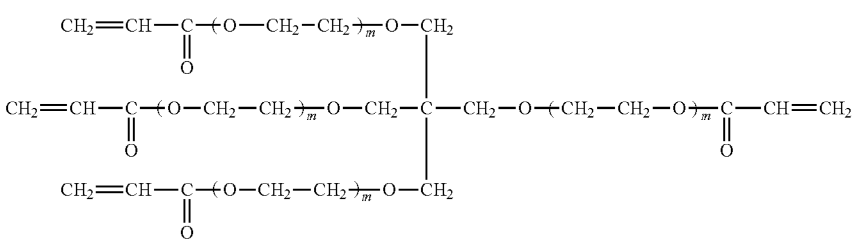

(the sum of the respective m's is 4)

(f)

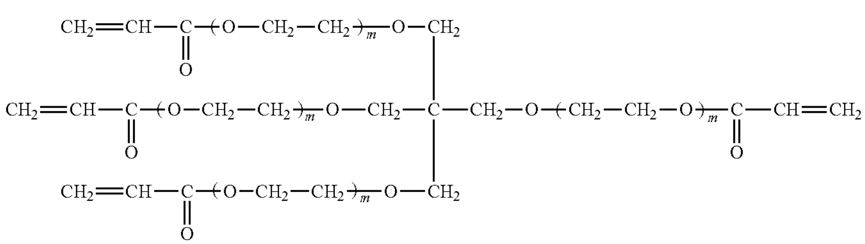

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer, and DPCA-60 which is a hexafunctional acrylate having six pentyleneoxy chains and TPA-330 which is a trifunctional acrylate having three isobutyleneoxy chains, manufactured by Nippon Kayaku Co., Ltd.

Moreover, as the polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), are used as the polymerizable compounds, a curable composition which is extremely excellent in photosensitization speed can be obtained. Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL CO., LTD.).

As the cyclic ether (epoxy or oxethane), examples of a bisphenol A type epoxy resin, which have an epoxy group, include JER-827, JER-828, JER-834, JER-1001, JER-1002, JER-1003, JER-1055, JER-1007, JER-1009, and JER-1010 (all manufactured by Japan Epoxy Resins Co., Ltd.), and EPICLON860, EPICLON1050, EPICLON1051, and EPICLON1055 (all manufactured by DIC Corporation); examples of a bisphenol F type epoxy resin include JER-806, JER-807, JER-4004, JER-4005, JER-4007, and JER-4010 (all manufactured by Japan Epoxy Resins Co., Ltd.), EPICLON 830 and EPICLON 835 (both manufactured by DIC Corporation), and LCE-21 and RE-602S (all manufactured by Nippon Kayaku Co., Ltd.); examples of a phenol novolac type epoxy resin include JER-152, JER-154, JER-157 S70, and JER-157 S65 (all manufactured by Japan Epoxy Resins Co., Ltd.), and EPICLON N-740, EPICLON N-770, and EPICLON N-775 (all manufactured by DIC Corporation); examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (all manufactured by Nippon Kayaku Co., Ltd.); and examples of an aliphatic epoxy resin include ADEKA RESIN EP-4080S, ADEKA RESIN EP-4085S, and ADEKA RESIN EP-4088S (all manufactured by ADEKA CORPORATION), CELLOXIDE 2021P, CELLOXIDE 2081, CELLOXIDE 2083, CELLOXIDE 2085, EHPE-3150 (a 1,2-epoxy-4-(2-oxylanyl(cyclohexane adduct of 2,2-bis(hydroxymethyl)-1-butanol), EPOLEAD PB 3600, and EPOLEAD PB 4700 (all manufactured by Daicel Chemical Industries, Ltd.), DENACOL EX-211L, EX-212L, EX-214L, EX-216L, EX-321L, and EX-850L (all manufactured by Nagase ChemteX Corporation), ADEKA RESIN EP-4000S, ADEKA RESIN EP-4003S, ADEKA RESIN EP-4010S, and ADEKA RESIN EP-4011S (all manufactured by ADEKA CORPORATION), NC-2000, NC-3000, NC-7300, XD-1000, EPPN-501, and EPPN-502 (all manufactured by ADEKA CORPORATION), and JER-1031S (manufactured by Japan Epoxy Resins Co., Ltd.). Such polymerizable compounds are suitable for a case of forming a pattern by a dry etching method.

Details of how to use these polymerizable compounds, such as the structure, whether the polymerizable compounds are used singly or used in combination thereof, and the amount of the polymerizable compounds added, can be arbitrarily set according to the designed final performance of the coloring composition. For example, from the viewpoint of sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the coloring composition, it is preferable that the polymerizable compound has 3 or more functional groups. In addition, a method for adjusting both the sensitivity and the strength by using a combination of compounds which differ in the number of functional groups and have different polymerizable groups (for example, an acrylic ester, a methacrylic ester, a styrene-based compound, and a vinylether-based compound) is also effective. Further, it is preferable to use polymerizable compounds having 3 or more functional groups and differing in the length of an ethylene oxide chain since the developability of the coloring composition can be adjusted, and excellent pattern formability is obtained.

In addition, from the viewpoints of the compatibility with other components (for example, a photopolymerization initiator, a substance to be dispersed, and an alkali-soluble resin) contained in the coloring composition, and the dispersibility, how to select and use the polymerizable compound is an important factor. For example, if a low-purity compound is used or a combination of two or more kinds thereof is used, the compatibility can be improved in some cases. In addition, from the viewpoint of improving the adhesiveness of the composition to a hard surface of a support or the like, specific structures may be selected in some cases.

In the case where of the curable compound is blended into the coloring composition of the present invention, the content thereof is preferably 0.1% by mass to 90% by mass, more preferably 1.0% by mass to 50% by mass, and particularly preferably 2.0% by mass to 30% by mass, with respect to the total solid contents of the coloring composition.

The composition of the present invention may include one kind or two or more kinds of curable compound. In the case where the composition includes two or more kinds of curable compound, the total amount thereof is preferably within the range.

<Polyfunctional Thiol Compound>

The coloring composition of the present invention may include a polyfunctional thiol having two or more mercapto groups in the molecule for the purpose of promoting the reaction of the polymerizable compound. The polyfunctional thiol compounds are preferably secondary alkanethiols, and particularly preferably compounds having a structure represented by the following General Formula (I).

General Formula (T1)

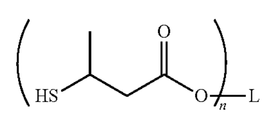

(In Formula (T1), n represents an integer of 2 to 4, and L represents a di- to tetra-valent linking group.)

In General Formula (T1), the linking group L is preferably an aliphatic group having 2 to 12 carbon atoms, n is 2, and L is particularly preferably an alkylene group having 2 to 12 carbon atoms. Specific examples of the polyfunctional thiol compound include the compounds represented by the following Structural Formulae (T2) to (T4), with the compound represented by General Formula (T2) being particularly preferable. These polyfunctional thiols can be used singly in combination of a plurality thereof.

(T2)

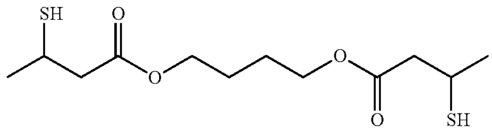

(T3)

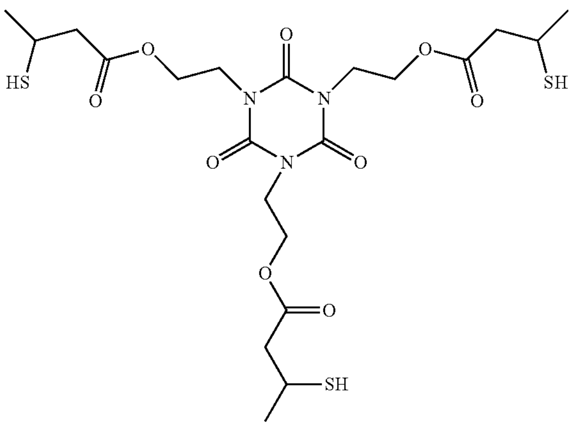

(T4)

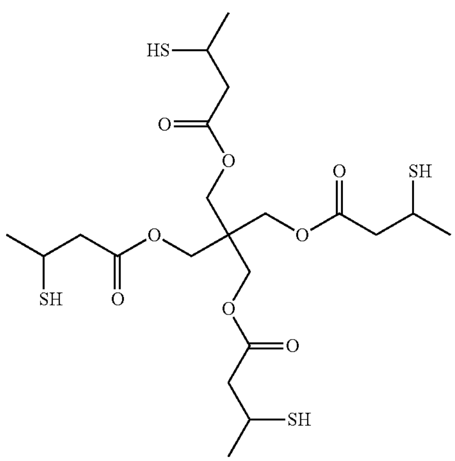

The blending amount of the polyfunctional thiol in the composition of the present invention is preferably in a range of 0.3% by weight to 8.9% by weight, and more preferably 0.8% by weight to 6.4% by weight, with respect to the total solid content excluding the solvent. Further, the polyfunctional thiol may be added for the purpose of improving stability, odors, resolution, developability, adhesion, and the like.

<Other Components of Coloring Composition>

The coloring composition of the present invention may include other components, in addition to the dye multimer and the curable compound. For example, for the purpose of controlling color values or the like, the coloring composition used in the present invention may include a pigment and a pigment dispersant, in addition to the dye multimer. In the case of using the pigment, a colored film thus formed preferably has a high transmittance, and in order to maintain this physical property, the kind of a pigment, the particle diameter, and the addition amount can be controlled.

Furthermore, in the case of forming a color filter used in the colored layer of the color filter, usually, the coloring composition of the present invention may further include a polymerization initiator, in addition to the dye multimer, the curable compound, the pigment, and the pigment dispersion liquid.

For example, in the case of forming a colored layer by dry etching, the composition may be a composition including a dye multimer, a polymerizable compound as a curable compound, a pigment, a pigment dispersion liquid, and a polymerization initiator. Further, the composition may include components such as a surfactant and a solvent.

<<Pigment>>

The coloring composition of the present invention may further include a pigment.

As the pigment used in the present invention, various inorganic or organic pigments known in the related art can be used, and the organic pigments are preferably used. As the pigment, one having a high transmittance is preferable.

Examples of the inorganic pigment include metal compounds represented by a metal oxide, a metal complex salt, or the like, and carbon black (C. I. Pigment Black 7). Specific examples of the metal compound include metal oxides of iron, cobalt, aluminum, cadmium, lead, copper, titanium, magnesium, chromium, zinc, antimony, and the like, and complex oxides of the metals.

Examples of the organic pigment include:

C. I. Pigment Yellow 11, 24, 31, 53, 83, 93, 99, 108, 109, 110, 138, 139, 147, 150, 151, 154, 155, 167, 180, 185, and 199;

C. I. Pigment Orange 36, 38, 43, and 71;

C. I. Pigment Red 81, 105, 122, 149, 150, 155, 171, 175, 176, 177, 209, 220, 224, 242, 254, 255, 264, and 270;

C. I. Pigment Violet 19, 23, 32, and 39;

C. I. Pigment Blue 1, 2, 15, 15:1, 15:3, 15:6, 16, 22, 60, and 66;

C. I. Pigment Green 7, 36, 37, and 58;

C. I. Pigment Brown 25 and 28; and

C. I. Pigment Black 1.

Examples of the pigment which can be preferably used in the present invention include the following ones, but the present invention is not limited thereto:

C. I. Pigment Yellow 11, 24, 108, 109, 110, 138, 139, 150, 151, 154, 167, 180, and 185, C. I. Pigment Orange 36 and 71, C. I. Pigment Red 122, 150, 171, 175, 177, 209, 224, 242, 254, 255, and 264, C. I. Pigment Violet 19, 23, and 32, C. I. Pigment Blue 15:1, 15:3, 15:6, 16, 22, 60, and 66, C. I. Pigment Green 7, 36, 37, and 58, and C. I. Pigment Black 1 and 7.

These organic pigments can be used singly or in various combinations for spectral adjustment or improvement of color purity. Specific examples of the combination are shown below. For example, as a red pigment, an anthraquinone-based pigment, a perylene-based pigment, or a diketopyrrolopyrrole-based pigment can be used singly or as a mixture of at least one kind of these with a disazo-based yellow pigment, an isoindoline-based yellow pigment, a quinophthalone-based yellow pigment, or a perylene-based red pigment. Examples of the anthraquinone-based pigment include C. I. Pigment Red 177, examples of the perylene-based pigment include C. I. Pigment Red 155, and C. I. Pigment Red 224, and examples of the diketopyrrolopyrrole-based pigment include C. I. Pigment Red 254. In view of chromatic resolving properties, a mixture of the above pigment with C. I. Pigment Yellow 139 is preferable. The mass ratio between the red pigment and the yellow pigment is preferably 100:5 to 100:50. The mass ratio is preferably in a range of 100:10 to 100:30. In addition, in the case of a combination of red pigments, the mass ratio can be adjusted according to the required spectrum.

In addition, as a green pigment, a halogenated phthalocyanine-based pigment can be used singly or as a mixture of this pigment with a disazo-based yellow pigment, a quinophthalone-based yellow pigment, an azomethine-based yellow pigment, or an isoindoline-based yellow pigment. For example a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is more preferably in a range of 100:30 to 100:120.

As a blue pigment, a phthalocyanine-based pigment can be used singly or as a mixture of this pigment with a dioxazine-based violet pigment. For example, a mixture of C. I. Pigment Blue 15:6 with C. I. Pigment Violet 23 is preferable. The mass ratio between the blue pigment and the violet pigment is preferably 100:0 to 100:100.

Moreover, as a pigment for a black matrix, carbon, titanium black, iron oxide, or titanium oxide may be used singly or as a mixture, and a combination of carbon with titanium black is preferable. The mass ratio of carbon to titanium black is preferably in a range of 100:0 to 100:60.

In the case where the coloring composition is used for a color filter, the primary particle size of the pigment is preferably 100 nm or less from the viewpoint of color unevenness or contrast. From the viewpoint of dispersion stability, the primary particle size is preferably 5 nm or more. The primary particle size of the pigment is more preferably 5 nm to 75 nm, still more preferably 5 nm to 55 nm, and particularly preferably 5 nm to 35 nm.

The primary particle size of the pigment can be measured by a known method such as electron microscopy.

Among these, the pigment is preferably a pigment selected from an anthraquinone pigment, a diketopyrrolopyrrole pigment, a phthalocyanine pigment, a quinophthalone pigment, an isoindoline pigment, an azomethine pigment, and a dioxazine pigment. In particular, C. I. Pigment Red 177 (anthraquinone pigment), C. I. Pigment Red 254 (diketopyrrolopyrrole pigment), C. I. Pigment Green 7, 36, 58, C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are particularly preferable.

The content of the pigment is preferably 10% by mass to 70% by mass, more preferably 25% by mass to 65% by mass, and still more preferably 35% by mass to 55% by mass, with respect to the total amount of components excluding a solvent contained in the coloring composition.

The composition of the present invention may include one kind or two or more kinds of pigment. In the case where the composition includes two or more kinds of pigment, the total amount thereof is preferably within the range.

Moreover, in the present invention, dyes other than the dye multimers or pigments other than the above-described pigments may be included. For example, the colorants disclosed in JP1989-90403A (JP-S64-90403A), JP1989-91102A (JP-S64-91102A), JP1989-94301A (JP-H01-94301A), JP1994-11614A (JP-H06-11614A), JP2592207B, U.S. Pat. No. 4,808,501B, U.S. Pat. No. 5,667,920B, U.S. Pat. No. 505,950B, JP1993-333207A (JP-H05-333207A), JP1994-35183A (JP-H06-35183A), JP1994-51115A (JP-H06-51115A), JP1994-194828A (JP-H06-194828A), and the like can be used. In terms of the chemical structure, a pyrazoleazo-based dye, an anilinoazo-based dye, a triphenylmethane-based dye, an anthraquinone-based dye, a benzylidene-based dye, an oxonol-based dye, a pyrazolotriazole azo-based dye, a pyridine azo-based dye, a cyanine-based dye, a phenothiazine-based dye, an pyrrolopyrazole azomethane-based dye, or the like can be used.

<<Pigment Dispersant>>

In the case where the coloring composition of the present invention has a pigment, a pigment dispersant can be used in combination therewith, as desired.

Examples of the pigment dispersant which can be used in the present invention include polymer dispersants [for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate], surfactants such as a polyoxyethylene alkyl phosphoric ester, a polyoxyethylene alkylamine, and an alkanolamine; and pigment derivatives.

The polymer dispersants can be further classified into linear polymers, terminal-modified polymers, graft polymers, and block polymers, according to the structure.

Examples of the terminal-modified polymers which has a site anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic colorant as described in JP1997-77994A (JP-H09-77994A), and the like. Moreover, a polymer obtained by introducing two or more moieties (acid groups, basic groups, partial skeletons of an organic colorant, heterocycles, or the like) anchored to the pigment surface into a polymer terminal as described in JP2007-277514A is also preferable since this polymer is excellent in dispersion stability.

Examples of the graft polymers having a site anchored to the pigment surface include polyester-based dispersant and the like, and specific examples thereof include a product of a reaction between a poly(lower alkylenimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, and the like, a graft polymer having a partial skeleton or a heterocycle of an organic colorant, which is described in JP2003-238837A, JP2008-9426A, JP2008-81732A, and the like, and a copolymer of a macromonomer and an acid group-containing monomer, which is described in JP2010-106268A, and the like. From the viewpoint of dispersibility of a pigment dispersion liquid, dispersion stability, and developability which a coloring composition using the pigment exhibits, an amphoteric dispersion resin having basic and acid groups, which is described in JP2009-203462A, is particularly preferable.

As the macromonomer used in production of a graft polymer having a site anchored to the pigment surface by radical polymerization, known macromonomers can be used. Examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group) manufactured by TOAGOSEI, CO., LTD.; PLACCEL FM 5 (a product obtained by adding 5 molar equivalents of ε-caprolactone to 2-hydroxyethyl methacrylate) and FA10L (a product obtained by adding 10 molar equivalents of s-caprolactone to 2-hydroxyethyl acrylate) manufactured by DAICEL Corporation; a polyester-based macromonomer described in JP1990-272009A (JP-H02-272009A), and the like. Among these, from the viewpoint of dispersibility of the pigment, dispersion liquid, and the developability which the coloring composition using the pigment dispersion liquid exhibits, the polyester-based macromonomer excellent in flexibility and solvent compatibility is particularly preferable. Further, a polyester-based macromonomer represented by the polyester-based macromonomer described in JP1990-272009A (JP-H02-272009A) is particularly preferable.

As the block polymer having a site anchored to the pigment surface, block polymers described in JP2003-49110A, JP2009-52010A, and the like are preferable.

The pigment dispersants which can be used in the present invention are available as a commercially available product, and specific examples thereof include "DA-7301" manufactured by Kusumoto Chemicals, Ltd., "DISPERBYK-101 (polyamidamine phosphate), 107 (carboxylic ester), 110 (copolymer including an acid group), 130 (polyamide), 161, 162, 163, 164, 165, 166, and 170 (polymeric copolymers)", and "BYK-P104 and P105 (high-molecular-weight unsaturated polycarboxylic acids)", manufactured by BYK-Chemie, "EFKA 4047, 4050 to 4010 to 4165 (polyurethane-based dispersants), EFKA 4330 to 4340 (block copolymers), 4400 to 4402 (modified polyacrylates), 5010 (polyesteramide), 5765 (high-molecular-weight polycarboxylate), 6220 (aliphatic polyester), 6745 (phthalocyanine derivative), and 6750 (azo pigment derivative)", manufactured by EFKA, "AJISPER PB821, PB822, PB880, PB881" manufactured by Ajinomoto Fine-Techno Co., Inc., "FLOWLEN TG-710 (urethane oligomer)" and "POLYFLOW No. 50E, and No. 300 (acrylic copolymer), manufactured by KYOEISHA CHEMICAL CO., LTD., "DISPARLON KS-860, 873 SN, 874, and #2150 (aliphatic polyvalent carboxylic acid), #7004 (polyether ester), DA-703-50, DA-705, and DA-725", manufactured by Kusumoto Chemicals, Ltd., "DEMOL RN, N (naphthalene sulfonate formaldehyde condensates), MS, C, and SN-B (aromatic sulfonate formaldehyde condensates)", "HOMOGENOL L-18 (polymeric polycarboxylic acid), "EMULGEN 920, 930, 935, and 985 (polyoxyethylene nonyl phenyl ethers)", and "ACETAMINE 86 (stearylamine acetate)", manufactured by Kao Corporation, "SOLSPERSE 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)", manufactured by Lubrizol Japan Ltd., "NIKKOL T106 (polyoxyethylene sorbitan monooleate), MYS-IEX (polyoxyethylene monostearate)" manufactured by NIKKO CHEMICALS Co., Ltd., HINOACT T-8000E and the like manufactured by Kawaken Fine Chemicals Co., Ltd., "ORGANOSILOXANE POLYMER KP341" manufactured by Shin-Etsu Chemical Co., Ltd., "W001: Cationic Surfactants" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic ester, and anionic surfactants such as "W004, W005, and W017", "EFKA-46, EFKA-47, EFKA-47EA, EFKA POLYMER 100, EFKA POLYMER 400, EFKA POLYMER 401, and EFKA POLYMER 450", manufactured by MORISHITA SANGYO CO., LTD., polymer dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA Corporation, and "IONET (trade name) S-20" manufactured by Sanyo Chemical Industries, Ltd.

These pigment dispersants may be used singly or in combination of two or more kinds thereof. In the present invention, it is particularly preferable to use a combination of a pigment derivative and a polymer dispersant. Further, the pigment dispersant may be used in combination with an alkali-soluble resin, together with a terminal-modified polymer having a site anchored to the pigment surface, a graft polymer, or a block polymer. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and a (meth)acrylic acid copolymer is particularly preferable. In addition, the N-position-substituted maleimide monomers copolymer described in JP1998-300922A (JP-H10-300922A), the ether dimer copolymers described in JP2004-300204A, and the alkali-soluble resins containing a polymerizable group described in JP1995-319161A (JP-H07-319161A) are also preferable. Specifically, alkali-soluble resins: a benzyl methacrylate/methacrylic acid/2-hydroxyethyl methacrylate copolymer is exemplified.

In the case where the coloring composition contains a pigment dispersant, the total content of the pigment dispersant in the coloring composition is preferably 1 part by mass to 80 parts by mass, more preferably 5 parts by mass to 70 parts by mass, and still more preferably 10 parts by mass to 60 parts by mass, with respect to 100 parts by mass of the pigment.

Specifically, in the case of using the polymer dispersant, the amount of the polymer dispersant used is preferably in a range of 5 parts by mass to 100 parts by mass, and more preferably in a range of 10 parts by mass to 80 parts by mass, with respect to 100 parts by mass of the pigment.

Furthermore, in the case of using the pigment derivative, the amount of the pigment derivative used is preferably in a range of 1 part by mass to 30 parts by mass, more preferably in a range of 3 parts by mass to 20 parts by mass, and particularly preferably in a range of 5 parts by mass to 15 parts by mass, with respect to 100 parts by mass of the pigment.

In the coloring composition, from the viewpoints of curing sensitivity and color density, the sum of the contents of the colorant and the dispersant components is preferably from 50% by mass to 90% by mass, more preferably from 55% by mass to 85% by mass, and still more preferably from 60% by mass to 80% by mass, with respect to all the solid contents constituting the coloring composition.

<<Alkali-Soluble Resin>>

The coloring composition of the present invention may further contain an alkali-soluble resin.

The alkali-soluble resin can be appropriately selected from alkali-soluble resins which are linear organic high molecular polymers and have at least one group enhancing alkali-solubility in the molecule (preferably a molecule having an acryl-based copolymer or a styrene-based copolymer as a main chain). From the viewpoint of heat resistance, a polyhydroxystyrene-based resin, a polysiloxane-based resin, an acryl-based resin, an acrylamide-based resin, and an acryl/acrylamide copolymer resin are preferable. Further, from the viewpoint of controlling developability, an acryl-based resin, an acrylamide-based resin, and an acryl/acrylamide copolymer resin are preferable.

Examples of the group promoting alkali-solubility (hereinafter also referred to as an "acid group") include a carboxyl group, a phosphoric acid group, a sulfonic acid group, a phenolic hydroxyl group, and the like. The group promoting alkali-solubility is preferably a group which is soluble in an organic solvent and can be developed by an aqueous weak alkaline solution, and particularly preferred examples thereof include a (meth)acrylic acid. These acid groups may be used singly or in combination of two or more kinds thereof.

Examples of the monomer which can impart the acid group after polymerization include monomers having a hydroxyl group, such as 2-hydroxyethyl (meth)acrylate, monomers having an epoxy group, such as glycidyl (meth) acrylate, and monomers having an isocyanate group, such as 2-isocyanatoethyl (meth)acrylate. The monomers for introducing these acid groups may be used singly or in combination of two or more kinds thereof. In order to introduce the acid group into the alkali-soluble resin, for example, the monomer having the acid group and/or the monomer which can impart the acid group after polymerization (hereinafter referred to as a "monomer for introducing an acid group" in some cases) may be polymerized as a monomer component.

Incidentally, in the case where a monomer which can impart the acid group after polymerization is used as a monomer component to introduce the acid group, a treatment for imparting the acid group, which will be described later, needs to be performed after polymerization.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, an aryl (meth)acrylate, and a vinyl compound. Examples of the alkyl (meth)acrylate and aryl (meth)acrylate include methyl (meth)acrylate, ethyl (meth) acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer disclosed in JP1998-300922A (JP-H10-300922A) include N-phenylmaleimide and N-cyclohexylmaleimide. Incidentally, other monomers copolymerizable with a (meth)acrylic acid may be used singly or in combination of two or more kinds thereof.

It is also preferable that the coloring composition contains, as the alkali-soluble resin, a polymer (a) obtained by polymerizing monomer components including a compound represented by the following General Formula (ED) and/or a compound represented by the following General Formula (ED2) (these compounds may hereinafter also be referred to as an "ether dimer" in some cases) as an essential component.

General Formula (ED)

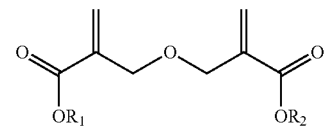

In General Formula (ED), $R_1$ and $R_2$ each independently represent a hydrogen atom or a hydrocarbon group having 1 to 25 carbon atoms, which may have a substituent.

General Formula (ED2)

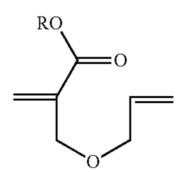

In General Formula (ED2), R represents a hydrogen atom or an organic group having 1 to 30 carbon atoms. With respect to specific examples of General Formula (ED2), reference can be made to the description of JP2010-168539A.

Thus, the coloring composition of the present invention can form a cured coated film which is extremely excellent in heat resistance as well as transparency. In General Formula (ED) which represents the ether dimer, the hydrocarbon group having 1 to 25 carbon atom, represented by $R_1$ and $R_2$, which may have a substituent, is not particularly limited, and examples thereof include linear or branched alkyl groups such as methyl, ethyl, n-propyl, isopropyl, n-butyl, isobutyl, tert-butyl, tert-amyl, stearyl, lauryl, and 2-ethylhexyl; aryl groups such as phenyl; alicyclic groups such as cyclohexyl, tert-butylcyclohexyl, dicyclopentadienyl, tricyclodecanyl, isobornyl, adamantyl, and 2-methyl-2-adamantyl; alkyl groups substituted with alkoxy such as 1-methoxyethyl and 1-ethoxyethyl; and alkyl groups substituted with an aryl group such as benzyl. Among these, from the viewpoints of heat resistance, substituents of primary or secondary carbon, which are not easily eliminated by an acid or heat, such as methyl, ethyl, cyclohexyl, and benzyl, are preferable.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis (methylene)]bis-2-propenoate, di(isopropyl)-2,2'-[oxybis (methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used singly or in combination of two or more kinds thereof. The structure derived from the compound represented by General Formula (ED) may be copolymerized with other monomers.

The alkali-soluble resin may include a structural unit derived from an ethylenically unsaturated monomer (a) represented by the following Formula (X).

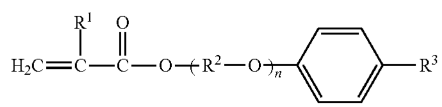

(In Formula (X), $R^1$ represents a hydrogen atom or a methyl group, $R^2$ represents an alkylene group having 2 to 10 carbon atoms, $R^3$ represents a hydrogen atom or an alkyl group having 1 to 20 carbon atoms, which may contain a benzene ring, and n represents an integer of 1 to 15.)

In Formula (X), the number of carbon atoms of the alkylene group of $R^2$ is preferably 2 to 3. Further, the number of carbon atoms of the alkyl group of $R^3$ is 1 to 20, and more preferably 1 to 10, and the alkyl group of $R^3$ may contain a benzene ring. Examples of the alkyl group containing a benzene ring, represented by $R^3$, include a benzyl group and a 2-phenyl(iso)propyl group.

Moreover, in order to improve the crosslinking efficiency of the coloring composition in the present invention, an alkali-soluble resin having a polymerizable group may be used. As the alkali-soluble resin having a polymerizable group, an alkali-soluble resins and the like containing an allyl group, a (meth)acryl group, an allyloxyalkyl group, and the like on a side chain thereof are useful. Examples of the polymer containing the above polymerizable group include DIANAL NR series (manufactured by Mitsubishi Rayon Co., Ltd.), PHOTOMER 6173 (a polyurethane acrylic oligomer containing COOH, manufactured by Diamond Shamrock Co., Ltd.), BISCOAT R-264 and KS RESIST 106 (all manufactured by OSAKA ORGANIC CHEMICAL INDUSTRY LTD.), CYCLOMER P series and PLACCEL CF200 series (all manufactured by DAICEL Corporation), and Ebecryl 3800 (manufactured by DAICEL-UCB Co., Ltd.). As the alkali-soluble resin containing a polymerizable group, a polymerizable double bond-containing acryl-based resin modified with urethane, which is a resin obtained by reacting an isocyanate group and an OH group in advance to leave one unreacted isocyanate group and performing a reaction between a compound including a (meth)acryloyl group and an acryl-based resin including a carboxyl group, an unsaturated bond-containing acryl-based resin which is obtained by a reaction between an acryl-based resin including a carboxyl group and a compound having both an epoxy group and a polymerizable double bond in a molecule, a polymerizable double bond-containing acryl-based resin which is obtained by a reaction between an acid pendant type epoxy acrylate resin, an acryl-based resin including an OH group, and a dibasic acid anhydride having a polymerizable double bond, a resin obtained by a reaction between an acryl-based resin having an OH group and a compound having isocyanate and a polymerizable group, a resin which is obtained by treating a resin, which has an ester group having an elimination group such as a halogen atom or a sulfonate group in an α-position or a β-position described in JP2002-229207A and JP2003-335814A on a side chain, with a base, and the like are preferable. Further, ACRYCURE RD-F8 (manufactured by NIPPON SHOKUBAI CO., LTD.) is also preferable.

As the alkali-soluble resin, a benzyl (meth)acrylate/(meth)acrylic acid copolymer or a multicomponent copolymer including benzyl (meth)acrylate/(meth)acrylic acid/other monomers is particularly suitable. Examples thereof also include a benzyl (meth)acrylate/(meth)acrylic acid/2-hydroxyethyl (meth)acrylate copolymer obtained by copolymerizing 2-hydroxyethyl methacrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, and particularly preferably a benzyl methacrylate/methacrylic acid copolymer.

With respect to the alkali-soluble resin, reference can be made to the descriptions in paragraphs "0558" to "0571" of JP2012-208494A ("0685" to "0700" of the corresponding US2012/0235099A), the contents of which are incorporated herein by reference.

Furthermore, it is preferable to use the copolymers (B) described in paragraph Nos. "0029" to "0063" of JP2012-32767A and the alkali-soluble resins used in Examples of the document; the binder resins described in paragraph Nos. "0088" to "0098" of JP2012-208474A and the binder resins used in Examples of the document; the binder resins described in paragraph Nos. "0022" to "0032" of JP2012-137531A and the binder resins in Examples of the document; the binder resins described in paragraph Nos. "0132" to "0143" of JP2013-024934A and the binder resins used in Examples of the document; the binder resins described in paragraph Nos. "0092" to "0098" of JP2011-242752A and used in Examples; or the binder resins described in paragraph Nos. "0030" to 0072" of JP2012-032770A, the contents of which are incorporated herein by reference. More specifically, the following resins are preferable.

-continued
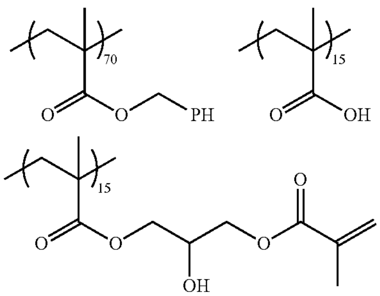
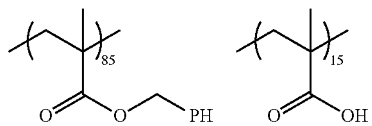
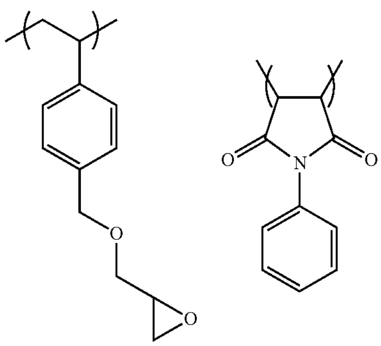
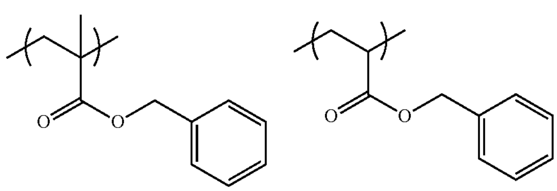
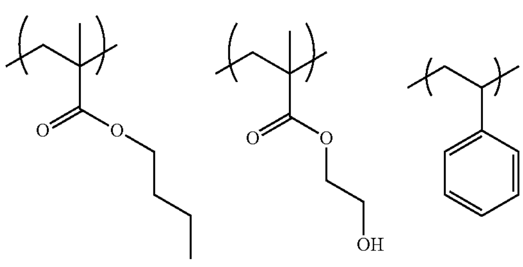
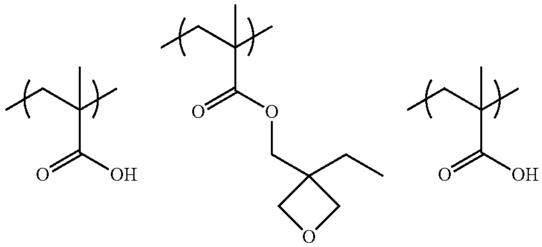
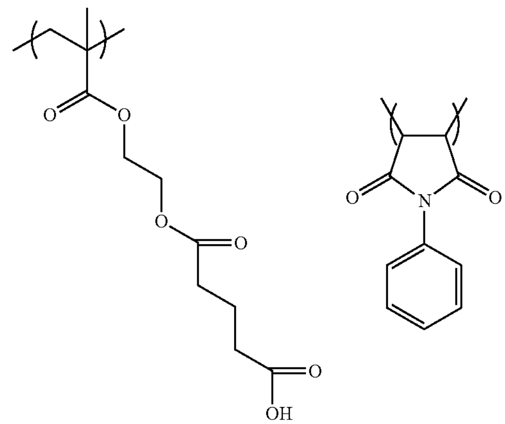
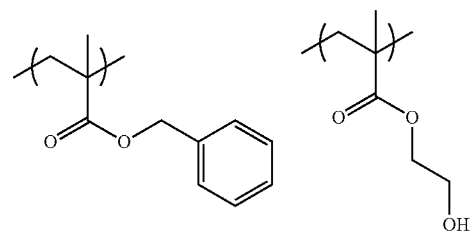
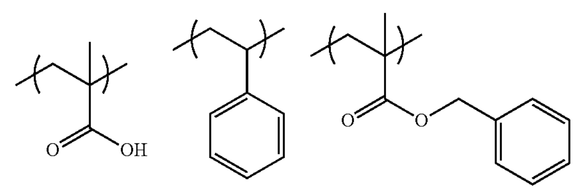
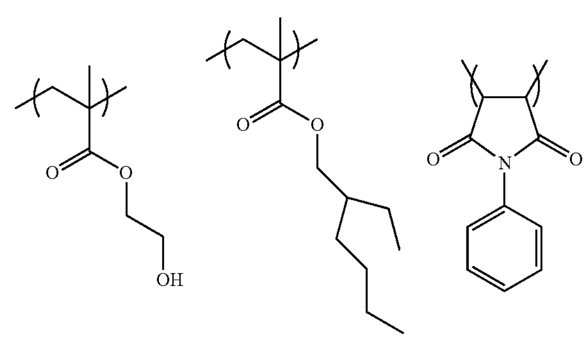
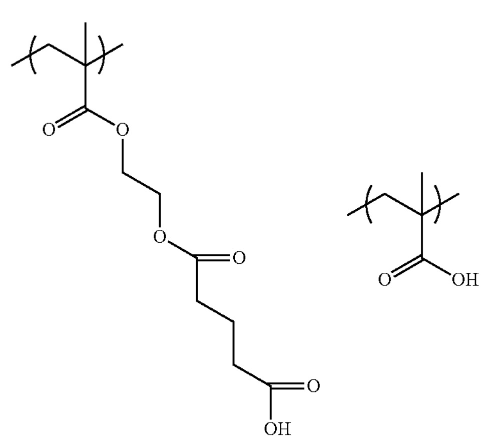

-continued

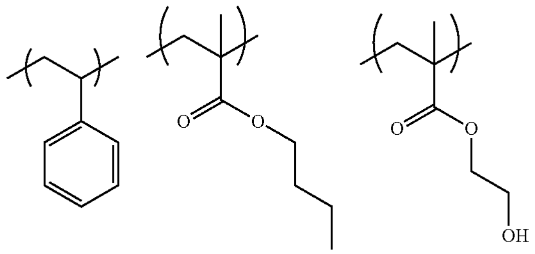

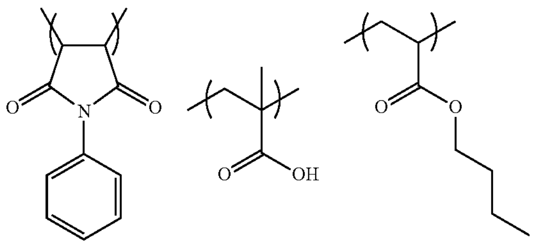

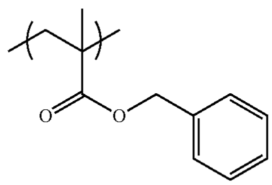

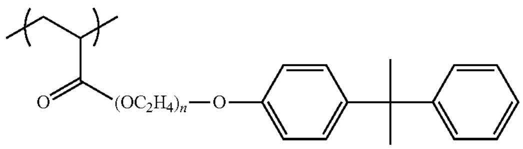

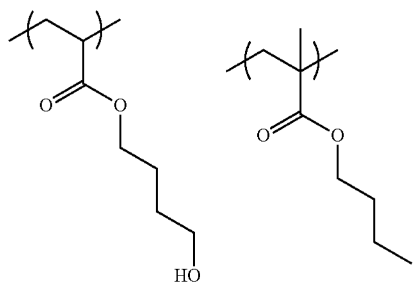

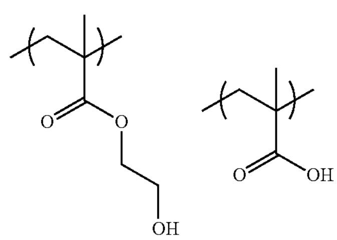

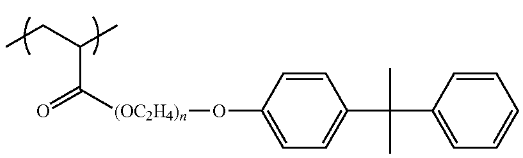

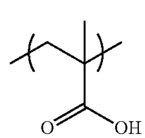

-continued

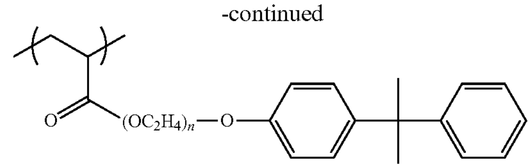

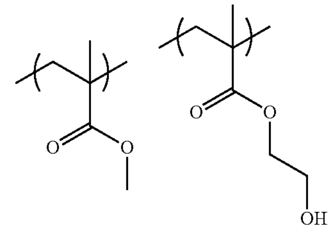

The acid value of the alkali-soluble resin is preferably 30 mgKOH/g to 200 mgKOH/g, more preferably 50 mgKOH/g to 150 mgKOH/g, and particularly preferably 70 mgKOH/g to 120 mgKOH/g.

Furthermore, the weight-average molecular weight (Mw) of the alkali-soluble resin is preferably 2,000 to 50,000, more preferably 5,000 to 30,000, and particularly preferably 7,000 to 20,000.

In the case where the coloring composition contains an alkali-soluble resin, the content of the alkali-soluble resin is preferably 1% by mass to 15% by mass, more preferably 2% by mass to 12% by mass, and particularly preferably 3% by mass to 10% by mass, with respect to the total solid contents of the coloring composition.

The composition of the present invention may include one kind or two or more kinds of alkali-soluble resin. In the case where the composition includes two or more kinds of the alkali-soluble resin, the total amount thereof is preferably within the range.

<<Polymerization Initiator>>

From the viewpoint of further improving sensitivity, it is essential that the coloring composition of the present invention further contains a polymerization initiator.

The polymerization initiator is not particularly limited as long as it has an ability of initiating polymerization of a polymerizable compound, and can be appropriately selected from known photopolymerization initiators. For example, polymerization initiators sensitive to light rays in a range from ultraviolet region to visible light are preferable. In addition, the polymerization initiator may be either an activator which interacts with a photo-excited sensitizer in any way and generates active radicals or an initiator which initiates cationic polymerization according to the type of monomer.

In addition, it is preferable that the polymerization initiator contains at least one compound having a molar light absorption coefficient of at least about 50 in a range of about 300 nm to 800 nm (more preferably 330 nm to 500 nm).

Examples of the photopolymerization initiator include halogenated hydrocarbon derivatives (for example, a derivative having a triazine skeleton, and a derivative having an oxadiazole skeleton), acyl phosphine compounds such as acyl phosphine oxide, oxime compounds such as hexaaryl biimidazole and oxime derivatives, organic peroxides, thio compounds, ketone compounds, aromatic onium salts, ketoxime ethers, aminoacetophenone compounds, and hydroxyacetophenone are preferable.

Furthermore, as the polymerization initiator, a compound selected from the group consisting of a trihalomethyltriazine compound, a benzyldimethylketal compound, an α-hydroxyketone compound, an α-aminoketone compound, an acyl phosphine compound, a phosphine oxide compound, a metallocene compound, an oxime compound, a triallylimidazole dimer, an onium compound, a benzothiazole compound, a benzophenone compound, an acetophenone compound and a derivative thereof, a cyclopentadiene-benzene-iron complex and a salt thereof, a halomethyloxadiazole compound, a 3-aryl substituted coumarin compound is preferable from the viewpoint of exposure sensitivity.

A trihalomethyltriazine compound, an α-aminoketone compound, an acyl phosphine compound, a phosphine oxide compound, an oxime compound, a triallylimidazole dimer, an onium compound, a benzophenone compound, or an acetophenone compound is more preferable, and at least one type of compound selected from the group consisting of a trihalomethyltriazine compound, an α-aminoketone compound, an oxime compound, a triallylimidazole dimer, and a benzophenone compound is particularly preferable.

In particular, in the case where the coloring composition of the present invention is used for the manufacture of a color filter for a solid-state imaging device, a fine pattern needs to be formed in a sharp shape. Accordingly, it is important that the coloring composition has curing properties and is developed without residues in an unexposed area. From this viewpoint, an oxime compound is particularly preferable as a polymerization initiator. In particular, in the case where a fine pattern is formed in the solid-state imaging device, stepper exposure is used for the exposure for curing. However, the exposure machine used at this time is damaged by halogen in some cases, so it is necessary to reduce the amount of a polymerization initiator added. In consideration of this point, in order to form a fine pattern as in a solid-state imaging device, it is particularly preferable to use an oxime compound as the polymerization initiator.

With respect to specific examples of the polymerization initiator used in the present invention, reference can be made to, for example, paragraphs "0265" to "0268" of JP2013-29760A, the contents of which may be incorporated herein by reference.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379 (trade names, all manufactured by BASF) which are commercially available products can be used. In addition, as the aminoacetophenone-based initiator, the compound described in JP2009-191179A, of which an absorption wavelength matches a light source of a long wavelength of 365 nm, 405 nm, or the like, can be used. Moreover, as the acyl phosphine-based initiator, IRGACURE-819 or DAROCUR-TPO (trade name, both manufactured by BASF) which are commercially available products can be used.

More preferred examples of the polymerization initiator include an oxime compound. Specific examples of the oxime compound include the compound described in JP2001-233842A, the compound described in JP2000-80068A, or the compound described in JP2006-342166A can be used.

Examples of the oxime compound such as an oxime derivative that is suitably used as the polymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime ester compound include the compounds described in J. C. S. Perkin II (1979), pp. 1653-1660, J. C. S. Perkin II (1979), pp. 156-162, Journal of Photopolymer Science and Technology (1995), pp. 202-232, and JP2000-66385A, and the compounds described respectively in JP2000-80068A, JP2004-534797A, JP2006-342166A, and the like.

As commercially available products, IRGACURE OXE-01 (manufactured by BASF), IRGACURE OXE-02 (manufactured by BASF), or TR-PBG-304 (manufactured by Changzhou Tronly New Electronic Materials CO., LTD.) is also suitably used.

As the oxime ester compound other than the above compounds, the compound described in JP2009-519904A in which oxime is linked to an N-position of carbazole, the compound described in U.S. Pat. No. 7,626,957B in which a hetero-substituent is introduced into a benzophenone site, the compounds described in JP2010-15025A and US2009/292039A in which a nitro group is introduced into a colorant site, the ketoxime compound described in WO2009/131189A, the compound described in U.S. Pat. No. 7,556,910B that contains a triazine skeleton and an oxime skeleton in the same molecule, the compound described in JP2009-221114A that exhibits maximum absorption at 405 nm and exhibits excellent sensitivity to a light source of a g-line, and the like may be used.

Preferably, reference can be made to, for example, paragraphs "0274" to "0275" of JP2013-29760A, the contents of which may be incorporated herein by reference.

Specifically, the oxime polymerization initiator is preferably a compound represented by the following Formula (OX-1). Moreover, the compound may be an oxime compound in which the N—O bond of oxime forms an (E) isomer, an oxime compound in which the N—O bond forms a (Z) isomer, or a mixture in which the N—O bond forms a mixture of an (E) isomer and a (Z) isomer.

(0X-1)

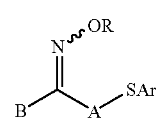

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. Moreover, the substituents may be further substituted with other substituents.

Examples of the substituents include a halogen atom, an aryloxy group, an alkoxycarbonyl or aryloxycarbonyl group, an acyloxy group, an acyl group, an alkyl group, and an aryl group.

Specific examples (C-4) to (C-13) of the compound represented by General Formula (OX-1) are shown below, but the present invention is not limited thereto.

(C-4)

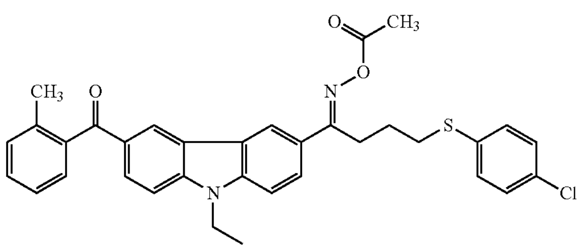

(C-5)

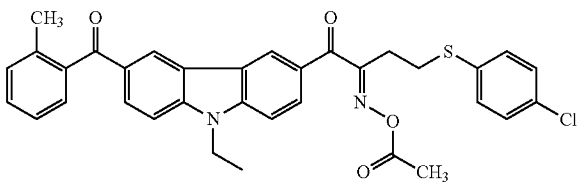

(C-6)

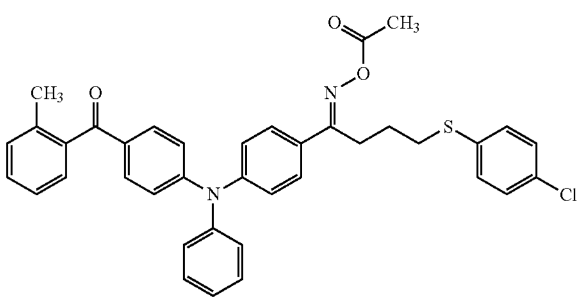

(C-7)

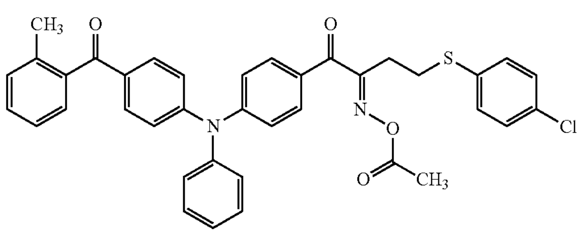

(C-8)

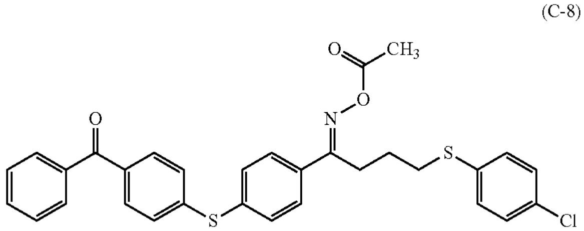

-continued (C-9)

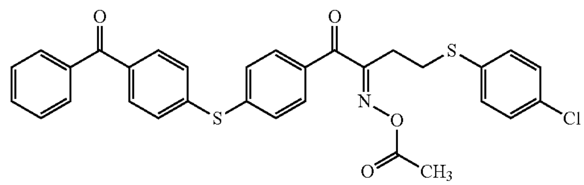

(C-10)

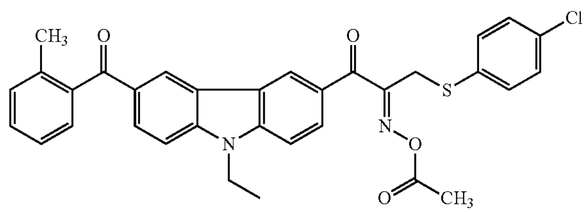

(C-11)

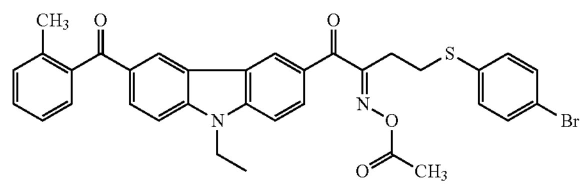

(C-12)

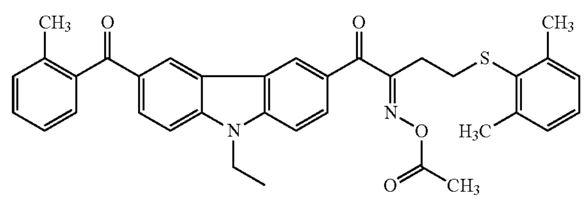

(C-13)

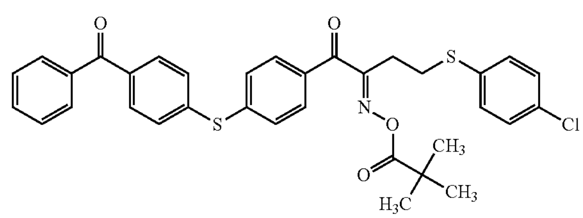

The oxime compound has a maximum absorption wavelength in a wavelength region of 350 nm to 500 nm and preferably has an absorption wavelength in a wavelength region of 360 nm to 480 nm, and an oxime compound showing a high absorbance at 365 nm and 455 nm is particularly preferable.

From the viewpoint of sensitivity, the molar light absorption coefficient at 365 nm or 405 nm of the oxime compound is preferably 1,000 to 300,000, and more preferably 2,000 to 300,000, and particularly preferably 5,000 to 200,000.

The molar light absorption coefficient of the compound can be measured using a known method, but specifically, it is preferable to measure the molar light absorption coefficient by means of, for example, a UV-visible spectrophotometer (Carry-5 spectrophotometer manufactured by Varian Medical System, Inc.) by using an ethyl acetate solvent at a concentration of 0.01 g/L.

Two or more kinds of the polymerization initiators used in the present invention may also be used, if desired.

In the case where the coloring composition of the present invention contains the polymerization initiator, the content of the polymerization initiator is preferably from 0.1% by mass to 50% by mass, more preferably from 0.5% by mass to 30% by mass, and still more preferably from 1% by mass to 20% by mass, with respect to the total solid contents of the coloring composition. Within this range, improved sensitivity and pattern formability are obtained.

The composition of the present invention may include one kind or two or more kinds of polymerization initiator. In the case where the composition includes two or more kinds of the polymerization initiator, the total amount thereof is preferably within the range.

<Other Components>

The coloring composition of the present invention may also contain other components such as an organic solvent, a crosslinking agent, a polymerization inhibitor, a surfactant, an organic carboxylic acid, and an organic carboxylic anhydride, in addition to the respective components as described above, within a range which does not diminish the effects of the present invention.

<<Organic Solvent>>

The coloring composition of the present invention may contain an organic solvent. Basically, the organic solvent is not particularly limited as long as it satisfies the solubility of the respective components or the coatability of the coloring composition, but in particular, the organic solvent is preferably selected in consideration of the solubility, coatability, and safety of an ultraviolet absorber, an alkali-soluble resin, a dispersant, or the like. In addition, when the coloring composition in the present invention is prepared, the coloring composition preferably includes at least two kinds of organic solvents.

Suitable examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethy ether acetate, propylene glycol monoethyl ether acetate, and propylene glycol monopropyl ether acetate; ketones such as methyl ethyl ketone, cyclohexanone, 2-heptanone, and 3-butanone; and aromatic hydrocarbons such as toluene and xylene.

From the viewpoint of the solubility of an ultraviolet absorber and the alkali-soluble resin, and improvement of the shape of the coated surface, it is also preferable to mix two or more kinds of these organic solvents. In this case, a mixed solution consisting of two or more kinds selected from the methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable.

From the viewpoint of coatability, the content of the organic solvent in the coloring composition is set such that the concentration of the total solid contents of the composition becomes preferably 5% by mass to 80% by mass, more preferably 5% by mass to 60% by mass, and particularly preferably 10% by mass to 50% by mass.

The composition of the present invention may include one kind or two or more kinds of organic solvent. In the case where the composition includes two or more kinds of the organic solvents, the total amount thereof is preferably within the range.

<<Crosslinking Agent>>

By using a crosslinking agent supplementarily in the colored composition of the present invention, the hardness of the colored cured film formed by curing the coloring composition can further be enhanced.

The crosslinking agent is not particularly limited as long as it can cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound, which is substituted with at least one substituent selected from a methylol group, an alkoxymethyl group, and an acyloxymethyl group. Among these, a polyfunctional epoxy resin is preferable.

With regard to details of specific examples and the like of the crosslinking agent, reference can be made to the descriptions in paragraphs "0134" to "0147" of JP2004-295116A, the contents of which may be incorporated herein by reference.

In the case where the coloring composition of the present invention contains a crosslinking agent, the blending amount of the crosslinking agent is not particularly limited, but is preferably 2% by mass to 30% by mass, and more preferably 3% by mass to 20% by mass, with respect to the total solid content of the composition.

The composition of the present invention may one kind or two or more kinds of crosslinking agent. In the case where the composition includes two or more kinds of the crosslinking agent, the total amount thereof is preferably within the range.

<<Polymerization Inhibitor>>

It is preferable to add a small amount of a polymerization inhibitor to the coloring composition of the present invention in order to suppress the occurrence of unnecessary thermal polymerization of the polymerizable compound during production or storage of the coloring composition.

Examples of the polymerization inhibitor which can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and a cerium (III) salt of N-nitrosophenyl hydroxylamine.

In the case where the coloring composition of the present invention contains a polymerization inhibitor, the amount of the polymerization inhibitor added is preferably about 0.01% by mass to about 5% by mass, with respect to the total mass of the composition.

The composition of the present invention may include one kind or two or more kinds of polymerization inhibitor. In the case where the composition includes two or more kinds of the polymerization inhibitor, the total amount thereof is preferably within the range.

<<Surfactant>>

From the viewpoint of further improving coatability, various surfactants may be added to the coloring composition of the present invention. As the surfactants, it is possible to use various surfactants such as a fluorine-based surfactant, a nonionic surfactant, a cationic surfactant, an anionic surfactant, and a silicone-based surfactant.

In particular, if the coloring composition of the present invention contains a fluorine-based surfactant, liquid characteristics (particularly, fluidity) are further improved when the composition is prepared as a coating liquid, whereby evenness of the coating thickness or liquid saving properties can be further improved.

That is, in the case where a coating liquid obtained by applying the coloring composition containing a fluorine-based surfactant is used to form a film, the surface tension between a surface to be coated and the coating liquid is reduced to improve wettability with respect to the surface to be coated, and enhance coatability with respect to the surface to be coated. Therefore, even in the case where a thin film of about several μm is formed of a small amount of liquid, the coloring composition containing a fluorine-based surfactant is effective in that a film with a uniform thickness which exhibits a small extent of thickness unevenness can be more suitably formed.

The fluorine content in the fluorine-based surfactant is preferably 3% by mass to 40% by mass, more preferably 5% by mass to 30% by mass, and particularly preferably 7% by mass to 25% by mass. The fluorine-based surfactant in which the fluorine content is within this range is effective in terms of the uniformity of the thickness of the coated film or liquid saving properties, and the solubility of the surfactant in the coloring composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (all manufactured by DIC Corporation); FLUORAD FC430, FC431, and FC171 (all manufactured by Sumitomo 3M); and SURFLON S-382, SURFLON SC-101, SURFLON SC-103, SURFLON SC-104, SURFLON SC-105, SURFLON SC-1068, SURFLON SC-381, SURFLON SC-383, SURFLON SC-393, and SURFLON KH-40 (all manufactured by ASAHI GLASS Co., Ltd.).

Specific examples of the nonionic surfactant include glycerol, trimethylolpropane, trimethylolethane, and ethoxylate and propoxylate thereof (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.).

Specific examples of the cationic surfactant include phthalocyanine derivatives (trade name: EFKA-745 manufactured by MORISHITA & CO., LTD.), ORGANOSILOXANE POLYMER KP341 (manufactured by Shin-Etsu Chemical Co., Ltd.), (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicon-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400", manufactured by Dow Corning Toray CO., LTD., "TSF-4440", "TSF-4300", "TSF-4445", "TSF-4460", and "TSF-4452", manufactured by Momentive Performance Materials Inc., "KP341", "KF6001", and "KF6002", manufactured by Shin-Etsu Chemical Co., Ltd., and "BYK307", "BYK323", and "BYK330", manufactured by BYK-Chemie.

In the case where the coloring composition of the present invention contains a surfactant, the amount of the surfactant added is preferably 0.001% by mass to 2.0% by mass and more preferably 0.005% by mass to 1.0% by mass, with respect to the total mass of the coloring composition.

The composition of the present invention may include one kind or two or more kinds of surfactant. In the case where the composition includes two or more kinds of the surfactant, the total amount thereof is preferably within the range.

<<Organic Carboxylic Acid and Organic Carboxylic Anhydride>>

The coloring composition of the present invention may contain an organic carboxylic acid having a molecular weight of 1,000 or less, and/or an organic carboxylic anhydride. With respect to specific examples of the organic carboxylic acid and the organic carboxylic acid anhydride, reference can be made to, for example, paragraphs "0338" to "0340" of JP2013-29760A, the contents of which may be incorporated herein by reference.

If the coloring composition of the present invention contains an organic carboxylic acid or an organic carboxylic anhydride, the amount of these organic carboxylic acids and/or the organic carboxylic anhydrizdes added is generally in a range of 0.01% by weight to 10% by weight, preferably 0.03% by weight to 5% by weight, and more preferably 0.05% by weight to 3% by weight in the total solid contents.

The composition of the present invention may include one kind or two or more kinds of each of an organic carboxylic acid and/or an organic carboxylic anhydride. In the case where the composition includes two or more kinds of the organic carboxylic acid and/or the organic carboxylic anhydride, the total amount thereof is preferably within the range.

If desired, various additives such as a filler, an adhesion promoting agent, an antioxidant, an ultraviolet absorber, and an anti-aggregation agent may be blended into the coloring composition. Examples of these additives include those described in paragraphs "0155" and "0156" of JP2004-295116A, the contents of which are incorporated herein by reference.

The coloring composition of the present invention can contain the sensitizer or the light stabilizer described in paragraph "0078" of JP2004-295116A, and the thermal polymerization inhibitor described in paragraph "0081" of JP2004-295116A.

<Method for Preparing Coloring Composition>

The coloring composition of the present invention is prepared by mixing the aforementioned components.

Furthermore, when the coloring composition is prepared, the respective components constituting the coloring composition may be mixed together at the same time or mixed together sequentially after being dissolved and dispersed in a solvent. Further, the order of adding the components and the operation conditions during the mixing are not particularly restricted. For example, all the components may be dissolved and dispersed in a solvent at the same time to prepare the composition. Alternatively, if desired, the respective components may be appropriately prepared as two or more solutions or dispersion liquids and mixed at the time of use (at the time of coating) to prepare the composition.

It is preferable that the coloring composition of the present invention is filtered using a filter for the purpose of removing impurities or reducing deficit, for example. Filters that have been used in the related art for filtration use and the like may be used without particular limitation. Examples thereof include filters formed of a fluorine resin such as polytetrafluoroethylene (PTFE), a polyamide-based resin such as Nylon-6 and Nylon-6,6, and a polyolefin resin (including a high density and a ultrahigh molecular weight) such as polyethylene and polypropylene (PP). Among these materials, polypropylene (including high density polypropylene) is preferable.

The pore diameter of the filter is suitably approximately 0.01 μm to 7.0 μm, preferably approximately 0.01 μm to 3.0 μm, and more preferably approximately 0.05 μm to 0.5 μm. By setting the pore diameter to this range, it is possible to reliably remove fine impurities which interfere with preparation of a uniform and smooth coloring composition in a subsequent step.

When a filter is used, other filters may be used in combination therewith. At that time, filtering at a first filter may be performed only once or two or more times.

In addition, first filters having different pore diameters within the aforementioned range may be combined. As the pore diameter herein, a reference may be made to nominal values of a filter maker. A commercially available filter may be selected from various filters provided by, for example, Pall Corporation, Toyo Roshi Kaisha., Ltd., Nihon Entegris K. K. (former Nippon Microlith Co., Ltd.), Kitz Micro Filter Corporation, or the like.

As a second filter, a filter formed of a material which is the same as the material for the aforementioned first filter and the like can be used.

For example, the filtration at the first filter may be performed with only the dispersion, and the other components may be mixed and then the filtration at the second filtration may be performed.

The coloring composition of the present invention is suitably used for forming a colored layer of a color filter since it can improve adhesiveness to a substrate and can form a colored cured film having good surface roughness. Further, the coloring composition of the present invention can be suitably used for forming a colored pattern of a color filter or the like used in a solid-state imaging device (for example, a CCD and a CMOS), or an image display device such as a liquid crystal display (LCD). Further, the coloring composition can also be suitably used in an application of the manufacture of a print ink, an ink jet ink, a coating material, or the like. Among these, the composition can be suitably used in an application of the manufacture of a color filter for a solid-state imaging device such as a CCD and a CMOS.

<Cured Film, Pattern Forming Method, Color Filter, and Method for Manufacturing Color Filter>

Next, the cured film, the pattern forming method, and the color filter in the present invention will be described in detail by an explanation of production methods thereof. Further, a method for manufacturing a color filter using the pattern forming method of the present invention will also be described.

The cured film of the present invention is formed by curing the coloring composition of the present invention. Such a cured film is preferably used in a color filter.

In the pattern forming method of the present invention, the coloring composition of the present invention is applied onto a support to form a coloring composition layer, and an undesired area is removed to form a colored pattern.

The pattern forming method of the present invention can be suitably applied for forming a colored pattern (pixel) included in a color filter.

With the composition of the present invention, a color filter may be produced by forming a pattern using a so-called photolithography method and a pattern may be formed by a dry etching method.

That is, as a first embodiment for manufacturing a color filter of the present, a method for manufacturing a color filter including a step of applying the coloring composition of the present invention onto a support to form a coloring composition layer, a step of patternwise exposing the coloring composition layer, and a step of removing an unexposed area by development to form a colored pattern is exemplified.

Furthermore, as a second embodiment for manufacturing a color filter of the present invention, a method for manufacturing a color filter, including a step of applying the coloring composition of the present invention onto a support to form a coloring composition layer, followed by curing, to form a colored layer, a step of forming a photoresist layer on the colored layer, a step of patterning the photoresist layer by exposure and development to obtain a resist pattern, and a step of dry etching the colored layer using the resist pattern as an etching mask is exemplified.

Such a pattern forming method is used for the manufacture of the colored layer of the color filter. That is, a method for manufacturing a color filter, including the pattern forming method of the present invention, is also disclosed in the present invention.

Hereinafter, details of these will be described.

The respective steps in the pattern faulting method of the present invention will be described in detail below with reference to the method for manufacturing a color filter for a solid-state imaging device, but the present invention is not limited to this method. Hereinafter, the color filter for a solid-state imaging device may be simply referred to as a "color filter" in some cases.

<<Coloring Composition Layer Forming Step>>

In the coloring composition layer forming step, the coloring composition of the present invention is applied onto a support to form a coloring composition layer.

As the support which can be used in the present step, for example, it is possible to use a substrate for a solid-state imaging device, which is formed by providing an imaging device (light-receiving element) such as a charge coupled device (CCD) or a complementary metal-oxide semiconductor (CMOS) onto a substrate (for example, a silicon substrate).

The colored pattern in the present invention may be formed on the surface (front surface) on which an imaging device is formed or on the surface (back surface) where an imaging device is not formed, of a substrate for a solid-state imaging device.

A light shielding film may be disposed between the colored pattern in a solid-state imaging device or onto the back surface of the substrate for a solid-state imaging device.

In addition, if desired, an undercoat layer may be disposed onto the support in order to improve adhesiveness between the support and the upper layer, prevent diffusion of substances, or planarize the substrate surface. A solvent, an alkali-soluble resin, a polymerizable compound, a polymerization inhibitor, a surfactant, a photopolymerization initiator, or the like can be blended into the undercoat layer, and it is preferable that these respective components are properly selected from the components blended into the aforementioned composition of the present invention.

As the method for applying the coloring composition of the present invention onto the support, various coating methods such as slit coating, ink jet coating, spin coating, cast coating, roll coating, and a screen printing method can be applied.

Drying (prebaking) of the coloring composition layer applied onto the support can be carried out using a hot plate, an oven, or the like at a temperature of 50° C. to 140° C. for 10 seconds to 300 seconds.

<Pattern Forming Step by Photolithography Method>

<<Exposing Step>>

In the exposing step, the coloring composition layer formed in the coloring composition layer forming step is patternwise exposed through a mask having a predetermined mask pattern by using, for example, an exposure device such as a stepper. Thus, a cured film is obtained.

As radiation (light) usable in exposure, particularly, ultraviolet rays such as a g-line and an i-line are preferably used (particularly, an i-line is preferably used). The irradiation dose (exposure dose) is preferably 30 mJ/cm$^2$ to 1,500 mJ/cm$^2$, more preferably 50 mJ/cm$^2$ to 1,000 mJ/cm$^2$, and particularly preferably 80 mJ/cm$^2$ to 500 mJ/cm$^2$.

The film thickness of the cured film (colored film) is preferably 1.0 μm or less, more preferably 0.1 μm to 0.9 μm, and still more preferably 0.2 μm to 0.8 μm.

It is preferable to set the film thickness to 1.0 μm or less since a high degree of resolution and adhesiveness are obtained.

Moreover, in this step, a cured film having a small film thickness of 0.7 μm or less can be suitably formed. Further, if the obtained cured film is subjected to a development process in a pattern forming step which will be described later, it is possible to obtain a thin film having a colored pattern which exhibits excellent developability and reduced surface roughness and has an excellent pattern shape.

<<Developing Step>>

Next, by carrying out an alkaline developing treatment, the coloring composition layer in an area not irradiated with light in the exposing step is eluted into an aqueous alkaline solution, and as a result, only a photocured area remains.

As a developing liquid, an organic alkaline developing liquid not damaging an imaging device, a circuit, or the like in an underlayer is preferable. The development temperature is usually from 20° C. to 30° C., and the development time is 20 seconds to 90 seconds in the related art. In order to further remove residues, development is recently carried out for 120 seconds to 180 seconds in some cases. Further, in order to improve residue removal properties, a step of sufficiently shaking the developing liquid every 60 seconds and newly supplying a developing liquid is repeated plural times in some cases.

Examples of an alkaline agent for use in the developing liquid include organic alkaline compounds such as aqueous ammonia, ethylamine, diethylamine, dimethyl ethanolamine, tetramethyl ammonium hydroxide, tetraethyl ammonium hydroxide, tetrapropyl ammonium hydroxide, tetrabutyl ammonium hydroxide, benzyltrimethyl ammonium hydroxide, choline, pyrrole, piperidine, and 1,8-diazabicyclo-[5,4,0]-7-undecene. An aqueous alkaline solution obtained by diluting these alkaline agents with pure water so as to yield a concentration of the alkaline agent of 0.001% by mass to 10% by mass, and preferably 0.01% by mass to 1% by mass is preferably used as the developing liquid.

Incidentally, inorganic alkali may be used for the developing liquid, and as the inorganic alkali, for example, sodium hydroxide, potassium hydroxide, sodium carbonate, sodium hydrogen carbonate, sodium silicate, sodium metasilicate, and the like are preferable.

Furthermore, in the case where a developing liquid formed of such an aqueous alkaline solution is used, the pattern is generally cleaned (rinsed) with pure water after development.

Next, it is preferable to carry out a heating treatment (postbaking) after drying. If a multi-colored pattern is formed, the above steps can be sequentially repeated for each color to produce a cured coat. Thus, a color filter is obtained.

The postbaking is a heating treatment performed after development so as to complete curing, and in the postbaking, a thermal curing treatment is carried out usually at 100° C. to 240° C., and preferably at 200° C. to 240° C.

The postbaking treatment can be carried out on the coated film obtained after development in a continuous or batch manner, by using heating means such as a hot plate, a convection oven (a hot-air circulation type drier), and a high-frequency heater under the conditions described above.

Furthermore, the manufacturing method of the present invention may have a step known as a method for manufacturing a color filter for a solid-state imaging device, if desired, as a step other than the above steps. For example, the method may include a curing step of curing the formed colored pattern by heating and/or exposure, if desired, after the coloring composition layer forming step, the exposing step, and the pattern forming step are carried out.

Moreover, in the case of using the coloring composition according to the present invention, contaminations or the like occur in some cases, for example, when a nozzle of an ejection portion or a piping portion of a coating device is clogged, or the coloring composition or a pigment adheres to, or is precipitated or dried inside the coating machine. Accordingly, in order to efficiently clean off the contaminations caused by the composition of the present invention, it is preferable to use the solvent relating to the coloring composition of the present invention as a cleaning liquid. In addition, the cleaning liquids described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, JP2007-281523A, and the like can also be suitably used to clean and remove the coloring composition according to the present invention.

Among those, alkylene glycol monoalkyl ether carboxylate and alkylene glycol monoalkyl ether are preferable.

These solvents may be used singly or as a mixture of two or more kinds thereof. In the case where two or more kinds thereof are mixed, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and still more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Further, in order to improve the permeability of the cleaning liquid with respect to the contaminant, it is preferable to add the aforementioned surfactants relating to the present composition to the cleaning liquid.

Since the color filter of the present invention uses the coloring composition of the present invention, exposure having an excellent exposure margin can be carried out, and the formed colored pattern (colored pixel) has an excellent pattern shape. Further, since the surface roughness of the pattern and the residues in a developed area are suppressed, excellent color characteristics are exhibited.

The color filter of the present invention can be suitably used for a solid-state imaging device such as a CCD and a CMOS, and is particularly preferable for a CCD, a CMOS, and the like with a high resolution, having more than 1,000,000 pixels. The color filter for a solid-state imaging device of the present invention can be used as, for example, a color filter disposed between a light-receiving portion of each pixel constituting a CCD or a CMOS and a microlens for condensing light.

Furthermore, the film thickness of the colored pattern (colored pixel) in the color filter of the present invention is preferably 2.0 μm or less, more preferably 1.0 μm or less, and still more preferably 0.7 μm or less.

Moreover, the size (pattern width) of the colored pattern (colored pixel) is preferably 2.5 μm or less, more preferably 2.0 μm or less, and particularly preferably 1.7 μm or less.

<Solid-State Imaging Device>

The solid-state imaging device of the present invention includes the color filter of the present invention. The constitution of the solid-state imaging device of the present invention is not particularly limited as long as the solid-state imaging device is constituted to include the color filter in the present invention and functions as a solid-state imaging device. However, for example, the solid-state imaging device can be constituted as below.

The solid-state imaging device has a configuration which has a plurality of photodiodes constituting a light-receiving area of a solid-state imaging device (a CCD image sensor, a CMOS image sensor, or the like) and a transfer electrode forming of polysilicon or the like, on a support; a light shielding film formed of tungsten or the like onto the photodiodes and the transfer electrodes, which has openings only over the light-receiving portion of the photodiode; a device protecting film formed of silicon nitride or the like, which is formed to cover the entire surface of the light shielding film and the light receiving portion of the photodiodes, on the light shielding film; and the color filter for a solid-state imaging device of the present invention on the device protecting film.

In addition, the solid-state imaging device may have a configuration in which a light-collecting means (for example, a micro lens or the like, the same applies hereinafter) is disposed on the device protecting film and under the color filter (side a side closer to the support), a configuration in which a light-condensing means is disposed on the color filter, and the like.

<Image Display Device>

The color filter of the present invention can be used not only for a solid-state imaging device, but also for an image display device such as a liquid crystal display device and an organic EL display device. In particular, the color filter is suitable in the applications of a liquid crystal display device. The liquid crystal display device including the color filter of the present invention can display a high-quality image showing a good hue of a display image and having excellent display characteristics.

The definition of display devices or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989), and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The color filter of the present invention may be used for a liquid crystal display device using a color TFT system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching driving system such as IPS and a pixel division system such as MVA, or to STN, TN, VA, OCS, FFS, R-OCB, and the like.

In addition, the color filter in the present invention can be provided to a Color-filter On Array (COA) system which is a bright and high-definition system. In the liquid crystal display device of the COA system, the characteristics required for a color filter layer need to include characteristics required for an interlayer insulating film, that is, a low dielectric constant and resistance to a peeling solution in some cases, in addition to the generally required characteristics as described above. In the color filter of the present invention, by using a colorant having an excellent hue, the color purity, light-transmitting properties, and the like are excellent, and the tone of the colored pattern (pixel) is excellent. Consequently, a liquid crystal display device of a COA system which has a high resolution and is excellent in long-term durability can be provided. Further, in order to satisfy the characteristics required for a low dielectric constant, a resin coat may be provided on the color filter layer.

These image display systems are described in, for example, p. 43 of "EL, PDP, and LCD Display Technologies and Recent Trend in Market (TORAY RESEARCH CENTER, Research Department, published in 2001)", and the like.

The liquid crystal display device including the color filter in the present invention is constituted with various members such as an electrode substrate, a polarizing film, a phase difference film, a backlight, a spacer, and a view angle compensation film, in addition to the color filter of the present invention. The color filter of the present invention can be applied to a liquid crystal display device constituted with these known members. These members are described in, for example, "'94 Market of Peripheral Materials And Chemicals of Liquid Crystal Display (Kentaro Shima, CMC Publishing Co., Ltd., published in 1994)" and "2003 Current Situation of Market Relating to Liquid Crystal and Prospects (Vol. 2) (Ryokichi Omote, Fuji Chimera Research Institute, Inc., published in 2003)".

The backlight is described in SID Meeting Digest 1380 (2005) (A. Konno, et al.), December Issue of Monthly "Display", 2005, pp. 18-24 (Yasuhiro Shima) and pp. 25-30 (Takaaki Yagi) of the documents, and the like.

If the color filter in the present invention is used in a liquid crystal display device, high contrast can be realized when the color filter is combined with a three-wavelength tube of a cold cathode tube known in the related art. Further, if a light source of LED in red, green, and blue (RGB-LED) is used as a backlight, a liquid crystal display device having high luminance, high color purity, and good color reproducibility can be provided.

The coloring composition in the present invention can also be suitably used in pattern formation using a dry etching process.

EXAMPLES

Hereinafter, the present invention will be described in more detail with reference to Examples. Materials, use amounts thereof, ratios, the treatment specifications, treatment procedures, and the like shown in Examples below can be appropriately modified as long as the gist of the present invention is not impaired. Thus, the scope of the present invention is not limited to the specific examples shown below. Further, "%". and "part(s)" are based on mass unless otherwise specified.

Synthesis of Dye a·b

A colorant monomer M1 was obtained by the method described in paragraphs "0413" to "0423" of JP2012-158739A.

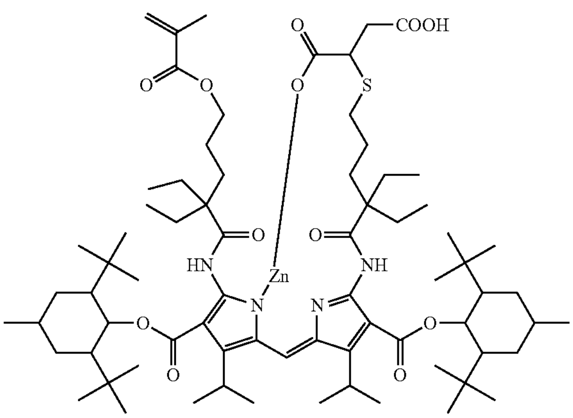

Colorant monomer M1

Synthesis Example 1

A mixed solution of 50 g of the colorant monomer M1, 3.67 g of methacrylic acid, 1.78 g of ADK STAB LA-82 (a monomer derived from a structural unit having the structure represented by Formula (1)) (manufactured by ADEKA), 1.05 g of dodecanethiol, 2.39 g of a polymerization initiator (V-601, manufactured by Wako Pure Chemical Industries, Ltd.), and 50 g of cyclohexanone was prepared. Separately, 50 g of the colorant monomer M1, 3.67 g of methacrylic acid, 1.05 g of dodecanethiol, 1.78 g of ADK STAB LA-82 (manufactured by ADEKA), and 50 g of cyclohexanone were put into a reaction container, and the mixture was stirred while being kept at 80° C. under a nitrogen flow. The mixed solution prepared above was added dropwise thereto for 1 hour, the mixture was stirred for 3 hours, and then the reaction was stopped. After cooling to room temperature, a solution obtained by mixing the obtained reaction solution and 1,038 mL of methanol was added dropwise to 6,200 mL of acetonitrile for 20 minutes, and the mixture was stirred for 10 minutes. The obtained precipitate was filtered and then dried to obtain 70 g of a dye a which is a dye multimer. The weight-average molecular weight (Mw) of the dye a as identified from GPC measurement was 6,000, and the ratio of the weight-average molecular weight/the number-average molecular weight (Mw/Mn) was 2.0. Further, the acid value as titrated using a 0.1 N aqueous sodium hydroxide solution was 82 mgKOH/g.

The structure (compound 101) of the dye a is shown below.

Compound 101

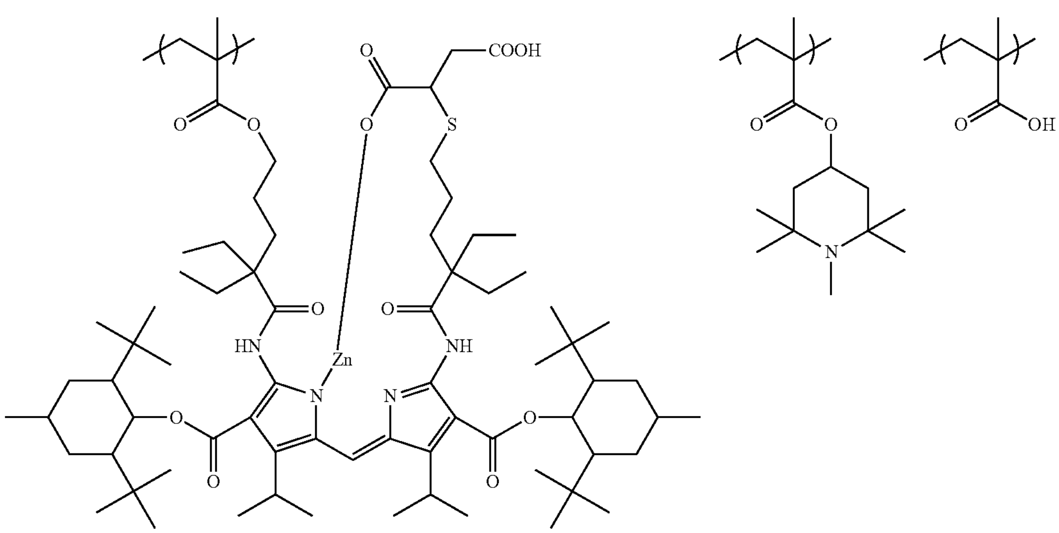

Synthesis Example 2

15 g of the dye a was added to 2.08 g of glycidyl methacrylate, 0.38 g of tetrabutylammonium bromide, 0.017 g of p-methoxyphenol, and 96.8 g of propylene glycol methyl ether acetate, and the mixture was heated and stirred at 100° C. for 8 hours. The obtained dye solution was added dropwise to a mixed solution of 180 g of acetonitrile and 900 g of ion exchange water, and the mixture was filtered and dried to obtain 15 g of a dye b which is a dye multimer. The weight-average molecular weight (Mw) of the dye b as identified from GPC measurement was 9,000 and the ratio of the weight-average molecular weight/the number-average molecular weight (Mw/Mn) was 2.2. Further, the acid value as titrated using a 0.1 N aqueous sodium hydroxide solution was 28 mgKOH/g.

The structure (compound 102) of the dye b is shown below.

Compound 102

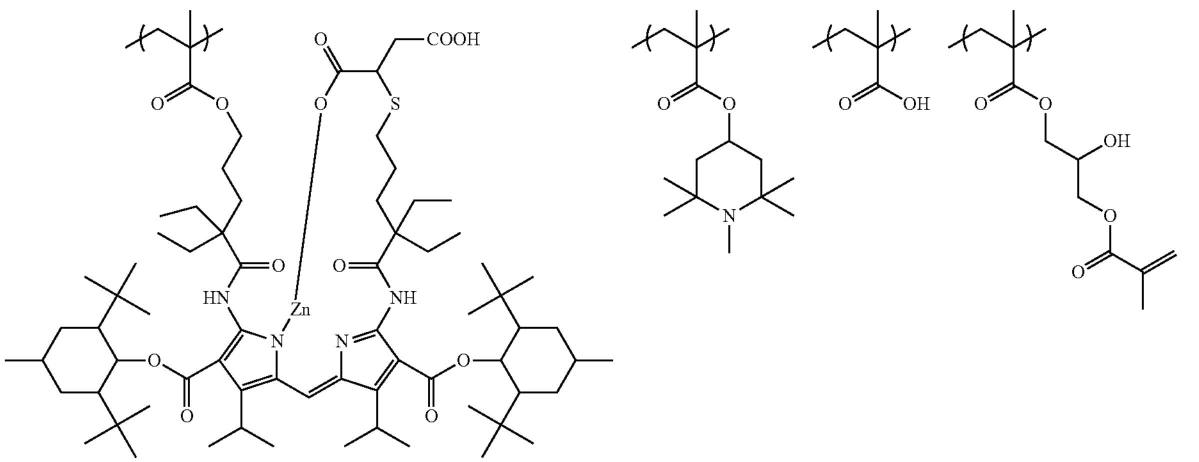

Synthesis Example 3

Synthesis of Dye c

The following dye c (compound 103) was synthesized using a colorant monomer M2 which is a triphenylmethane colorant as the colorant.

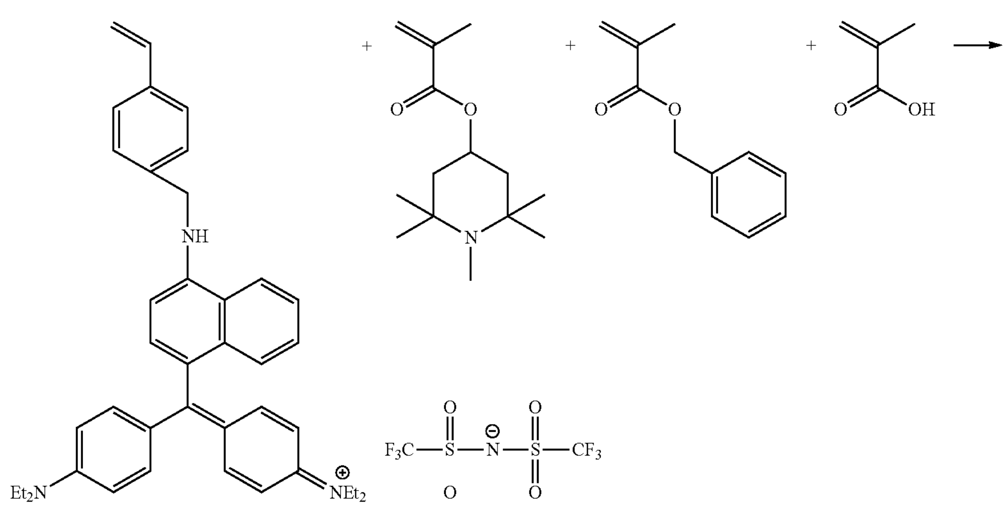

Colorant monomer M2

-continued

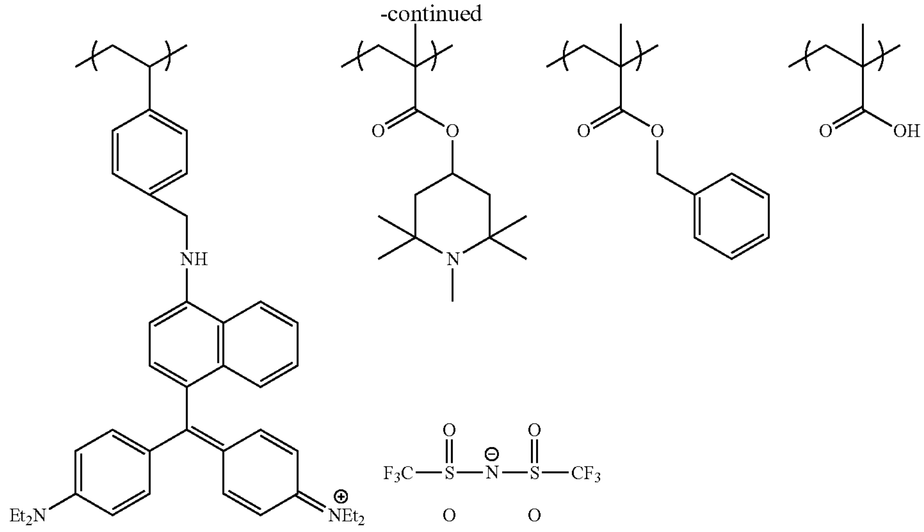

Compound 103

Hereinafter, detailed operations for Synthesis Example of a dye c will be described.

The colorant monomer M2 was synthesized by the method described in JP2000-162429A.

The colorant monomer M2 (15 g), ADK STAB LA-82 (manufactured by ADEKA) (1.0 g), benzyl methacrylate (10 g), methacrylic acid (3.5 g), and azobisisobutyronitrile (5 g) were added to N-ethylpyrrolidone (50 g), and the mixture was stirred and dissolved at room temperature for 30 minutes (a polymerization solution for dropwise addition).

Separately, the colorant monomer M2 (15 g), ADK STAB LA-82 (manufactured by ADEKA) (1.0 g), benzyl methacrylate (10 g), methacrylic acid (3.5 g), the colorant monomer M2 (15 g), 2-acrylamide-2-methylpropanesulfonic acid (6.5 g), hydroxyethyl methacrylate (23 g), and methacrylic acid (5.5 g) were dissolved in N-ethylpyrrolidone (50 g), and the mixture was stirred at 95° C. The polymerization solution for dropwise addition, thus prepared above, was added dropwise thereto for 3 hours, the mixture was stirred for 1 hour, azoisobutyronitrile (2.5 g) was then added thereto, and the reaction was stopped after additional 2 hours. After cooling to room temperature, the solvent was removed by distillation to obtain a dye c. The weight-average molecular weight (Mw) of the obtained dye c was 20,000. Further, the acid value as titrated using a 0.1 N aqueous sodium hydroxide solution was 77 mgKOH/g.

Synthesis Example 4

Synthesis of Dye d

The following dye d (compound 104) was synthesized using a colorant monomer M3 which is an anthroquinone colorant as the colorant.

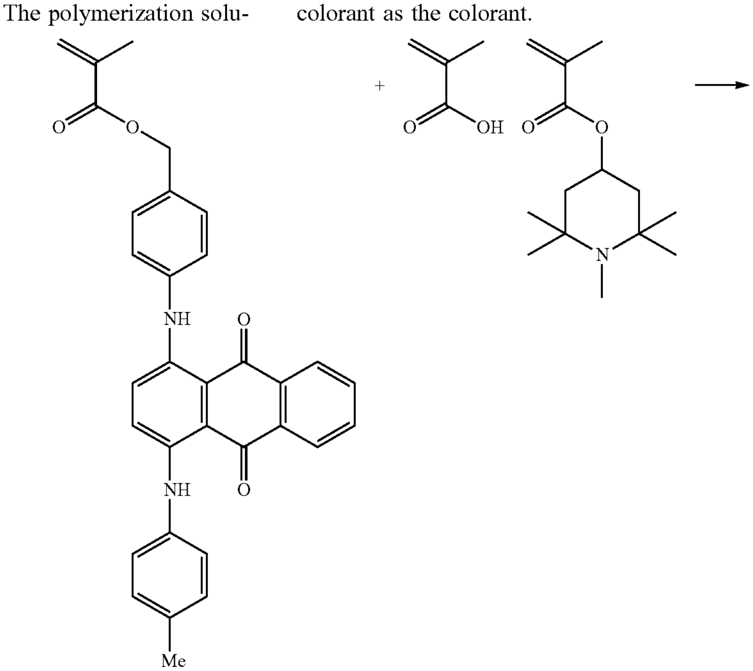

Colorant monomer M3

-continued

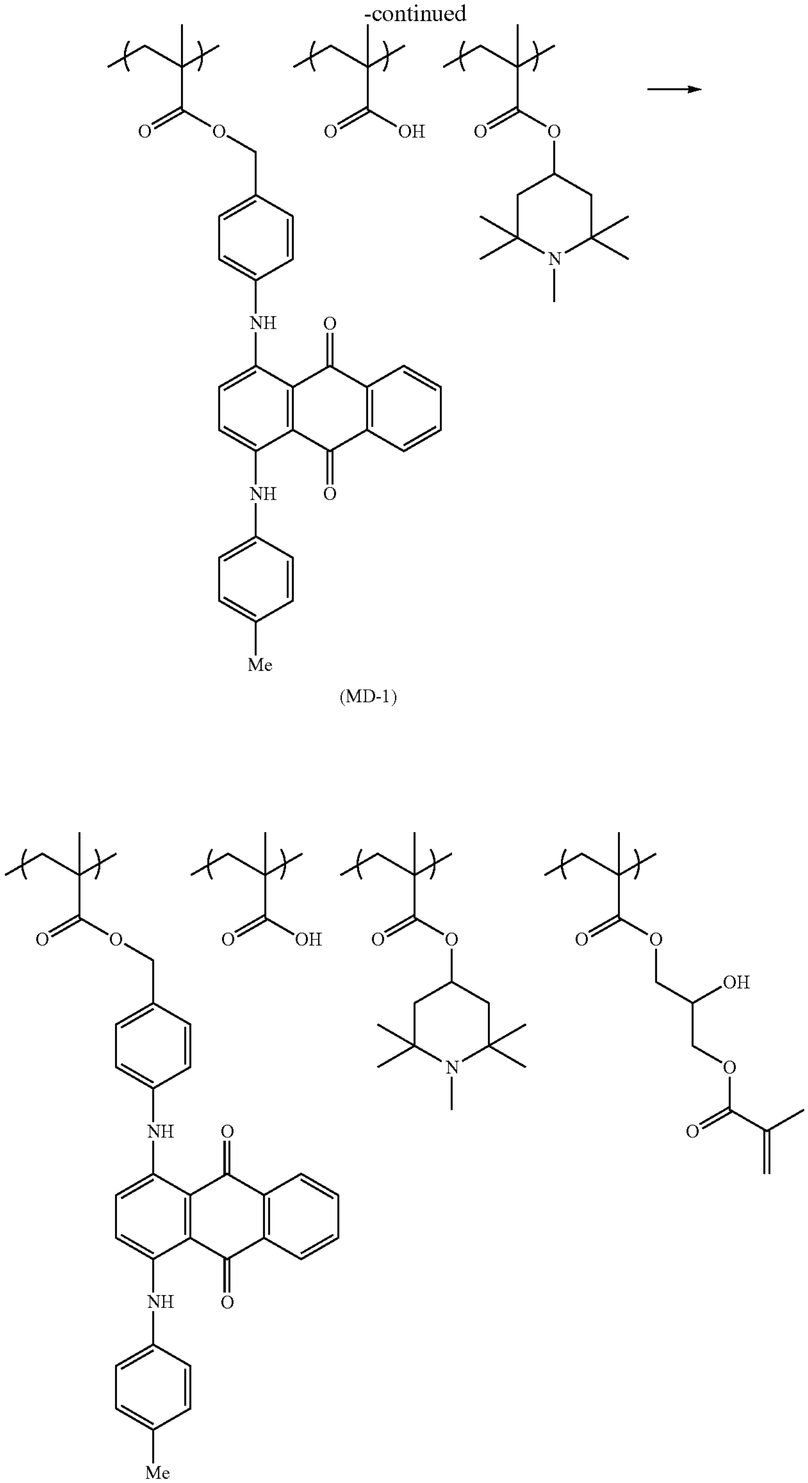

(MD-1)

Compound 104

The colorant monomer M3 (8.21 g), methacrylic acid (1.61 g), ADK STAB LA-82 (manufactured by ADEKA) (0.35 g), dodecylmercaptan (0.20 g), and propylene glycol 1-monomethylether 2-acetate (PGMEA) (23.3 g) were added to a reaction container, and heated at 80° C. in a nitrogen atmosphere. To this solution was added dropwise a mixed solution of the colorant monomer M3 (8.21 g), methacrylic acid (1.61 g), ADK STAB LA-82 (manufactured by ADEKA) (0.35 g) dodecylmercaptan (0.25 g), dimethyl 2,2'-azobis(isobutyrate) (0.46 g), and PGMEA (23.3 g) for 2 hours. Thereafter, the solution was stirred for 3 hours, then warmed to 90° C., heated and stirred for 2 hours, and then left to be cooled to obtain a PGMEA solution of (MD-1). Next, to the PGMEA solution of (MD-1) were added glycidyl methacrylate (1.42 g), tetrabutylammonium bromide (80 mg), and p-methoxyphenol (20 mg), and heated at 100° C. for 15 hours in an air atmosphere, and it was found that glycidyl methacrylate was lost. After cooling, the resultant was added dropwise to a mixed solvent of methanol/ion exchange water=100 mL/10 mL, and the mixture was reprecipitated to obtain 17.6 g of a dye d. The weight-average molecular weight (Mw) of the dye d as identified from GPC measurement was 9,000 and the ratio of the weight-average molecular weight/the number-average molecular weight (Mw/Mn) of the dye d was 1.9. Further, the acid value as titrated using a 0.1 N aqueous sodium hydroxide solution was 42 mgKOH/g. In addition, the amount of the polymerizable groups contained in the dye d was 0.7 mmol/g with respect to the dye d (1 g) by NMR measurement.

Synthesis Examples 5 to 30

Synthesis of Dye e to Dye ad

In the same manner as in Synthesis of the dye d except that the kind of the colorant monomer and ADK STAB LA-82 (a monomer derived from a structural unit having the structure represented by General Formula (1)) was changed as shown in Table 1 below, dye e to dye ad were synthesized. Synthesis Examples 29 and 30 were synthesized using a half of the weight of each of the colorant monomers.

In Table 1 below, colorant monomers M4 to M18, monomers S1 to S4 derived from structural units having the structures represented by Formulae (1) to (5) as described above, and compound 105 to compound 130 are as shown below.

Here, the colorant monomers M4 and the colorant monomer M5 are anthroquinone colorants, the colorant monomer M6 is a squarylium colorant, the colorant monomer M7 is a cyanine colorant, the colorant monomer M8 is a phthalocyanine colorant, the colorant monomer M9 is a subphthalocyanine colorant, the colorant monomer M10 is a quinophthalone colorant, the colorant monomer M11 is a xanthene colorant, the colorant monomer M12 to the colorant monomer M15 are azo colorants, and the colorant monomers M16 to 18 are xanthene colorants.

M4

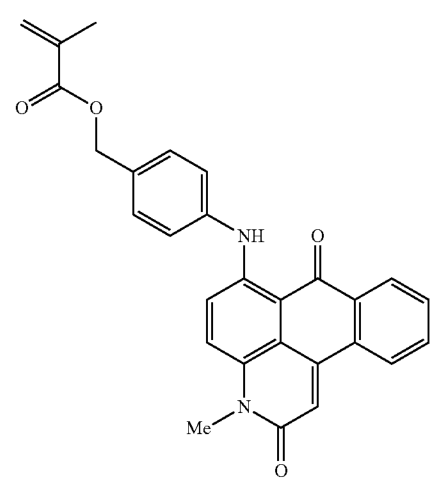

-continued

M5

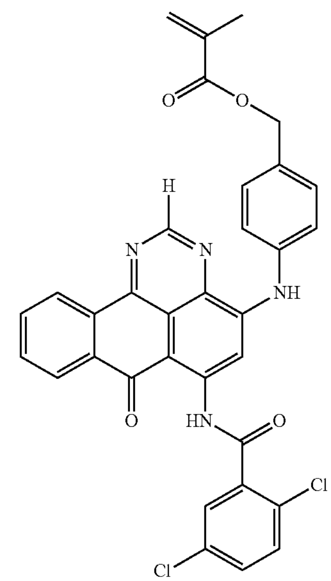

M6

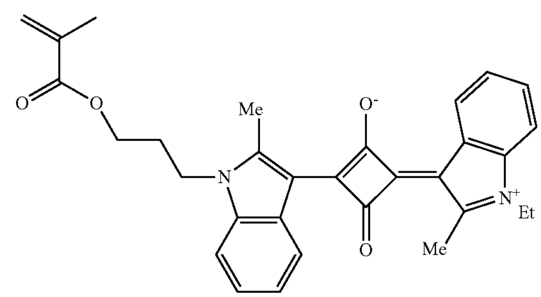

M7

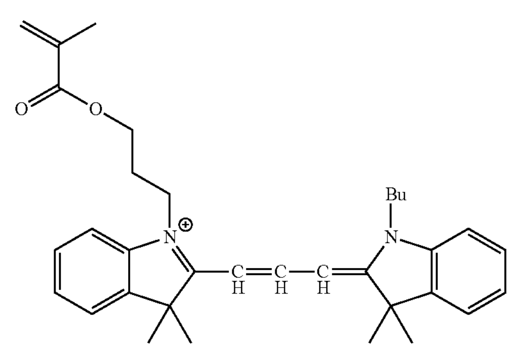

-continued
M8
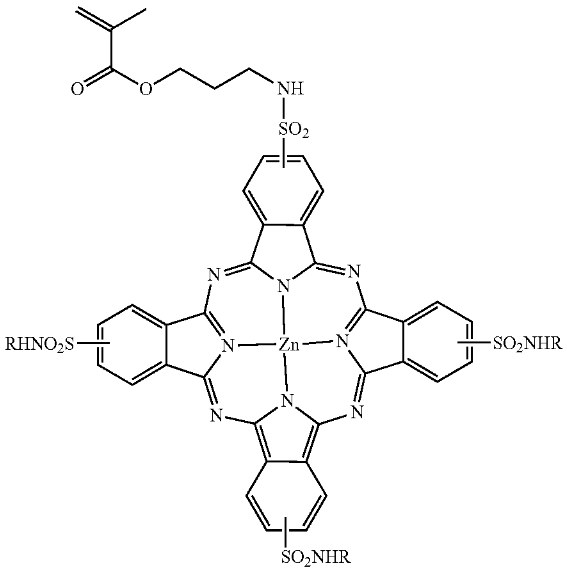
R = $CH_2CH_2CH_2OH$
M9
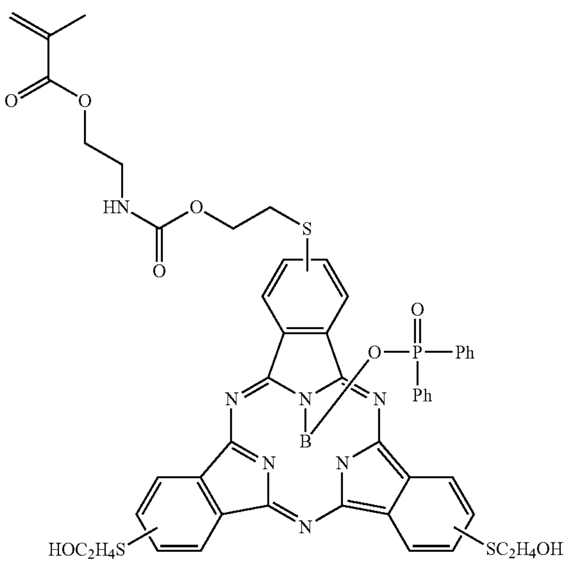
M10
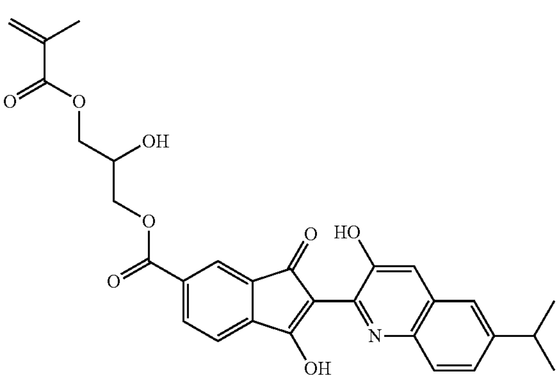
-continued
M11
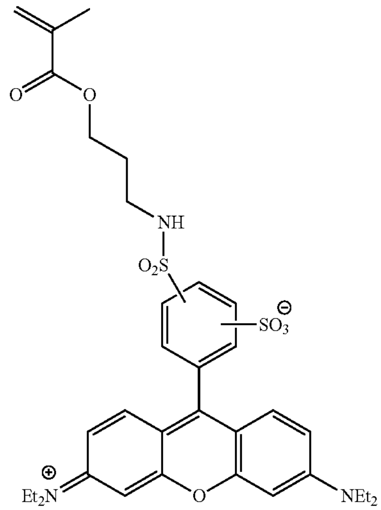
M12
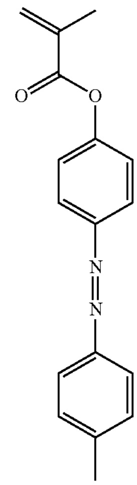
M13
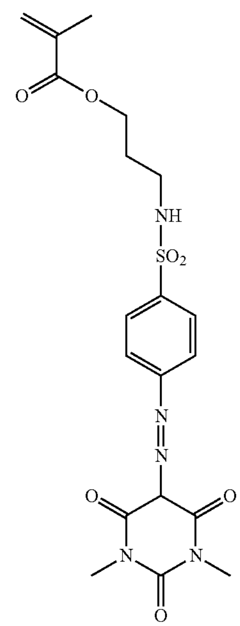

-continued
M14
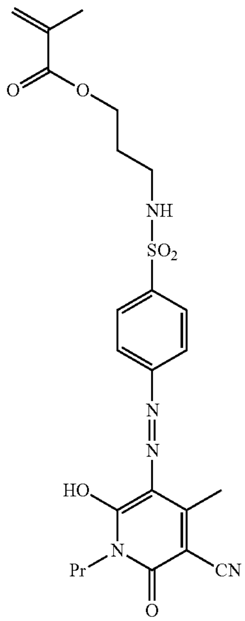
M15
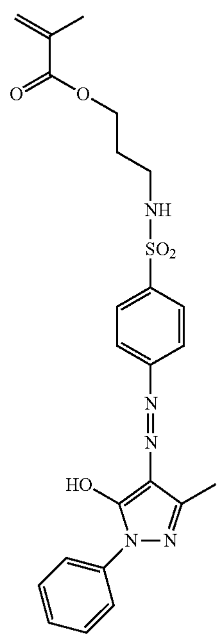
M16
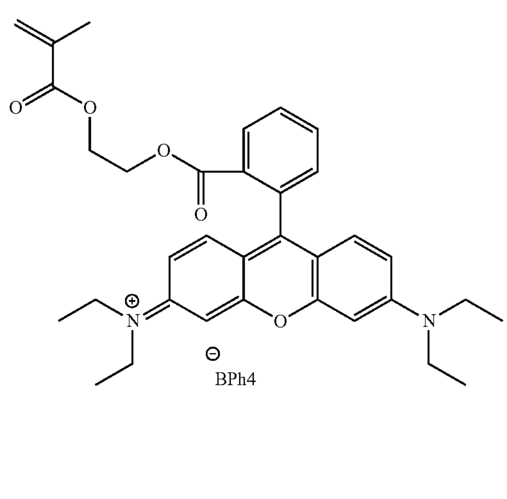
-continued
M17
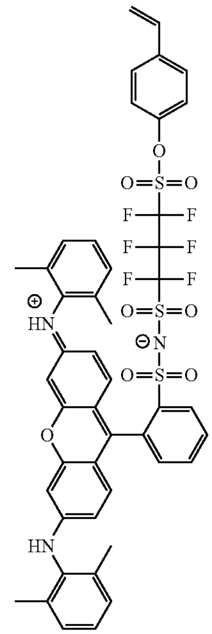
M18
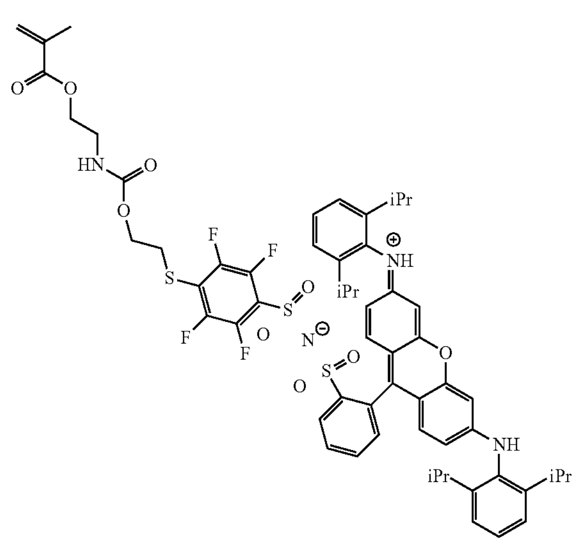
ADK STAB LA-82 (manufactured by ADEKA) was used as S1, products manufactured by Tokyo Chemical Industry Co., Ltd. were used as S2 and S3, and one synthesized by the method described in Synthesis Example 22 of U.S. Pat. No. 5,672,704A1 was used as S4.
S1
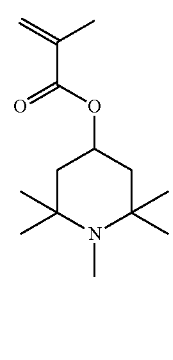

-continued
S2
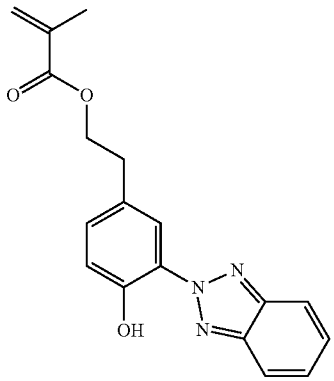
S3
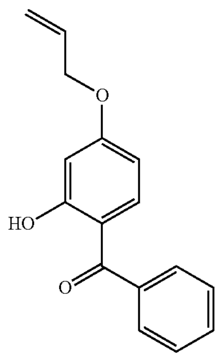
S4
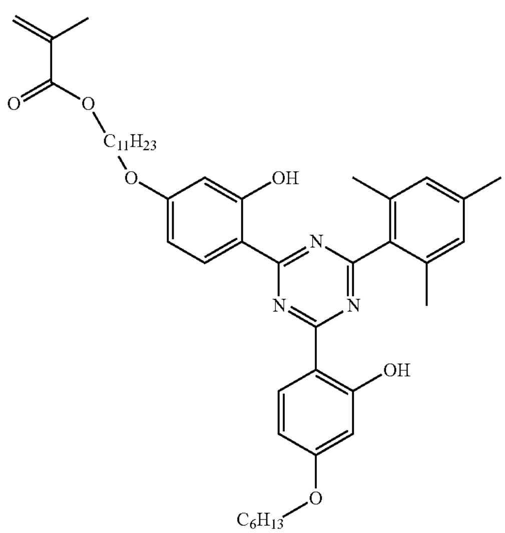
In the following dye multimers, "-w-" represents a structural unit having a colorant structure. For example, Compound 105 has a structural unit represented by "-w-", in addition to the following three structural units.
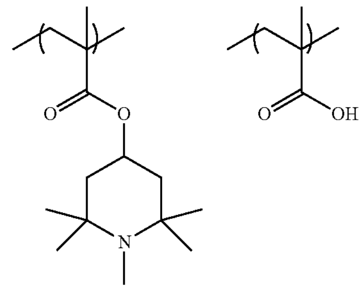
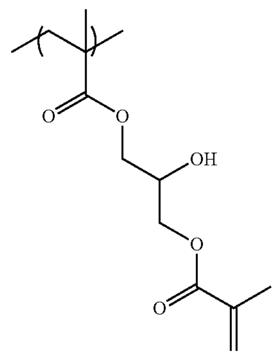
—w—
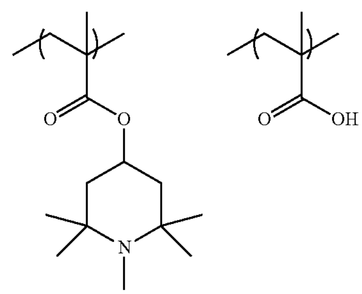
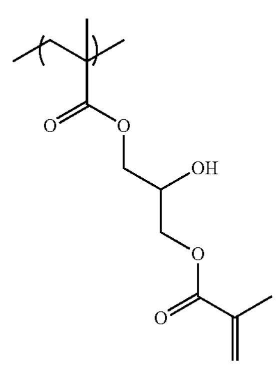

-continued
—W— =
Compound 105
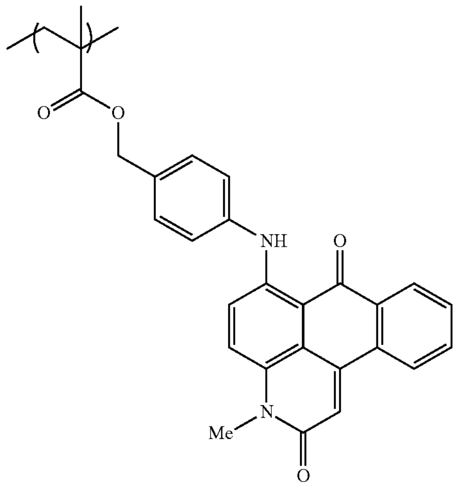
Compound 106
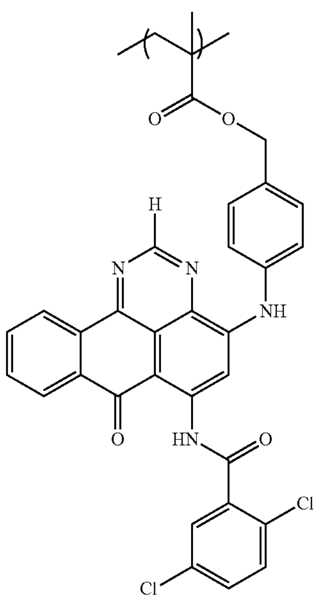
Compound 107
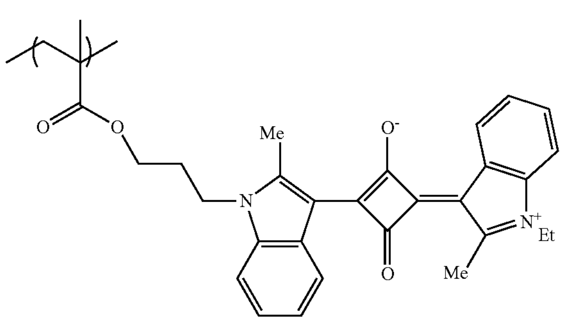
-continued
Compound 108
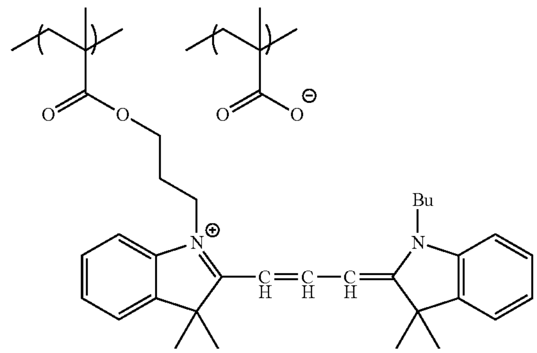
Compound 109
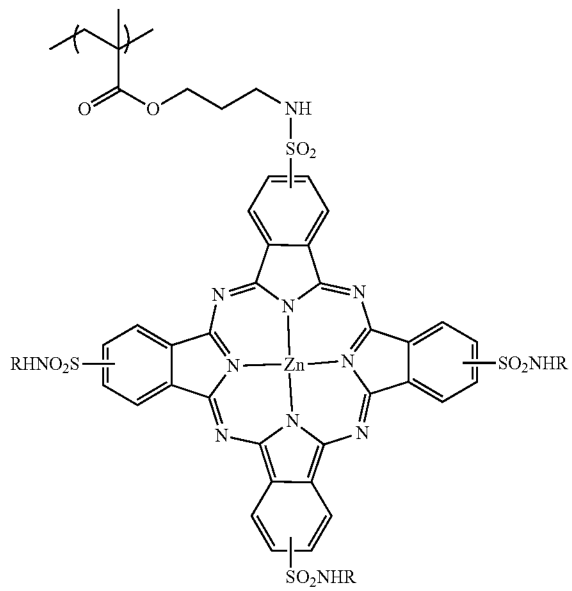
R = $CH_2CH_2CH_2OH$
Compound 110
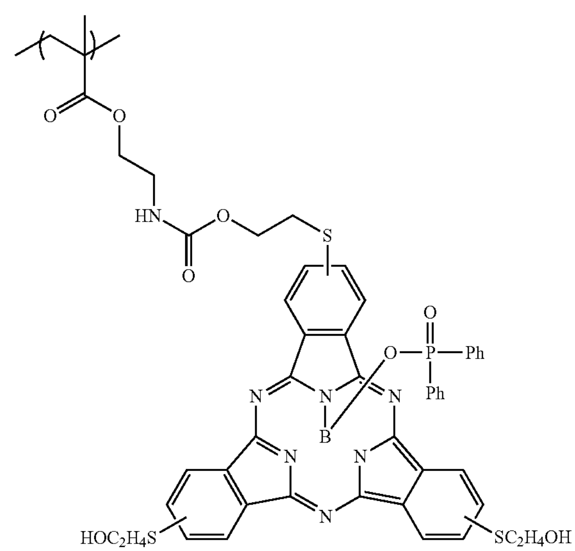

-continued
Compound 111
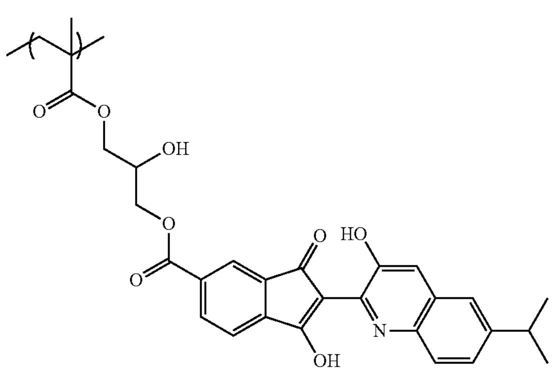
Compound 112
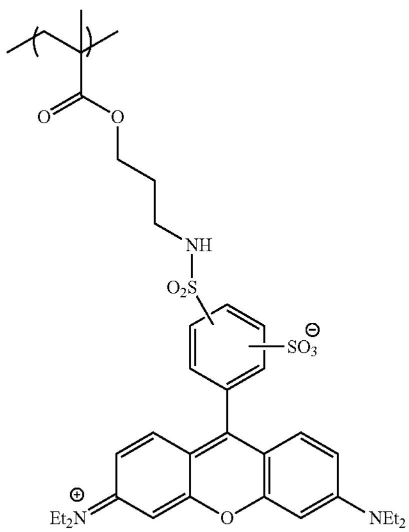
—W— =
Compound 113
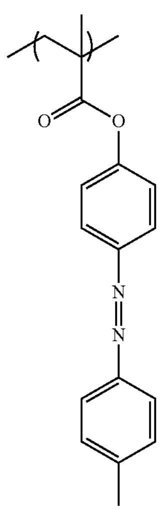
-continued
Compound 114
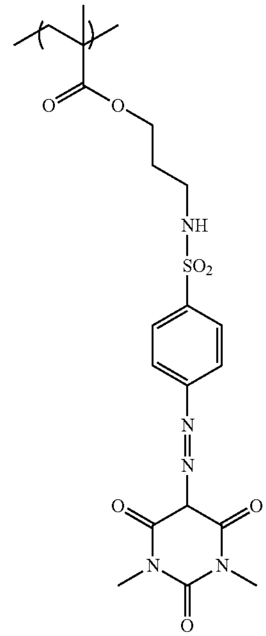
Compound 115
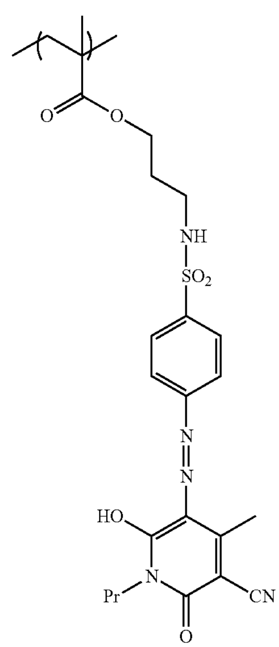

-continued
Compound 116
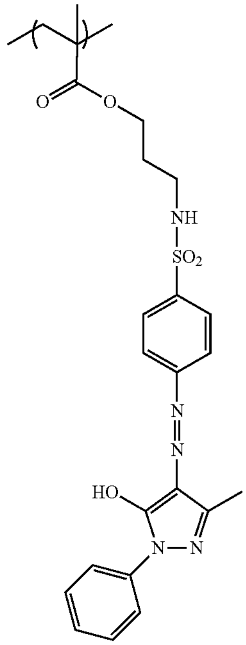
Compound 117
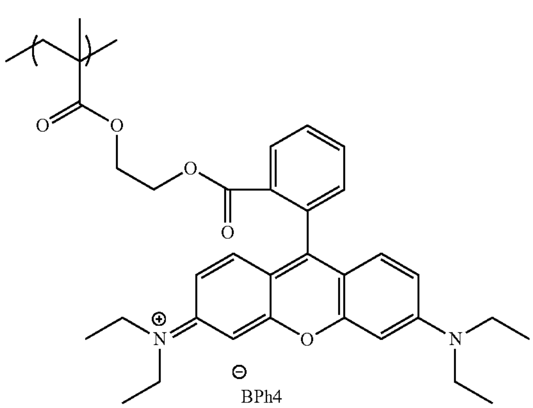
-continued
Compound 118
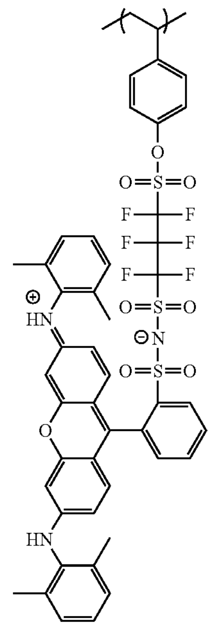
Compound 119
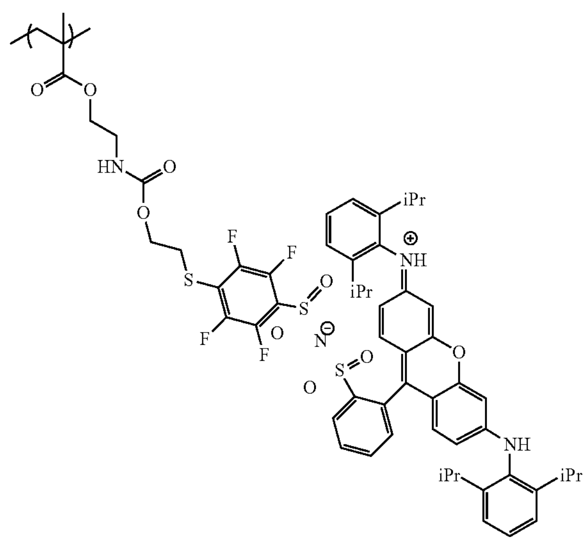
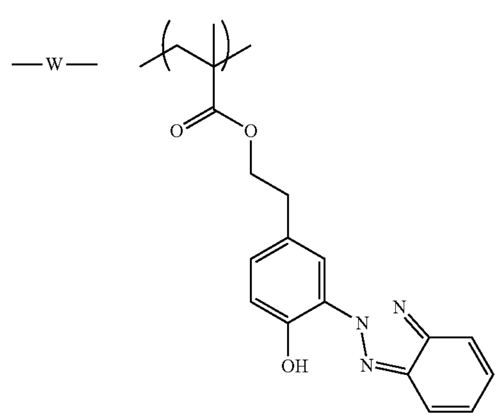

-continued
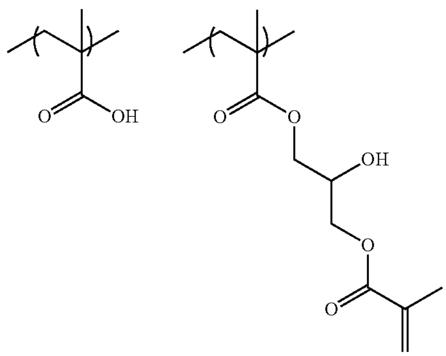
Compound 120
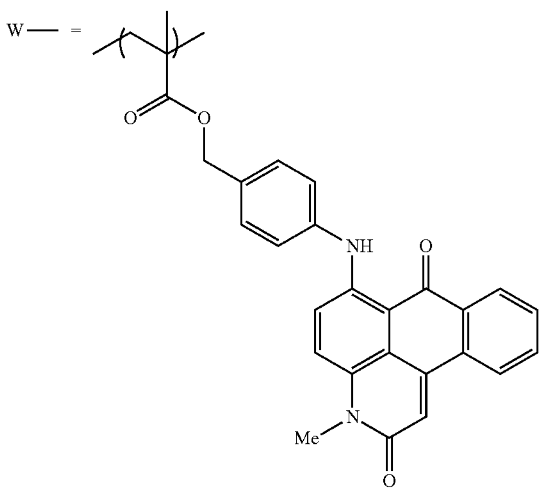
Compound 121
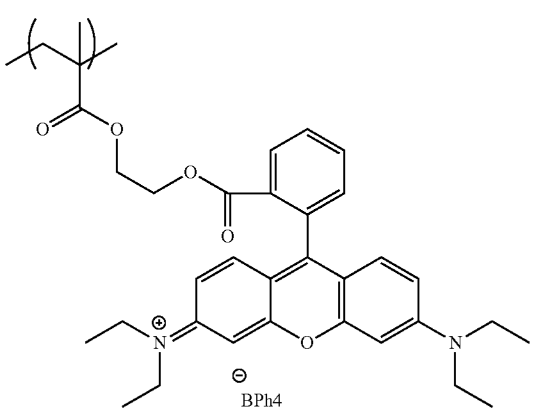
-continued
Compound 122
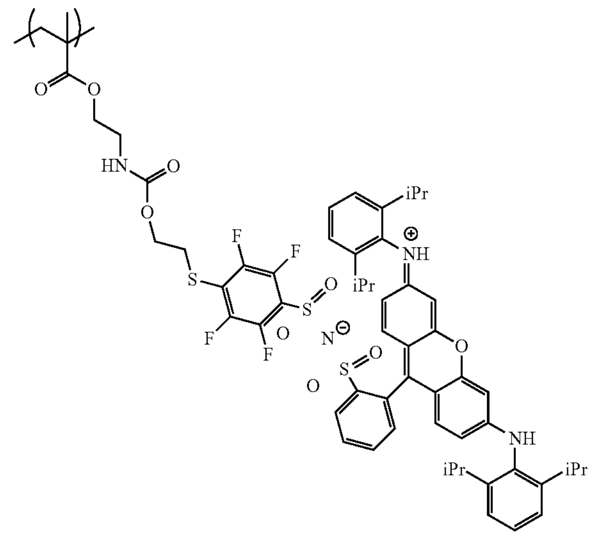
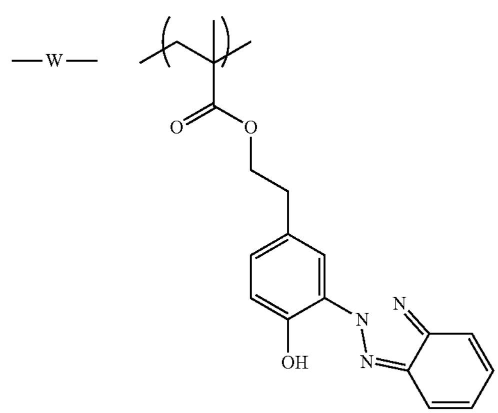
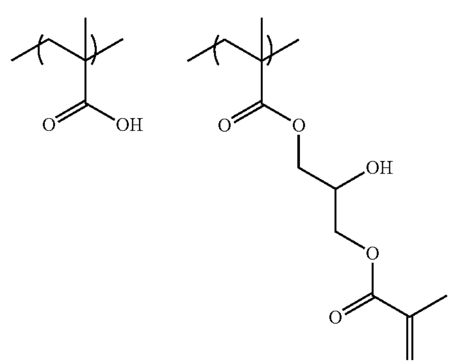

-continued
Compound 130
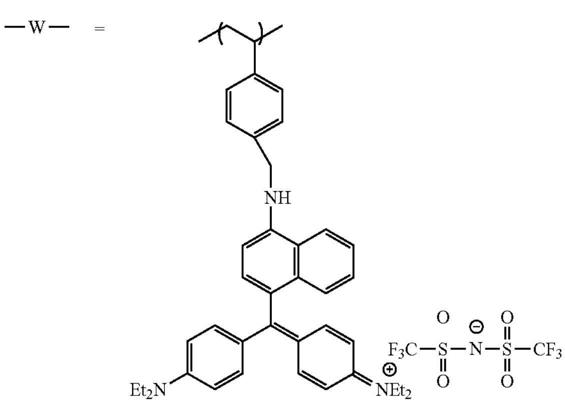
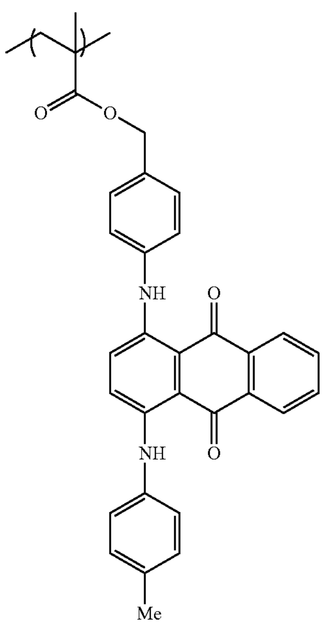
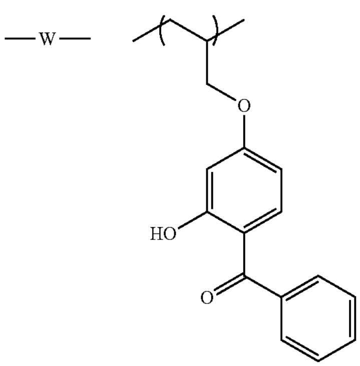
-continued
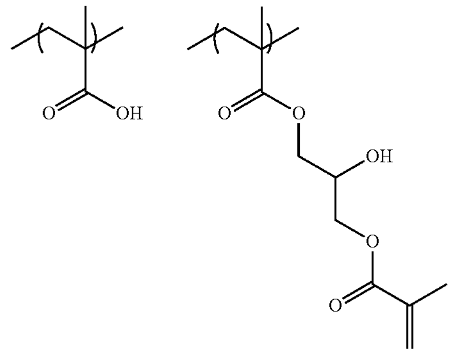
Compound 123
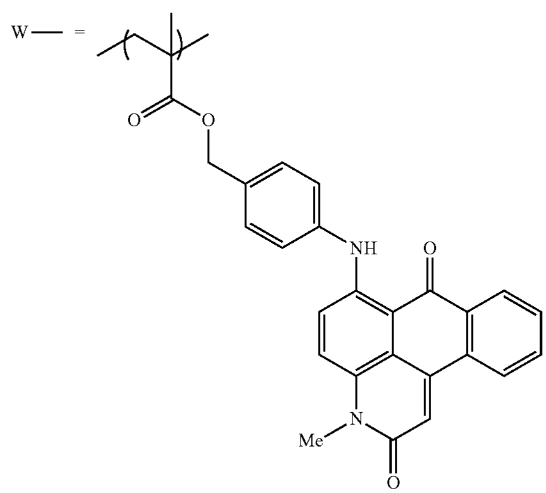
Compound 124
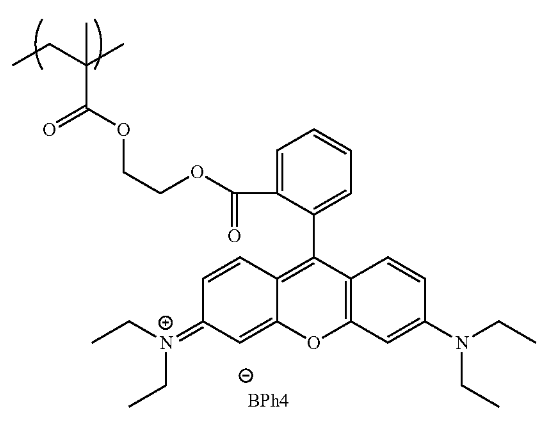

-continued
Compound 125
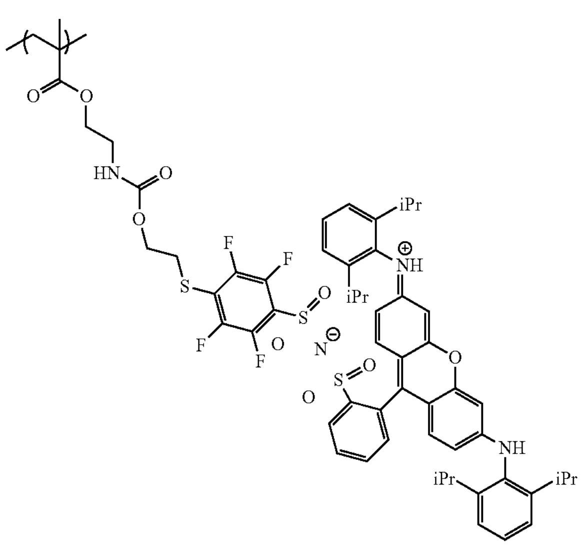
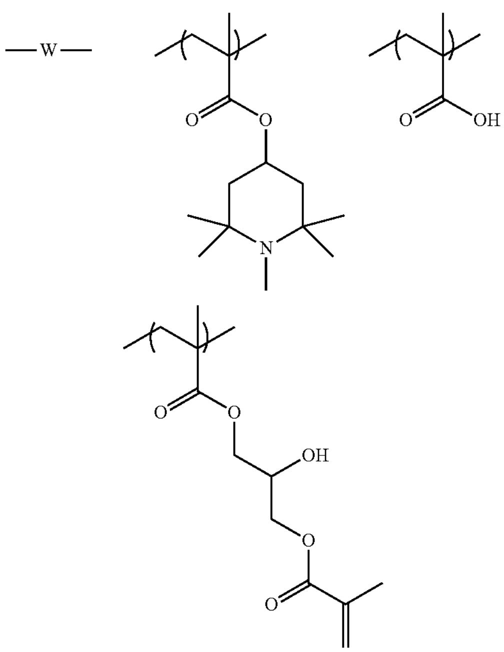
Compound 129
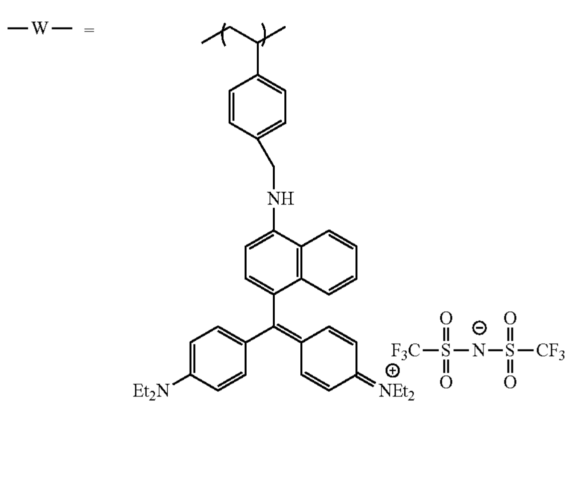
-continued
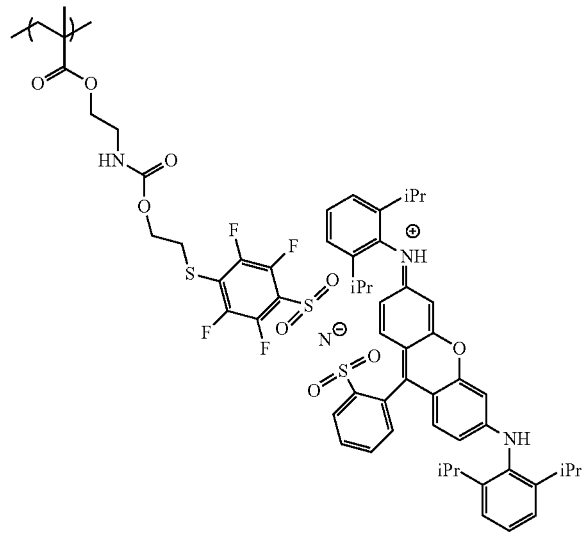
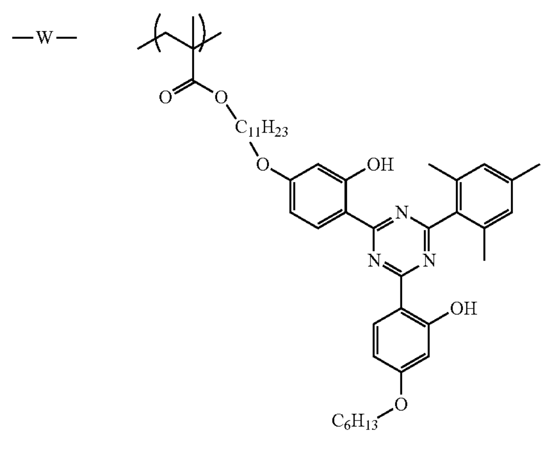
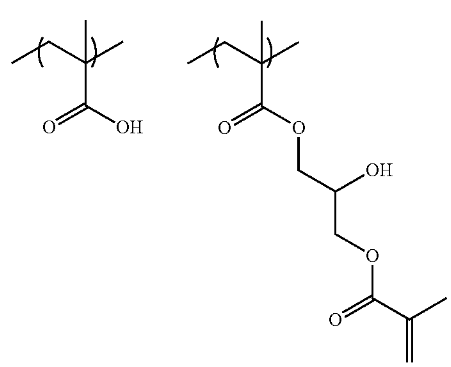

-continued

Compound 126

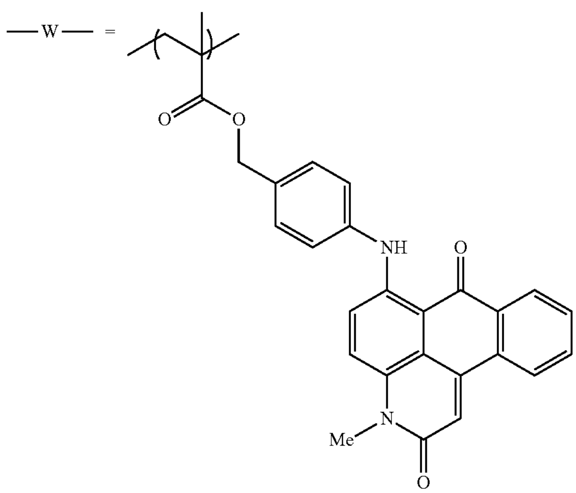

Compound 127

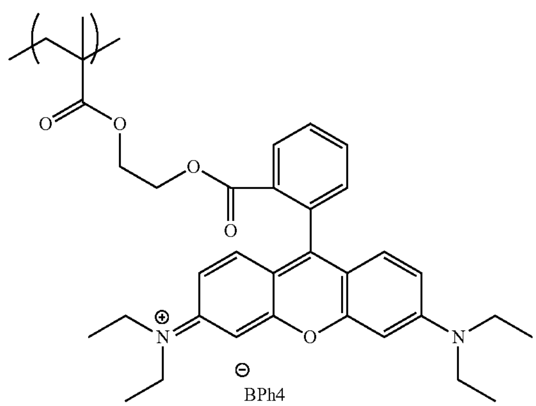

-continued

Compound 128

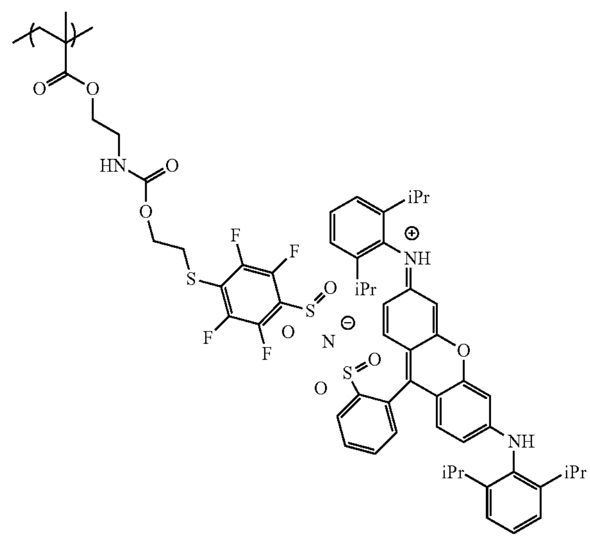

The kinds (M1 to M18) of colorant monomers capable of forming the colorant structures included in the dye a to the dye ad which are dye multimers, dye multimers (compounds 101 to 130), and the acid values and the weight-average molecular weights (Mw) of the obtained dye multimers are described in Table 1 below.

In the following table, (a-1) represents a structural unit having a colorant structure, (a-2) represents a structural unit having any one of the structures represented by Formulae (1) to (5), (a-3) represents a structural unit having an acid group, (a-4) represents a structural unit having a polymerizable group, and the others represent other structural units having functional groups other than (a-1) to (a-4).

In addition, the dye multimers (dye a to dye ad) in the following table are random radical polymers.

TABLE 1

| Synthesis Example | Dye multimer | | Colorant monomer (a-1) | (a-2) | Proportion (% by mole) in dye multimer (a-1) | (a-2) | (a-3) | (a-4) | Others | Acid value (mgKOH/g) | Mw |
|---|---|---|---|---|---|---|---|---|---|---|---|
| 1 | Dye a | Compound 101 | M1 | S1 | 51 | 21 | 28 | 0 | 0 | 82 | 6000 |
| 2 | Dye b | Compound 102 | M1 | S1 | 35 | 15 | 19 | 30 | 0 | 28 | 9000 |
| 3 | Dye c | Compound 103 | M2 | S1 | 15 | 4 | 34 | 0 | 48 | 77 | 28000 |
| 4 | Dye d | Compound 104 | M3 | S1 | 45 | 4 | 23 | 28 | 0 | 40 | 9000 |
| 5 | Dye e | Compound 105 | M4 | S1 | 48 | 4 | 21 | 27 | 0 | 37 | 7500 |
| 6 | Dye f | Compound 106 | M5 | S1 | 41 | 4 | 25 | 30 | 0 | 45 | 7200 |
| 7 | Dye g | Compound 107 | M6 | S1 | 46 | 4 | 22 | 28 | 0 | 35 | 8500 |
| 8 | Dye h | Compound 108 | M7 | S1 | 45 | 4 | 23 | 28 | 0 | 40 | 8200 |
| 9 | Dye i | Compound 109 | M8 | S1 | 24 | 6 | 31 | 39 | 0 | 35 | 10000 |
| 10 | Dye j | Compound 110 | M9 | S1 | 29 | 5 | 29 | 37 | 0 | 50 | 5300 |
| 11 | Dye k | Compound 111 | M10 | S1 | 45 | 4 | 23 | 28 | 0 | 46 | 6800 |
| 12 | Dye l | Compound 112 | M11 | S1 | 37 | 5 | 26 | 32 | 0 | 33 | 7200 |
| 13 | Dye m | Compound 113 | M12 | S1 | 60 | 3 | 17 | 21 | 0 | 45 | 8900 |
| 14 | Dye n | Compound 114 | M13 | S1 | 47 | 4 | 22 | 27 | 0 | 32 | 7700 |
| 15 | Dye o | Compound 115 | M14 | S1 | 45 | 4 | 23 | 28 | 0 | 44 | 7500 |
| 16 | Dye p | Compound 116 | M15 | S1 | 46 | 4 | 22 | 28 | 0 | 48 | 5500 |
| 17 | Dye q | Compound 117 | M16 | S1 | 32 | 5 | 28 | 35 | 0 | 42 | 9000 |
| 18 | Dye r | Compound 118 | M17 | S1 | 30 | 5 | 29 | 36 | 0 | 44 | 9800 |
| 19 | Dye s | Compound 119 | M18 | S1 | 27 | 5 | 30 | 38 | 0 | 48 | 9200 |
| 20 | Dye t | Compound 120 | M4 | S2 | 49 | 3 | 22 | 27 | 0 | 35 | 9800 |
| 21 | Dye u | Compound 121 | M16 | S2 | 33 | 4 | 28 | 35 | 0 | 35 | 9500 |
| 22 | Dye v | Compound 122 | M18 | S2 | 27 | 4 | 31 | 38 | 0 | 44 | 9500 |
| 23 | Dye w | Compound 123 | M4 | S3 | 48 | 4 | 21 | 27 | 0 | 45 | 8000 |
| 24 | Dye x | Compound 124 | M16 | S3 | 32 | 5 | 28 | 35 | 0 | 40 | 9000 |
| 25 | Dye y | Compound 125 | M18 | S3 | 27 | 5 | 30 | 38 | 0 | 46 | 9200 |

TABLE 1-continued

| Synthesis Example | Dye multimer | | Colorant monomer (a-1) | (a-2) | Proportion (% by mole) in dye multimer (a-1) | (a-2) | (a-3) | (a-4) | Others | Acid value (mgKOH/g) | Mw |
|---|---|---|---|---|---|---|---|---|---|---|---|
| 26 | Dye z | Compound 126 | M4 | S4 | 49 | 1 | 22 | 27 | 0 | 35 | 9500 |
| 27 | Dye aa | Compound 127 | M16 | S4 | 33 | 2 | 29 | 36 | 0 | 30 | 10000 |
| 28 | Dye ab | Compound 128 | M18 | S4 | 28 | 2 | 31 | 39 | 0 | 44 | 8500 |
| 29 | Dye ac | Compound 129 | M2 | S1 | 17 | 5 | 29 | 36 | 0 | 44 | 8500 |
| | | | M18 | | 13 | | | | | | |
| 30 | Dye ad | Compound 130 | M2 | S2 | 15 | 3 | 25 | 32 | 0 | 44 | 8500 |
| | | | M3 | | 25 | | | | | | |

Synthesis Example 31

Synthesis of Dye ae

Synthesis of Monomer S5 Precursor

A monomer S5 precursor having the following formula was synthesized by the method described in Bulletin of the Chemical Society of Japan, 1980, vol. 53, #7 p. 1853-1859.

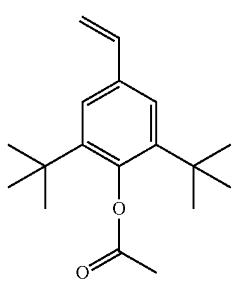

S5 Precursor

A mixed solution of 50 g of the following Colorant monomer M19, 3.67 g of methacrylic acid, 1.78 g of S5 precursor, 2.39 g of a polymerization initiator (V-601, manufactured by Wako Pure Chemical Industries, Ltd.), and 50 g of PGMEA was prepared. Separately, 25 g of PGMEA was put into a reaction container, and stirred while being kept at 80° C. under a nitrogen flow. The mixed solution prepared above was added dropwise thereto for 1 hour, the mixture was stirred for 3 hours, and then reaction was stopped. After cooling to room temperature, 5.0 mL of a 1.7 M toluene solution of potassium tert-pentylate was added thereto at room temperature, and the mixture was stirred at 55° C. for 1 hour and cooled to room temperature. Subsequently, 0.88 g of methanesulfonic acid was added dropwise, and then the reaction liquid was added dropwise to 1,000 g of water. The obtained precipitate was filtered and then dried to obtain 55 g of a dye ae which is a dye multimer. The weight-average molecular weight (Mw) of the dye ae as identified from GPC measurement was 9,000. Further, the ratio of the weight-average molecular weight/the number-average molecular weight (Mw/Mn) of the dye x was 2.0. Further, the acid value of the dye ae as titrated using a 0.1 N aqueous sodium hydroxide solution was 82 mgKOH/g.

The molar ratio of the respective structural units in the dye ae was as follows: the structural units derived from the colorant monomer M19:the structural units derived from methacrylic acid:the structural units derived from the S5 precursor=49:44:7.

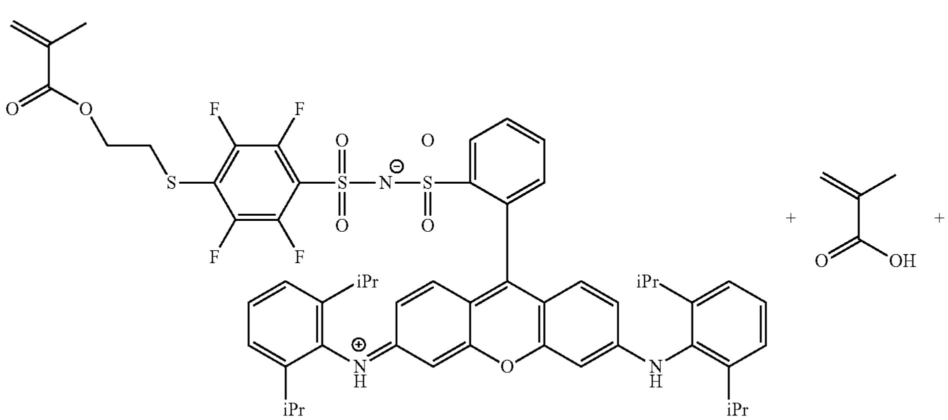

Colorant monomer M19

-continued
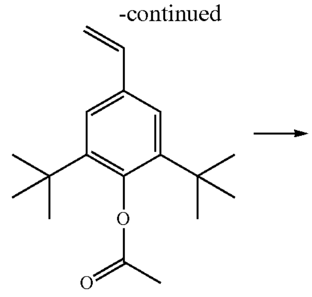
S5 Precursor
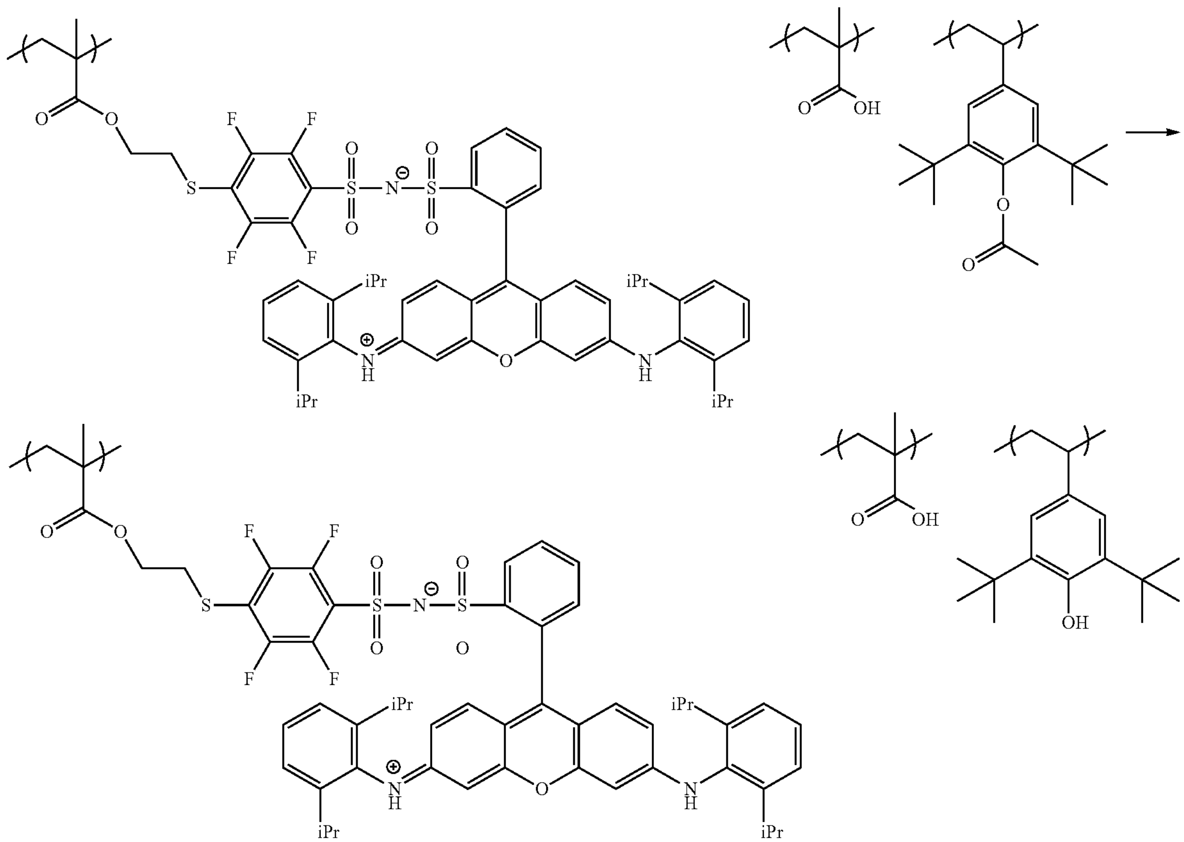
Synthesis Example 32
Synthesis of Dye af
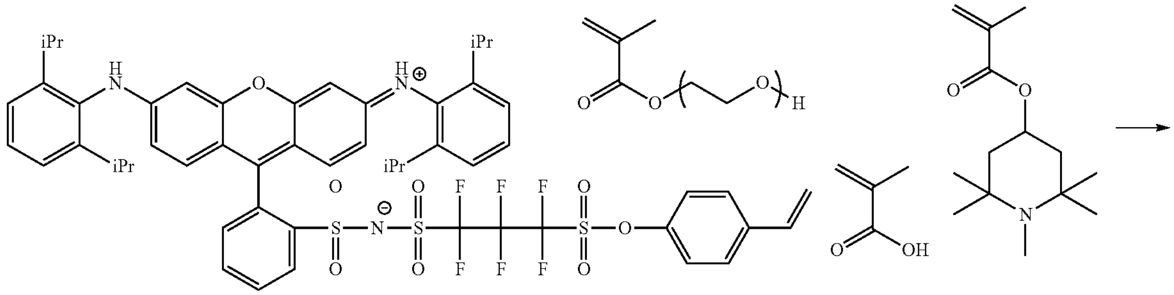
M20

-continued

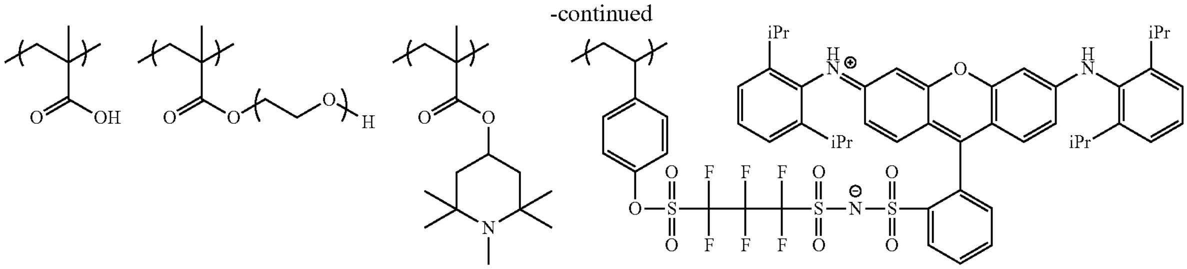

31.2 g of cyclohexanone was added to a three-neck flask and heated at 90° C. in a nitrogen atmosphere. To this solution was added dropwise a mixed solution of the colorant monomer M20 (33.0 g, 31 mmol), methacrylic acid (9.6 g, 112 mmol), dodecylmercaptan (2.8 g, 13 mmol), polyethylene glycol monomethacrylate [trade name: BLEMMER PE-90, manufactured by NOF Corporation] (3.5 g), ADK STAB LA-82 (manufactured by ADEKA)(2.0 g), dimethyl 2,2'-azobis(isobutyrate) [trade name: V601, manufactured by Wako Pure Chemical Industries, Ltd.)] (6.2 g, 27 mmol), and cyclohexanone (81 g) for 1 hour. Thereafter, the mixture was stirred at 90° C. for 3 hours, then cooled to room temperature, added dropwise to a mixed solvent of ethyl acetate/acetonitrile=1,530 mL/170 mL, and reprecipitated. After air-drying at 40° C. for 1 day, 25.3 g of a dye af which is a dye multimer was obtained. The dye af has an acid value of 123 mgKOH/g, and the compositional ratio (molar ratio) as identified by $^{1}$H-NMR was found to be as follows: the structural units derived from the colorant monomer M20:the structural units derived from methacrylic acid: the structural units derived from polyethylene glycol monomethacrylate:the structural units derived from ADK STAB LA-82=18:65:11:6. From the GPC measurement, the weight-average molecular weight (Mw) was 15,000. The ratio of the weight-average molecular weight/the number-average molecular weight (Mw/Mn) of the dye af was 1.9.

Synthesis of Comparative Compound 1

By the following procedure using the Colorant monomer M2 which is a triarylmethane colorant as a colorant, Comparative dye 1 (Comparative compound 1) was synthesized.

The colorant monomer M2 (15 g), benzyl methacrylate (11 g), methacrylic acid (3.5 g), and azobisisobutyronitrile (5 g) were added to N-ethylpyrrolidone (50 g), and the mixture was stirred at room temperature for 30 minutes to make them dissolved (a polymerization solution for dropwise addition).

Separately, the colorant monomer M2 (15 g), benzyl methacrylate (11 g), methacrylic acid (3.5 g), the colorant monomer M2 (15 g), 2-acrylamide-2-methylpropanesulfonic acid (6.5 g), hydroxyethyl methacrylate (23 g), and methacrylic acid (5.5 g) were dissolved in N-ethylpyrrolidone (50 g) and stirred at 95° C. The polymerization solution for dropwise addition, thus prepared, was added dropwise thereto for 3 hours, and stirred for 1 hour, and then azoisobutyronitrile (2.5 g) was added thereto to perform the reaction for additional 2 hours and stop the reaction. After cooling to room temperature, the solvent was removed by distillation to obtain a comparative dye 1. The weight-average molecular weight (Mw) of the obtained comparative dye 1 was 19,000. Further, the acid value of Dye ae as titrated using a 0.1 N aqueous sodium hydroxide solution was 75 mgKOH/g.

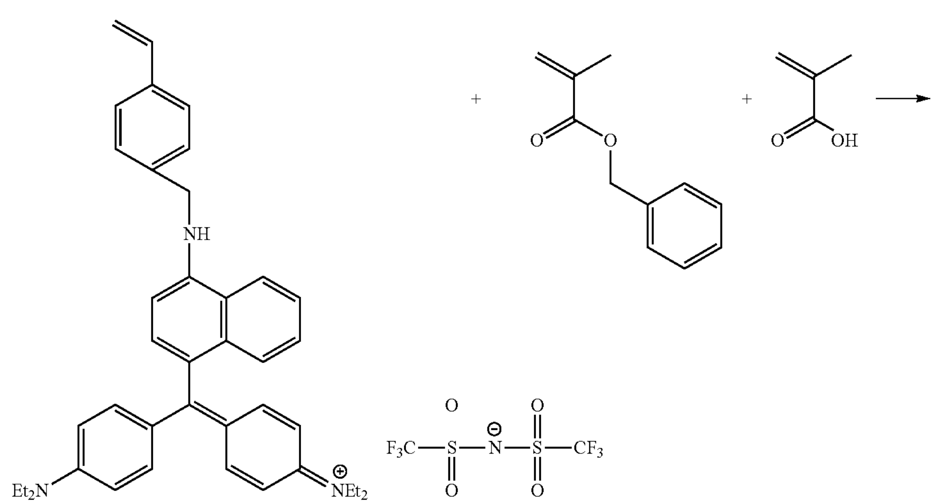

Colorant monomer M2

-continued
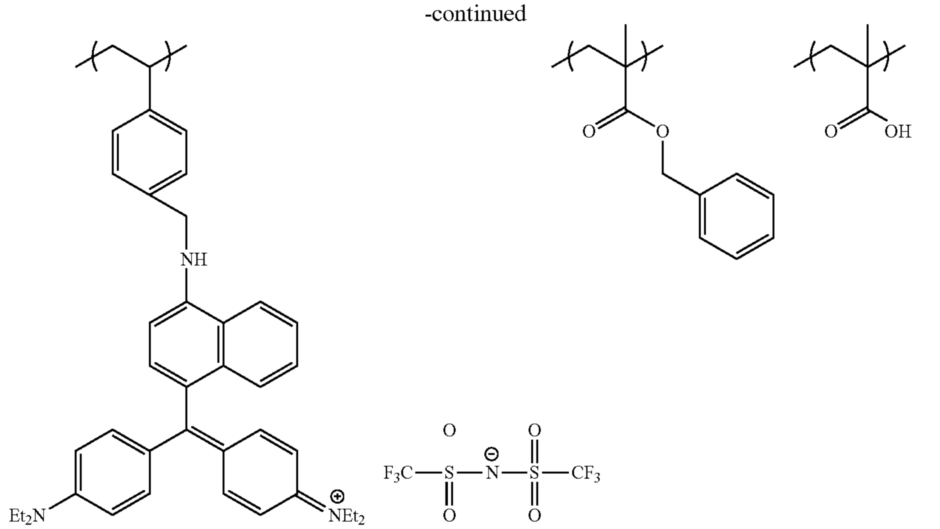
Comparative compound 1
Synthesis of Comparative Compound 2
By the following procedure using the colorant monomer M16 which is a xanthene colorant as a colorant, a comparative dye 2 (comparative compound 2) was synthesized.
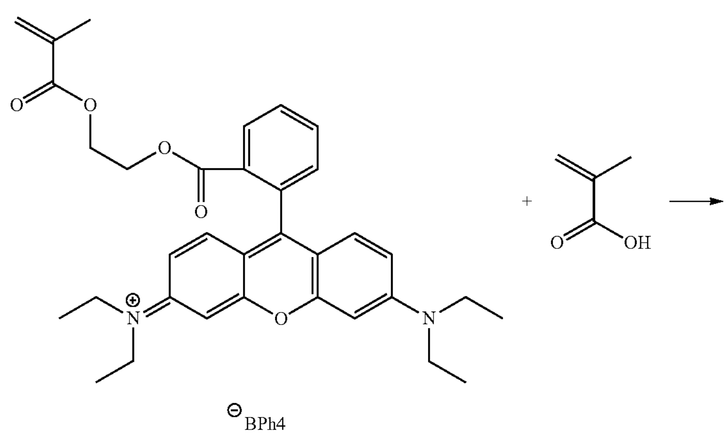
M16
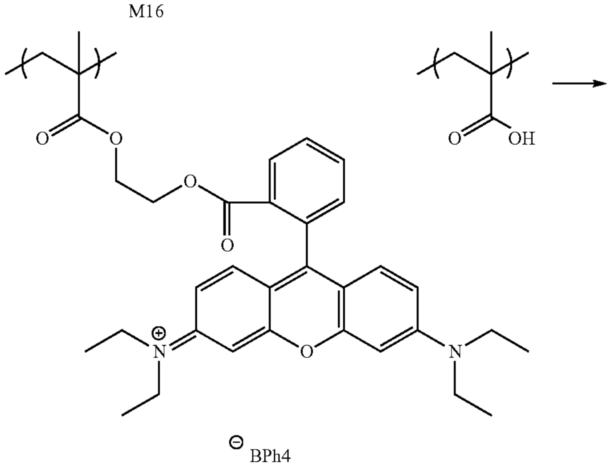
(XA-1)

-continued

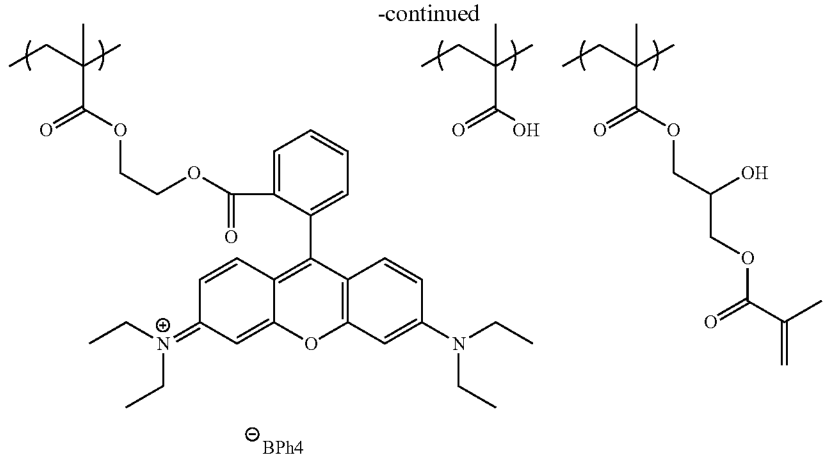

Comparative Compound 2

The colorant monomer M16 (8.5 g), methacrylic acid (1.6 g), dodecylmercaptan (0.20 g), and propylene glycol 1-monomethylether 2-acetate (PGMEA) (23.3 g) were added to a reaction container, and heated at 80° C. in a nitrogen atmosphere. To this solution was added dropwise a mixed solution of the colorant monomer M16 (8.5 g), methacrylic acid (1.6 g), dodecylmercaptan (0.25 g), dimethyl 2,2'-azobis(isobutyrate) (0.46 g), and PGMEA (23.3 g) for 2 hours. Thereafter, the mixture was stirred for 3 hours, then warmed to 90° C., heated and stirred for 2 hours, and left to be cooled to obtain a PGMEA solution of (XA-1). Next, to the PGMEA solution of (XA-1) were added glycidyl methacrylate (1.4 g), tetrabutylammonium bromide (80 mg), and p-methoxyphenol (20 mg), and mixture was heated at 100° C. for 15 hours in an air atmosphere, and it was found that glycidyl methacrylate was lost. After cooling, the resultant was added dropwise to a mixed solvent of methanol/ion exchange water=100 mL/10 mL, and the mixture was reprecipitated to obtain 17.6 g of a comparative dye 2. The weight-average molecular weight (Mw) from GPC measurement was 10,000. The ratio of the weight-average molecular weight/the number-average molecular weight (Mw/Mn) of the comparative dye 2 was 1.9. Further, the acid value as titrated using a 0.1 N aqueous sodium hydroxide solution was 45 mgKOH/g. In addition, the amount of the polymerizable groups contained in the comparative dye 2 was 0.7 mmol/g with respect to the comparative dye 2 (1 g) by NMR measurement.

Preparation of Coloring Composition

Example 1

Preparation of Pigment Dispersion Liquid P1 (C. I. Pigment Blue 15:6 Dispersion Liquid)

In the following manner, a pigment dispersion liquid P1 (C. I. Pigment Blue 15:6 dispersion liquid) was prepared.

That is, a mixed liquid composed of 19.4 parts by mass (average primary particle diameter 55 nm) of C. I. Pigment Blue 15:6 (blue pigment; hereinafter also referred to as "PB 15:6"), 2.95 parts by mass of a pigment dispersant BY-161 (manufactured by BYK), 2.95 parts by mass of an alkali-soluble resin 1 (a benzyl methacrylate/methacrylic acid copolymer, a 30% PGMEA solution), and 172.3 parts by mass of PGMEA was mixed and dispersed by means of a beads mill (zirconia beads having a diameter of 0.3 mm) for 3 hours. Thereafter, the dispersion liquid was further subjected to a dispersion treatment with a high-pressure dispersing machine equipped with a pressure-reducing system NANO-3000-10 (manufactured by Nippon BEE Chemical Co., Ltd.) at a pressure of 2,000 kg/cm$^3$ and a flow rate of 500 g/min. The dispersion treatment was carried out 10 times to obtain a C. I. Pigment Blue 15:6 dispersion liquid as a pigment dispersion liquid. The average primary particle diameter of the pigment of the obtained C. I. Pigment Blue 15:6 dispersion liquid was measured by a dynamic light scattering method (Microtrac Nanotrac UPA-EX150 (manufactured by Nikkiso Co., Ltd.)), and was found to be 24 nm.

Preparation of Coloring Composition Blue 1

The following respective components were mixed, dispersed, and dissolved to obtain a coloring composition (coloring composition 1).

Composition of Coloring Composition 1

- Organic solvent (PGMEA): 17.12 parts
- Alkali-soluble resin 1 above: 1.23 parts
- Alkali-soluble resin 2 (ACRYCURE RD-F8 (manufactured by NIPPON SHOKUBAI CO., LTD.)): 0.23 parts
- Polymerization initiator 1-2 (Compound below, IRGACURE OXE-02): 0.975 parts
- Cyclohexanone solution of the dye a (solid content concentration of 12.3%): 24.57 parts
- Pigment dispersion liquid P1 (C. I. Pigment Blue 15:6 dispersion liquid, PGMEA solution, solid content concentration of 12.8%): 51.40 parts
- Polymerizable compound (NKester A-DPH-12E (manufactured by Shin-Nakamura Chemical Co., Ltd.)): 1.96 parts
- Polymerization inhibitor (p-methoxyphenol): 0.0007 parts
- Fluorine-based surfactant (F475 manufactured by DIC, 1% PGMEA solution): 2.50 parts (I-2)

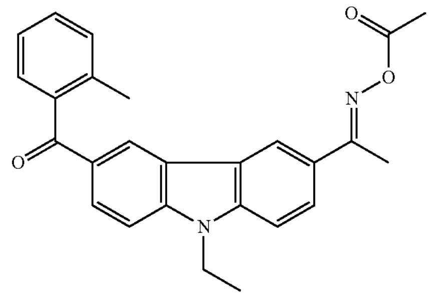

Examples 2 to 32, and Comparative Examples 1 to 4

Preparation of Pigment Dispersion Liquids P2 to P8

The following pigment dispersion liquids were prepared in the same manner as in "Preparation of C. I. Pigment Blue 15:6 Dispersion Liquid" in Example 1 except that the following pigments were used instead of C. I. Pigment Blue 15:6 used as a blue pigment in "Preparation of C. I. Pigment Blue 15:6 Dispersion Liquid" in Example 1.

Red Pigment A: pigment dispersion liquid P2

C. I. Pigment Red 254 (PR254) (average primary particle diameter of 26 nm)

Red Pigment B: pigment dispersion liquid P3

C. I. Pigment Red 177 (PR177) (average primary particle diameter of 28 nm)

Green Pigment A: pigment dispersion liquid P4

C. I. Pigment Green 36 (PG36) (average primary particle diameter of 25 nm)

Green Pigment B: pigment dispersion liquid P5

C. I. Pigment Green 58 (PG58) (average primary particle diameter of 30 nm)

Yellow Pigment A: pigment dispersion liquid P6

C. I. Pigment Yellow 139(PY139) (average primary particle diameter of 27 nm)

Yellow Pigment B: pigment dispersion liquid P7

C. I. Pigment Yellow 150(PY150) (average primary particle diameter of 26 nm)

Violet Pigment A: pigment dispersion liquid P8

C. I. Pigment Violet 23 (PV 150) (average primary particle diameter of 27 nm)

Preparation of Coloring Composition

Coloring Composition Blue 2 to 19, Green 1 to 5, Red 1 to 8, and Comparative Blue 1 and 3 were prepared in the same manner as in "Preparation of Coloring Composition Blue 1" in Example 1 except that the pigment dispersion liquid and the dye in Example 1 were changed as in the following table.

Preparation of Comparative Blue 2

The following respective components were mixed, dispersed, and dissolved to obtain a coloring composition (Comparative Blue 2).

Composition of Comparative Blue 2

Organic solvent (PGMEA): 17.12 parts

Alkali-soluble resin 1 (a copolymer of benzyl methacrylate/methacrylic acid, 30% PGMEA solution): 1.23 parts Alkali-soluble resin 2 (ACRYCURE RD-F8 (manufactured by NIPPON SHOKUBAI CO., LTD.)): 0.23 parts Polymerization initiator 1-2 (IRGACURE OXE-02): 0.975 parts Cyclohexanone solution of Comparative dye 1 (solid content concentration of 12.3%): 24.57 parts Pigment dispersion liquid P1 (C. I. Pigment Blue 15:6 dispersion liquid, PGMEA solution, solid content concentration of 12.8%): 51.40 parts Polymerizable compound (NKester A-DPH-12E (manufactured by Shin-Nakamura Chemical Co., Ltd.)): 1.66 parts Polymerization inhibitor (p-methoxyphenol): 0.0007 parts Fluorine-based surfactant (F475 manufactured by DIC, 1% PGMEA solution): 2.50 parts (Additive) ADK STAB LA-52: 0.30 parts Preparation of Comparative Blue 4

In the same manner as for Comparative Blue 2 except that the dye was changed from the comparative dye 1 to the comparative dye 2, a coloring composition (Comparative Blue 4) was obtained.

For the obtained coloring composition, the light fastness was evaluated.

<Preparation of Substrate for Evaluation of Light Resistance>

The coloring composition which had been prepared as above was applied onto a glass substrate using a spin coater (manufactured by Mikasa Co., Ltd.) to form a coated film. Then, the coated film was subjected to a heating treatment (prebaking) for 120 seconds by using a hot plate at 100° C. such that the dry film thickness of the coated film became 0.6 μm. Then, the coated film was heated at 200° C. for 5 minutes and cured to form a colored layer.

<Light Resistance Test>

A glass substrate having the colored film formed thereon was subjected to a light fastness test, using a light fastness test device (SX-75 manufactured by Suga Test Instruments Co., Ltd.) for 100 hours under the conditions of a black panel temperature of 63° C., a quartz inner filter, a 275-nm cut outer filter, an illuminance of 75 mw/$m^2$ (300 nm to 400 nm), and a humidity of 50%.

<Light Resistance Evaluation>

The color difference (ΔE*ab value) before and after the light fastness test was measured, using a colorimeter MCPD-3000 (manufactured by Otsuka Electronics Co., Ltd.). Based on the measured color difference (ΔE*ab value), the light fastness was evaluated in accordance with the following evaluation criteria. A smaller value can indicate better light fastness. The evaluation results are shown in the following table. A and B are the levels which pose no problem in practical use.

<Evaluation Criteria>

A: ΔE*ab is 3 or less.

B: ΔE*ab is more than 3 and 5 or less.

C: ΔE*ab is more than 5 and 10 or less.

D: ΔE*ab is more than 10.

For the obtained composition, the exposure sensitivity/lithography/adhesion sensitivity were evaluated.

<Manufacture of Undercoat Layer-Attached Glass Wafer>

The undercoat layer-attached glass wafer for use in evaluation was manufactured in the following manner.

(1) Preparation of Composition for Undercoat Layer

Propylene glycol monomethyl ether acetate (PGMEA): 19.20 parts

Ethyl lactate: 36.67 parts

Binder (41% EL solution of a benzyl methacrylate/methacrylic acid/2-hydroxyethyl methacrylate copolymer (molar ratio=60/20/20)): 30.51 parts KAYARAD DPHA (manufactured by Nippon Kayaku Co., Ltd., dipentaerythritolhexaacrylate): 12.20 parts Polymerization inhibitor (p-methoxyphenol): 0.006 parts Fluorine-based surfactant: 0.83 parts Polymerization initiator (TAZ-107 (manufactured by Midori Kagaku Co., Ltd.)): 0.59 parts (2) Manufacture of Undercoat Layer-Attached Glass Wafer The coloring composition for an undercoat layer, which had been obtained above, was applied onto a 8-inch glass wafer using a spin coater, thereby forming a coated film. The coated film thus formed was subjected to a heating treatment on a hot plate at 120° C. for 120 seconds. Further, the coating rotation frequency of the spin coat was adjusted such that the film thickness of the coated film after the heating treatment became about 0.5 μm.

The coated film after the heating treatment was further subjected to a treatment in an oven at 220° C. for 1 hour to obtain an undercoat layer.

In the manner described above, an undercoat layer-attached glass wafer having an undercoat layer formed on a 8-inch glass wafer was obtained.

The coloring composition which had been prepared as above was applied onto the undercoat layer of the undercoat layer-attached silicon wafer which had been obtained above, thereby forming a colored layer (coated film) Further, the colored layer was subjected to a heating treatment (prebaking) for 120 seconds by using a hot plate at 100° C. such that the dry film thickness of the coated film became 1 μm.

Next, the wafer was exposed at a wavelength of 365 nm through an island pattern mask having a 1.0 μm×1.0 μm pattern, by varying the exposure dose in a range from 50 mJ/cm$^2$ to 1,200 mJ/cm$^2$, by using an i-line stepper exposure device FPA-3000i5+(manufactured by CANON Inc.).

Subsequently, the silicon wafer substrate having the coated film irradiated with light formed thereon was loaded onto a horizontal spin table of a spin shower developing machine (Model DW-30, manufactured by Chemitronics Co., Ltd.), and subjected to paddle development at 23° C. for 60 seconds by using CD-2000 (manufactured by FUJIFILM Electronic Materials CO., LTD.), thereby forming a colored pattern on the undercoat layer of the undercoat layer-attached silicon wafer.

The silicon wafer having the colored pattern formed thereon was fixed onto the horizontal spin table by a vacuum chuck method, and the silicon wafer was rotated at a rotation frequency of 50 rpm by using a rotation device. In this state, from the position above the rotation center, pure water was supplied onto the wafer from a spray nozzle in the form of a shower so as to carry out a rinsing treatment, and then the wafer was spray-dried. The wafer was subjected to postbaking using a hot plate at 200° C. for 300 seconds to obtain a transparent pattern (cured film) having a film thickness of 1 μm on the silicon wafer.

In the manner described above, a colored pattern-attached silicon water configured to include a colored pattern (color filter) on the undercoat layer of the undercoat layer-attached silicon wafer was obtained.

Thereafter, the size of the colored pattern was measured by using a length measuring SEM "S-9260A" (manufactured by Hitachi High-Technologies Corporation).

By using the pattern which had been exposed at various exposure doses of 50 mJ/cm$^2$ to 1,200 mJ/cm$^2$, the exposure does and the adhesion were evaluated. Further, by using the colored pattern at an exposure dose such that the pattern size became 1.0 μm, evaluation of the development residues was carried out.

<Evaluation of Exposure Sensitivity>

The exposure dose (mJ/cm$^2$) at which the pattern size became 1.0 μm was measured and evaluated. The evaluation results are shown in the following table. A and B are the levels which pose no problem in practical use.

<Evaluation Criteria>

A: 100 mJ/cm$^2$ or less

B: More than 100 mJ/cm$^2$ and 500 mJ/cm$^2$ or less

C: More than 500 mJ/cm$^2$ and 1,000 mJ/cm$^2$ or less

D: More than 1,000 mJ/cm$^2$

<Evaluation of Adhesion>

The exposure dose (mJ/cm$^2$) at which the formed island pattern did not flow by a developing liquid was measured and evaluated. The evaluation results are shown in the flowing table. A and B are the levels which pose no problem in practical use.

<Evaluation Criteria>

A: 100 mJ/cm$^2$ or less

B: More than 100 mJ/cm$^2$ and 500 mJ/cm$^2$ or less

C: More than 500 mJ/cm$^2$ and 1,000 mJ or less

D: More than 1,000 mJ

<Evaluation of Development Residues>

An area (unexposed area) other than an area having a colored pattern formed therein in the silicon wafer was observed at a magnification of 30,000 using a scanning type electron microscope, and evaluated in accordance with the following evaluation criteria.

A: No residue was found in an area (unexposed area) other than an area having a colored pattern formed therein.

B: Some residues were found in an area (unexposed area) other than an area having a colored pattern formed therein, at which there is no problem in practical use.

C: Significant residues were found in an area (unexposed area) other than an area having a colored pattern formed therein.

TABLE 2

| | | Coloring composition | | | Evaluation results | | | |
|---|---|---|---|---|---|---|---|---|
| | | Dye multimer | Pigment dispersion liquid | Additive | Light resistance | Exposure sensitivity | Adhesion | Development residue |
| Blue 1 | Example 1 | Dye a | P1 | None | A | B | A | A |
| Blue 2 | Example 2 | Dye b | P1 | None | A | A | A | A |
| Blue 3 | Example 3 | Dye c | P1 | None | A | B | A | A |

TABLE 2-continued

| | Coloring composition | | | | Evaluation results | | | |
|---|---|---|---|---|---|---|---|---|
| | | Dye multimer | Pigment dispersion liquid | Additive | Light resistance | Exposure sensitivity | Adhesion | Development residue |
| Red 1 | Example 4 | Dye d | P6 | None | A | A | A | A |
| Red 2 | Example 5 | Dye e | P6 | None | A | A | A | A |
| Blue 4 | Example 6 | Dye f | P1 | None | A | A | A | A |
| Blue 5 | Example 7 | Dye g | P8 | None | A | A | A | A |
| Red 3 | Example 8 | Dye h | P6 | None | A | A | A | A |
| Green 1 | Example 9 | Dye i | P7 | None | A | A | A | A |
| Green 2 | Example 10 | Dye j | P4 | None | A | A | A | A |
| Blue 6 | Example 11 | Dye k | P1 | None | A | A | A | A |
| Red 4 | Example 12 | Dye l | P2 | None | A | A | A | A |
| Red 5 | Example 13 | Dye m | P3 | None | A | A | A | A |
| Green 3 | Example 14 | Dye n | P4 | None | A | A | A | A |
| Green 4 | Example 15 | Dye o | P4 | None | A | A | A | A |
| Green 5 | Example 16 | Dye p | P5 | None | A | A | A | A |
| Blue 7 | Example 17 | Dye q | P1 | None | A | A | A | A |
| Blue 8 | Example 18 | Dye r | P1 | None | A | A | A | A |
| Blue 9 | Example 19 | Dye s | P1 | None | A | A | A | A |
| Red 6 | Example 20 | Dye t | P6 | None | A | A | B | A |
| Blue 10 | Example 21 | Dye u | P1 | None | A | A | B | A |
| Blue 11 | Example 22 | Dye v | P1 | None | A | A | B | A |
| Red 7 | Example 23 | Dye w | P6 | None | A | A | B | A |
| Blue 12 | Example 24 | Dye x | P1 | None | A | A | B | A |
| Blue 13 | Example 25 | Dye y | P1 | None | A | A | B | A |
| Red 8 | Example 26 | Dye z | P6 | None | A | A | B | A |
| Blue 14 | Example 27 | Dye aa | P1 | None | A | A | B | A |
| Blue 15 | Example 28 | Dye ab | P1 | None | A | A | B | A |
| Blue 16 | Example 29 | Dye ac | P1 | None | A | A | A | A |
| Blue 17 | Example 30 | Dye ad | P1 | None | A | A | A | A |
| Blue 18 | Example 31 | Dye ae | P1 | None | A | A | A | A |
| Blue 19 | Example 32 | Dye af | P1 | None | A | A | A | A |
| Comparative Blue 1 | Comparative Example 1 | Comparative dye 1 | P1 | None | D | B | B | A |
| Comparative Blue 2 | Comparative Example 2 | Comparative dye 1 | P1 | ADK STAB LA-52 | C | C | C | A |
| Comparative Blue 3 | Comparative Example 3 | Comparative dye 2 | P1 | None | D | A | B | A |
| Comparative Blue 4 | Comparative Example 4 | Comparative dye 2 | P1 | ADK STAB LA-52 | C | C | C | A |

From the evaluation results, it could be seen that coloring compositions of Examples have good light fastness and exposure sensitivity in the case where a cured film was manufactured. It could also be seen that the adhesion was good and generation of development residues can also be suppressed.

In contrast, it could be seen that in Comparative Examples 1 and 3 in which at least one of the structure represented by Formula (1), Formula (2), Formula (3), Formula (4) or Formula (5) was not contained, the light fastness was insufficient.

It could also be seen that in Comparative Examples 2 and 4 in which the structural unit having a colorant structure, and the structural unit having at least one of the structure represented by Formula (1), Formula (2), Formula (3), Formula (4) or Formula (5) are not contained, the light fastness and the exposure sensitivity are insufficient. That is, it could be seen that the light fastness and the exposure sensitivity are insufficient even when a compound (hindered amine) having the structures represented by Formulae (1) to (5) is added as an additive to the dye multimer. Further, it could also be seen that in Comparative Examples 2 and 4, the adhesion is not good.

Example 33

The same test as in Example 1 except that the polymerizable compound was changed to the same mass of KAYARAD DPHA (manufactured by Nippon Kayaku Co., Ltd., dipentaerythritolhexaacrylate) in Example 1, the same preferred results as in Example 1 were obtained.

Example 34

The same test as in Example 1 except that the polymerizable compound was changed to IRGACURE OXE-01 (manufactured by BASF) in Example 1, the same preferred results as in Example 1 were obtained.

Example 35

Manufacture of Full-Color Color Filter for Solid-State Imaging Device

Green pixels in an island bayer-shaped pattern in 1.0 μm×1.0 μm were formed using the green coloring composition which had been prepared in Example 9, and then red pixels in an island-shaped pattern in 1.0 μm×1.0 μm were formed using the red coloring composition which had been prepared in Example 4. In addition, in the remaining grids, blue pixels in an island-shaped pattern in 1.0 μm×1.0 μm were formed using the blue coloring composition which had been prepared in Example 32, thereby manufacturing a color filter for a light-shielding solid-state imaging device.

<Evaluation>

The obtained full-color color filter for a solid-state imaging device was introduced into the solid-state imaging device, and it was found that the solid-state imaging device had high resolution and excellent color separation.

<Manufacture of Color Filter for Liquid Crystal Display Device>

On a black matrix, a colored pattern in red (R) at 80 μm×80 μm was formed using a red coloring composition that had been prepared in Example 10. Further, in the same manner as above, colored patterns in green (G) and blue (B) were formed, in this order, using a green coloring composition that had been prepared in Example 8 and a blue coloring composition that had been prepared in Example 17, respectively, thereby manufacturing color filters for liquid crystal display devices.

<Evaluation>

The full-color color filter was subjected to processings of an ITO transparent electrode, an alignment film, and the like, thereby manufacturing a liquid crystal display device. It was found that since the coloring composition of the present invention has good uniformity of a coated surface and a color filter thus formed has a good pattern shape, the liquid crystal display device including the color filter had no display unevenness with good image quality.

What is claimed is:

1. A coloring composition comprising:

a dye multimer having a structural unit represented by General Formula (A) and at least one structure selected from the group consisting of a structure represented by formula (1) and a structure represented by formula (2); and a curable compound:

General Formula (A)

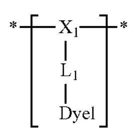

wherein $X_1$ represents a linking group formed by polymerization, $L_1$ represents a single bond or a divalent linking group, and DyeI represents a colorant structure;

(1)

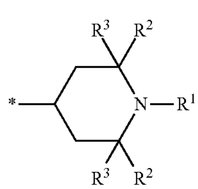

in Formula (1), $R^1$ represents a hydrogen atom, an alkyl group having 1 to 18 carbon atoms, an aryl group, or an oxy radical; $R^2$ and $R^3$ each independently represent an alkyl group having 1 to 18 carbon atoms; $R^2$ and $R^3$ may be bonded to each other to represent an aliphatic ring having 4 to 12 carbon atoms; and "*" represents a bonding hand of the structure represented by Formula (1) with a polymer skeleton;

(2)

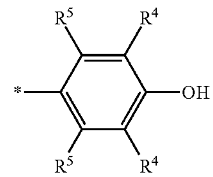

in Formula (2), $R^4$ represents the following Formula (2A), an alkyl group having 1 to 18 carbon atoms, or an aryl group; $R^5$'s each independently represent a hydrogen atom or an alkyl group having 1 to 18 carbon atoms; and "*" represents a bonding hand of the structure represented by Formula (2) with a polymer skeleton;

(2A)

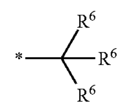

in Formula (2A), $R^6$'s each independently represent an alkyl group having 1 to 18 carbon atoms; and "*" represents a bonding hand of the structure represented by Formula (2A) and the structure represented by Formula (2).

2. The coloring composition according to claim 1, wherein the curable compound is a polyfunctional polymerizable monomer and the coloring composition further contains a polymerization initiator.

3. The coloring composition according to claim 1, wherein the dye multimer further has an acid group.

4. The coloring composition according to claim 1, wherein the dye multimer further has a polymerizable group.

5. The coloring composition according to claim 1, wherein the dye multimer is a random radical polymer.

6. The coloring composition according to claim 1, wherein the content of the structural unit having at least one structure selected from the group consisting a structure represented by the formula (1) and a structure represented by the formula (2) in all the structural units contained in the dye multimer is 0.5% by mole to 20% by mole.

7. The coloring composition according to claim 1, further comprising an alkali-soluble resin.

8. The coloring composition according to claim 1, wherein the colorant structure represented by DyeI is derived from a colorant selected from a dipyrromethane colorant, an azo colorant, an anthroquinone colorant, a triphenylmethane colorant, a xanthene colorant, a cyanine colorant, a squarylium colorant, a quinophthalone colorant, a phthalocyanine colorant, and a subphthalocyanine colorant.

9. The coloring composition according to claim 1, further comprising a pigment.

10. The coloring composition according to claim 1, wherein a color difference ΔE*ab between before and after exposure for 100 hours under a conditions of an illuminance of 75 mw/$m^2$ in a light having a wavelength of 300 nm to 400 nm and a humidity of 50% when a colored film having a thickness of 0.6 μm is formed is 5 or less.

11. The coloring composition according to claim 1, used for forming a colored layer of a color filter.

12. A colored cured film obtained by curing the coloring composition according to claim 1.

13. A color filter comprising the colored cured film according to claim 12.

14. A solid-state imaging device comprising the color filter according to claim 13.

15. An image display device comprising the color filter according to claim 13.

16. A pattern forming method comprising:

applying the coloring composition according to claim 1 onto a support to form a coloring composition layer;

patternwise-exposing the coloring composition layer; and removing an unexposed area by development to form a colored pattern.

17. A method for manufacturing a color filter, comprising:

applying the coloring composition according to claim 1 onto a support to form a coloring composition layer;

patternwise exposing the coloring composition layer; and removing an unexposed area by development to form a colored pattern.

18. The coloring composition according to claim 1, wherein the dye multimer has the structure represented by formula (1).

* * * * *